(12) United States Patent
Sonoda et al.

(10) Patent No.: US 9,458,532 B2
(45) Date of Patent: Oct. 4, 2016

(54) VAPOR DEPOSITION METHOD AND VAPOR DEPOSITION APPARATUS

(75) Inventors: Tohru Sonoda, Osaka (JP); Nobuhiro Hayashi, Osaka (JP); Shinichi Kawato, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 1157 days.

(21) Appl. No.: 13/395,879

(22) PCT Filed: Sep. 10, 2010

(86) PCT No.: PCT/JP2010/065641
§ 371 (c)(1),
(2), (4) Date: Mar. 13, 2012

(87) PCT Pub. No.: WO2011/034011
PCT Pub. Date: Mar. 24, 2011

(65) Prior Publication Data
US 2012/0183676 A1    Jul. 19, 2012

(30) Foreign Application Priority Data

Sep. 15, 2009 (JP) ................. 2009-213570
Nov. 20, 2009 (JP) ................. 2009-265685
Dec. 4, 2009 (JP) ................. 2009-276415

(51) Int. Cl.
*B05B 15/04* (2006.01)
*B05C 11/11* (2006.01)
(Continued)

(52) U.S. Cl.
CPC ............. *C23C 14/12* (2013.01); *C23C 14/042* (2013.01); *H01L 51/0011* (2013.01); *H01L 51/56* (2013.01)

(58) Field of Classification Search
USPC ........................................................ 118/504
See application file for complete search history.

(56) References Cited

U.S. PATENT DOCUMENTS 5,688,551 A    11/1997  Littman et al.
5,742,129 A     4/1998  Nagayama et al.
(Continued)

FOREIGN PATENT DOCUMENTS

JP     8-227276 A     9/1996
JP     9-167684 A     6/1997
(Continued)

OTHER PUBLICATIONS

International Search Report received for PCT Patent Application No. PCT/JP2010/065641, mailed on Dec. 14, 2010, 7 pages (3 pages of English translation and 4 pages of PCT Search Report).
(Continued)

*Primary Examiner* — Austin Murata
(74) *Attorney, Agent, or Firm* — Morrison & Foerster LLP

(57) ABSTRACT

The present invention (i) uses a mask unit (80) including: a shadow mask (81) that has an opening (82) and that is smaller in area than a vapor deposition region (210) of a film formation substrate (200) and; a vapor deposition source (85) that has a emission hole (86) for emitting a vapor deposition particle, the emission hole (86) being provided so as to face the shadow mask (81), the shadow mask (81) and the vapor deposition source (85) being fixed in position relative to each other, (ii) adjusts an amount of a void between the shadow mask (81) and the film formation substrate (200), (iii) moves at least a first one of the mask unit (80) and the film formation substrate (200) relative to a second one thereof while uniformly maintaining the amount of the void between the mask unit (80) and the film formation substrate (200), and (iv) sequentially deposit the vapor deposition particle onto the vapor deposition region (210) through the opening (82) of the shadow mask (81). This makes it possible to form a high-resolution vapor deposition pattern on a large-sized substrate.

9 Claims, 55 Drawing Sheets

(51) Int. Cl.
  *C23C 14/12* (2006.01)
  *C23C 14/04* (2006.01)
  *H01L 51/00* (2006.01)
  *H01L 51/56* (2006.01)

(56) References Cited

U.S. PATENT DOCUMENTS

| | | | |
|---|---|---|---|
| 6,294,892 | B1 | 9/2001 | Utsugi et al. |
| 6,609,297 | B1* | 8/2003 | Hiramatsu ............ H05K 3/0035 174/255 |
| 2002/0076847 | A1 | 6/2002 | Yamada et al. |
| 2004/0020435 | A1 | 2/2004 | Tsuchiya et al. |
| 2005/0153472 | A1* | 7/2005 | Yotsuya .......................... 438/29 |
| 2007/0024831 | A1* | 2/2007 | Hibbs et al. .................... 355/53 |
| 2007/0137568 | A1 | 6/2007 | Schreiber |
| 2009/0030640 | A1* | 1/2009 | Takeuchi et al. ............... 702/95 |
| 2010/0297348 | A1 | 11/2010 | Lee et al. |
| 2010/0297349 | A1 | 11/2010 | Lee et al. |

FOREIGN PATENT DOCUMENTS

| | | |
|---|---|---|
| JP | 10-41069 A | 2/1998 |
| JP | 10-102237 A | 4/1998 |
| JP | 2000-188179 A | 7/2000 |
| JP | 2001-93667 A | 4/2001 |
| JP | 2002-175878 A | 6/2002 |
| JP | 2003-41361 A | 2/2003 |
| JP | 2003-68453 A | 3/2003 |
| JP | 2003-68454 A | 3/2003 |
| JP | 2003-272839 A | 9/2003 |
| JP | 2003-332056 A | 11/2003 |
| JP | 2004-303559 A | 10/2004 |
| JP | 2004-349101 A | 12/2004 |
| JP | 2005-165015 A | 6/2005 |
| JP | 2005-206939 A | 8/2005 |
| JP | 2005-353510 A | 12/2005 |

OTHER PUBLICATIONS

European Search Report received for European Patent Application No. EP10817124.0, mailed Jul. 10, 2015, 3 pages.

* cited by examiner

F I G. 1
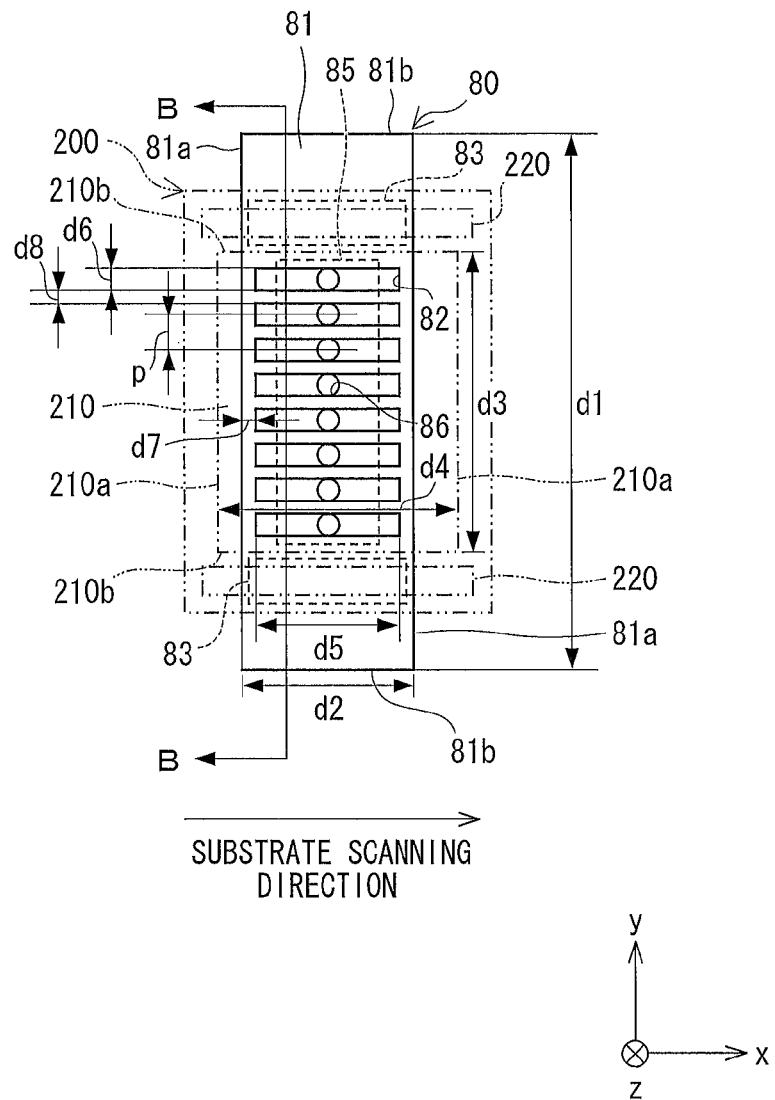
SUBSTRATE SCANNING DIRECTION

F I G. 5
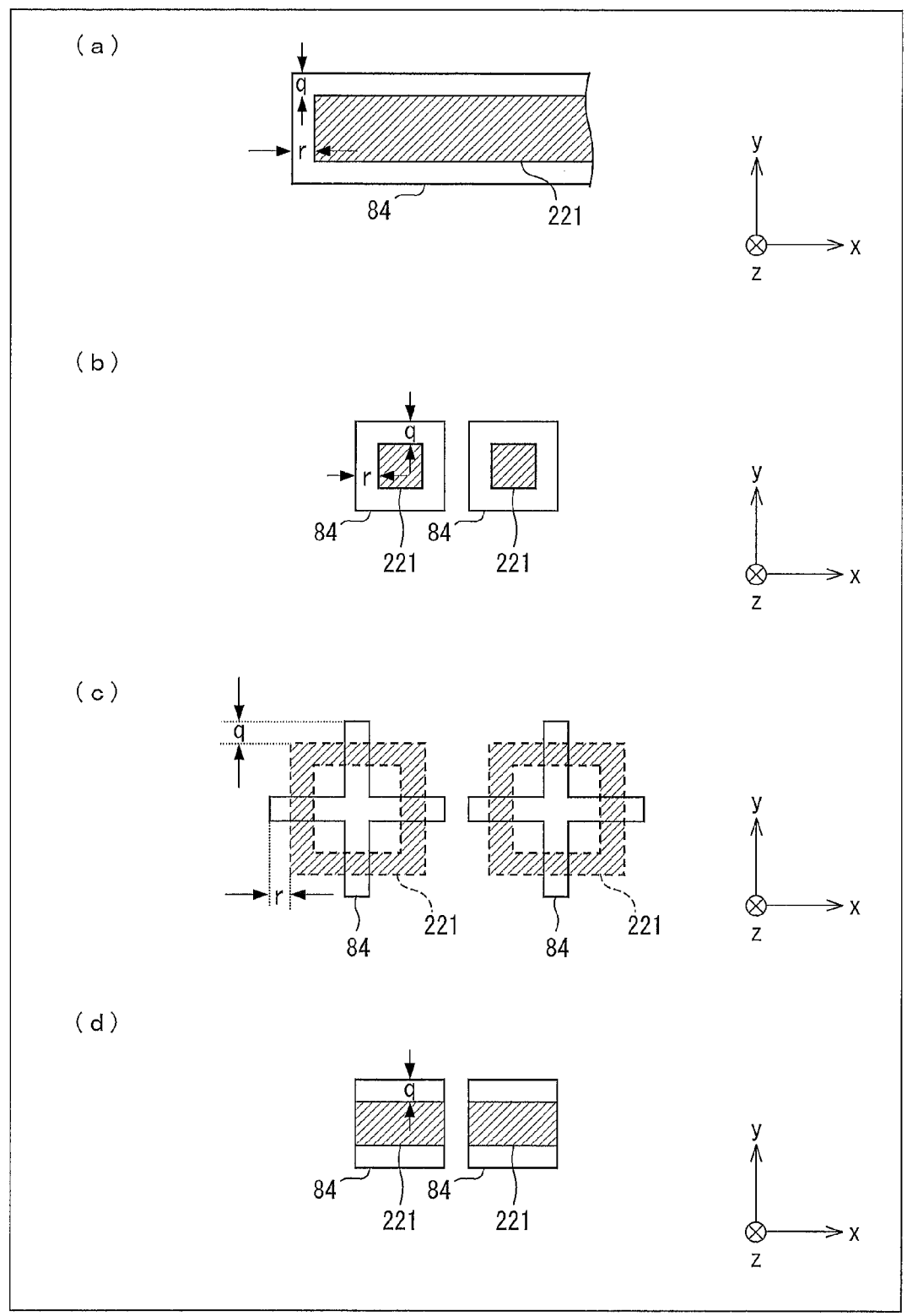

F I G. 6
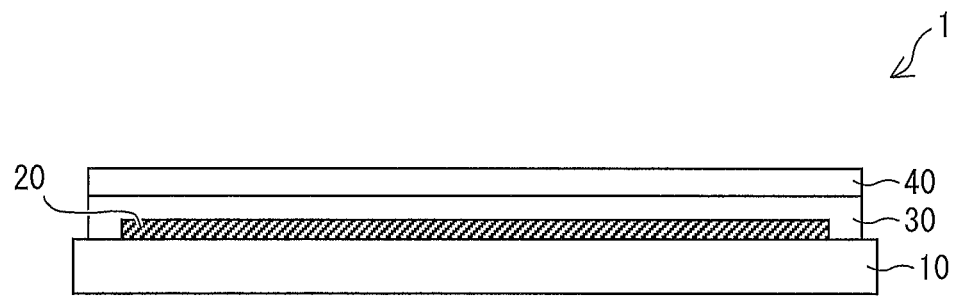

F I G. 1 0
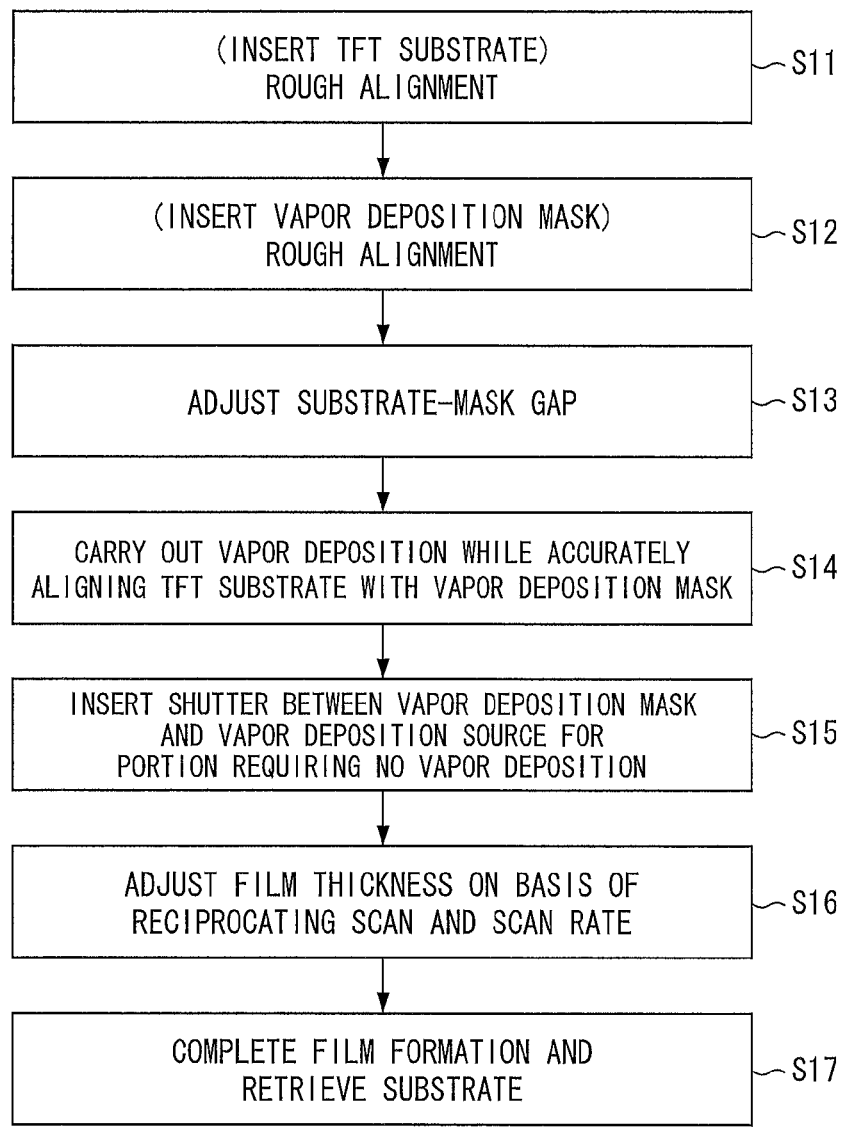

F I G. 1 3
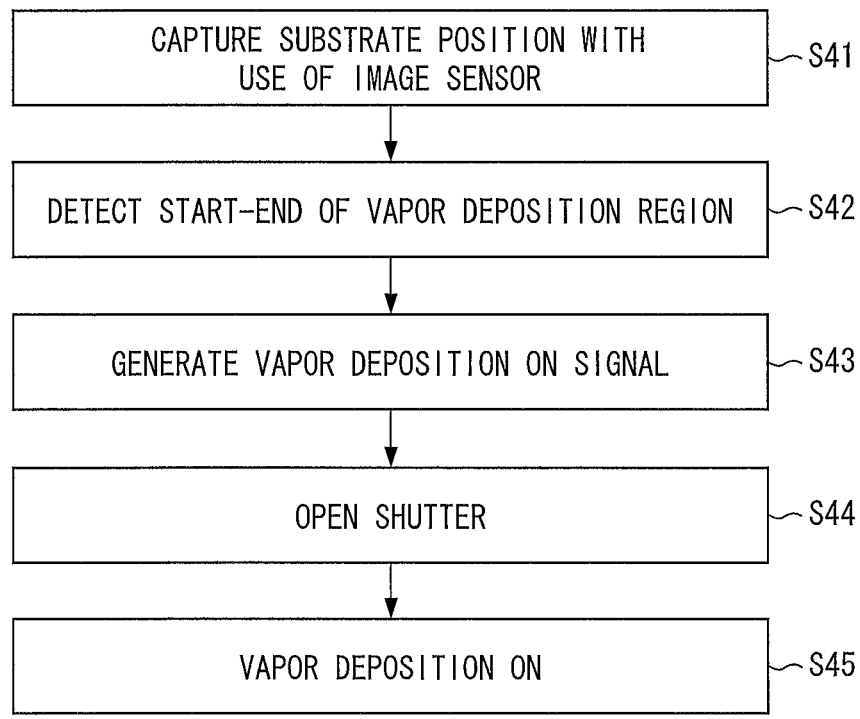

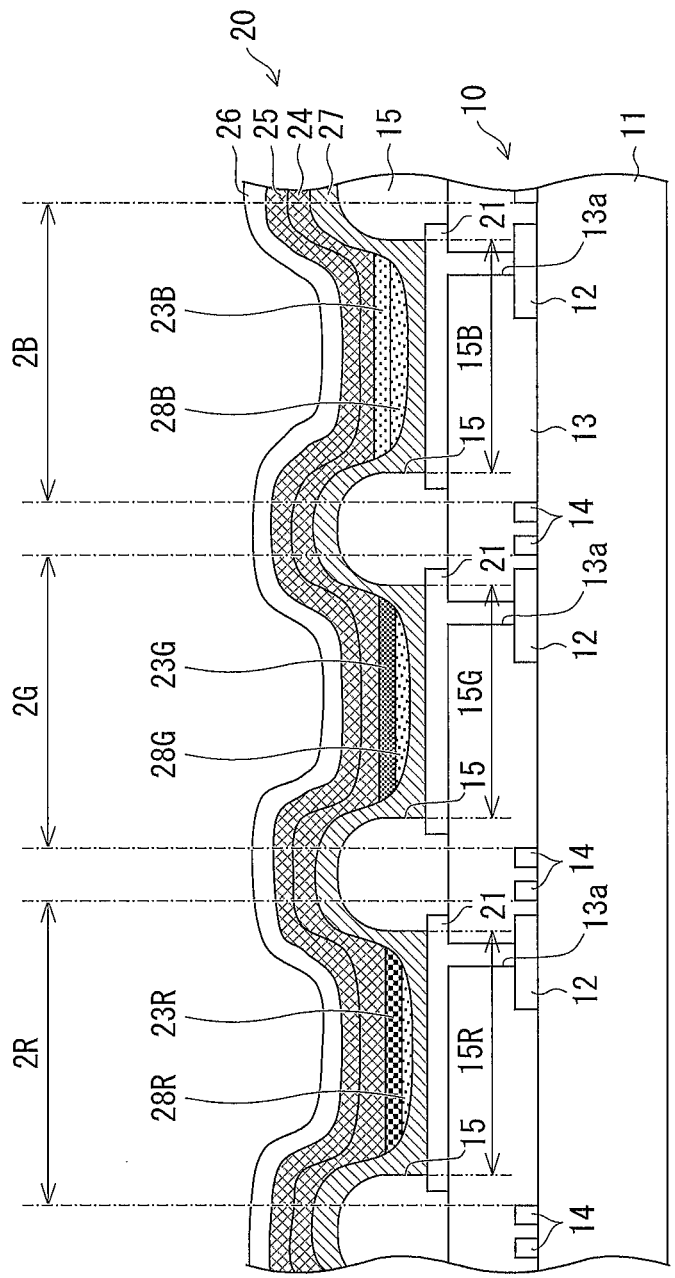

F I G. 1 5
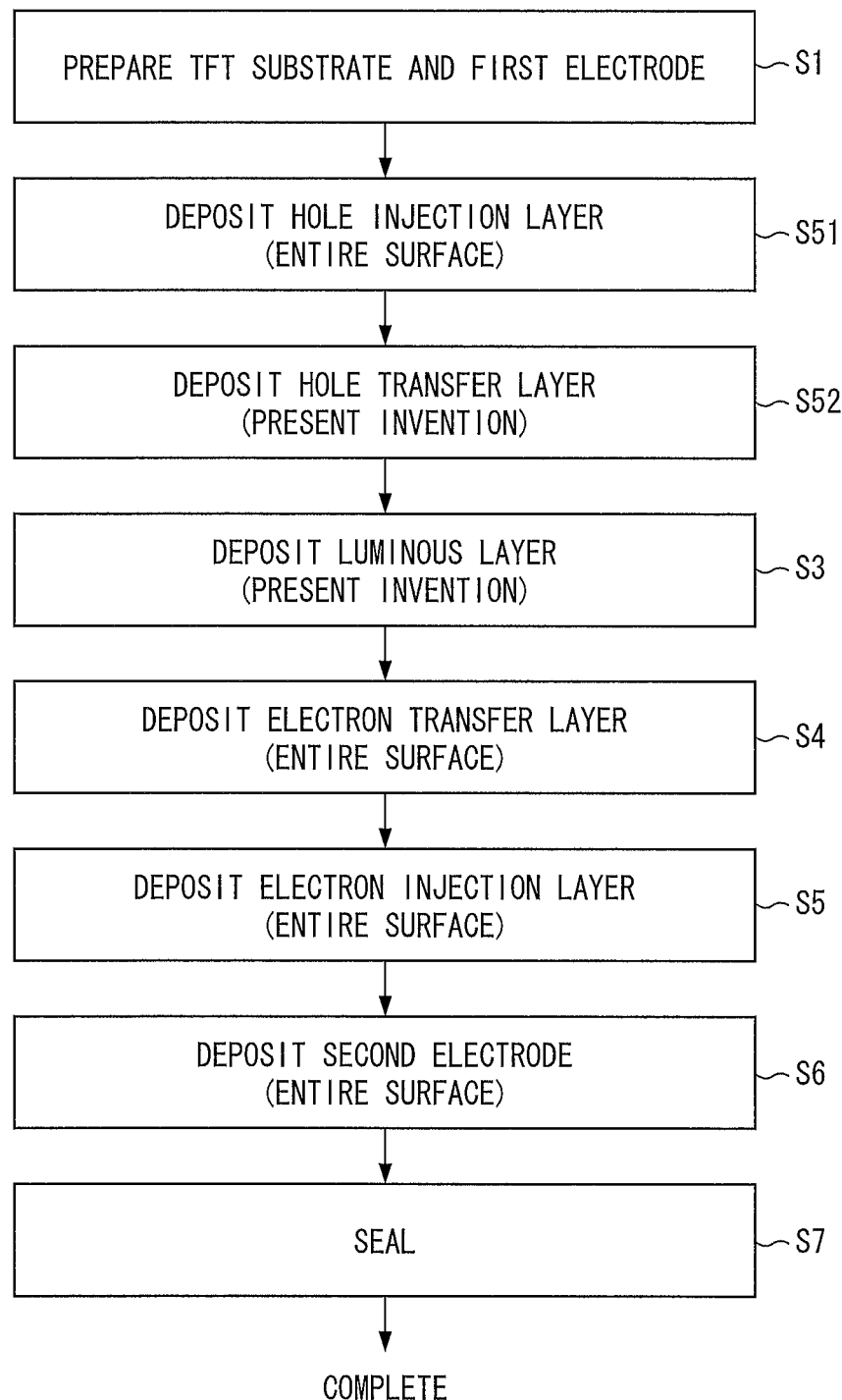

F I G. 1 8
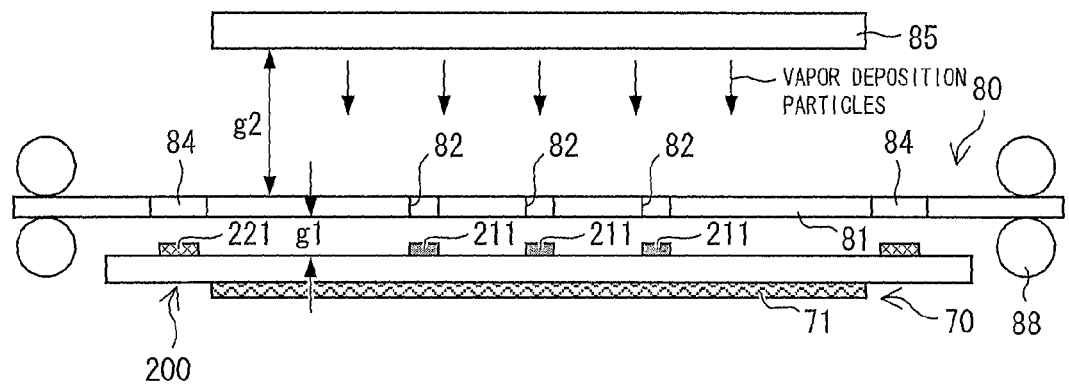

F I G. 2 1
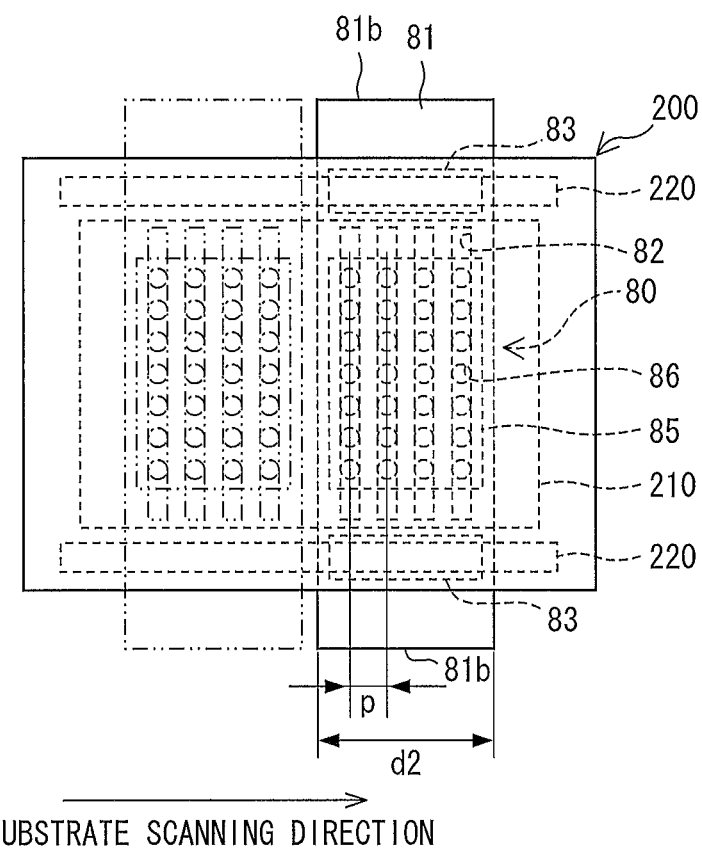
SUBSTRATE SCANNING DIRECTION

F I G. 2 2
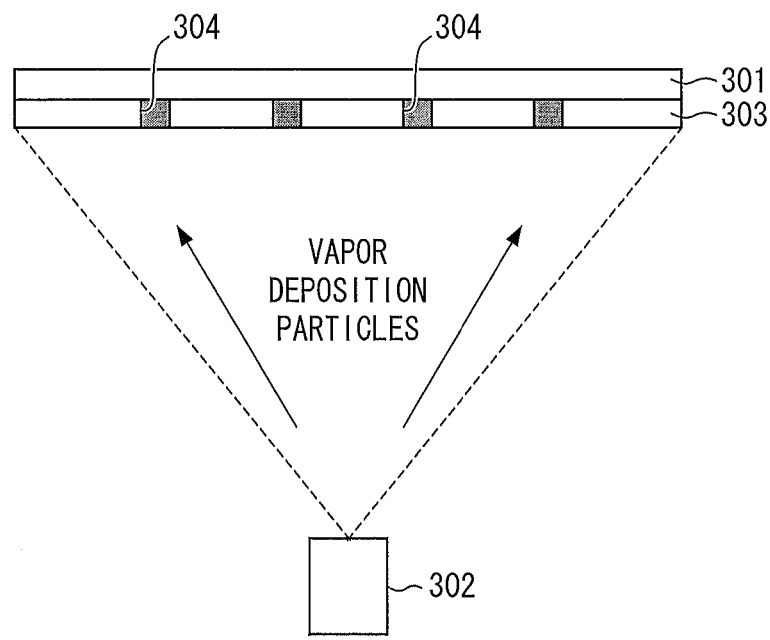
F I G. 2 3
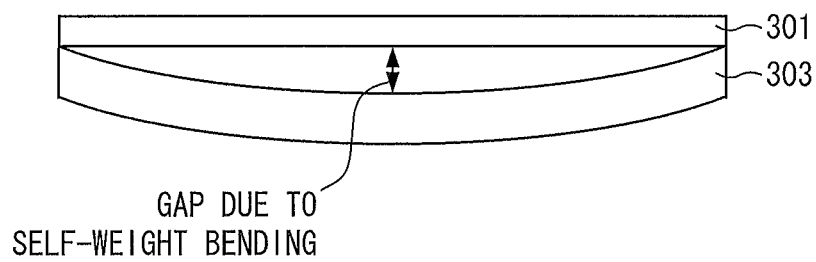

F I G. 4 1
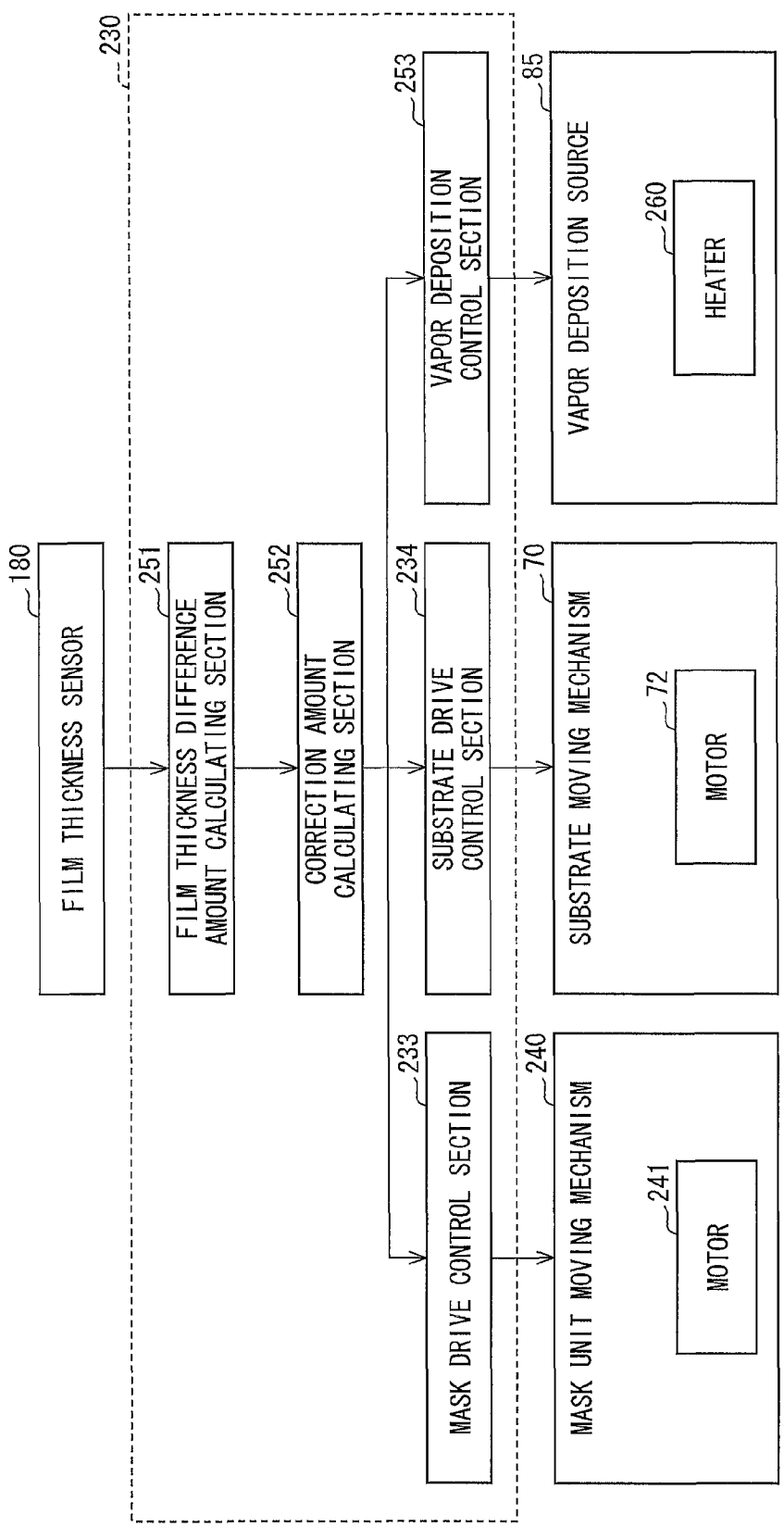

F I G. 4 2
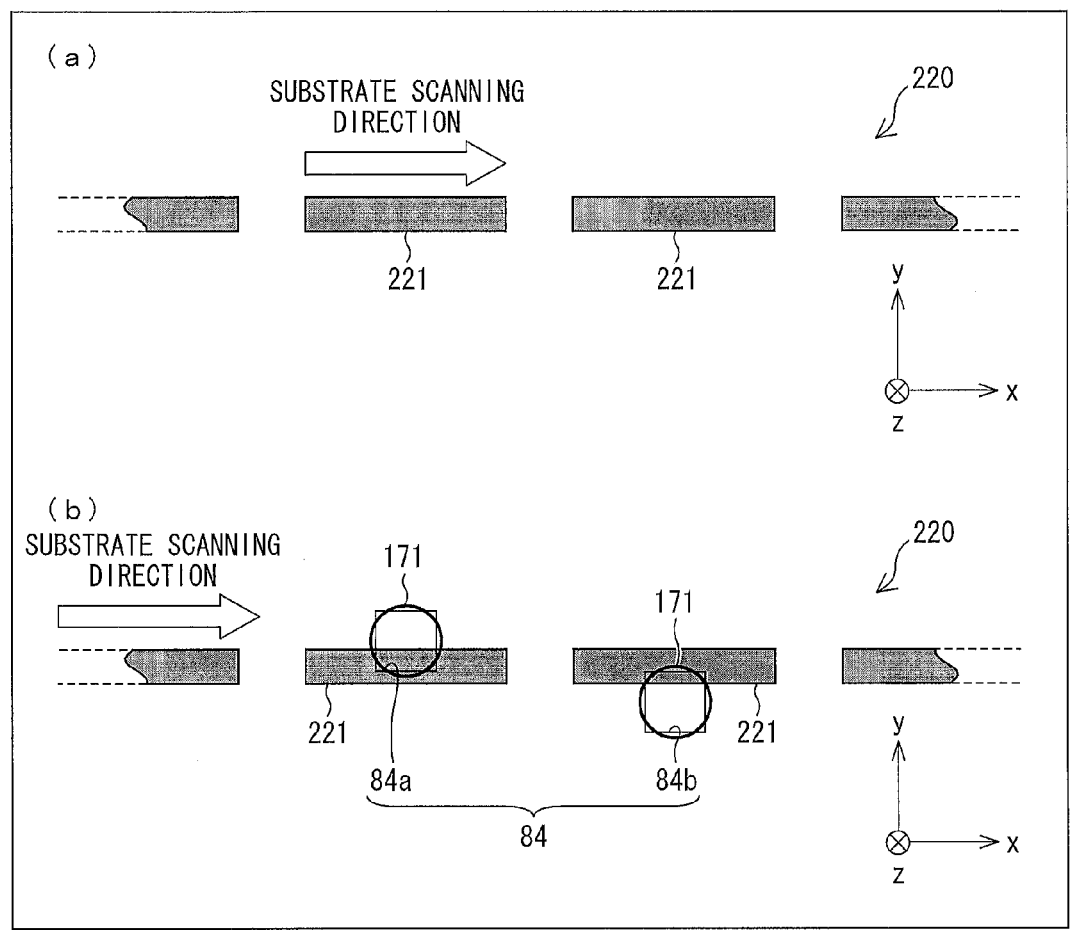

F I G. 4 5
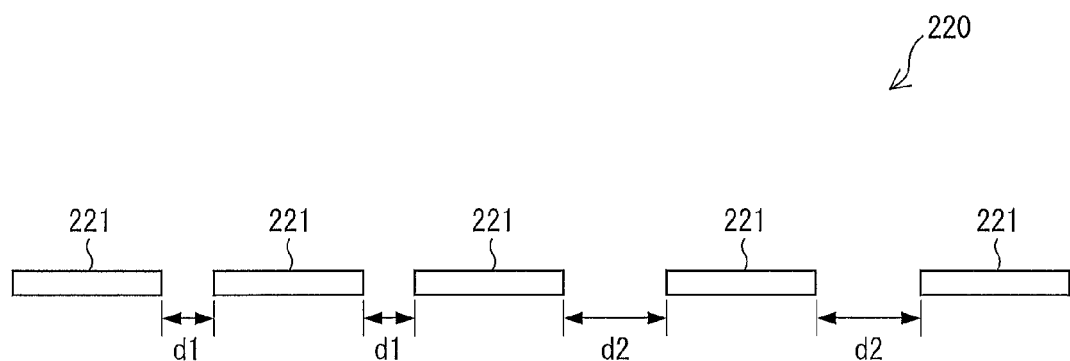

FIG. 53
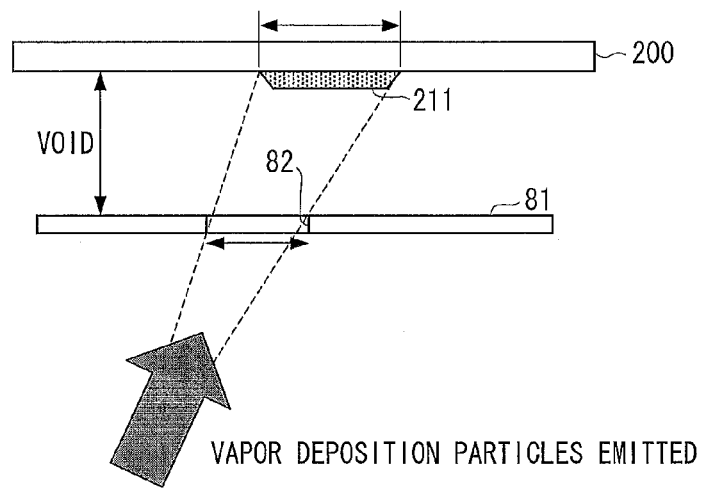
(a)
VAPOR DEPOSITION PARTICLES EMITTED
(b)
POSITION CHANGE AND WIDTH CHANGE OF PIXEL PATTERN
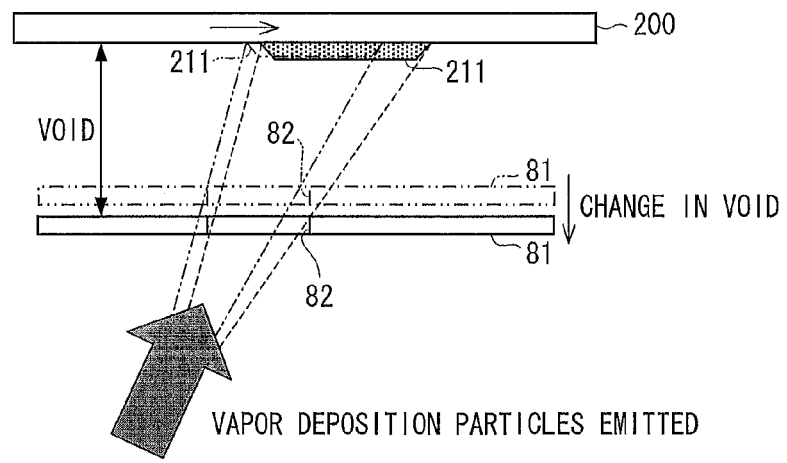
VAPOR DEPOSITION PARTICLES EMITTED F I G. 5 9
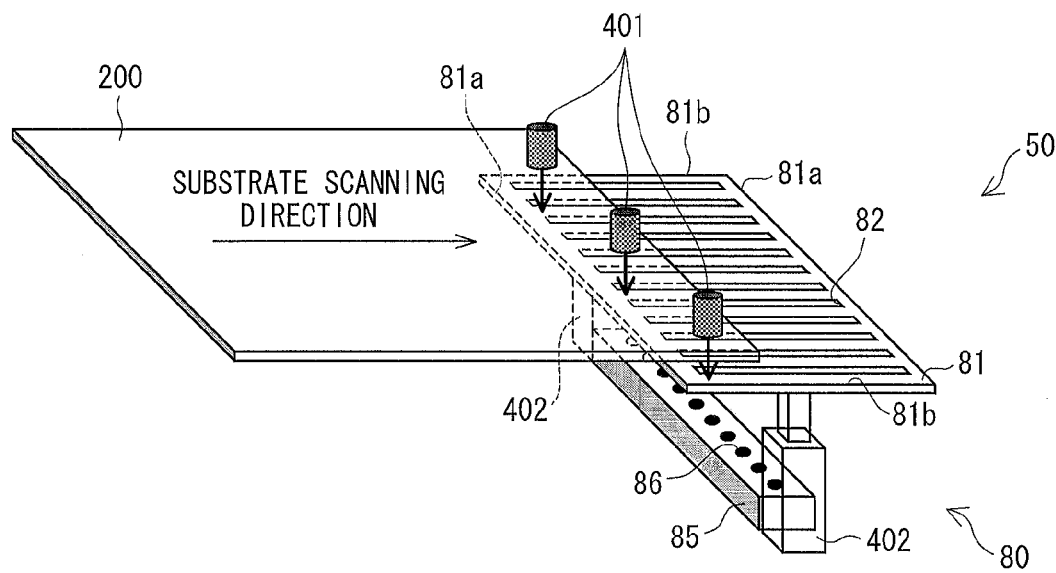
F I G. 6 0
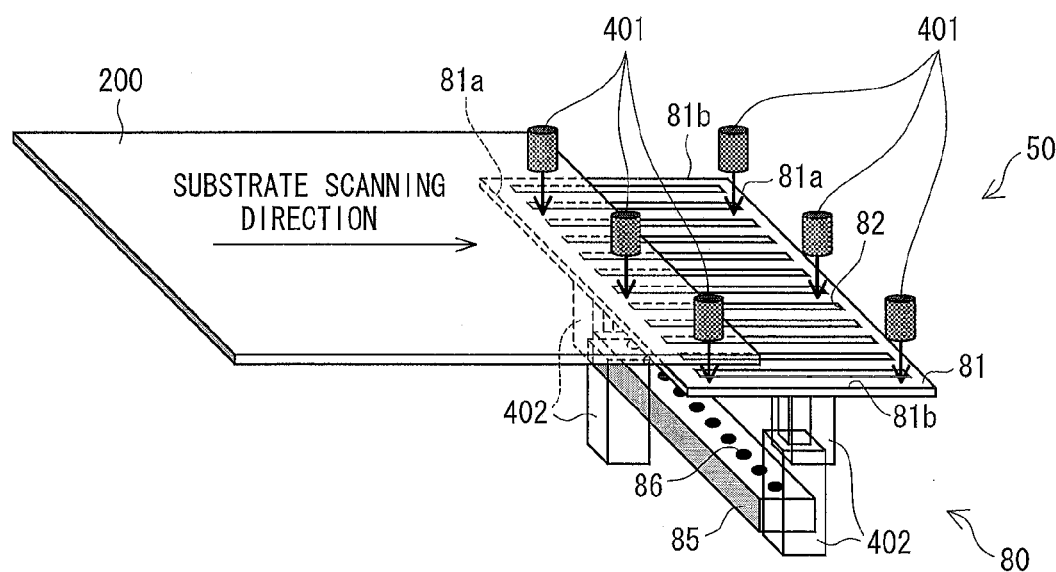

F I G. 6 1
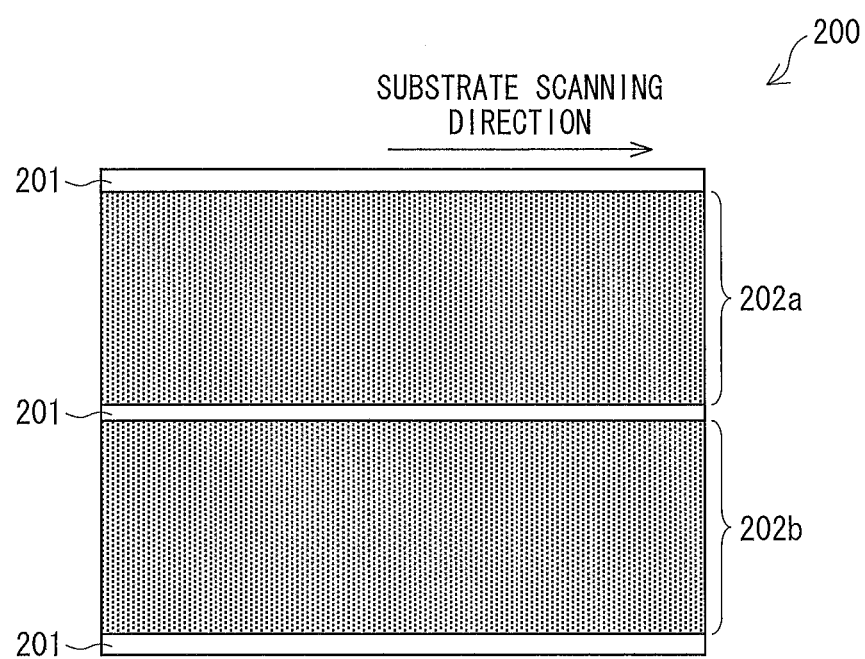

VAPOR DEPOSITION METHOD AND VAPOR DEPOSITION APPARATUS

CROSS REFERENCE TO RELATED APPLICATIONS

This is a U.S. National Phase patent application of PCT/JP2010/065641, filed Sep. 10, 2010, which claims priority to Japanese Patent Application No. 2009-213570, filed Sep. 15, 2009, Japanese Patent Application No. 2009-265685, filed Nov. 20, 2009, and Japanese Patent Application No. 2009-276415, filed Dec. 4, 2009, each of which is hereby incorporated by reference in the present disclosure in its entirety.

TECHNICAL FIELD

The present invention relates to a vapor deposition method and a vapor deposition device each involving use of a vapor deposition mask.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescence (hereinafter abbreviated to "EL") element which uses EL of an organic material and that (ii) is an all-solid-state flat-panel display which is excellent in, for example, low-voltage driving, high-speed response, and self-emitting.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of high-luminance light emission based on low-voltage direct-current driving, and includes in its structure a first electrode, an organic EL layer, and a second electrode stacked on top of one another in that order, the first electrode being connected to a TFT. The organic EL layer between the first electrode and the second electrode is an organic layer including a stack of layers such as a hole injection layer, a hole transfer layer, an electron blocking layer, a luminous layer, a hole blocking layer, an electron transfer layer, and an electron injection layer.

A full-color organic EL display device typically includes organic EL elements of red (R), green (G), and blue (B) as sub-pixels aligned on a substrate. The full-color organic EL display device carries out an image display by, with use of TFTs, selectively causing the organic EL elements to each emit light with a desired luminance.

Such an organic EL display device is produced through a process that forms, for each organic EL element serving as a light-emitting element, a pattern of a luminous layer made of an organic luminescent material which emits light of at least the above three colors (see, for example, Patent Literatures 1 to 3).

Such formation of a luminous layer pattern is performed by a method such as (i) a vacuum vapor deposition method that uses a vapor deposition mask referred to as a shadow mask, (ii) an inkjet method, and (iii) a laser transfer method.

The production of, for example, a low-molecular organic EL display (OLED) has conventionally used a vapor deposition method involving a shadow mask, the vapor deposition method forming organic layers by discriminative application.

The vacuum vapor deposition method involving a shadow mask uses a shadow mask (full-cover contact type shadow mask) that is so sized as to allow vapor deposition to be performed throughout the entire vapor deposition region of a substrate (see, for example, Patent Literatures 4 to 7). The shadow mask is typically equivalent in size to the substrate.

FIG. 22 is a cross-sectional view schematically illustrating a configuration of a conventional vapor deposition device involving a shadow mask.

The vacuum vapor deposition method involving a shadow mask, as illustrated in FIG. 22, forms a pattern by (i) placing a substrate 301 and a vapor deposition source 302 at such positions that the substrate 301 and the vapor deposition source 302 face each other, (ii) forming, in a shadow mask 303, openings 304 corresponding to a pattern of a portion of a target vapor deposition region so that no vapor deposition particles are adhered to a region other than the vapor deposition region, and (iii) depositing vapor deposition particles onto the substrate 301 through the openings 304.

The substrate 301 is placed in a vacuum chamber (not shown). The vapor deposition source 302 is fixed below the substrate 301. The shadow mask 303 is either fixed in close contact with the substrate 301 or moved relative to the substrate 301 while the substrate 301 and the vapor deposition source 302 are fixed to an inner wall of the vacuum chamber (see, for example, Patent Literatures 1, 2, 8, and 9).

Patent Literature 1, for example, discloses a method that involves a load-lock vapor deposition source, the method (i) aligning a mask and a substrate with each other, next (ii) performing vacuum vapor deposition of a first luminescent material from directly below the substrate to form an arrangement of first light-emitting sections each substantially identical in shape to an opening of the mask, then (iii) shifting the mask, and (iv) performing vacuum vapor deposition of a second luminescent material from directly below the substrate to form an arrangement of second light-emitting sections each substantially identical in shape to the opening of the mask.

Patent Literature 2 discloses a method involving a partition wall that is so provided on a substrate to which display electrodes are provided as to protrude from the substrate and surround the display electrodes, the method (i) placing a mask on a top surface of the partition wall, (ii) depositing an organic EL medium on the display electrodes surrounded by the partition wall, then (iii) shifting the mask so that an opening of the mask is shifted from the position directly above a display electrode to the position directly above an adjacent display electrode, thereby sequentially forming luminous layers each substantially identical in shape to the opening of the mask.

Patent Literature 8 discloses a vapor deposition method involving a vapor deposition source, the method (i) placing a metal mask closely to a substrate and (ii) simultaneously carrying the metal mask and the substrate.

The vacuum vapor deposition method involving a shadow mask is used not only to form a luminous layer but also to form an electrode pattern.

Patent Literature 9, for example, discloses a method for forming an electrode pattern, the method (i) aligning, in a mask equivalent in size to a substrate, short-diameter holes or long and narrow slit pores in a direction which intersects a direction in which the mask is shifted and (ii) performing vapor deposition of an electrode material while the mask is shifted.

In the vacuum vapor deposition method involving a shadow mask as described above, the shadow mask is fixed (for example, welded) to a mask frame under tension for prevention of, for example, bending and distortion.

The vacuum vapor deposition method involving a shadow mask forms a luminous layer pattern or an electrode pattern by (i) closely contacting a shadow mask such as the above with a substrate and (ii) causing vapor deposition particles from a vapor deposition source to be deposited (adhered) onto a desired position of the substrate through an opening of the shadow mask.

CITATION LIST

Patent Literature 1

Japanese Patent Application Publication, Tokukai, No. 2000-188179 A (Publication Date: Jul. 4, 2000) [corresponding U.S. Pat. No. 6,294,892; Publication Date: Sep. 25, 2001]

Patent Literature 2

Japanese Patent Application Publication, Tokukaihei, No. 8-227276 A (Publication Date: Sep. 3, 1996) [corresponding U.S. Pat. No. 5,742,129; Publication Date: Apr. 21, 1998]

Patent Literature 3

Japanese Patent Application Publication, Tokukaihei, No. 9-167684 A (Publication Date: Jun. 24, 1997) [corresponding U.S. Pat. No. 5,688,551; Publication Date: Nov. 18, 1997]

Patent Literature 4

Japanese Patent Application Publication, Tokukai, No. 2003-68453 A (Publication Date: Mar. 7, 2003)

Patent Literature 5

Japanese Patent Application Publication, Tokukai, No. 2003-272839 A (Publication Date: Sep. 26, 2003)

Patent Literature 6

Japanese Patent Application Publication, Tokukai, No. 2003-332056 A (Publication Date: Nov. 21, 2003)

Patent Literature 7

Japanese Patent Application Publication, Tokukaihei, No. 10-41069 A (Publication Date: Feb. 13, 1998)

Patent Literature 8

Japanese Patent Application Publication, Tokukai, No. 2001-93667 A (Publication Date: Apr. 6, 2001)

Patent Literature 9

Japanese Patent Application Publication, Tokukaihei, No. 10-102237 A (Publication Date: Apr. 21, 1998)

Patent Literature 10

Japanese Patent Application Publication, Tokukai, No. 2004-349101 A (Publication Date: Dec. 9, 2004)

Patent Literature 11

Japanese Patent Application Publication, Tokukai, No. 2002-175878 A (Publication Date: Jun. 21, 2002)

SUMMARY OF INVENTION

Technical Problem

Unfortunately, a larger substrate size requires the shadow mask 303 to be larger in size as well.

Such a larger size results in, as illustrated in FIG. 23, a gap opening between the substrate 301 and the shadow mask 303 due to, for example, self-weight bending and elongation of the shadow mask 303. This makes it impossible to form a pattern with high positional accuracy, and thus causes, for example, misplacement in vapor deposition and color mixture, thereby making it difficult to achieve high resolution.

Further, a larger substrate size requires the shadow mask 303 and a mask frame that holds it to be both extremely large and heavy. This in turn requires a device that uses the shadow mask 303 to be extremely large and complex, which not only makes it difficult to design such a device, but also causes a safety problem in handling the shadow mask during a production step or a step such as replacing the shadow mask.

It is, in consequence, extremely difficult to form a pattern of a large-sized substrate with use of a large-sized shadow mask.

A process of producing an organic EL display device requires a substrate size of approximately 1 m per side in order to use an existing mass production process of the vapor deposition method involving a full-cover contact type shadow mask. It is difficult to use the vapor deposition method for a large-sized substrate having a substrate size larger than approximately 1 m per side. This indicates that there currently exists no established organic layer discriminative application technique that is usable for a large-sized substrate. It is thus impossible to mass-produce a large-sized organic EL display device of a 60-inch class or a larger size.

Further, pattern formation based on the inkjet method causes, for example, color mixture between adjacent sub-pixels because of finer patterns, and only has a limited patterning accuracy in, for example, controlling a liquid drop position.

The inkjet method typically uses an organic luminescent material made of a high molecule. Such a high-molecular luminescent material is, however, difficult to develop in some respects, and is at present problematically inferior in light emission property and life to a low-molecular luminescent material.

The inkjet method additionally requires a particular arrangement so that no foundation layer will dissolve in a solvent of a material used to form an upper layer. The inkjet method thus does not make it possible to use an arbitrary foundation layer.

The inkjet method also requires a long tact time for formation of a pattern on a large-sized substrate because of an increased number of ejected droplets and an expansion of an ejection range. Further, the inkjet method causes a large variation in film thickness and film flatness, depending on how well a solvent of the ejected liquid is dried. The inkjet method thus tends to result in display irregularity occurring in a display device produced.

The laser transfer method involving a source of light such as laser light uses (i) a donor substrate including a light-heat converting layer and an organic donor layer and (ii) a film formation substrate including, for example, first electrodes and sub-pixels, the donor substrate and the film formation substrate being placed so that the organic donor layer of the donor substrate faces the electrodes and the like of the film formation substrate. Irradiating the light-heat converting layer of the donor substrate with laser light causes the light-heat converting layer to absorb optical energy and convert it into heat. Scanning a desired region with the laser light during the irradiation causes the organic donor layer to vaporize in a corresponding region, which forms a pattern of an organic layer on the film formation substrate. The laser transfer method thus makes it possible to selectively transfer a luminous layer to regions corresponding respectively to the first electrodes.

The laser transfer method, however, requires laser scanning to be performed as many times as the number of sub-pixel lines, and thus requires a long tact time.

The laser transfer method causes a formed film to be non-uniform in film thickness when having problems with, for example, (i) stability of a laser light source and/or (ii) non-uniformity in beam profile due to, for example, deflection arising from mechanical scanning and/or a change in focal length. This leads to display irregularity occurring in a resulting display device produced. The laser transfer method thus poses a lot of problems in handling a larger size substrate and in mass production.

As described above, none of the above pattern formation methods will facilitate forming a pattern of an organic layer on a large-sized substrate, particularly an eighth-generation substrate (approximately 2,160 mm×2,460 mm) or newer. Further, the above pattern formation methods all pose a problem in mass production.

As described above, there has been known no production technique or production device that allows a pattern of an organic layer to be formed on a large-sized substrate. The constraint in substrate size has prevented production of a large-sized organic EL display device.

A larger substrate size normally allows a larger number of panels to be formed from a single substrate, and thus reduces the unit cost of a panel. This means that a larger sized substrate allows an organic EL display device to be produced at a lower cost. Conventionally, however, the above constraint in substrate size has prevented production of a low-cost organic EL display device.

Recent years have seen a proposal of a method that uses a vapor deposition mask which is smaller in size than a film formation substrate, the method (i) performing vapor deposition while shifting the vapor deposition mask and a vapor deposition source relative to the film formation substrate so that a large-sized substrate is used as the film formation substrate, and (ii) producing a large-sized organic EL display device on such a film formation substrate (see Patent Literatures 10 and 11).

(a) of FIG. 62 is a plan view schematically illustrating a vapor deposition device disclosed in Patent Literature 10. (b) of FIG. 62 is a cross-sectional view of the vapor deposition device, taken along the line in (a) of FIG. 62.

The vapor deposition device 310 of Patent Literature 10, as illustrated in (a) and (b) of FIG. 62, includes: a vapor deposition source 311; a vapor deposition source container 312 that contains the vapor deposition source 311; and a ball screw 313 to which the vapor deposition source container 312 is attached. Circular movement of the ball screw 313 about an axis can move the vapor deposition source container 312 in the long-axis direction of the ball screw 313 along a linear guide 314.

The vapor deposition device 310 further includes: a mask holding section 315 above the vapor deposition source container 312; and a vapor deposition mask 316 fixed to the mask holding section 315.

The vapor deposition device 310 also includes a film formation substrate 317 that is so held by a substrate holding section 318 as to have a vapor deposition surface facing the vapor deposition source 311.

The vapor deposition source 311 and the vapor deposition mask 316 are (i) moved together in the long-axis direction of the ball screw 313 in response to movement of the vapor deposition source container 312 which movement is caused by circular movement of the ball screw 313, and are thus (ii) shifted relative to the film formation substrate 317.

The film formation substrate 317 and the vapor deposition mask 316, to prevent themselves from being damaged when the vapor deposition source 311 and the vapor deposition mask 316 are shifted relative to the film formation substrate 317 as described above, need to be separated from each other by a void so as not to be in contact with each other.

This void needs to be maintained at a constant amount; otherwise, a vapor deposition pattern obtained is mispositioned, which in turn makes it impossible to form a high-resolution vapor deposition pattern throughout the entire vapor deposition region of the film formation substrate 317.

The amount of the void, however, is changed by factors such as (i) self-weight bending of the film formation substrate 317, (ii) accuracy of the vapor deposition device 310 itself, and (iii) thermal expansion of members (particularly, the film formation substrate 317 and the vapor deposition mask 316).

The vapor deposition device of Patent Literature 10 is, however, merely arranged as illustrated in (a) and (b) of FIG. 62 such that the film formation substrate 317 is held by the substrate holding section 318 at (i) an end section on a start-end side of the direction in which the vapor deposition source container is moved and (ii) an end section on a rear-end side of the same direction. Patent Literature 10 thus fails to consider the change in the amount of the void, the change being caused by, for example, self-weight bending and/or thermal expansion of the film formation substrate 317. Similarly, as illustrated in (a) and (b) of FIG. 62, the vapor deposition mask 316 is also only simply placed on the mask holding section 315 of the vapor deposition source container 312. This indicates that the vapor deposition mask 316 is merely supported by the mask holding section 315 at a peripheral portion of its lower surface.

As described above, Patent Literature 10 includes no mechanism for controlling the amount of the void. The method disclosed in Patent Literature 10 thus cannot maintain the void at a constant amount, and unfortunately causes, for example, blurring in a vapor deposition pattern (that is, variation in pattern width) and mispositioning of a vapor deposition pattern. The vapor deposition device 310 disclosed in Patent Literature 10, in consequence, fails to form, throughout the entire vapor deposition region, a high-resolution vapor deposition pattern necessary for a display device such as an organic EL display device.

Patent Literature 11 discloses a vapor deposition method that (i) uses a vapor deposition mask smaller in size than a film formation substrate and that (ii) covers, with a mask support that supports an end section(s) of the vapor deposition mask, a region of the film formation substrate which region is not covered by the vapor deposition mask. The method thus divides a single large-sized substrate into a plurality of regions to perform vapor deposition.

Patent Literature 11 discloses that (i) in the case where the vapor deposition mask is a metal mask, it is fixed by a fixing section mechanism to a mask supporting section of a mask support, and that (ii) the metal mask becomes fixed while it is being pulled in a direction toward its periphery. Patent Literature 11 further discloses increasing the thickness of the vapor deposition mask for greater strength to reduce self-weight bending of the vapor deposition mask.

Patent Literature 11, however, fails to provide any particular arrangement for the change in the amount of the void, the change being caused by thermal expansion of, for example, the vapor deposition mask and/or the film formation substrate. In addition, Patent Literature 11 fails to disclose information on how the film formation substrate is held. It is unrealistic to increase the thickness of the film formation substrate as with the vapor deposition mask in order to reduce self-weight bending of the film formation substrate.

As described above, Patent Literature 11 also fails to consider the change in the amount of the void, the change being caused by (i) thermal expansion of, for example, the film formation substrate and/or the vapor deposition mask or (ii) self-weight bending of the film formation substrate. Patent Literature 11 thus fails to disclose a mechanism for controlling the void amount. As described above, Patent Literature 11 as well as Patent Literature 10 fails to maintain the void at a constant amount, and consequently fails to form, throughout the entire vapor deposition region, a high-resolution vapor deposition pattern necessary for a display device such as an organic EL display device.

The present invention has been accomplished in view of the above problem. It is an object of the present invention to provide (i) a vapor deposition method and a vapor deposition device each of which makes it possible to form a high-resolution vapor deposition pattern on a large-sized substrate and (ii) a method for producing an organic EL display device which method uses the vapor deposition method or the vapor deposition device.

Solution to Problem

In order to solve the above problems, a vapor deposition method of the present invention is a vapor deposition method for forming, on a film formation substrate, vapor deposition film having a predetermined pattern, the vapor deposition method including the steps of: (A) (i) preparing a mask unit including: a vapor deposition mask that has an opening and that is smaller in area than a vapor deposition region of the film formation substrate; and a vapor deposition source that has an emission hole for emitting a vapor deposition particle, the emission hole being provided so as to face the vapor deposition mask, the vapor deposition mask and the vapor deposition source being fixed in position relative to each other, and (ii) aligning the mask unit and the film formation substrate with each other by adjusting an amount of a void between the vapor deposition mask and the film formation substrate so that the vapor deposition mask faces the film formation substrate in a state in which the vapor deposition mask is separated from the film formation substrate by a uniform void; and (B) (i) moving at least a first one of the mask unit and the film formation substrate relative to a second one thereof while uniformly maintaining a void between the mask unit and the film formation substrate, and (ii) sequentially depositing the vapor deposition particle through the opening of the vapor deposition mask onto the vapor deposition region of the film formation substrate.

In order to solve the above problems, a vapor deposition device of the present invention is a vapor deposition device for forming, on a film formation substrate, a film having a predetermined pattern, the vapor deposition device including: a mask unit provided so as to face the film formation substrate and so as to include: a vapor deposition mask that has an opening and that is smaller in area than a vapor deposition region of the film formation substrate; and a vapor deposition source that has an emission hole for emitting a vapor deposition particle, the emission hole being provided so as to face the vapor deposition mask, the vapor deposition mask and the vapor deposition source being fixed in position relative to each other; and moving means for moving at least a first one of the mask unit and the film formation substrate relative to a second one thereof while maintaining a uniform void between the mask unit and the film formation substrate.

Advantageous Effects of Invention

The arrangements above are each different from conventional art in that the vapor deposition mask and the film formation substrate are not fixed to each other and that the vapor deposition mask and the vapor deposition source are fixed in position relative to each other. This makes it possible to carry out vapor deposition by (i) using, as described above, a vapor deposition mask smaller in area than the vapor deposition region of the film formation substrate and (ii) moving at least a first one of the mask unit and the film formation substrate relative to a second one thereof.

The above arrangements each thus prevent the problem of, for example, self-weight bending and elongation due to a large-sized vapor deposition mask, and consequently make it possible to not only form a pattern of an organic layer on a large-sized substrate, but also form such a pattern with high positional accuracy and high resolution.

The arrangements above each use a vapor deposition mask smaller in area than the vapor deposition region of the film formation substrate as described above. This can reduce or prevent problems caused by a frame for holding a vapor deposition mask which frame is extremely large and extremely heavy due to a large-sized vapor deposition mask.

The arrangements above can each carry out vapor deposition by moving at least a first one of the mask unit and the film formation substrate relative to a second one thereof while maintaining the void between the mask unit and the film formation substrate, and thus form a film formation pattern (vapor deposition film) that is uniform in width and film thickness.

The void between the mask unit and the film formation substrate prevents the film formation substrate from coming into contact with the vapor deposition mask, and thus prevents the film formation substrate from being damaged by the vapor deposition mask. The arrangements above each thus eliminate the need to form on the film formation substrate a mask spacer for preventing such damage, and can reduce costs as well.

BRIEF DESCRIPTION OF DRAWINGS

FIG. 1 is a plan view illustrating a film formation substrate and a mask unit inside a vacuum chamber of a vapor deposition device according to Embodiment 1 of the present invention, the plan view being taken from a back surface side of the film formation substrate.

FIG. 5 (a) through (d) are each a diagram illustrating example shapes of alignment markers provided to the film formation substrate and a vapor deposition mask according to Embodiment 1 of the present invention.

FIG. 6 is a cross-sectional view schematically illustrating a configuration of an organic EL display device for carrying out an RGB full color display.

FIG. 10 is a flowchart indicating an example method for forming a predetermined pattern on a TFT substrate with use of the vapor deposition device according to Embodiment 1 of the present invention.

FIG. 13 is a flowchart indicating a flow of a vapor deposition control carried out when vapor deposition is turned ON.

FIG. 14 is a cross-sectional view illustrating a variation of an organic EL display device according to Embodiment 2 of the present invention.

FIG. 15 is a flowchart indicating successive steps for producing the organic EL display device illustrated in FIG. 14.

FIG. 18 is a cross-sectional view schematically illustrating a configuration of a main part inside the vacuum chamber of the vapor deposition device according to Embodiment 3 of the present invention.

FIG. 21 is a plan view illustrating a relation between (i) the long-axis direction of openings of a shadow mask of a mask unit according to Embodiment 6 of the present invention and (ii) a substrate scanning direction.

FIG. 22 is a cross-sectional view schematically illustrating a configuration of a conventional vapor deposition device including a shadow mask.

FIG. 23 is a cross-sectional view illustrating a problem involved in a conventional vapor deposition method.

FIG. 41 is another block diagram partially illustrating the configuration of the vapor deposition device illustrated in FIG. 37.

FIG. 42 (a) is a plan view schematically illustrating an arrangement of a main part of an alignment marker section of the film formation substrate illustrated in FIG. 39, and (b) is a plan view illustrating a positional relationship between individual alignment markers in the alignment marker section of the film formation substrate illustrated in (a), alignment markers of the vapor deposition mask, and laser spots.

FIG. 45 is a plan view illustrating alignment markers of the film formation substrate which have a varying discontinuous cycle.

FIG. 53 (a) and (b) are each a diagram illustrating a relation between an opening of a vapor deposition mask and a vapor deposition width and vapor deposition position of a vapor deposition film for a case in which there is provided a void between a film formation substrate and the vapor deposition mask.

FIG. 59 is a bird's eye view illustrating other example main constituent elements inside a vacuum chamber of the vapor deposition device illustrated in FIG. 54.

FIG. 60 is a bird's eye view illustrating example main constituent elements inside a vacuum chamber of a vapor deposition device according to Embodiment 17 of the present invention.

FIG. 61 is a plan view illustrating a void sensing transmitting region in the film formation substrate used in Embodiment 17 of the present invention.

DESCRIPTION OF EMBODIMENTS

Embodiments of the present invention are described below in detail.

Embodiment 1

An embodiment of the present invention is described below with reference to FIGS. 1 through 13.

The present embodiment describes, as an example vapor deposition method involving a vapor deposition device of the present embodiment, a method for producing an organic EL display device that (i) is of a bottom emission type, that is, extracts light from a TFT substrate side, and that (ii) carries out an RGB full color display.

The description first deals with the overall configuration of the organic EL display device.

Figure 7:
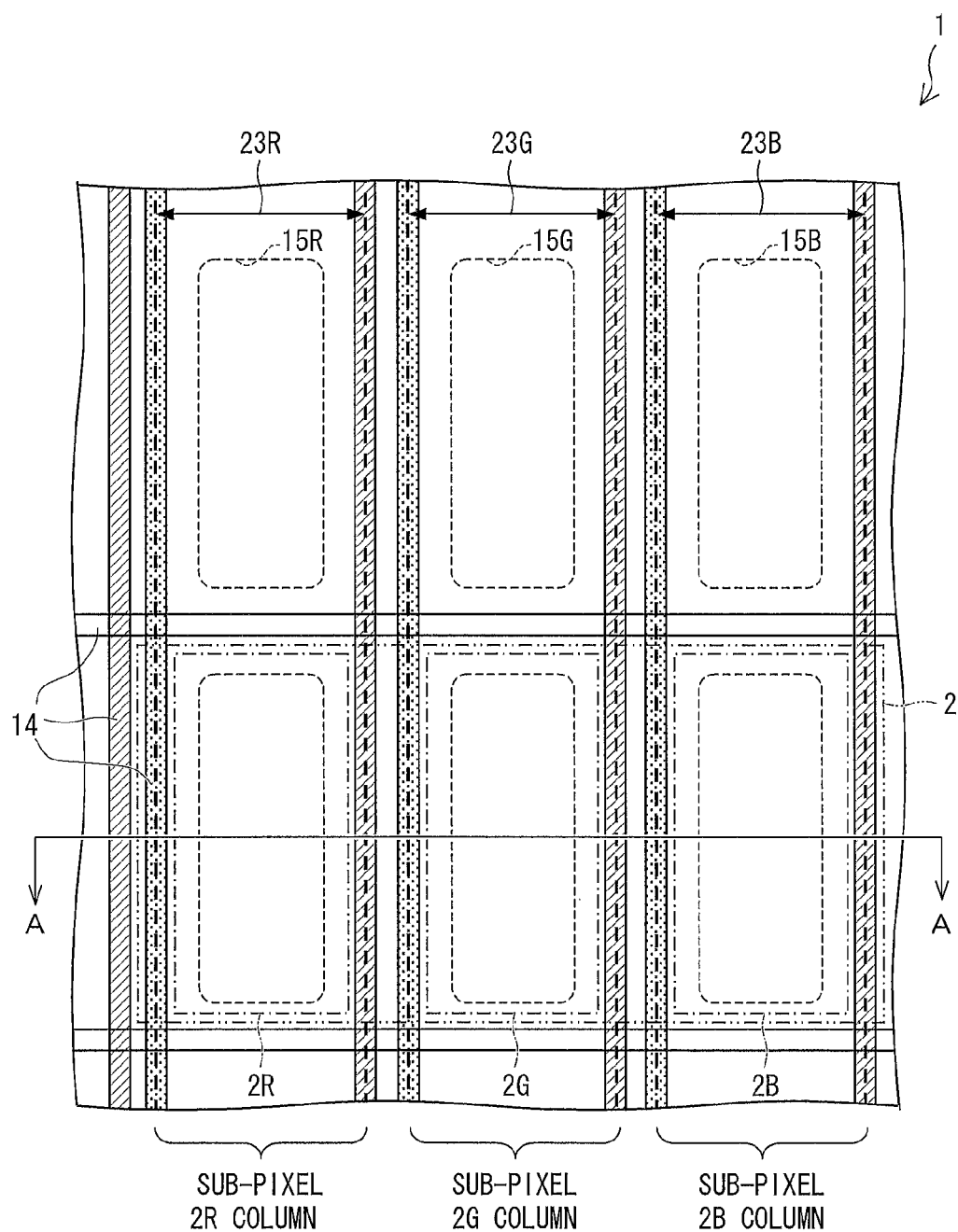
FIG. 7 is a plan view illustrating an arrangement of pixels constituting the organic EL display device illustrated in FIG. 6.
Figure 8:
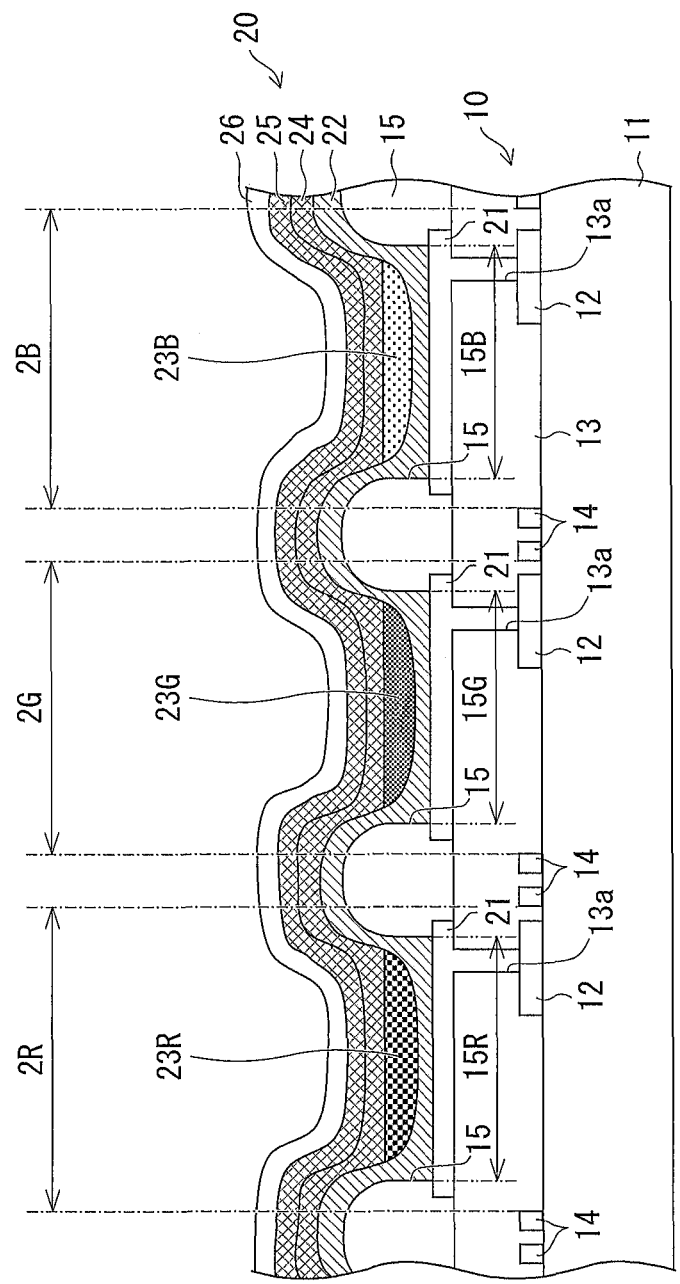
FIG. 8 is a cross-sectional view, taken along line A-A, illustrating a TFT substrate in the organic EL display device illustrated in FIG. 7.

FIG. 6 is a cross-sectional view schematically illustrating a configuration of the organic EL display device that carries out an RGB full color display. FIG. 7 is a plan view illustrating an arrangement of pixels included in the organic EL display device illustrated in FIG. 6. FIG. 8 is a cross-sectional view, taken long line A-A in FIG. 7, of a TFT substrate included in the organic EL display device illustrated in FIG. 7.

As illustrated in FIG. 6, the organic EL display device 1 produced in the present embodiment includes: a TFT substrate 10 including TFTs 12 (see FIG. 8); an organic EL element 20 provided on the TFT substrate 10 and connected to the TFTs 12; an adhesive layer 30; and a sealing substrate 40 arranged in that order.

The organic EL element 20, as illustrated in FIG. 6, is contained between the TFT substrate 10 and the sealing substrate 40 by attaching the TFT substrate 10, on which the organic EL element 20 is provided, to the sealing substrate 40 with use of the sealing substrate 40.

The organic EL display device 1, in which the organic EL element 20 is contained between the TFT substrate 10 and the sealing substrate 40 as described above, prevents infiltration of oxygen, moisture and the like present outside into the organic EL element 20.

As illustrated in FIG. 8, the TFT substrate 10 includes, as a supporting substrate, a transparent insulating substrate 11 such as a glass substrate. The insulating substrate 11 is, as illustrated in FIG. 7, provided with a plurality of wires 14 including (i) a plurality of gate lines laid in the horizontal direction and (ii) a plurality of signal lines laid in the vertical direction and intersecting with the gate lines. The gate lines are connected to a gate line driving circuit (not shown in the drawings) that drives the gate lines, whereas the signal lines are connected to a signal line driving circuit (not shown in the drawings) that drives the signal lines.

The organic EL display device 1 is a full-color, active matrix organic EL display device. The organic EL display device 1 includes, on the insulating substrate 11 and in regions defined by the wires 14, sub-pixels 2R, 2G, and 2B arranged in a matrix which include organic EL elements 20 of red (R), green (G), and blue (B), respectively.

In other words, the regions defined by the wires 14 each (i) correspond to a single sub-pixel (dot) and (ii) provide a light-emitting region of R, G, or B for each sub-pixel.

FIG. 7 illustrates a pixel 2 (that is, a single pixel) that includes three sub-pixels: a red sub-pixel 2R transmitting red light; a green sub-pixel 2G transmitting green light; and a blue sub-pixel 2B transmitting blue light.

The sub-pixels 2R, 2G, and 2B include, as light-emitting regions of the respective colors which light-emitting regions perform light emission of the respective sub-pixels 2R, 2G, and 2B, openings 15R, 15G, and 15B that are covered respectively by stripe-shaped luminous layers 23R, 23G, and 23B of the respective colors.

The luminous layers 23R, 23G, and 23B are each formed in a pattern by vapor deposition. The openings 15R, 15G, and 15B are described below in detail.

The sub-pixels 2R, 2G, and 2B include respective TFTs 12 each connected to a first electrode 21 of the organic EL element 20. The sub-pixels 2R, 2G, and 2B each have an emission intensity that is determined by scan through the wires 14 and selection of the TFTs 12. As described above, the organic EL display device 1 carries out an image display by selectively causing the organic EL element 20 to emit, by use of the TFTs 12, light with desired luminance.

The following describes in detail respective configurations of the TFT substrate 10 and the organic EL element 20 both included in the organic EL display device 1.

The description below first deals with the TFT substrate 10.

The TFT substrate 10, as illustrated in FIG. 8, includes on a transparent insulating substrate 11 such as a glass substrate: TFTs 12 (switching elements) and wires 14; an interlayer film 13 (interlayer insulating film; planarizing film); and an edge cover 15, formed in that order.

The insulating substrate 11 is provided thereon with (i) wires 14 and (ii) TFTs 12 corresponding respectively to the sub-pixels 2R, 2G, and 2B. Since the configuration of a TFT has conventionally been well known, the individual layers of a TFT 12 are not illustrated in the drawings or described herein.

The interlayer film 13 is provided on the insulating substrate 11 throughout the entire region of the insulating substrate 11 to cover the TFTs 12 and the wires 14.

There are provided on the interlayer film 13 a first electrode 21 of the organic EL element 20.

The interlayer film 13 has contact holes 13a for electrically connecting the first electrode 21 of the organic EL element 20 to the TFTs 12. This electrically connects the TFTs 12 to the organic EL element 20 via the contact holes 13a.

The edge cover 15 is an insulating layer for preventing the first electrode 21 and a second electrode 26 of the organic EL element 20 from short-circuiting with each other due to, for example, (i) a reduced thickness of the organic EL layer in an edge section of the pattern of the first electrode 21 or (ii) an electric field concentration.

The edge cover 15 is so formed on the interlayer film 13 as to cover edge sections of the pattern of the first electrode 21.

The edge cover 15 has openings 15R, 15G, and 15B for the sub-pixels 2R, 2G, and 2B, respectively. The openings 15R, 15G, and 15B of the edge cover 15 define the respective light-emitting regions of the sub-pixels 2R, 2G, and 2B.

The sub-pixels 2R, 2G, and 2B are, in other words, isolated from one another by the insulating edge cover 15. The edge cover 15 thus functions as an element isolation film as well.

The description below now deals with the organic EL element 20.

The organic EL element 20 is a light-emitting element capable of high-luminance light emission based on low-voltage direct-current driving, and includes: a first electrode 21; an organic EL layer; and a second electrode 26, provided on top of one another in that order.

The first electrode 21 is a layer having the function of injecting (supplying) positive holes into the organic EL layer. The first electrode 21 is, as described above, connected to the TFTs 12 via the contact holes 13a.

The organic EL layer provided between the first electrode 21 and the second electrode 26 includes, as illustrated in FIG. 8: a hole injection layer/hole transfer layer 22; luminous layers 23R, 23G, and 23B; an electron transfer layer 24; and an electron injection layer 25, formed in that order from the first electrode 21 side.

The above stack order intends to use (i) the first electrode 21 as an anode and (ii) the second electrode 26 as a cathode. The stack order of the organic EL layer is reversed in the case where the first electrode 21 serves as a cathode and the second electrode 26 serves as an anode.

The hole injection layer has the function of increasing efficiency in injecting positive holes into the luminous layers 23R, 23G, and 23B. The hole transfer layer has the function of increasing efficiency in transferring positive holes to the luminous layers 23R, 23G, and 23B. The hole injection layer/hole transfer layer 22 is so formed uniformly throughout the entire display region of the TFT substrate 10 as to cover the first electrode 21 and the edge cover 15.

The present embodiment describes an example case involving, as the hole injection layer and the hole transfer layer, a hole injection layer/hole transfer layer 22 that integrally combines a hole injection layer with a hole transfer layer as described above. The present embodiment is, however, not limited to such an arrangement: The hole injection layer and the hole transfer layer may be provided as separate layers independent of each other.

There are provided on the hole injection layer/hole transfer layer 22 the luminous layers 23R, 23G, and 23B so formed in correspondence with the respective sub-pixels 2R, 2G, and 2B as to cover the respective openings 15R, 15G, and 15B of the edge cover 15.

The luminous layers 23R, 23G, and 23B are each a layer that has the function of emitting light by recombining (i) holes (positive holes) injected from the first electrode 21 side with (ii) electrons injected from the second electrode 26 side. The luminous layers 23R, 23G, and 23B are each made of a material with high luminous efficiency, such as a low-molecular fluorescent dye and a metal complex.

The electron transfer layer 24 is a layer that has the function of increasing efficiency in transferring electrons from the second electrode 26 to the luminous layers 23R, 23G, and 23B. The electron injection layer 25 is a layer that has the function of increasing efficiency in injecting electrons from the second electrode 26 into the luminous layers 23R, 23G, and 23B.

The electron transfer layer 24 is so provided on the luminous layers 23R, 23G, and 23B and the hole injection layer/hole transfer layer 22 uniformly throughout the entire display region of the TFT substrate 10 as to cover the luminous layers 23R, 23G, and 23B and the hole injection layer/hole transfer layer 22. The electron injection layer 25 is so provided on the electron transfer layer 24 uniformly throughout the entire display region of the TFT substrate 10 as to cover the electron transfer layer 24.

The electron transfer layer 24 and the electron injection layer 25 may be provided either (i) as separate layers independent of each other as described above or (ii) integrally with each other. In other words, the organic EL display device 1 may include an electron transfer layer/electron injection layer instead of the electron transfer layer 24 and the electron injection layer 25.

The second electrode 26 is a layer having the function of injecting electrons into the organic EL layer including the above organic layers. The second electrode 26 is so provided on the electron injection layer 25 uniformly throughout the entire display region of the TFT substrate 10 as to cover the electron injection layer 25.

The organic layers other than the luminous layers 23R, 23G, and 23B are not essential for the organic EL layer, and may thus be included as appropriate in accordance with a required property of the organic EL element 20. The organic EL layer may further include a carrier blocking layer according to need. The organic EL layer can, for example, additionally include, as a carrier blocking layer, a hole blocking layer between the luminous layers 23R, 23G, and 23B and the electron transfer layer 24 to prevent positive holes from transferring from the luminous layers 23R, 23G, and 23B to the electron transfer layer 24 and thus to improve luminous efficiency.

The organic EL element 20 can have, for example, any of the layered structures (1) through (8) below.

(1) first electrode/luminous layer/second electrode
(2) first electrode/hole transfer layer/luminous layer/electron transfer layer/second electrode
(3) first electrode/hole transfer layer/luminous layer/hole blocking layer/electron transfer layer/second electrode
(4) first electrode/hole transfer layer/luminous layer/hole blocking layer/electron transfer layer/electron injection layer/second electrode
(5) first electrode/hole injection layer/hole transfer layer/luminous layer/electron transfer layer/electron injection layer/second electrode
(6) first electrode/hole injection layer/hole transfer layer/luminous layer/hole blocking layer/electron transfer layer/second electrode
(7) first electrode/hole injection layer/hole transfer layer/luminous layer/hole blocking layer/electron transfer layer/electron injection layer/second electrode
(8) first electrode/hole injection layer/hole transfer layer/electron blocking layer (carrier blocking layer)/luminous layer/hole blocking layer/electron transfer layer/electron injection layer/second electrode As described above, the hole injection layer and the hole transfer layer, for example, may be integrated with each other. The electron transfer layer and the electron injection layer may be integrated with each other.

The structure of the organic EL element 20 is not limited to the above example layered structure, and may be a desired layered structure according to a required property of the organic EL element 20 as described above.

The description below deals with a method for producing the organic EL display device 1.

Figure 9:
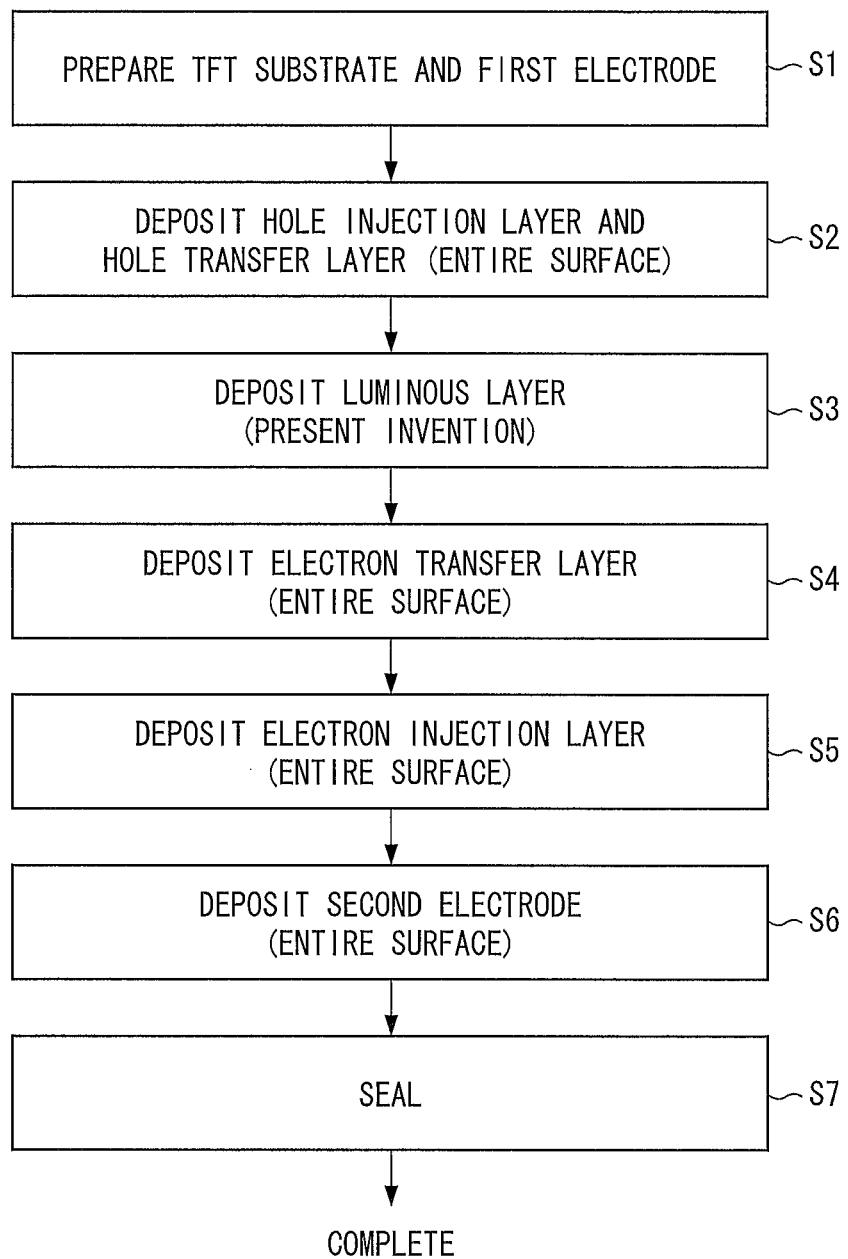
FIG. 9 is a flowchart indicating successive steps for producing the organic EL display device according to a Embodiment 1 of the present invention.

FIG. 9 is a flowchart indicating successive steps for producing the organic EL display device 1.

As illustrated in FIG. 9, the method of the present embodiment for producing the organic EL display device 1 includes steps such as a TFT substrate/first electrode preparing step (S1), a hole injection layer/hole transfer layer vapor deposition step (S2), a luminous layer vapor deposition step (S3), an electron transfer layer vapor deposition step (S4), an electron injection layer vapor deposition step (S5), a second electrode vapor deposition step (S6), and a sealing step (S7).

The following describes, with reference to the flowchart illustrated in FIG. 9, the individual steps described above with reference to FIGS. 6 and 8.

Note, however, that the dimensions, materials, shapes and the like of the respective constituent elements described in the present embodiment merely serve as an embodiment, and that the scope of the present invention should not be construed limitedly on the grounds of such aspects of the constituent elements.

The stack order described in the present embodiment, as mentioned above, intends to use (i) the first electrode 21 as an anode and (ii) the second electrode 26 as a cathode. In the converse case where the first electrode 21 serves as a cathode and the second electrode 26 serves as an anode, the stack order of the organic EL layer is reversed, and the respective materials of the first electrode 21 and the second electrode 26 are switched similarly.

First, as illustrated in FIG. 8, the method of the present embodiment (i) applies a photosensitive resin onto an insulating substrate 11 that is made of a material such as glass and that includes, for example, TFTs 12 and wires 14 each formed by a publicly known technique, and (ii) carries out patterning with respect to the photosensitive resin by photolithography. This forms an interlayer film 13 on the insulating substrate 11.

The insulating substrate 11 is, for example, a glass or plastic substrate having (i) a thickness of 0.7 to 1.1 mm, (ii) a length (longitudinal length) of 400 to 500 mm along a y axis direction, and (iii) a length (lateral length) of 300 to 400 mm along an x axis direction. The insulating substrate 11 of the present embodiment was a glass substrate.

The interlayer film 13 can be made of, for example, an acrylic resin or a polyimide resin. The acrylic resin is, for example, a product in the Optomer series available from JSR Corporation. The polyimide resin is, for example, a product in the Photoneece series available from Toray Industries, Inc. Note that since a typical polyimide resin is not transparent but colored, the interlayer film 13 is more suitably made of a transparency resin such as an acrylic resin in the case where an organic EL display device of the bottom emission type is produced as the organic EL display device 1 as illustrated in FIG. 8.

The interlayer film 13 is simply required to have a film thickness that can compensate for the difference in level created by the TFTs 12. The film thickness is thus not particularly limited. The film thickness was, for example, approximately 2 μm in the present embodiment.

The method of the present embodiment next forms, in the interlayer film 13, contact holes 13a for electrically connecting the first electrode 21 to the TFTs 12.

The method then forms, as a conductive film (electrode film), a film such as an ITO (indium tin oxide) film by a method such as a sputtering method so that the film has a thickness of 100 nm.

The method next applies a photoresist onto the ITO film, carries out patterning with respect to the photoresist by photolithography, and then carries out etching with respect to the ITO film with use of ferric chloride as an etchant. The method then strips the photoresist with use of a resist stripping solution, and further washes the substrate. This forms, on the interlayer film 13, a first electrode 21 in a matrix.

The conductive film material for the first electrode 21 is, for example, (i) a transparent conductive material such as ITO, IZO (indium zinc oxide), and gallium-added zinc oxide (GZO) or (ii) a metal material such as gold (Au), nickel (Ni), and platinum (Pt).

The above conductive film can be formed by, instead of the sputtering method, a method such as a vacuum vapor deposition method, a chemical vapor deposition (CVD) method, a plasma CVD method, and a printing method.

The thickness of the first electrode 21 is not particularly limited. The first electrode 21 can have a thickness of, for example, 100 nm as mentioned above.

The method next forms a pattern of an edge cover 15, as with the interlayer film 13, to have a film thickness of, for example, approximately 1 μm. The edge cover 15 can be made of an insulating material similar to that for the interlayer film 13.

The step described above prepares the TFT substrate 10 and the first electrode 21 (S1).

The method of the present embodiment next carries out, with respect to the TFT substrate 10 prepared through the above step, (i) a bake under a reduced pressure for dehydration and (ii) an oxygen plasma treatment for surface washing of the first electrode 21.

The method then carries out vapor deposition of a hole injection layer and a hole transfer layer (in the present embodiment, a hole injection layer/hole transfer layer 22) on the TFT substrate 10 throughout its entire display region with use of a conventional vapor deposition device (S2).

Specifically, the method (i) carries out an alignment adjustment, relative to the TFT substrate 10, of an open mask having an opening corresponding to the entire display region and (ii) closely attaches the open mask to the TFT substrate 10. The method then, while rotating the TFT substrate 10 and the open mask together, carries out, through the opening of the open mask and uniformly throughout the entire display region, vapor deposition of vapor deposition particles scattered from a vapor deposition source.

The above vapor deposition carried out throughout the entire display region refers to vapor deposition carried out unintermittently over sub-pixels having different colors and located adjacent to one another.

The hole injection layer and the hole transfer layer are each made of a material such as (i) benzine, styryl amine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or a derivative of any of the above, (ii) a polysilane compound, (iii) a vinylcarbazole compound, (iv) and a monomer, an oligomer, or a polymer of a heterocyclic conjugated system, such as a thiophene compound and an aniline compound.

The hole injection layer and the hole transfer layer may be either integrated with each other as described above or formed as separate layers independent of each other. The hole injection layer and the hole transfer layer each have a film thickness of, for example, 10 to 100 nm.

The present embodiment used, as the hole injection layer and the hole transfer layer, a hole injection layer/hole transfer layer 22 that was made of 4,4'-bis[N-(1-naphthyl)-N-phenylamino]biphenyl(α-NPD) and that had a film thickness of 30 nm.

The method of the present embodiment next carries out a discriminative application formation (pattern formation) of luminous layers 23R, 23G, and 23B on the hole injection layer/hole transfer layer 22 in correspondence with respective sub-pixels 2R, 2G, and 2B so that the luminous layers 23R, 23G, and 23B cover respective openings 15R, 15G, and 15B of the edge cover 15 (S3).

As described above, the luminous layers 23R, 23G, and 23B are each made of a material with high luminous efficiency, such as a low-molecular fluorescent dye and a metal complex.

The luminous layers 23R, 23G, and 23B are each made of a material such as (i) anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or a derivative of any of the above, (ii) a tris(8-hydroxyquinolinate) aluminum complex, (iii) a bis(benzohydroxyquinolinate) beryllium complex, (iv) a tri(dibenzoylmethyl)phenanthroline europium complex, (v) and ditoluoyl vinyl biphenyl.

The luminous layers 23R, 23G, and 23B each have a film thickness of, for example, 10 to 100 nm.

The vapor deposition method and the vapor deposition device of the present embodiment are each particularly suitably used for a discriminative application formation (pattern formation) of such luminous layers 23R, 23G, and 23B.

A description below deals in detail with a discriminative application formation of the luminous layers 23R, 23G, and 23B which discriminative application formation involves the vapor deposition method and the vapor deposition device of the present embodiment.

The method of the present embodiment next carries out, in a manner similar to that described for the above hole injection layer/hole transfer layer vapor deposition step (S2), vapor deposition of an electron transfer layer 24 throughout the entire display region of the TFT substrate 10 so that the electron transfer layer 24 covers the hole injection layer/hole transfer layer 22 and the luminous layers 23R, 23G, and 23B (S4).

The method then carries out, in a manner similar to that described for the above hole injection layer/hole transfer layer vapor deposition step (S2), vapor deposition of an electron injection layer 25 throughout the entire display region of the TFT substrate 10 so that the electron injection layer 25 covers the electron transfer layer 24 (S5).

The electron transfer layer 24 and the electron injection layer 25 are each made of a material such as (i) quinoline, perylene, phenanthroline, bisstyryl, pyrazine, triazole, oxazole, oxadiazole, fluorenone, or a derivative or metal complex of any of the above, and (ii) LiF (lithium fluoride).

Specific examples of the material include (i) Alq(tris(8-hydroxy quinoline)aluminum), anthracene, naphthalene, phenanthrene, pyrene, anthracene, perylene, butadiene, coumarin, acridine, stilbene, 1,10-phenanthroline, and a derivative or metal complex of any of the above, and (ii) LiF.

As mentioned above, the electron transfer layer 24 and the electron injection layer 25 may be either integrated with each other or formed as separate layers independent of each other. The electron transfer layer 24 and the electron injection layer 25 each have a film thickness of, for example, 1 to 100 nm, or preferably have a film thickness of 10 to 100 nm. The respective film thicknesses of the electron transfer layer 24 and the electron injection layer 25 add up to, for example, 20 to 200 nm.

In the present embodiment, (i) the electron transfer layer 24 was made of Alq, whereas the electron injection layer 25 was made of LiF, and (ii) the electron transfer layer 24 had a film thickness of 30 nm, whereas the electron injection layer 25 had a film thickness of 1 nm.

The method of the present embodiment next carries out, in a manner similar to that described for the above hole injection layer/hole transfer layer vapor deposition step (S2), vapor deposition of a second electrode 26 throughout the entire display region of the TFT substrate 10 so that the second electrode 26 covers the electron injection layer 25 (S6).

The second electrode 26 is suitably made of a material (electrode material) such as a metal with a small work function. Examples of such an electrode material include a magnesium alloy (for example, MgAg), an aluminum alloy (for example, AlLi, AlCa, or AlMg) and calcium metal. The second electrode 26 has a thickness of, for example, 50 to 100 nm.

In the present embodiment, the second electrode 26 was made of aluminum and has a film thickness of 50 nm. The operation described above forms, on the TFT substrate 10, an organic EL element 20 including the organic EL layer, the first electrode 21, and the second electrode 26 described above.

The method of the present embodiment then attached (i) the TFT substrate 10, on which the organic EL element 20 is provided, to (ii) a sealing substrate 40 with use of an adhesive layer 30 as illustrated in FIG. 6 so that the organic EL element 20 was contained.

The sealing substrate 40 is, for example, an insulating substrate such as a glass substrate and a plastic substrate and 0.4 to 1.1 mm in thickness. The sealing substrate 40 of the present embodiment was a glass substrate.

The longitudinal and lateral lengths of the sealing substrate 40 may each be adjusted as appropriate in accordance with the size of a target organic EL display device 1. The sealing substrate 40 may be an insulating substrate substantially equal in size to the insulating substrate 11 of the TFT substrate 10, in which case a combination of the sealing substrate 40, the TFT substrate 10, and the organic EL element 20 contained therebetween is divided in accordance with the size of a target organic EL display device 1.

The method for containing the organic EL element 20 is not limited to the method described above. Examples of other containing methods include (i) a method that uses a centrally depressed glass substrate as the sealing substrate 40 and that the combination of the sealing substrate 40 and the TFT substrate 10 is sealed along the edge in a frame shape with use of, for example, a sealing resin or fritted glass, and (ii) a method that fills a space between the TFT substrate 10 and the sealing substrate 40 with a resin. The method for producing the organic EL display device 1 does not depend on the above containing method, and can employ any of various containing methods.

The second electrode 26 may be provided thereon with a protective film (not shown) that covers the second electrode 26 and that prevents infiltration of oxygen, moisture and the like present outside into the organic EL element 20.

The protective film is made of an electrically insulating or conductive material such as silicon nitride and silicon oxide. The protective film has a thickness of, for example, 100 to 1000 nm.

Through the above steps, the organic EL display device 1 is finally produced.

The organic EL display device 1, upon receipt of a signal through a wire 14, turns on a TFT 12 and thus allows (i) holes (positive holes) to be injected from the first electrode 21 into the organic EL layer and further (ii) electrons to be injected from the second electrode 26 into the organic EL layer. This causes the positive holes and the electrons to recombine with each other inside the luminous layers 23R, 23G, and 23B. The positive holes and the electrons thus recombined are emitted in the form of light when becoming inactive.

In the above organic EL display device 1, controlling respective light emission luminances of the sub-pixels 2R, 2G, and 2B allows a predetermined image to be displayed.

The following describes an arrangement of a vapor deposition device of the present embodiment.

Figure 2:
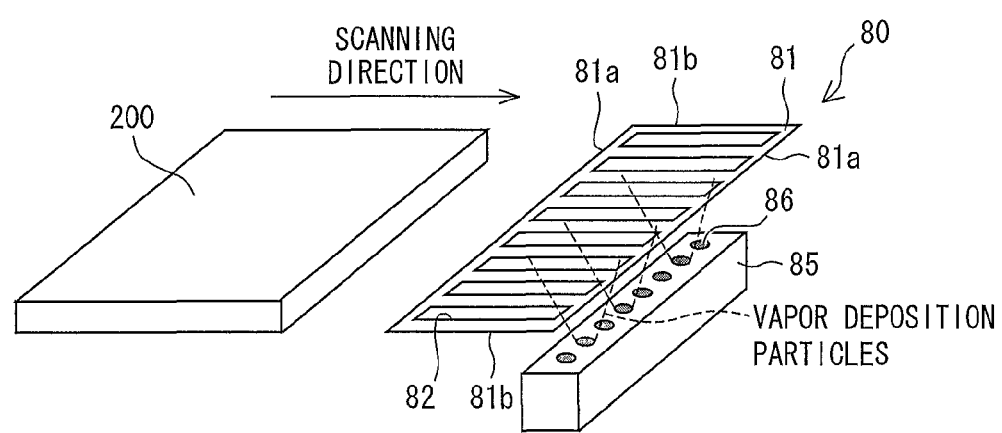
FIG. 2 is a bird's eye view illustrating main constituent elements inside the vacuum chamber of the vapor deposition device according to Embodiment 1 of the present invention.
Figure 3:
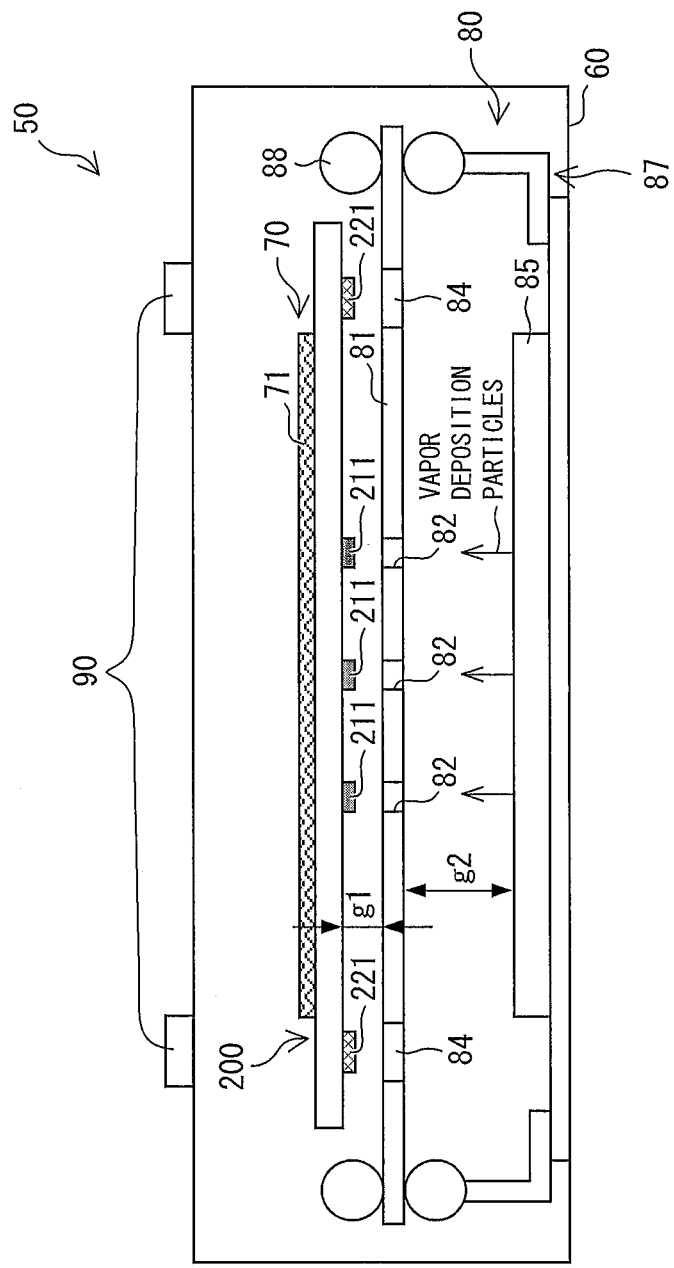
FIG. 3 is a cross-sectional view schematically illustrating a configuration of a main part of the vapor deposition device according to Embodiment 1 of the present invention.
Figure 4:
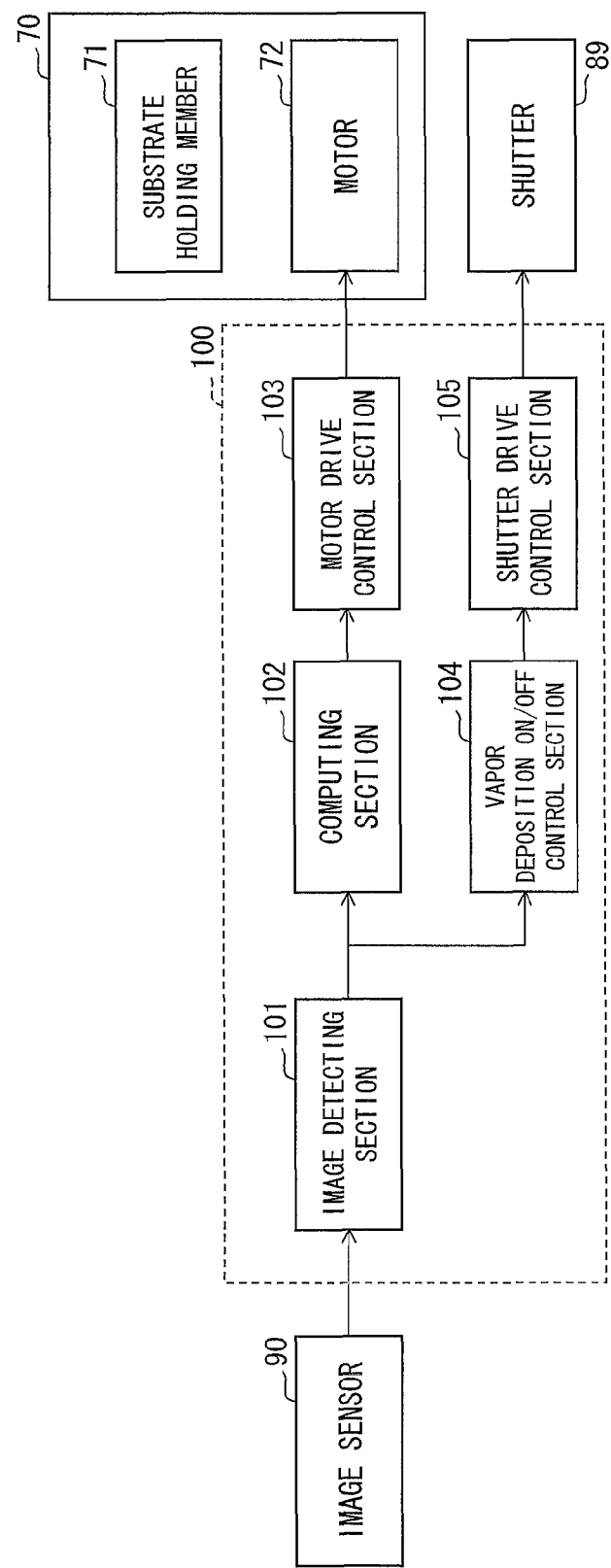
FIG. 4 is a block diagram partially illustrating a configuration of the vapor deposition device according to Embodiment 1 of the present invention.

FIG. 1 is a plan view of a film formation substrate (vapor deposition substrate) and a mask unit both inside a vacuum chamber of the vapor deposition device of the present embodiment, the plan view being taken from a back surface side of the film formation substrate (that is, the side opposite to the vapor deposition surface). For convenience of illustration, FIG. 1 uses a chain double-dashed line to represent the film formation substrate. FIG. 2 is a bird's eye view of main constituent elements inside the vacuum chamber of the vapor deposition device of the present embodiment. FIG. 3 is a cross-sectional view schematically illustrating a configuration of a main part of the vapor deposition device of the present embodiment. FIG. 3 illustrates a cross section of the vapor deposition device, the cross section being taken along line B-B of FIG. 1. For convenience of illustration, FIG. 3 partially omits an arrangement such as openings of a vapor deposition mask (shadow mask) and a vapor deposition film. FIG. 4 is a block diagram illustrating a part of a configuration of the vapor deposition device of the present embodiment.

The vapor deposition device 50 of the present embodiment, as illustrated in FIG. 3, includes: a vacuum chamber 60 (film growing chamber); a substrate moving mechanism 70 (substrate moving means; moving means; adjusting means); a mask unit 80; image sensors 90 (first image sensors; alignment observing means); and a control circuit 100 (see FIG. 4).

As illustrated in FIG. 3, the vacuum chamber 60 contains the substrate moving mechanism 70 and the mask unit 80.

The vacuum chamber 60 is provided with a vacuum pump (not shown) for vacuum-pumping the vacuum chamber 60 via an exhaust port (not shown) of the vacuum chamber 60 to keep a vacuum in the vacuum chamber 60 during vapor deposition.

The substrate moving mechanism 70 includes, for example: a substrate holding member 71 (substrate holding means) for holding a film formation substrate 200 (for example, a TFT substrate 10); and a motor 72 (see FIG. 4).

The substrate moving mechanism 70 causes (i) the substrate holding member 71 to hold the film formation substrate 200 and (ii) a below-described motor drive control section 103 (see FIG. 4) to drive the motor 72 so as to hold the film formation substrate 200 and move it in the horizontal direction. The substrate moving mechanism 70 may be provided to be capable of moving the film formation substrate 200 either (i) in both the x axis direction and the y axis direction or (ii) in one of the x axis direction and the y axis direction.

The substrate holding member 71 is an electrostatic chuck. The film formation substrate 200 is, in a state in which bend due to its own weight is absent, so held by the electrostatic chuck as to be separated from a below-described shadow mask 81 of the mask unit 80 by a fixed gap g1 (void; vertical distance).

The gap g1 between the film formation substrate 200 and the shadow mask 81 preferably falls within the range of not less than 50 μm and not more than 1 mm, or is more preferably on the order of 200 μm.

If the gap g1 is smaller than 50 μm, the film formation substrate 200 will likely be come into contact with the shadow mask 81.

If the gap g1 is larger than 1 mm, vapor deposition particles that have passed through openings 82 of the shadow mask 81 are spread widely, which results in a vapor deposition film 211 being formed to have too large a pattern width. In the case where, for example, the vapor deposition film 211 is the luminous layer 23R, the gap g1 being larger than 1 mm may undesirably result in vapor deposition of the material of the luminous layer 23R through the respective openings 15G and 15B of the adjacent sub-pixels 2G and 2B.

With the gap g1 being approximately 200 μm, (i) there is no risk of the film formation substrate 200 coming into contact with the shadow mask 81, and (ii) the vapor deposition film 211 can have a sufficiently small pattern width.

The mask unit 80, as illustrated in FIG. 3, includes: a shadow mask 81 (vapor deposition mask; mask); a vapor deposition source 85; a mask holding member 87 (holding means; supporting member); a mask tension mechanism 88 (tension mechanism; adjusting means); and a shutter 89 (see FIG. 4).

The shadow mask 81 is, for example, a metal mask.

The shadow mask 81 is so formed as to (i) be smaller in area (size) than a vapor deposition region 210 of the film formation substrate 200 and (ii) have at least one side that is shorter than the width of the vapor deposition region 210 of the film formation substrate 200.

The shadow mask 81 of the present embodiment has a rectangular shape (that is, in the shape of a belt), and is sized as follows: The shadow mask 81 is, as illustrated in FIG. 1, so formed as to have (i) long sides 81a each with a width d1 (that is, the length along the long-side direction [long-axis direction] of the shadow mask 81) that is larger than the width d3 of a side of the vapor deposition region 210 (in the example illustrated in FIG. 1, a long side 210a of the vapor deposition region 210) which side faces the long sides 81a of the shadow mask 81 and (ii) short sides 81b each with a width d2 (that is, the length along the short-side direction [short-axis direction] of the shadow mask 81) that is smaller than the width d4 of a side of the vapor deposition region 210 (in the example illustrated in FIG. 1, a short side 210b of the vapor deposition region 210) which side faces the short sides 81b of the shadow mask 81.

The shadow mask 81, as illustrated in FIGS. 1 and 2, has a plurality of openings 82 (through holes) arranged in a one-dimensional direction and each having the shape of, for example, a belt (that is, in a stripe shape). In the case where, for example, a discriminative application formation of the luminous layers 23R, 23G, and 23B is carried out with respect to the TFT substrate 10 as a pattern formation of vapor deposition films 211 (see FIG. 3) on the film formation substrate 200, the openings 82 are formed in correspondence with the size and pitch of columns for each color of the luminous layers 23R, 23G, and 23B.

The shadow mask 81, as illustrated in FIG. 1, includes, for example, alignment marker sections 83 extending along a scanning direction (substrate scanning direction) of the film formation substrate 200. The alignment marker sections 83 include respective alignment markers 84 (see FIG. 3) for use in an alignment between the film formation substrate 200 and the shadow mask 81.

The alignment marker sections 83 of the present embodiment are, as illustrated in FIG. 1, provided along the short sides 81b (short axis) of the shadow mask 81.

The shadow mask 81, as described above, has (i) long sides 81a each with a width d1 that is larger than the width d3 of a side of the vapor deposition region 210 which side faces the long sides 81a and (ii) short sides 81b each with a width d2 that is smaller than the width d4 of a side of the vapor deposition region 210 which side faces the short sides 81b. This arrangement allows the alignment marker sections 83 to be formed respectively in opposite end sections arranged along the long-side direction (that is, at the opposite short sides 81b and 81b). The above arrangement thus makes it possible to carry out an alignment easily and more precisely.

The film formation substrate 200, as illustrated in FIG. 1, includes alignment marker sections 220 outside the vapor deposition region 210 and along the scanning direction (substrate scanning direction) of the film formation substrate 200. The alignment marker sections 220 include respective alignment markers 221 (see FIG. 3) for use in an alignment between the film formation substrate 200 and the shadow mask 81.

The alignment marker sections 220 of the present embodiment are, as illustrated in FIG. 1, provided along the respective short sides 210b (short axis) of the vapor deposition region 210 of the film formation substrate 200.

The stripe-shaped openings 82 of the present embodiment are provided to (i) extend along the short side direction of the shadow mask 81, that is, the substrate scanning direction, and to (ii) be arranged next to one another along the long side direction of the shadow mask 81, that is, a direction that orthogonally crosses the substrate scanning direction.

The vapor deposition source 85 is, for example, a container that contains a vapor deposition material. The vapor deposition source 85 is, as illustrated in FIG. 3, (i) placed to face the shadow mask 81 and (ii) separated from the shadow mask 81 by a fixed gap g2 (void), that is, positioned away from the shadow mask 81 by a fixed distance.

The vapor deposition source 85 may be a container that itself contains a vapor deposition material or a container that includes a load-lock pipe.

The vapor deposition source 85 includes, for example, a mechanism for emitting vapor deposition particles upward.

As illustrated in FIGS. 1 and 2, the vapor deposition source 85 has, on a surface facing the shadow mask 81, a plurality of emission holes 86 for emitting (scattering) the vapor deposition material in the form of vapor deposition particles.

The present embodiment is arranged as described above such that (i) the vapor deposition source 85 is provided below the film formation substrate 200 and that (ii) the film formation substrate 200 is held by the substrate holding member 71 in such a state that the vapor deposition region 210 faces downward. Thus, in the present embodiment, the vapor deposition source 85 carries out vapor deposition of vapor deposition particles through the openings 82 of the shadow mask 81 onto the film formation substrate 200 upward from below (that is, up deposition; hereinafter referred to as "depo-up").

The emission holes 86 are, as illustrated in FIGS. 1 and 2, provided to face the respective openings 82 of the shadow mask 81 so as to be open in respective opening regions of the shadow mask 81. The emission holes 86 of the present embodiment are arranged one-dimensionally (i) along the direction in which the openings 82 of the shadow mask 81 are arranged next to one another and (ii) so as to face the respective openings 82 of the shadow mask 81.

Thus, as illustrated in FIGS. 1 and 2, the vapor deposition source 85 is formed to have a surface that faces the shadow mask 81, the surface (that is, the surface in which the emission holes 86 are provided) having, for example, a rectangular shape (belt shape) as viewed from the back surface side of the film formation substrate 200 (that is, in a plan view) so as to match the rectangular shape (belt shape) of the shadow mask 81.

In the mask unit 80, the shadow mask 81 and the vapor deposition source 85 are fixed in position relative to each other. Specifically, there is constantly a fixed gap g2 (see FIG. 3) between (i) the shadow mask 81 and (ii) the surface of the vapor deposition source 85 in which surface the emission holes 86 are provided, and there is constantly a fixed positional relationship between (i) the openings 82 of the shadow mask 81 and (ii) the emission holes 86 of the vapor deposition source 85.

The emission holes 86 of the vapor deposition source 85 are each so placed as to coincide with the center of a corresponding opening 82 of the shadow mask 81 when the mask unit 80 is viewed from the back surface side of the film formation substrate 200 (that is, in a plan view).

The shadow mask 81 and the vapor deposition source 85 are, for example, attached to the mask holding member 87 (for example, an identical holder) for holding and fixing (i) the shadow mask 81 via the mask tension mechanism 88 and (ii) the vapor deposition source 85 (see FIG. 3). The shadow mask 81 and the vapor deposition source 85 are thus so integrated with each other as to be held and fixed in the respective positions relative to each other.

The shadow mask 81 is under tension caused by the mask tension mechanism 88. The shadow mask 81 is thus adjusted as appropriate so that no bend or elongation due to its own weight is caused.

The vapor deposition device 50 is arranged as described above such that (i) the film formation substrate 200 is adhered to a fixing plate by the substrate holding member 71 (electrostatic chuck), and is thus prevented from being bent due to its own weight and (ii) the shadow mask 81 is under tension caused by the mask tension mechanism 88 so that the distance between the film formation substrate 200 and the shadow mask 81 is uniformly maintained throughout the entire region by which the film formation substrate 200 overlaps the shadow mask 81 in a plan view.

The shutter 89 is used according to need in order to control reaching of vapor deposition particles to the shadow mask 81. The shutter 89 is either closed or opened by a shutter drive control section 105 (see FIG. 4) in accordance with a vapor deposition OFF signal or vapor deposition ON signal from a vapor deposition ON/OFF control section 104 (see FIG. 4) described below.

The shutter 89 is, for example, provided to be capable of moving in a space between the shadow mask 81 and the vapor deposition source 85 (that is, capable of being inserted between them). The shutter 89 is inserted between the shadow mask 81 and the vapor deposition source 85 to close the openings 82 of the shadow mask 81. Appropriately inserting the shutter 89 between the shadow mask 81 and the vapor deposition source 85 can prevent vapor deposition on a portion for which vapor deposition is unnecessary (that is, a non vapor deposition region).

The vapor deposition device 50 is so adjusted that vapor deposition particles from the vapor deposition source 85 are scattered below the shadow mask 81. The vapor deposition device 50 may be arranged such that vapor deposition particles scattered beyond the shadow mask 81 are blocked as appropriate by, for example, a deposition preventing plate (shielding plate).

The vacuum chamber 60 is provided with, for example, image sensors 90 (see FIG. 4) each (i) attached to an outer surface of the vacuum chamber 60, (ii) including a CCD, and (iii) serving as image sensing means (image reading means). The vacuum chamber 60 is further provided with a control circuit 100 (i) attached to the outer surface of the vacuum chamber 60, (ii) connected to the image sensors 90, and (iii) serving as control means.

The image sensors 90 each function as position detecting means for use in an alignment of the film formation substrate 200 and the shadow mask 81.

The control circuit 100, as illustrated in FIG. 4, includes: an image detecting section 101; a computing section 102; a motor drive control section 103; a vapor deposition ON/OFF control section 104; and a shutter drive control section 105.

As described above, the film formation substrate 200 includes, as illustrated in FIG. 1, alignment marker sections 220 provided (i) outside the vapor deposition region 210 and (ii) along, for example, the substrate scanning direction, the alignment marker sections 220 each including an alignment marker 221.

The image detecting section 101 detects, on the basis of an image captured by the image sensors 90, respective images of (i) the alignment markers 221 included in the film formation substrate 200 and (ii) the alignment markers 84 of the shadow mask 81. The image detecting section 101 further detects the start-end and rear-end of the vapor deposition region 210 of the film formation substrate 200 on the basis of, among the alignment markers 221 included in the film formation substrate 200, (i) a start-end marker indicative of the start-end of the vapor deposition region 210 and (ii) a rear-end marker indicative of the rear-end of the vapor deposition region 210.

The start-end marker and the rear-end marker mentioned above may be identical to each other. In this case, the image detecting section 101 detects, with respect to the substrate scanning direction, whether a particular end of the vapor deposition region 210 is its start-end or rear-end.

The computing section 102 determines, from the image detected by the image detecting section 101, the amount of movement of the film formation substrate 200 and the shadow mask 81 relative to each other (for example, the amount of movement of the film formation substrate 200 relative to the shadow mask 81). The computing section 102, for example, measures the amount of positional difference (that is, a shift component along the x axis direction and the y axis direction, and a rotation component on the x-y plane) between the alignment markers 221 and the alignment markers 84 to determine a correction value for a substrate position of the film formation substrate 200 by computation. In other words, the computing section 102 determines the correction value by computation with respect to the direction perpendicular to the substrate scanning direction and a rotation direction of the film formation substrate 200.

The rotation direction of the film formation substrate refers to a direction of rotation on the x-y plane about a z axis, as a rotation axis, at the center of a film formation surface of the film formation substrate 200.

The correction value is outputted in the form of a correction signal to the motor drive control section 103. The motor drive control section 103, on the basis of the correction signal from the computing section 102, drives the motor 72 connected to the substrate holding member 71 and thus corrects the substrate position of the film formation substrate 200.

How the substrate position is corrected with use of the alignment markers 84 and 221 is described below together with example shapes of the alignment markers 84 and 221.

The motor drive control section 103 drives the motor 72 to move the film formation substrate 200 in the horizontal direction as mentioned above.

The vapor deposition ON/OFF control section 104 generates (i) a vapor deposition OFF signal when the image detecting section 101 detects the rear-end of the vapor deposition region 210 and (ii) a vapor deposition ON signal when the image detecting section 101 detects the start-end of the vapor deposition region 210.

The shutter drive control section 105 (i) closes the shutter 89 upon receipt of a vapor deposition OFF signal from the vapor deposition ON/OFF control section 104 and (ii) opens the shutter 89 upon receipt of a vapor deposition ON signal from the vapor deposition ON/OFF control section 104.

The following describes (i) how the substrate position is corrected with use of the alignment markers 84 and 221 and (ii) example shapes of the alignment markers 84 and 221.

(a) through (d) of FIG. 5 illustrate example shapes of the alignment markers 84 and 221. (b) through (d) of FIG. 5 each illustrate only two of the juxtaposed alignment markers 84 and of the juxtaposed alignment markers 221 for convenience of illustration.

The alignment markers 84 are each, for example, an opening formed in an alignment marker section 83 of the shadow mask 81. The opening can also be a notch section.

The alignment markers 221 are not particularly limited in terms of material, and can be made of a material identical to an electrode material used in, for example, the TFT substrate 10. Thus, the alignment markers 221 can be (i) formed during an electrode forming step for forming, for example, gate electrodes, source electrodes, and drain electrodes of the film formation substrate 200 such as the TFT substrate 10 and (ii) made of the material of which the above electrodes are made.

The computing section 102, on the basis of an image of the alignment markers 84 and 221, the image having been detected by the image detecting section 101, measures (determines) (i) a distance r between respective ends (outer edges) of each alignment marker 84 and its corresponding alignment marker 221 along the x axis direction and (ii) a distance q between respective ends (outer edges) of each alignment marker 84 and its corresponding alignment marker 221 along the y axis direction. The computing section 102 thus determines the amount of positional difference in alignment to compute a correction value for a substrate position.

In the case where, for example, the substrate scanning direction is the x axis direction, the sign "r" in (a) through (c) of FIG. 5 indicates a distance between the respective ends along the substrate scanning direction, whereas the sign "q" in (a) through (c) of FIG. 5 indicates a distance between the respective ends along the direction perpendicular to the substrate scanning direction. The computing section 102 measures (determines) the distances r and q at, for example, opposite ends of the vapor deposition region 210 of the film formation substrate 200 to determine the amount of shift caused in alignment during a substrate scan.

Including a plurality of alignment markers 84 in the shadow mask 81 as described above allows the shadow mask 81 and the film formation substrate 200 to be aligned with each other along the horizontal direction as well.

In the case where the film formation substrate 200 is moved in only one coordinate axis direction (for example, the x axis direction) as described above, the alignment markers 84 and 221 are not particularly limited in terms of size (which is larger or smaller) along the substrate scanning direction.

In the case where the substrate scanning direction corresponds to, for example, only the x axis direction as described above as illustrated in (d) of FIG. 5, it is not necessary to measure a distance r in a region of the film formation substrate 200 which region is other than ends of the film formation substrate 200. In this case, measuring a distance q at, for example, opposite ends of the vapor deposition region 210 of the film formation substrate 200 makes it possible to detect mispositioning of the film formation substrate 200. On the basis of the value of this distance q, it is possible to correct a substrate position of the film formation substrate 200.

Thus, the above case may involve, as illustrated in (d) of FIG. 5, alignment markers 84 and 221 that are (i) provided in a region of the film formation substrate 200 which region is other than ends of the film formation substrate 200 and (ii) shaped such that the alignment markers 84 and 221 illustrated in (a) of FIG. 5 are each divided into a plurality of segments along the x axis direction.

The present embodiment describes an example case that involves simultaneously scanning the film formation substrate 200 and carrying out an alignment between the shadow mask 81 and the film formation substrate 200 as described below. The present embodiment is, however, not limited to such an arrangement. The present embodiment can alternatively be arranged such that a sufficient alignment is carried out before a substrate scan and that no alignment is carried out during a substrate scan.

The present embodiment can be arranged as in an embodiment described below such that, for example, the film formation substrate 200 is moved along a first side of the vapor deposition region 210 of the film formation substrate 200 (for example, along the y axis direction in (a) through (c) of FIG. 5), and is then moved along a second side (for example, the x axis direction in (a) through (c) of FIG. 5) orthogonal to the first side. In this case, the sign "r" in (a) through (c) of FIG. 5 indicates a distance between the respective ends along the direction perpendicular to the substrate scanning direction, whereas the sign "q" in (a) through (c) of FIG. 5 indicates a distance between the respective ends along the direction (shift direction) in which the film formation substrate 200 is moved.

In this case, the computing section 102 measures distances r and q for alignment markers located at the four corners, and thus determines (i) the amount of positional difference present in alignment at the start of a substrate scan and (ii) the amount of positional difference present in alignment after the film formation substrate 200 is moved (shifted).

The alignment markers 84 and 221 may each be, as illustrated in (a) through (d) of FIG. 5, in the shape of, for example, (i) a belt, (ii) a quadrangle such as a square, (iii) a frame, or (iv) a cross. The alignment markers 84 and 221 are thus not particularly limited in terms of shape.

In the case where a sufficient alignment is carried out before a substrate scan and no alignment is carried out during a substrate scan as described above, the alignment markers 221 do not need to be provided along a side of the vapor deposition region 210 of the film formation substrate 200, and may instead be provided at, for example, the four corners of the film formation substrate 200.

The substrate position is desirably corrected with use of the alignment markers 84 and 221 before the film formation substrate 200 enters a region (vapor deposition area) in which vapor deposition particles from the vapor deposition source 85 are deposited.

Thus, the alignment markers 221 (that is, the alignment marker sections 220) of the film formation substrate 200 are preferably provided at such a position that an alignment marker 221 is located away, upstream in the scanning direction, from the region (vapor deposition area) in which vapor deposition particles from the vapor deposition source 85 are deposited.

Thus, the alignment markers 221 (that is, the alignment marker sections 220) are preferably provided, as illustrated in FIG. 1, such that (i) an alignment marker 221 is located away, upstream in the substrate scanning direction, from the region for vapor deposition (that is, the vapor deposition region 210), and that (ii) in a case where reciprocating vapor deposition is carried out, an alignment marker 221 is located away, downstream in the substrate scanning direction, from the vapor deposition region 210. In other words, in the case where reciprocating vapor deposition is carried out, the alignment markers 221 (that is, the alignment marker sections 220) are preferably located away, downstream and upstream in the substrate scanning direction respectively, from respective opposite ends of the vapor deposition region 210 which ends are juxtaposed along the substrate scanning direction (see FIG. 1).

In the case where it is impossible to locate the alignment markers 221 (that is, the alignment marker sections 220) away in the scanning direction from the vapor deposition region 210 for the purpose of securing the vapor deposition region 210, it is possible to locate the alignment markers 84 of the shadow mask 81 outside relative to the openings 82 of the shadow mask 81 by decreasing the opening width of the openings 82 of the shadow mask 81 along the scanning direction (that is, the width d5 along the long-axis direction; see FIG. 1). In other words, the alignment markers 84 of the shadow mask 81 may be provided so that an alignment marker 84 is located away, upstream in the scanning direction, from the openings 82 of the shadow mask 81 with respect to the vapor deposition region 210 during a scan. This arrangement makes it possible to adjust the shadow mask 81 for an alignment, and thus carry out an alignment between the alignment markers 84 and the alignment markers 221 before vapor deposition is carried out with respect to the film formation substrate 200.

In the case where the alignment markers 84 of the shadow mask 81 each have a width along the substrate scanning direction which width is smaller than the width (that is, the width d2 in the example illustrated in FIG. 1) of the shadow mask 81 along the substrate scanning direction as illustrated in (b) and (c) of FIG. 5, an alignment marker 84 is preferably located, for the same reason as above, at an end of the shadow mask 81 which end is located downstream in the direction in which the substrate makes its entry (that is, an end of the shadow mask 81 which end is located upstream in the substrate scanning direction). In the case where reciprocating vapor deposition is carried out, alignment markers 84 are preferably located at both ends along the substrate scanning direction (that is, at the four corners).

The following describes in detail a method for forming a pattern of an organic EL layer by using, as a device for producing the organic EL display device 1, the above vapor deposition device 50 of the present embodiment.

The description below deals with an example case that, as described above, involves (i) using, as the film formation substrate 200, a TFT substrate 10 obtained after the hole injection layer/hole transfer layer vapor deposition step (S2) is finished and (ii) carrying out, as a pattern formation of an organic EL layer, a discriminative application formation of luminous layers 23R, 23G, and 23B during the luminous layer vapor deposition step (S3).

The present embodiment assumed (i) 100 mm for the gap g2 between the vapor deposition source 85 and the shadow mask 81 (that is, the distance between a surface of the vapor deposition source 85 in which surface the emission holes 86 are provided and the shadow mask 81) and (ii) 200 μm for the distance between the TFT substrate 10 serving as the film formation substrate 200 and the shadow mask 81.

The present embodiment further assumed (i) for a substrate size of the TFT substrate 10, 320 mm along the scanning direction and 400 mm along the direction perpendicular to the scanning direction and (ii) for widths of the vapor deposition region (display region), 260 mm for the width along the scanning direction (that is, the width d4) and 310 mm for the width (that is, the width d3) along the direction perpendicular to the scanning direction.

The present embodiment assumed 360 μm (along the scanning direction)×90 μm (along the direction perpendicular to the scanning direction) for widths of the openings 15R, 15G, and 15B for the respective sub-pixels 2R, 2G, and 2B of the TFT substrate 10. The present embodiment further assumed 480 μm (along the scanning direction)×160 μm (along the direction perpendicular to the scanning direction) for a pitch between the openings 15R, 15G, and 15B. The pitch between the openings 15R, 15G, and 15B (that is, a pitch between pixel openings) refers to a pitch between respective openings 15R, 15G, and 15B for the sub-pixels 2R, 2G, and 2B adjacent to one another, but not to a pitch between sub-pixels of an identical color.

The present embodiment used, as the shadow mask 81, a shadow mask having (i) a length of 600 mm along the width d1 (that is, the width along the direction perpendicular to the scanning direction) along each long side 81a (corresponding to the long-axis direction) and (ii) a length of 200 mm along the width d2 (that is, the width along the scanning direction)

along each short side 81*b* (corresponding to the short-axis direction). The shadow mask 81 had openings 82 (i) each having opening widths of 150 mm (along the width d5 in the long-axis direction; see FIG. 1)×130 μm (along the width d6 in the short-axis direction; see FIG. 1), (ii) having a length of 350 μm along an interval d8 (see FIG. 1) between adjacent openings 82 and 82, and (iii) having a length of 480 μm along a pitch p (see FIG. 1) between respective centers of adjacent openings 82 and 82.

In the present embodiment, the shadow mask 81 preferably has a length of not less than 200 mm for the width d2 (that is, a short side length) along each short side 81*b*. This is due to the reason below.

The vapor deposition rate is preferably not higher than 10 nm/s. If the vapor deposition rate exceeds 10 nm/s, a deposited film (that is, a vapor deposition film) will have a decreased uniformity, thus resulting in a decreased organic EL property.

A vapor deposition film typically has a film thickness of not larger than 100 nm. A film thickness of larger than 100 nm will require application of a high voltage, and consequently increase power consumption of a produced organic EL display device. The above vapor deposition rate and the film thickness of a vapor deposition film allow estimation of a necessary vapor deposition period of 10 seconds.

Due to a limit in processing capability (tact time), a scan rate of 13.3 mm/s or higher is at least necessary in order to, for example, complete vapor deposition with respect to a 2 m-wide glass substrate in 150 seconds. The processing time of 150 seconds is a tact time that allows processing of about 570 glass substrates per day.

Securing the above vapor deposition period of 10 seconds at the above scan rate requires the shadow mask 81 to have openings 82 each having a width of at least 133 mm along the scanning direction.

Assuming that approximately 30 mm is appropriate for the distance (margin width d7; see FIG. 1) from each end of an opening 82 to a corresponding end of the shadow mask 81, the shadow mask 81 requires a length of 133+30+30≈200 mm for the width along the scanning direction.

The shadow mask 81 thus preferably has a short side length (that is, the width d2) of not less than 200 mm. The short side length is, however, not limited to not less than 200 mm if there is a change in the vapor deposition rate, the film thickness of a vapor deposition film, and/or the allowable amount of the tact time.

The present embodiment assumes 30 mm/s for the rate of scanning the TFT substrate 10.

FIG. 10 is a flowchart illustrating an example method for forming a predetermined pattern on the TFT substrate 10 with use of the vapor deposition device 50 of the present embodiment.

The following specifically describes, with reference to the flow illustrated in FIG. 10, a method of FIG. 10 for forming luminous layers 23R, 23G, and 23B with use of the vapor deposition device 50.

The method first, as illustrated in FIG. 3, places (fixes) the shadow mask 81 above the vapor deposition source 85 in the vacuum chamber 60 with use of the mask holding member 87 via the mask tension mechanism 88, and horizontally holds the shadow mask 81 under tension by the mask tension mechanism 88 so that no bending or elongation due to the self weight is caused to the shadow mask 81. During this step, the method simultaneously (i) maintains the distance between the vapor deposition source 85 and the shadow mask 81 with use of the mask holding member 87 and (ii) carries out an alignment with use of the alignment markers 84 of the shadow mask 81 in such a manner that the substrate scanning direction is identical to the long-axis direction of the stripe-shaped openings 82 provided in the shadow mask 81. The above step assembles the mask unit 80 (preparation of a mask unit).

The method next inserts the TFT substrate 10 in the vacuum chamber 60 and, as indicated in FIG. 10, carries out a rough alignment with use of the alignment markers 221 of the TFT substrate 10 as the film formation substrate 200 so that each sub-pixel column of an identical color of the TFT substrate 10 has a direction that is identical to the substrate scanning direction (S11). The method holds the TFT substrate 10 with use of the substrate holding member 71 so that no bending due to the self weight is caused to the TFT substrate 10.

The method then carries out a rough alignment between the TFT substrate 10 and the shadow mask 81 (S12). The method further adjusts the gap g1 (substrate-mask gap) between the TFT substrate 10 and the shadow mask 81 so that the gap is uniform, and places the TFT substrate 10 and the shadow mask 81 so that they face each other. This allows the TFT substrate 10 and the shadow mask 81 to be aligned with each other (S13). The present embodiment adjusted the gap g1 between the TFT substrate 10 and the shadow mask 81 to 200 μm throughout the entire TFT substrate 10.

The method next carried out vapor deposition of materials for the red luminous layer 23R with respect to the TFT substrate 10 while scanning the TFT substrate 10 at 30 mm/s.

The above step carried out a substrate scan in such a manner that the TFT substrate 10 passed through a position above the shadow mask 81. The above step simultaneously carried out the scan and a precise alignment with use of the alignment markers 84 and 221 so that the openings 82 of the shadow mask 81 coincide with red sub-pixel 2R columns (S14).

The luminous layer 23R was made of (i) 3-phenyl-4(1'-naphthyl)-5-phenyl-1,2,4-triazole (TAZ) (host material) and (ii) bis(2-(2'-benzo[4,5-α]thienyl)pyridinato-N, C3')iridium (acetylacetonate) (btp2Ir(acac)) (red-light emitting dopant). These materials (red organic materials) were codeposited at respective vapor deposition rates of 5.0 nm/s and 0.53 nm/s to form the luminous layer 23R.

Vapor deposition particles of the red organic materials which particles are emitted from vapor deposition source 85 are deposited, through the openings 82 of the shadow mask 81 and onto positions facing the respective openings 82 of the shadow mask 81, when the TFT substrate 10 passes through a position directly above the shadow mask 81. In the present embodiment, the TFT substrate 10 having passed through the position directly above the shadow mask 81 had the red organic materials deposited thereon at a film thickness of 25 nm.

Figure 11:
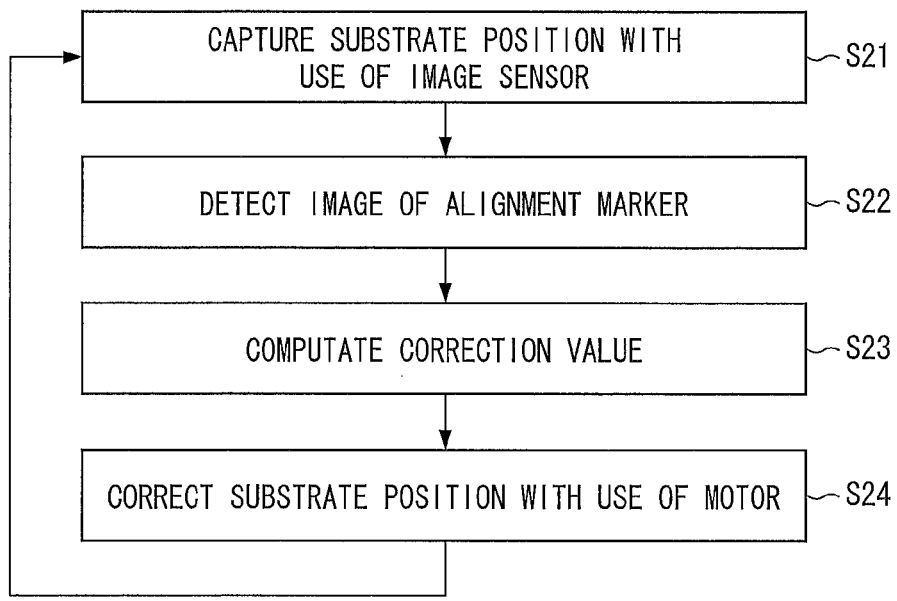
FIG. 11 is a flowchart indicating an alignment adjustment method.

The following describes, with reference to FIG. 11, a method for adjusting an alignment in S14 above.

FIG. 11 is a flowchart illustrating the alignment adjustment method. The alignment is adjusted as illustrated in the flow of FIG. 11.

The method first captures a substrate position of the TFT substrate 10 as the film formation substrate 200 with use of the image sensors 90 (S21).

Next, the image detecting section 101, on the basis of the image captured by the image sensors 90, detects respective images of (i) the alignment markers 221 of the TFT substrate 10 and of (ii) the alignment markers 221 of the shadow mask 81 (S22).

Then, the computing section 102 calculates, from the respective images of the alignment markers 221 and 84, the images having been detected by the image detecting section 101, the amount of positional difference between the alignment markers 221 and the alignment markers 84 to determine a correction value for a substrate position by computation (S23).

Next, the motor drive control section 103 drives the motor 72 on the basis of the correction value to correct the substrate position (S24).

Then, the image sensors 90 detect the substrate position as corrected, after which the steps S21 through S25 are repeated.

As described above, the present embodiment causes the image sensors 90 to repeatedly detect a substrate position to correct it. This makes it possible to simultaneously carry out a substrate scan and correct a substrate position, and consequently to form a film while carrying out a precise alignment between the TFT substrate 10 and the shadow mask 81.

The film thickness of the luminous layer 23R can be adjusted on the basis of (i) a reciprocating scan (that is, reciprocating movement of the TFT substrate 10) and (ii) a scan rate. As indicated in FIG. 10, the present embodiment, after the scan in S14, (i) reversed the direction of scanning the TFT substrate 10, and (ii) further deposited the red organic materials by the same method as in S14 at the positions at which the red organic materials were deposited in S14 (S16). This formed a luminous layer 23R having a film thickness of 50 nm.

While in S14 through S16, the non vapor deposition region of the TFT substrate 10 was positioned directly above the openings 82 of the shadow mask 81 (for example, during the period after the step in S14 ends and before the scanning direction is reversed in S16), the shutter 89 was inserted between the vapor deposition source 85 and the shadow mask 81 to prevent vapor deposition particles from adhering to the non vapor deposition region (S15).

Figure 12:
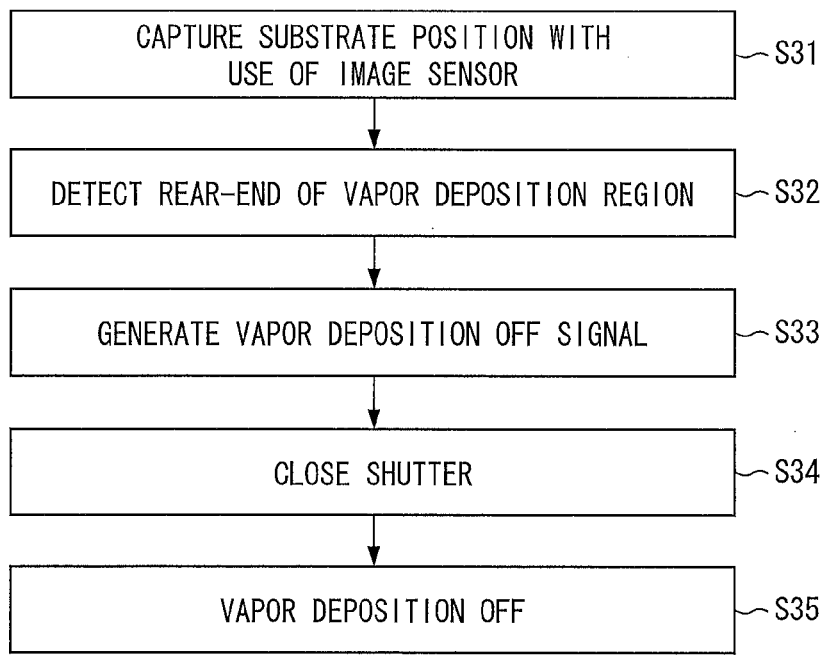
FIG. 12 is a flowchart indicating a flow of a vapor deposition control carried out when vapor deposition is turned OFF.

The following describes, with reference to FIGS. 12 and 13, a vapor deposition control in S15 above which vapor deposition control involves the shutter 89.

FIG. 12 is a flowchart illustrating a flow of a vapor deposition control carried out when vapor deposition is turned OFF. FIG. 13 is a flowchart illustrating a flow of a vapor deposition control carried out when vapor deposition is turned ON.

The description below first deals with the flow carried out when vapor deposition is turned OFF.

As indicated in FIG. 12, the substrate position of the TFT substrate 10 serving as the film formation substrate 200 is constantly captured by the image sensors 90 during a vapor deposition process as described above with reference to FIG. 11 (S31).

As indicated in FIG. 11, the image detecting section 101, on the basis of an image captured by the image sensors 90, detects respective images of (i) the alignment markers 221 of the TFT substrate 10 and of (ii) the alignment markers 221 of the shadow mask 81. The image detecting section 101 detects, as an alignment marker 221 of the TFT substrate 10, a rear-end marker indicative of the rear-end of the vapor deposition region to detect the rear-end of the vapor deposition region 210 as indicated in FIG. 12 (S32).

When the image detecting section 101 has detected the rear-end of the vapor deposition region 210 as described above, the vapor deposition ON/OFF control section 104 generates a vapor deposition OFF signal (S33).

The shutter drive control section 105, upon receipt of the vapor deposition OFF signal from the vapor deposition ON/OFF control section 104, closes the shutter 89 (S34). The shutter 89 thus closed prevents vapor deposition particles from reaching the mask, which achieves the state of vapor deposition OFF (S35).

The description below now deals with the flow carried out when vapor deposition is turned ON.

As indicated in FIG. 13, the substrate position of the TFT substrate 10 serving as the film formation substrate 200 is, as described above, constantly captured by the image sensors 90 during a vapor deposition process (S41).

The image detecting section 101 detects, as an alignment marker 221 of the TFT substrate 10, a start-end marker indicative of the start-end of the vapor deposition region to detect the start-end of the vapor deposition region 210 (S42).

When the image detecting section 101 has detected the rear-end of the vapor deposition region 210, the vapor deposition ON/OFF control section 104 generates a vapor deposition ON signal (S43).

The shutter drive control section 105, upon receipt of the vapor deposition ON signal from the vapor deposition ON/OFF control section 104, opens the shutter 89 (S44). The shutter 89 thus opened allows vapor deposition particles to reach the mask, which achieves the state of vapor deposition ON(S45).

The reciprocating scan in S16 above is carried out as follows: First, through the steps S21 to S24, the substrate is scanned while a precise alignment is carried out. When the image detecting section 101 has detected the rear-end of the vapor deposition region 210, the motor drive control section 103 drives the motor 72 to reverse the direction of scanning the TFT substrate 10. During this operation, (i) vapor deposition is turned OFF through the steps S31 to S35, (ii) the position of the TFT substrate 10 is corrected through the steps S21 to S24, and (iii) vapor deposition is turned ON at the start-end of the vapor deposition region 210 through the steps S41 to S45. Then, the substrate is scanned again while a precise alignment is carried out through the steps S21 to S24.

The above operation forms a luminous layer 23R having a desired film thickness as indicated in S16.

The present embodiment, after the step S16, retrieved from the vacuum chamber 60 the TFT substrate 10 on which the luminous layer 23R was formed (S17), and then formed a green luminous layer 23G, with use of (i) a mask unit 80 for forming the green luminous layer 23G and (ii) a vacuum chamber 60, in a manner similar to the above process of forming the luminous layer 23R.

The present embodiment, after thus forming the luminous layer 23G, formed a blue luminous layer 23B, with use of (i) a mask unit 80 for forming the blue luminous layer 23B and (ii) a vacuum chamber 60, in a manner similar to the respective processes of forming the luminous layers 23R and 23G.

Specifically, the present embodiment, for each of the processes of forming the luminous layers 23G and 23B, prepared a shadow mask 81 having openings 82 at positions for a corresponding one of the luminous layers 23G and 23B. The present embodiment placed each shadow mask 81 in a vacuum chamber 60 for forming a corresponding one of the luminous layers 23G and 23B, and thus scanned the TFT substrate 10 for vapor deposition while carrying out an alignment so that the openings 82 of the shadow mask 81 coincide with a corresponding one of (i) sub-pixel 2G columns and (ii) sub-pixel 2B columns.

The luminous layer 23G was made of (TAZ) (host material) and Ir(ppy) 3 (green-light emitting dopant). These materials (green organic materials) were codeposited at respective vapor deposition rates of 5.0 nm/s and 0.67 nm/s to form the luminous layer 23G.

The luminous layer 23B was made of TAZ (host material) and 2-(4'-t-butyl phenyl)-5-(4"-biphenylyl)-1,3,4-oxadiazole (t-Bu PBD) (blue-light emitting dopant). These materials (blue organic materials) were codeposited at respective vapor deposition rates of 5.0 nm/s and 0.67 nm/s to form the luminous layer 23B.

The luminous layers 23G and 23B each had a film thickness of 50 nm.

The above steps prepared a TFT substrate 10 on which were formed respective patterns of the luminous layers 23R, 23G, and 23B having respective colors of red (R), green (G), and blue (B).

According to the present embodiment, it is possible to produce an organic EL display device 1 larger in size than conventional organic EL display devices through production involving the use of (i) the above vapor deposition device 50 as a device for producing the organic EL display device 1 and (ii) the above vapor deposition method.

Conventional mask vapor deposition methods have each carried out vapor deposition in a state in which a shadow mask and a film formation substrate are integrated with each other by, for example, (i) aligning the shadow mask and the film formation substrate with each other and attaching them to each other or (ii) closely attaching the shadow mask and the film formation substrate to each other by magnetic force. Further, conventional mask vapor deposition methods have, when moving the shadow mask relative to the film formation substrate, each moved the shadow mask relative to the film formation substrate in a state in which a vapor deposition source is fixed to the vacuum chamber, and thus used a shadow mask that is substantially equal in size to the film formation substrate.

In consequence, conventional mask vapor deposition methods have each problematically caused a gap between the film formation substrate and the shadow mask due to self-weight bending and/or elongation of the shadow mask, and thus caused vapor deposition mispositioning and/or color mixture, with the result of difficulty in achieving high resolution.

In addition, conventional mask vapor deposition methods have each used a vapor deposition source fixed to the vacuum chamber. Thus, in the case where (i) a small-sized shadow mask is used and (ii) vapor deposition is sequentially carried out with respect to partial regions of the film formation substrate while the shadow mask is moved, it is necessary to (i) use an adhesion prevention shielding plate so that no vapor deposition particles are adhered to the film formation substrate in a region that is not covered by the shadow mask and (ii) sequentially move the shielding plate in synchronization with the shadow mask. Such a necessity requires a complex structure.

Further, in the case where no movable shielding plate is used, and in accordance with movement of the shadow mask, (i) each vapor deposition source is turned ON which corresponds to a region for which the moved shadow mask has an opening and (ii) the other vapor deposition sources are turned OFF, it is necessary to use a highly controlled planar vapor deposition source having a substrate size and a uniform evaporation distribution. In addition, such a vapor deposition device will have a low processing efficiency because a vapor deposition source in the OFF state is not in operation.

In contrast, the present embodiment, as described above, (i) integrates the shadow mask 81 with the vapor deposition source 85 (that is, fixes the respective positions relative to each other) to secure a fixed gap g1 between the TFT substrate 10 serving as the film formation substrate 200 and the shadow mask 81, and (ii) passes the TFT substrate 10 through a position directly above the shadow mask 81 to scan the TFT substrate 10 so that vapor deposition particles having passed through the openings 82 of the shadow mask 81 are deposited onto the TFT substrate 10.

More specifically, the present embodiment (i) uses the mask unit 80 and (ii) for example, moves the TFT substrate 10 relative to the mask unit 80 in a state in which there is a fixed gap g1 between the TFT substrate 10 and the mask unit 80. This arrangement causes vapor deposition particles emitted from the emission holes 86 of the vapor deposition source 85 to be sequentially deposited onto the vapor deposition region 210 in the vapor deposition surface of the TFT substrate 10 through the openings 82 of the shadow mask 81. The above arrangement thus makes it possible to form a predetermined pattern on the vapor deposition region 210 of the TFT substrate 10.

The present embodiment, as described above, (i) does not fix the shadow mask 81 and the TFT substrate 10 to each other, but allows them to freely move relative to each other, and (ii) fixes the respective positions of the TFT substrate 10, the shadow mask 81, and the vapor deposition source 85 relative to one another. With this arrangement, it is possible to carry out vapor deposition while scanning the TFT substrate 10 by using, as described above, a shadow mask 81 that is smaller in area than the vapor deposition region 210 of the TFT substrate. The above arrangement thus eliminates the need to use a large-sized shadow mask that is equivalent in size to the TFT substrate 10 as conventional.

The above arrangement solves the problems caused in conventional mask vapor deposition methods, for example, (i) self-weight bending and elongation due to a large-sized shadow mask and (ii) a size limit due to a limit in original length. The above arrangement consequently makes it possible to not only form a pattern of an organic layer on a large-sized substrate, but also form such a pattern with high positional accuracy and high resolution.

The present embodiment, which uses a shadow mask 81 smaller in area than the TFT substrate 10 as described above, prevents such problems as follows: A larger sized shadow mask requires a frame for holding the shadow mask to be extremely large and extremely heavy, which in turn requires a device handling such a frame to be also extremely large and complex and which consequently poses a hazard in handling such a device during a production process. The above arrangement, as a result, facilitates device design (smaller sized device) and improves safety in, for example, mask replacement.

The present embodiment, which fixes the respective positions of the shadow mask 81 and the vapor deposition source 85 relative to each other as described above, simply needs to, for example, move the TFT substrate 10 for a substrate scan. The present embodiment thus eliminates the need to, as conventional, (i) move the shadow mask in a state in which the shadow mask is closely attached to the film formation substrate or (ii) move a vapor deposition source relative to the film formation substrate to which the shadow mask is closely attached as above.

The above arrangement thus eliminates the unnecessity to include a complicated mechanism for (i) firmly fixing the shadow mask and the film formation substrate to each other to prevent mispositioning thereof and (ii) moving both the shadow mask and the film formation substrate. The above arrangement further eliminates the unnecessity to carry out precise vapor deposition amount control and movement control for a vapor deposition source for the purpose of achieving a uniform film thickness.

In the present embodiment, vapor deposition particles scattered (flying) substantially vertically from the vapor deposition source 85 toward the shadow mask 81 pass through the openings 82 of the shadow mask 81 and fly substantially vertically to be adhered to the TFT substrate 10 to form a vapor deposition film 211. During this operation, the present invention maintains a fixed gap g1 between the TFT substrate 10 and the shadow mask 81 also while the TFT substrate 10 is scanned. This makes it possible to form a vapor deposition film 211 having a uniform width and a uniform film thickness.

Conventional art has had the following problem: Since a substrate and a vapor deposition source are fixed in a vacuum chamber, in a case where a flying distribution of vapor deposition particles scattered (flying) from the vapor deposition source extends along a substrate scanning direction, the flying distribution directly makes a film thickness distribution, thus causing a screen to have a non-uniform luminance.

In contrast, the present embodiment, which carries out vapor deposition while scanning the TFT substrate 10 as described above, has a uniform flying distribution of vapor deposition particles along the substrate scanning direction even in a case where the distribution extends along the scanning direction. This arrangement prevents non-uniformity in luminance over the screen.

The present embodiment thus makes it possible to form a pattern of an organic layer that is uniform over a surface of the substrate, and consequently to produce an organic EL display device 1 having high display quality.

In addition, carrying out vapor deposition while scanning the TFT substrate 10 as described above makes it possible to form a highly uniform vapor deposition film 211 on the TFT substrate 10 while maintaining high material use efficiency.

The present embodiment, which secures a gap g1 between the TFT substrate 10 and the shadow mask 81, prevents the TFT substrate 10 from coming into contact with the shadow mask 81, thus preventing the shadow mask 81 from damaging the TFT substrate 10. Further, the present embodiment eliminates the need to form on the TFT substrate 10 a mask spacer for preventing the shadow mask 81 from damaging the organic EL element 20 on the TFT substrate 10. The present embodiment thus prevents the organic EL display device 1 from becoming expensive due to formation of such a mask spacer.

The present embodiment, which fixes the respective positions of the shadow mask 81 and the vapor deposition source 85 relative to each other as described above, eliminates the need to include a shielding plate for preventing vapor deposition particles from adhering to an unnecessary portion (that is, the non vapor deposition region). The present embodiment, even if it uses such a shielding plate, can simply fix the shielding plate, and can thus have a simple structure.

The present embodiment, which uses a vapor deposition source 85 that is equal in size to the shadow mask, does not require a planar vapor deposition source that is equal in size to the substrate. Further, the present embodiment is simply required to control uniformity in evaporation distribution along only the direction perpendicular to the substrate scanning direction.

In addition, the present embodiment does not need to, as conventional, switches ON/OFF a vapor deposition source that is equal in size to the substrate, and thus has an improved processing efficiency.

The present embodiment is arranged such that the mask unit 80 is fixedly placed in the vacuum chamber 60. The present embodiment is, however, not limited to such an arrangement.

The vapor deposition device 50 may include, instead of the substrate moving mechanism 70, (i) a substrate holding member 71 (for example, an electrostatic chuck) for fixing the film formation substrate 200 and (ii) a mask unit moving mechanism (mask unit moving means; adjusting means) for moving the mask unit 80 relative to the film formation substrate 200 while maintaining the respective positions of the shadow mask 81 and the vapor deposition source 85 relative to each other. The vapor deposition device 50 may alternatively include both the substrate moving mechanism 70 and the mask unit moving mechanism.

In other words, the film formation substrate 200 and the mask unit 80 simply need to be so provided that at least one of them is moveable relative to the other. The advantages of the present invention can be achieved regardless of which of the film formation substrate 200 and the mask unit 80 is arranged to move.

The mask unit moving mechanism, the mask tension mechanism 88, and the substrate moving mechanism 70 each further function as adjusting means for adjusting the respective positions of the film formation substrate 200 and the shadow mask 81 relative to each other.

The substrate moving mechanism 70 and the mask unit moving mechanism may each be, for example, a roller-type moving mechanism or a hydraulic moving mechanism.

In the case where the mask unit 80 is moved relative to the film formation substrate 200 as described above, the mask unit 80 is arranged, for example, such that the shadow mask 81 and the vapor deposition source 85 are moved, relative to the film formation substrate 200, together with the mask holding member 87 (for example, an identical holder). This arrangement makes it possible to move the mask unit 80 relative to the film formation substrate 200 while maintaining the respective positions of the shadow mask 81 and the vapor deposition source 85 relative to each other.

In the case where the mask unit 80 is moved relative to the film formation substrate 200 as described above, the shadow mask 81 and the vapor deposition source 85 are preferably so held by, for example, an identical holder (holding member; holding means) as to be integrated with each other.

In the case where the film formation substrate 200 is moved relative to the mask unit 80 as described above, the shadow mask 81 and the vapor deposition source 85 simply need to be fixed in position relative to each other, but do not necessarily need to be integrated with each other.

The mask unit 80 may be arranged, for example, such that (i) the vapor deposition source 85 is fixed to, for example, a bottom wall among inner walls of the vacuum chamber 60, (ii) the mask holding member 87 is fixed to one of the inner walls of the vacuum chamber 60, and consequently (iii) the shadow mask 81 and the vapor deposition source 85 are fixed in position relative to each other.

The mask holding member 87 and the mask tension mechanism 88 may be provided integrally with each other. For example, the mask holding member 87 may be a holding member such as a roller that applies tension to the film formation substrate 200 and that holds the film formation substrate 200 by mechanically sandwiching it.

The mask holding member 87 may alternatively be arranged to (i) include a slider mechanism and (ii) in a state in which the mask tension mechanism 88 sandwiches the shadow mask 81, be slid to apply tension to the shadow mask 81.

In the present embodiment, the mask tension mechanism 88 for applying tension to the shadow mask 81 is provided, not as a jig (mask jig; fitting) for the film formation substrate 200 as conventional, but as a part (mechanism) of the vapor deposition device 50.

The present embodiment (i) secures a fixed gap g1 between the film formation substrate 200 and the shadow mask 81 as described above to use a vapor deposition system that does not allow the film formation substrate 200 and the shadow mask 81 to be closely attached to each other, and (ii) includes the mask tension mechanism 88 in the vapor deposition device 50. The present embodiment can thus reduce bending and thermal expansion of the shadow mask 81. Further, the present invention can adjust alignment accuracy for the shadow mask 81 by tension in accordance with a situation occurring during vapor deposition (for example, thermal expansion of the shadow mask 81 and/or finishing accuracy of the film formation substrate 200).

The shadow mask 81 can be subjected to tension in, for example, the case (I) or (II) below so that the size of the shadow mask 81 is further increased in correspondence with the film formation substrate 200 (more specifically, a substrate pattern such as a pixel pattern).

(I) The shadow mask 81 has openings 82 each of which is designed, when the shadow mask 81 is prepared, to be smaller in size than desired, and the openings will each have a desired size only after the shadow mask is subjected to tension (that is, the mask is designed to have intended dimensions when there is (i) no bending in the mask and (ii) an extra tension applied to the mask.

(II) The pixel pattern formed on the film formation substrate 200 has been slightly elongated due to heat history of the film formation substrate 200.

Adjusting tension applied to the shadow mask 81 as described above simultaneously (i) corrects self-weight bending and/or thermal bending of the shadow mask 81 and (ii) in accordance with the substrate pattern, adjusts the amount of elongation of the shadow mask 81 (that is, the elongation rate for the shadow mask 81).

When expanded by tension, the shadow mask 81 is bent. The mask tension mechanism 88 is thus preferably has a set minimum tension (MIN).

In the case where, for example, the vapor deposition device has determined that the shadow mask 81 is under excessive tension, the mask tension mechanism 88 is moved in such a direction as to ease the tension. Excessively easing the tension may, however, cause the shadow mask 81 to bend so excessively as to come into contact with the film formation substrate 200. The mask tension mechanism thus preferably has a set minimum tension in order to at least prevent contact between the film formation substrate 200 and the shadow mask 81.

In comparison between (i) the problem of mispositioning between the shadow mask 81 and the film formation substrate 200 and (ii) the problem of bending in the shadow mask 81, the latter problem of the bending may cause a severe defect in a formed vapor deposition film 211. The mask tension mechanism 88 thus preferably has a set minimum tension to preferentially prevent the bending.

The mask tension mechanism 88 preferably also has a set maximum tension (MAX). In the case where, for example, the vapor deposition device has determined that the shadow mask 81 is under insufficient tension, the mask tension mechanism 88 is moved in such a direction as to increase the tension. An excessive tension may, however, crack or distort the shadow mask 81. The mask tension mechanism 88 thus preferably has a set maximum tension to prevent such a problem.

Whether the shadow mask 81 is subjected to an excessive or insufficient tension can be determined from, for example, the positional relationship between (i) the alignment markers 84 of the shadow mask 81 and (ii) the alignment markers 221 of the film formation substrate 200.

The above determination may alternatively be made by (i) providing the shadow mask 81 with a reference position marker such as an alignment marker for an absolute alignment which alignment marker is used to place the shadow mask 81 at an absolute position and (ii) referring to the positional relationship between the above reference marker and a reference position provided on the device side.

Even in a case where the shadow mask 81 is expanded by tension, it can still be used while the expansion is within a margin allowed by design. The shadow mask 81 is, however, desirably prepared to have a size smaller than design absolute dimensions (designed values) in prior consideration of, for example, expansion due to temperature.

It is possible to finely adjust a vapor deposition position and control thermal deformation of the shadow mask 81 by, as described above, (i) preparing a shadow mask 81 with a size smaller than designed values to absorb thermal expansion of the shadow mask 81 and (ii) applying tension to the shadow mask 81 in order to adjust an alignment (that is, an alignment between the film formation substrate 200 and the shadow mask 81) before vapor deposition on the film formation substrate 200.

The alignment between the film formation substrate 200 and the shadow mask 81 may be carried out by (i) a method of placing the shadow mask 81 at a home position (that is, a default position set for the device) and aligning the film formation substrate 200 with the shadow mask 81 serving as a basis (mask-based) or (ii) a method of aligning the shadow mask 81 with the film formation substrate 200 serving as a basis method (substrate-based).

The present embodiment describes an example case in which the openings 82 of the shadow mask 81 are aligned with the emission holes 86 of the vapor deposition source 85 so that the emission holes 86 are each positioned inside one of the openings 82 in a plan view and that the openings 82 are provided in a one-to-one correspondence with the emission holes 86. The present embodiment is, however, not limited to such an arrangement. The openings 82 do not necessarily need to be provided (i) to face the emission holes 86 or (ii) in a one-to-one correspondence with the emission holes 86.

Specifically, the openings 82 may each have a pitch p that is unequal to the pitch of an emission hole 86. Further, the widths d5 and d6 of an opening 82 do not need to match the opening width (opening diameter) of an emission hole 86. For example, in the example illustrated in FIG. 1, the emission holes 86 may each have an opening diameter that is larger or smaller than the width d6 of an opening 82. In addition, a plurality of emission holes 86 may be provided to correspond to a single opening 82, whereas a single emission hole 86 may be provided to correspond to a plurality of openings 82. Further, a part (that is, at least one) of a plurality of emission holes 86 or a partial region of an emission hole 86 may be provided to face a non-opening section (that is, a region of the shadow mask 81 which region is other than the openings 82; for example, a region between openings 82 and 82).

To reduce the number of vapor deposition particles adhering to a non-opening section of the shadow mask 81 and thus improve material use efficiency as much as possible, the emission holes 86 are preferably provided to face the openings 82 in such a manner that at least a portion (that is, at least a partial region) of each emission hole 86 coincides with one or more openings 82. Further, the emission holes 86 are more preferably provided to (i) face the openings 82 and (ii) be each positioned inside one of the openings 82 in a plan view.

To improve material use efficiency, the openings 82 and the emission holes 86 are desirably provided in a one-to-one correspondence with the each other.

The present embodiment describes an example case in which both (i) the openings 82 of the shadow mask 81 and (ii) the emission holes 86 of the vapor deposition source 85 are arranged one-dimensionally (that is, in a linear manner). The present embodiment is, however, not limited to such an arrangement. It is alternatively possible to arrange both the openings 82 of the shadow mask 81 and the emission holes 86 of the vapor deposition source 85 two-dimensionally (that is, in a planar manner).

The present embodiment describes an example case involving a plurality of openings 82 in the shadow mask 81 and a plurality of emission holes 86 in the vapor deposition source 85. The present embodiment is, however, not limited to such an arrangement. The shadow mask 81 is simply required to include at least one opening 82, whereas the vapor deposition source 85 is simply required to include at least one emission hole 86.

In other words, the present embodiment may alternatively be arranged such that the shadow mask 81 includes only one opening 82 and that the vapor deposition source 85 includes only one emission hole 86. Even this arrangement makes it possible to form a predetermined pattern on the film formation substrate 200 by (i) moving at least one of the mask unit 80 and the film formation substrate 200 relative to the other and (ii) sequentially depositing vapor deposition particles onto the vapor deposition region 210 of the film formation substrate 200 through the openings 82 of the shadow mask 81. There is no particular limit to the respective numbers of the openings 82 and the emission holes 86. The numbers can each be set as appropriate in accordance with, for example, the size of the film formation substrate 200.

The present embodiment describes an example case in which the shadow mask 81 includes slit-shaped openings 82 (specifically, stripe-shaped openings 82 extending in the substrate scanning direction). The shape of the openings 82 can, however, be simply set as appropriate to form a desired vapor deposition pattern, and is thus not particularly limited to any specific one.

The openings 82 may each have the shape of, for example, a slot. Even in this case, the openings 82 desirably each extend in a direction that is, in the case where the film formation substrate 200 is an array substrate such as a TFT substrate 10, identical to the column direction of sub-pixels provided in the shape of a stripe and having an identical color.

The present embodiment describes an example case in which the substrate moving mechanism 70 includes an electrostatic chuck as the substrate holding member 71. Using the electrostatic chuck to hold the film formation substrate 200 as described above can effectively prevent self-weight bending of the film formation substrate 200.

The present embodiment is, however, not limited to such an arrangement. Depending on the size of the film formation substrate 200, the substrate holding member 71 may be, for example, a holding member such as a roller for applying tension to the substrate to mechanically sandwich and hold it.

The present embodiment describes an example case involving, as the shutter 89, a shutter capable of moving in a space between the shadow mask 81 and the vapor deposition source 85. The present embodiment is, however, not limited to such an arrangement. The present embodiment may alternatively be arranged, for example, such that (i) the vapor deposition source 85 is a vapor deposition source 85 that can be switched ON/OFF and that (ii) when a portion of the film formation substrate 200 which portion needs no vapor deposition is positioned in a region (that is, a region facing an opening 82) that faces an opening region of the shadow mask 81, vapor deposition is turned OFF so that no vapor deposition particles fly.

The present embodiment may alternatively be arranged, for example, such that the shutter 89 is a shutter 89 provided to the vapor deposition source 85 and serving to close the emission holes 86 of the vapor deposition source 85 to block emission (release) of vapor deposition particles.

The present embodiment may further alternatively be arranged such that instead of providing the shutter 89 to the emission holes 86, the vapor deposition source 85 is switched ON/OFF on the basis of a vapor deposition ON signal or a vapor deposition OFF signal to stop the generation itself of vapor deposition particles.

Regardless of the arrangement, the present embodiment, which uses a shadow mask 81 with an area smaller than the substrate area (substrate size) and integrates the shadow mask 81 and the vapor deposition source 85 with each other as described above, (i) eliminates the need to, as conventional, carry out OFF/OFF control of a part of a plurality of vapor deposition sources (or emission holes) and (ii) simply needs to turn ON or OFF the vapor deposition source 85 itself, that is, all emission holes 86, for a non vapor deposition region. The present embodiment thus requires no complicated mechanism and consequently allows ON/OFF control to be easily carried out.

The present embodiment describes an example method for producing, as described above, an organic EL display device 1 of the bottom emission type, which extracts light from the TFT substrate 10 side. The present embodiment is, however, not limited to such production. The present invention is also suitably applicable to an organic EL display device 1 of a top emission type, which extracts light from the sealing substrate 40 side.

The present embodiment describes an example case that uses a glass substrate as a supporting substrate for each of the TFT substrate 10 and the sealing substrate 40. The present embodiment is, however, not limited to such an arrangement.

The respective supporting substrates for the TFT substrate 10 and the sealing substrate 40 may, for example, each be, other than a glass substrate, a transparent substrate such as a plastic substrate in the case where the organic EL display device 1 is an organic EL display device of the bottom emission type. In the case where the organic EL display device 1 is an organic EL display device of the top emission type, the respective supporting substrates may, for example, each be an opaque substrate such as a ceramics substrate other than the above transparent substrate.

The present embodiment describes an example case involving an anode (in the present embodiment, the first electrode 21) formed in a matrix. The anode is, however, not particularly limited in terms of shape, material, or size as long as it has the function as an electrode for supplying positive holes to an organic EL layer. The anode may have, for example, a stripe shape. By the nature of an organic EL element, at least one of the anode and the cathode is preferably transparent. An organic EL element typically includes a transparent anode.

The present embodiment is not limited by the above values for the scan rate, the vapor deposition rate, and the number of reciprocating scans for the TFT substrate 10. Adjusting the above values makes it possible to achieve a desired film thickness in a desired tact time.

The present embodiment is also not limited by the above values for (i) the gap g1 between the TFT substrate 10 serving as the film formation substrate 200 and the shadow mask 81 and (ii) the gap g2 between the vapor deposition source 85 and the shadow mask 81.

The gap g1 between the TFT substrate 10 and the shadow mask 81 may be adjusted as appropriate as long as (i) the gap is fixed and (ii) the TFT substrate 10 and the shadow mask 81 do not come into contact with each other.

The gap g2 between the vapor deposition source 85 and the shadow mask 81 may be adjusted as appropriate in consideration of (i) distribution of, for example, spatial spread of vapor deposition particles and (ii) influence of heat radiated from the vapor deposition source 85.

The present embodiment describes an example case in which the computing section 102, when it determines, from an image detected by the image detecting section 101, the amount of movement of the film formation substrate 200 and the shadow mask 81 relative to each other, determines a correction value for a substrate position of the film formation substrate 200 by computation from the amount of positional difference between the alignment markers 221 and the alignment markers 84. The present embodiment is, however, not limited to such an arrangement. The present embodiment may alternatively be arranged, for example, such that the computing section determines a correction value for a substrate position of the film formation substrate 200 from the amount of positional difference between the alignment markers 221 and the alignment markers 84 with reference to a lookup table stored in a storage section (storage means) in advance.

More specifically, the control circuit 100 may further include: a storage section that stores the lookup table; and a selecting section that selects (determines) a correction value for a substrate position of the film formation substrate 200 from the amount of positional difference between the alignment markers 221 and the alignment markers 84 with reference to the lookup table.

Embodiment 2

The present embodiment is described below mainly with reference to FIGS. 14 through 16.

The present embodiment mainly deals with how the present embodiment is different from Embodiment 1 above. Constituent elements of the present embodiment that are identical in function to their respective equivalents described in Embodiment 1 are each assigned the same reference numeral, and are not described here.

FIG. 14 is a cross-sectional view illustrating a variation of the organic EL display device 1.

The present embodiment describes a method for producing, as a variation of the organic EL display device 1 illustrated in FIG. 8, the organic EL display device 1 illustrated in FIG. 14.

The present embodiment varies, for optimization, the respective film thicknesses of its hole transfer layers for each of the respective colors of R, G, and B, that is, for each of the sub-pixels 2R, 2G, and 2B.

The organic EL display device 1 illustrated in FIG. 14 includes, instead of the hole injection layer/hole transfer layer 22 included in the organic EL display device 1 illustrated in FIG. 8, a hole injection layer 27 and hole transfer layers 28R, 28G, and 28B. The hole transfer layers 28R, 28G, and 28B are made of an identical material, and are different from one another in film thickness only.

As illustrated in FIG. 14, the present embodiment is arranged to include (i) within the opening 15R of the sub-pixel 2R, the hole transfer layer 28R and the luminous layer 23R stacked in that order from the hole injection layer 27 side, (ii) within the opening 15G of the sub-pixel 2G, the hole transfer layer 28G and the luminous layer 23G stacked in that order from the hole injection layer 27 side, and (iii) within the opening 15B of the sub-pixel 2B, the hole transfer layer 28B and the luminous layer 23B stacked in that order from the hole injection layer 27 side, the combinations (i), (ii), and (iii) being adjacent to one another.

The present embodiment carries out a discriminative application formation (pattern formation) of the hole transfer layers 28R, 28G, and 28B in addition to the luminous layers 23R, 23G, and 23B.

FIG. 15 is a flowchart indicating successive steps for producing the organic EL display device 1 illustrated in FIG. 14. (a) through (c) of FIG. 16 are each a plan view illustrating an alignment carried out between the TFT substrate 10 and the shadow mask 81 during vapor deposition for the red sub-pixel 2R, the green sub-pixel 2G, and the blue sub-pixel 2B, respectively. (a) of FIG. 16 is a plan view illustrating vapor deposition for the red sub-pixel 2R, (b) of FIG. 16 is a plan view illustrating vapor deposition for the green sub-pixel 2G, and (c) of FIG. 16 is a plan view illustrating vapor deposition for the blue sub-pixel 2B.

The method of the present embodiment for producing the organic EL display device 1, as indicated in FIG. 15, includes a hole injection layer vapor deposition step (S51) and a hole transfer layer vapor deposition step (S52) in place of the hole injection layer/hole transfer layer vapor deposition step (S2).

The steps other than the step S2 are identical to the respective corresponding steps described in Embodiment 1 above. The present embodiment thus does not describe the steps other than the hole injection layer vapor deposition step (S51) and the hole transfer layer vapor deposition step (S52).

The present embodiment prepares a TFT substrate 10 as in the TFT substrate preparing step (S1) of Embodiment 1 above. The present embodiment then carries out, with respect to the TFT substrate 10, (i) a bake under a reduced pressure for dehydration and (ii) an oxygen plasma treatment for surface washing of the first electrode 21, as in Embodiment 1 above.

The present embodiment next carries out vapor deposition of a hole injection layer 27 on the TFT substrate 10 throughout the entire display region with use of a conventional vapor deposition device as in Embodiment 1 above (S51).

In the present embodiment, the hole injection layer 27 was made of m-MTDATA (4,4'4"-tris(N-3-methylphenyl-N-phenylamino)-triphenylamine), and had a film thickness of 30 nm.

The present embodiment then carries out a discriminative application formation of the hole transfer layers 28R, 28G, and 28B with use of the vapor deposition device 50 described in Embodiment 1 above (S52).

Figure 16:
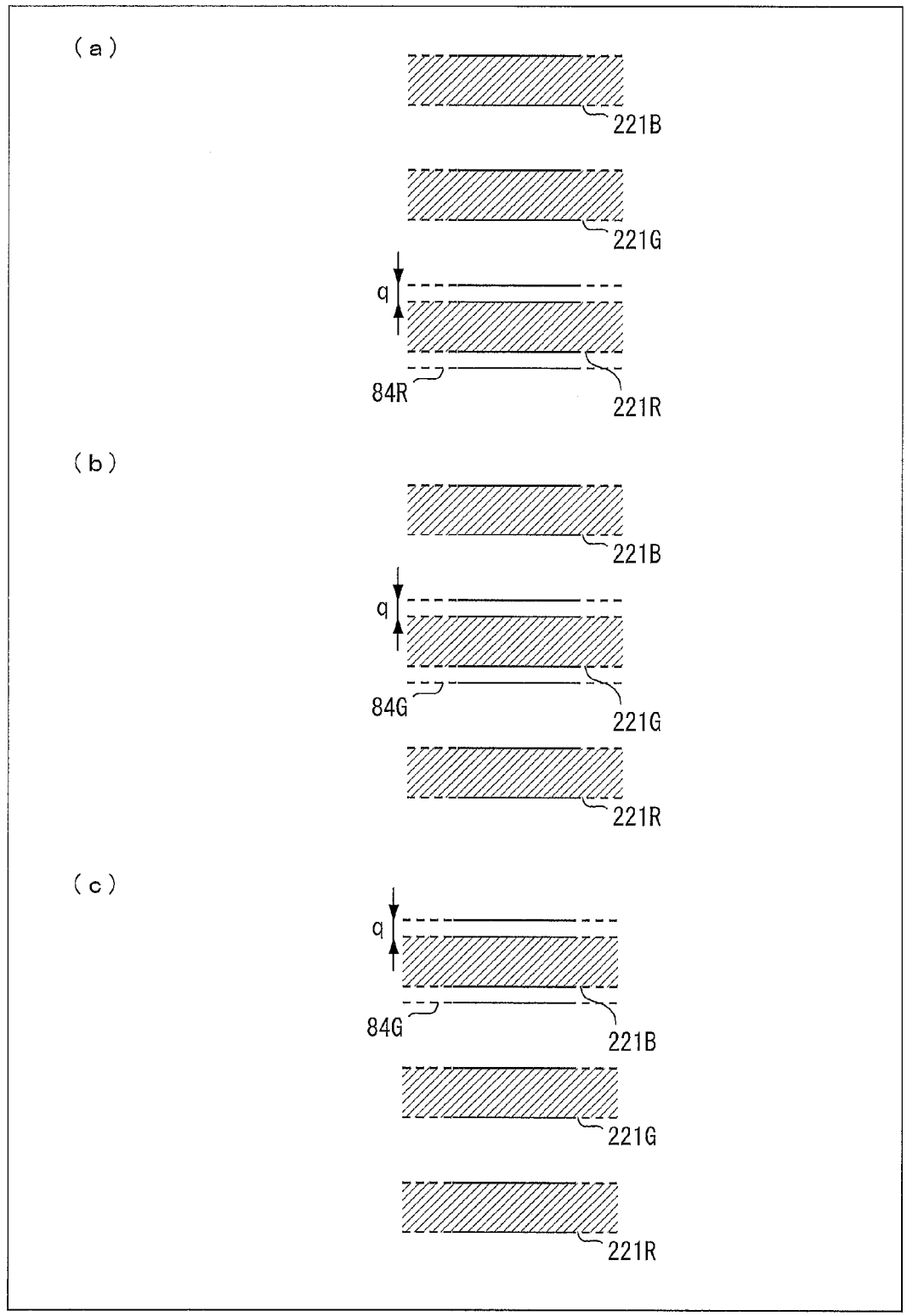
FIG. 16 (a) through (c) are each a plan view illustrating an alignment carried out between a TFT substrate and the shadow mask when vapor deposition is carried out for red sub-pixels, green sub-pixels, or blue sub-pixels, where (a) is a plan view taken when vapor deposition is carried out for red sub-pixels, (b) is a plan view taken when vapor deposition is carried out for green sub-pixels, and (c) is a plan view taken when vapor deposition is carried out for blue sub-pixels.

As illustrated in (a) through (c) of FIG. 16, the TFT substrate 10 includes, as alignment markers 221, (i) an alignment marker 221R for the sub-pixel 2R, (ii) an alignment marker 221G for the sub-pixel 2G, and (iii) an alignment marker 221B for the sub-pixel 2B. Further, the shadow mask 81 includes, as alignment markers 84, (i) an alignment marker 84R for the sub-pixel 2R, (ii) an alignment marker 84G for the sub-pixel 2G, and (iii) an alignment marker 84B for the sub-pixel 2B.

For vapor deposition of the hole transfer layers 28R, 28G, and 28B, when an alignment is carried out between the TFT substrate 10 and the shadow mask 81 as indicated in S11 and S14 of FIG. 10, the alignment is first carried out with use of the alignment markers 84R and 221R for the sub-pixel 2R.

The present embodiment next forms the hole transfer layer 28R for the sub-pixel 2R by a vapor deposition method that is identical, except for the material, to the method for forming the luminous layers 23R, 23G, and 23B.

The present embodiment then shifts the TFT substrate 10, on which the hole transfer layer 28R has been formed, in the direction perpendicular to the substrate scanning direction. The present embodiment thus carries out an alignment with use of the alignment markers 84G and 221G for the sub-pixel 2G and forms the hole transfer layer 28G for the sub-pixel 2G similarly to the hole transfer layer 28R.

The present embodiment next shifts the TFT substrate 10, on which the hole transfer layer 28G has been formed, in the direction perpendicular to the substrate scanning direction. The present embodiment thus carries out an alignment with use of the alignment markers 84B and 221B for the sub-pixel 2B and forms the hole transfer layer 28B for the sub-pixel 2B similarly to the hole transfer layers 28R and 28G.

The hole transfer layers 28R, 28G, and 28B can be varied in film thickness by, for example, changing, for each of the sub-pixels 2R, 2G, and 2B, (i) the rate of scanning the TFT substrate 10 serving as the film formation substrate 200 and/or (ii) the number of reciprocating the TFT substrate 10.

The present embodiment sets the respective film thicknesses of the hole transfer layers 28R, 28G, and 28B so that the sub-pixels 2R, 2B, and 2G (that is, the hole transfer layers 28R, 28B, and 28G) are, in this sequence, in order of increasing film thickness.

The present embodiment used α-NPD as a material for the hole transfer layers 28R, 28G, and 28B, and set the respective film thicknesses to 50 nm, 150 nm, and 100 nm.

The present embodiment, which can vary the respective film thicknesses of the hole transfer layers 28R, 28G, and 28B for each color (that is, for each of the sub-pixels 2R, 2G, and 2B) as described above, can optimize a microcavity effect for each color.

The microcavity effect refers to a phenomenon in which an optical resonant structure formed by the sub-pixels 2R, 2G, and 2B causes light generated between the first electrode 21 and the second electrode 26 to move back and forth and thus resonate, with the result of a sharper emission spectrum and improvement in color purity.

Since an optical distance that causes an optimal microcavity effect is different depending on the emission wavelength of each color, it is necessary to adjust the optical distance for each color. One method to make such an adjustment is a method of varying the film thickness of a particular organic layer as described above.

The present embodiment varied the respective film thicknesses of the hole transfer layers 28R, 28G, and 28B for each color as described above. The present embodiment is, however, not limited to such an arrangement. The present embodiment may alternatively vary, by the method of the present invention, the film thickness of not only the hole transfer layers 28R, 28G, and 28B but also, for example, the hole injection layer 27, the electron transfer layer 24, the electron injection layer 25, or the carrier blocking layer described above (not shown in the drawings) for each color.

The present embodiment, which forms, by the alignment method illustrated in (a) through (c) of FIG. 16, the hole transfer layers 28R, 28G, and 28B individually for the respective sub-pixels 2R, 2G, and 2B as described above, eliminates the need to replace the shadow mask 81 for each of the sub-pixels 2R, 2G, and 2B. The present embodiment further makes it possible to form the hole transfer layers 28R, 28G, and 28B in a single vacuum chamber 60.

The present embodiment can, in addition, control the film thicknesses by means of, for example, the rate of scanning the TFT substrate 10 and/or the number of reciprocating the TFT substrate 10. The present embodiment thus eliminates the need to change, for each of the hole transfer layers 28R, 28G, and 28B, the rate (vapor deposition rate) at which vapor deposition particles are emitted from the vapor deposition source 85 by evaporation.

Conventional art has had the necessity to, in the case where, for example, a crucible is used as a vapor deposition source, control the film thickness by means of temperature in order to change the vapor deposition rate. This has led to, for example, (i) the problem that it takes a long time to stabilize temperature and/or (ii) the problem that a variation in temperature tends to cause instability in vapor deposition rate.

The present embodiment can, in contrast, control the film thickness by means of not temperature but the scan rate or the reciprocating number as described above. The present embodiment thus does not pose the above problems.

The present embodiment describes an example case that, as described above, provides (i) the TFT substrate 10 with the alignment markers 221R, 221G, and 221B for the respective sub-pixels 2R, 2G, and 2B and (ii) the shadow mask 81 with the alignment markers 84R, 84G, and 84B for the respective sub-pixels 2R, 2G, and 2B.

The present embodiment is, however, not limited to such an arrangement. It is alternatively possible to use a single alignment marker in place of (i) the alignment markers 221R, 221G, and 221B or (ii) the alignment markers 84R, 84G, and 84B.

The present embodiment may, for example, be arranged such that the shadow mask 81 includes a single pattern as an alignment marker 84 and that vapor deposition is carried out while the single alignment marker 84 is aligned sequentially with the alignment markers 221R, 221G, and 221B of the TFT substrate 10 for individual formation of the hole transfer layers 28R, 28G, and 28B. The present embodiment may alternatively be arranged such that the shadow mask 81 includes, as alignment markers 84, the alignment markers 84R, 84G, and 84B for the respective sub-pixels 2R, 2G, and 2B and that the TFT substrate 10 includes a single alignment marker 221 for all the sub-pixels 2R, 2G, and 2B.

In the case where the present embodiment includes, for the respective colors, vapor deposition sources 85 and shadow masks 81 arranged in the substrate scanning direction in parallel to each other so that the hole transfer layers 28R, 28G, and 28B are formed individually for the respective colors (that is, for the respective sub-pixels 2R, 2G, and 2B), the TFT substrate 10 and the shadow mask 81 simply need to include a single alignment marker 221 and a single alignment marker 84, respectively, for in-line vapor deposition.

Embodiment 3

The present embodiment is described below mainly with reference to FIGS. 17 and 18.

The present embodiment mainly deals with how the present embodiment is different from Embodiments 1 and 2 above. Constituent elements of the present embodiment that are identical in function to their respective equivalents described in Embodiments 1 and 2 are each assigned the same reference numeral, and are not described here.

Figure 17:
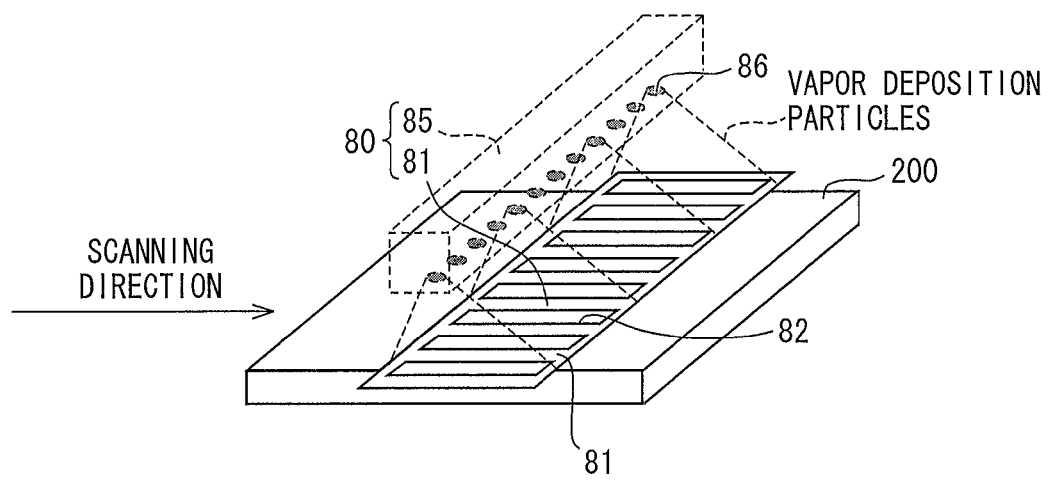
FIG. 17 is a bird's eye view illustrating main constituent elements inside a vacuum chamber of a vapor deposition device according to Embodiment 3 of the present invention.

FIG. 17 is a bird's eye view of main constituent elements inside the vacuum chamber 60 of the vapor deposition device 50 of the present embodiment. FIG. 18 is a cross-sectional view schematically illustrating a configuration of a main part provided inside the vacuum chamber 60 (see FIG. 3) of the vapor deposition device 50 of the present embodiment.

The vapor deposition device 50 of the present embodiment includes constituent elements that are similar to those of the vapor deposition device 50 described in Embodiment 1. FIGS. 17 and 18 each omit some constituent elements.

The vapor deposition device 50 of the present embodiment differs from the vapor deposition device 50 of Embodiment 1, as illustrated in FIGS. 17 and 18, in that the mask unit 80 and the substrate holding member 71 for holding the film formation substrate 200 are positioned inversely along the vertical direction.

The present embodiment is arranged such that (i) the substrate holding member 71 includes, for example, a so-called XY stage, that is, a substrate stage provided movably along an x direction and a y direction, and that (ii) the film formation substrate 200 is held by the substrate stage. The substrate stage may have the function as an electrostatic chuck. The present embodiment may alternatively be arranged such that (i) the substrate holding member 71 includes, instead of the substrate stage, a roller as described in Embodiment 1 above, and that (ii) the film formation substrate 200 is held and moved by the roller.

The mask unit 80 of the present embodiment is, as well as that of the embodiments above, arranged such that the shadow mask 81 and the vapor deposition source 85 are held integrally with each other by a mask holding member (not illustrated in FIG. 17 or 18) (that is, the mask holding member 87; see FIG. 3), such as a holder, which is, for example, fixed to the vacuum chamber 60 and in which the shadow mask 81 and the vapor deposition source 85 are, for example, placed to be contained and fixed. The mask holding member may be fixed to a top wall or peripheral wall of the vacuum chamber 60, or to a bottom wall of the vacuum chamber 60 by a prop (strut; not shown) extending from the bottom wall.

In the case where the mask unit 80 is fixed and the film formation substrate 200 is moved relative to the mask unit 80, the present embodiment may be arranged, for example, such that (i) the vapor deposition source 85 is directly fixed to the top wall of the vacuum chamber 60 (see FIG. 3) and that (ii) the shadow mask 81 is fixed to one of the inner walls of the vacuum chamber 60 by the mask holding member not illustrated. The present embodiment may alternatively be arranged such that (i) the top wall of the vacuum chamber 60 is provided with top windows in correspondence with the emission holes 86 of the vapor deposition source 85 and that (ii) the body of the vapor deposition source 85 is positioned (placed) outside the vacuum chamber 60. Regardless of the arrangement, the mask unit 80 simply needs to be arranged such that the shadow mask 81 and the vapor deposition source 85 are fixed in position relative to each other.

The present embodiment is, as illustrated in FIGS. 17 and 18, arranged such that the vapor deposition source 85 and the shadow mask 81 are provided above the film formation substrate 200. This causes vapor deposition particles to be emitted downward from the emission holes 86 of the vapor deposition source 85.

The vapor deposition source 85 includes a mechanism for emitting vapor deposition particles downward. Vapor deposition particles emitted by the vapor deposition source 85 pass through the openings 82 of the shadow mask 81 to be deposited in the vapor deposition region 210 (see FIG. 1) of the film formation substrate 200 which is passing a position below the shadow mask 81.

More specifically, while the vapor deposition method described in Embodiment 1 above carries out vapor deposition by depo-up, the present embodiment is arranged such that, as described above, (i) the vapor deposition source 85 is provided above the film formation substrate 200 and that, as described above, (ii) vapor deposition particles pass through the openings 82 of the shadow mask 81 to be deposited onto the film formation substrate 200 downward from above (that is, down deposition; hereinafter referred to as "depo-down").

Embodiment 1 used, as the substrate holding member 71, an electrostatic chuck to adhere the film formation substrate 200 thereto in order to (i) prevent self-weight bending of the film formation substrate 200 and (ii) maintain a fixed distance between the film formation substrate 200 and the shadow mask 81. In contrast, the present embodiment, which carries out vapor deposition by depo-down as described above, simply needs to, as described above, use a substrate stage or a roller to hold the film formation substrate 200 in a manner sufficient to prevent self-weight bending thereof.

The present embodiment can thus simplify the structure of the vapor deposition device 50 and eliminate the risk of a large-sized film formation substrate 200 dropping due to adhesion defect. The present embodiment can consequently increase stability in operation of the vapor deposition device 50 and improve yield.

Embodiment 4

The present embodiment is described below mainly with reference to (a) through (c) of FIG. 19.

The present embodiment mainly deals with how the present embodiment is different from Embodiments 1 through 3 above. Constituent elements of the present embodiment that are identical in function to their respective equivalents described in Embodiments 1 through 3 are each assigned the same reference numeral, and are not described here.

Figure 19:
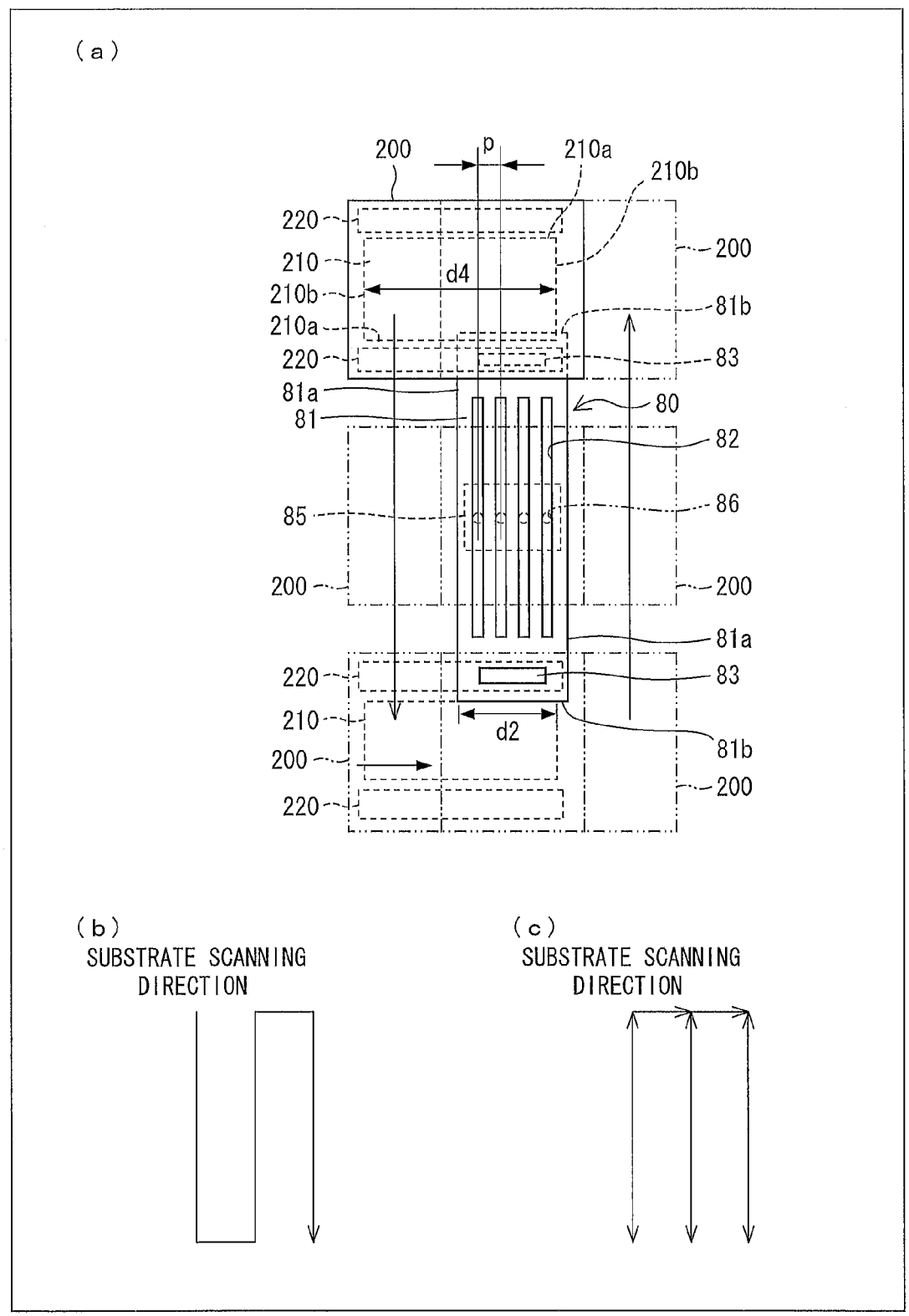
FIG. 19 (a) is a plan view illustrating a positional relationship observed, when vapor deposition is carried out, between a mask unit and a film formation substrate inside a vacuum chamber of a vapor deposition device according to Embodiment 4 of the present invention, and (b) and (c) are each a diagram illustrating an example substrate scanning direction with an arrow.

(a) of FIG. 19 is a plan view illustrating a positional relationship, observed during vapor deposition, between the mask unit 80 and the film formation substrate 200 inside the vacuum chamber 60 of the vapor deposition device 50 of the present embodiment. (b) and (c) of FIG. 19 are each a diagram illustrating an example substrate scanning direction with an arrow. (a) of FIG. 19 omits some constituent elements.

The present embodiment differs from Embodiment 1, as illustrated in (a) of FIG. 19, in that the film formation substrate 200 is scanned in the long-axis direction of the openings 82 of the shadow mask 81 in the mask unit 80.

More specifically, the present embodiment is arranged such that in S12 indicated in FIG. 10, the alignment is carried out with use of the alignment markers 84 of the shadow mask 81 in such a manner that the substrate scanning direction is identical to the long-axis direction of the openings 82 of the shadow mask 81.

The present embodiment is thus arranged, as illustrated in (a) of FIG. 19, to include alignment marker sections 220 provided (i) outside the vapor deposition region 210 of the film formation substrate 200 and (ii) along the direction perpendicular to the substrate scanning direction, that is, along each long side 210a of the vapor deposition region 210.

The present embodiment is, as well as Embodiment 1 above, arranged such that the openings 82 are each in the shape of a stripe extending along each long side 81a, that is, along the long-axis direction of the shadow mask 81.

The present embodiment is thus arranged such that in S13 indicated in FIG. 10, the film formation substrate 200 is held by the substrate holding member 71 in a state in which the film formation substrate 200 is rotated 90° as compared to that of Embodiment 1 above, that is, in such a manner that the long-axis direction of the film formation substrate 200 is identical to the short-axis direction of the shadow mask 81.

The present embodiment is arranged such that, as illustrated in, for example, (a) through (c) of FIG. 19, the film formation substrate 200 is first moved relative to the shadow mask 81 along a first side (short side 210b) of the vapor deposition region 210 of the film formation substrate 200, and is then moved relative to the shadow mask 81 along a second side (long side 210a) of the vapor deposition region 210 which second side is orthogonal to the first side.

The present embodiment is arranged such that after S13 indicated in FIG. 10, the film formation substrate 200 is moved, as a vapor deposition step, relative to the shadow mask 81 alternately along a first side of the vapor deposition region 210 of the film formation substrate 200 and along a second side of the vapor deposition region 210 which second side is orthogonal to the first side (zigzag movement; zigzag scan).

The present embodiment carries out a sufficient alignment before a substrate scan and carries out no alignment during a substrate scan.

The film formation substrate 200 includes, as illustrated in (a) of FIG. 19, two alignment marker sections 220 that are so aligned along the substrate scanning direction as to sandwich the vapor deposition region 210 of the film formation substrate 200.

The description below, for convenience of explanation, uses (i) the term "first alignment marker section 220" to refer to one of the two alignment marker sections 220 which is located upstream (that is, on the start-end side) in the substrate scanning direction at the start of a scan illustrated with a solid line in (a) of FIG. 19 and (ii) the term "second alignment marker section 220" to refer to the other alignment marker section 220.

In the present embodiment, the film formation substrate 200 and the shadow mask 81 are first so aligned with each other, as indicated by a solid line in FIG. 19, that the vapor deposition region 210 of the film formation substrate 200 (i) lies outside the vapor deposition region of the shadow mask 81 and thus (ii) overlaps none of the openings 82 of the shadow mask 81.

Specifically, the alignment is first carried out by using (i) as a start-end marker, an alignment marker 221 in the first alignment marker section 220 of the film formation substrate 200 and (ii) an alignment marker 84 in an alignment marker section 83 of the shadow mask 81 which alignment marker section 83 (hereinafter referred to as "first alignment marker section 83" for convenience of explanation) faces the first alignment marker section 220.

The present embodiment next scans the film formation substrate 200 along the long-axis direction of the shadow mask 81 (that is, the short-axis direction of the film formation substrate 200) as indicated by a chain double-dashed line and an arrow in (a) of FIG. 19.

The above operation forms the above-described stripe-shaped vapor deposition film 211, through the openings 82 of the shadow mask 81, on the vapor deposition region 210 of the film formation substrate 200 in the direction as rotated 90° from that of Embodiment 1.

Then, the vapor deposition region 210 of the film formation substrate 200 finishes passing the openings 82 of the shadow mask 81, so that the film formation substrate 200 is scanned up to a position outside the vapor deposition region 210 as illustrated at the bottom portion of (a) of FIG. 19. The present embodiment next carries out another alignment with use of alignment markers 221 and 84 in respective second alignment marker sections 220 and 83 that are opposite respectively from the above first alignment marker sections 220 and 83.

The present embodiment then, as indicated by an arrow and a chain double-dashed line in (a) and (b) of FIG. 19, shifts the film formation substrate 200 along the short-axis direction of the shadow mask 81 by using (i) as a rear-end marker, the alignment marker 221 in the second alignment marker section 220 and (ii) the alignment marker 84 in the second alignment marker section 83. The present embodiment next carries out an alignment by using (i) as a start-end marker, the alignment marker 221 in the second alignment marker section 220, which is used as such when the film formation substrate 200 is shifted along the short-axis direction of the shadow mask 81 as described above, and (ii) the alignment marker 84 in the second alignment marker section 83.

The present embodiment then, as illustrated in (a) and (b) of FIG. 19, scans the film formation substrate 200 along the opposite direction (that is, along the direction opposite to the substrate scanning direction used for the first time) to further scan the film formation substrate 200 with respect to a region for which no vapor deposition has been carried out.

In the case where vapor deposition is carried out a plurality of times with respect to an identical region by a reciprocating scan, vapor deposition is repeated, as indicated by an arrow in (c) of FIG. 19, with respect to such an identical region along the long-axis direction of the shadow mask 81 with the substrate scanning direction reversed each time. Such a reciprocating scan forms, in a partial region of the vapor deposition region 210, a vapor deposition film 211 having a desired film thickness (completion of an n-th scan). The present embodiment then (i) shifts the film formation substrate 200 along the short-axis direction of the shadow mask 81 as described above, and (ii) for an (n+1)th time, scans the film formation substrate 200, as in the n-th scan, with respect to a region for which no vapor deposition has been carried out. Repeating the above operation forms a stripe-shaped vapor deposition film 211 throughout the entire vapor deposition region 210 of the film formation substrate 200.

The present embodiment thus makes it possible to form, throughout the entire vapor deposition region 210 of the film formation substrate 200, a vapor deposition film 211 with a desired film thickness by using a shadow mask 81 that is smaller in width (that is, the width d2 of each short side 81b) along the direction perpendicular to the substrate scanning direction than the width (in the present embodiment, the width d4 of each long side 210a extending in parallel to each short side 81b of the shadow mask 81) of the vapor deposition region 210 of the film formation substrate 200 along the direction perpendicular to the substrate scanning direction.

The present embodiment consequently makes it possible to (i) downsize a shadow mask 81 further and also (ii) use a shadow mask 81 of which each side is smaller in width than any side of the vapor deposition region 210 of the film formation substrate 200.

The present embodiment merely requires the film formation substrate 200 to stop momentarily when the substrate scanning direction is reversed (switched), and carries out vapor deposition even while the film formation substrate 200 is in motion. The present embodiment thus does not require a long tact time.

Embodiment 5

The present embodiment is described below mainly with reference to FIG. 20.

The present embodiment mainly deals with how the present embodiment is different from Embodiments 1 through 4 above. Constituent elements of the present embodiment that are identical in function to their respective equivalents described in Embodiments 1 through 4 are each assigned the same reference numeral, and are not described here.

Figure 20:
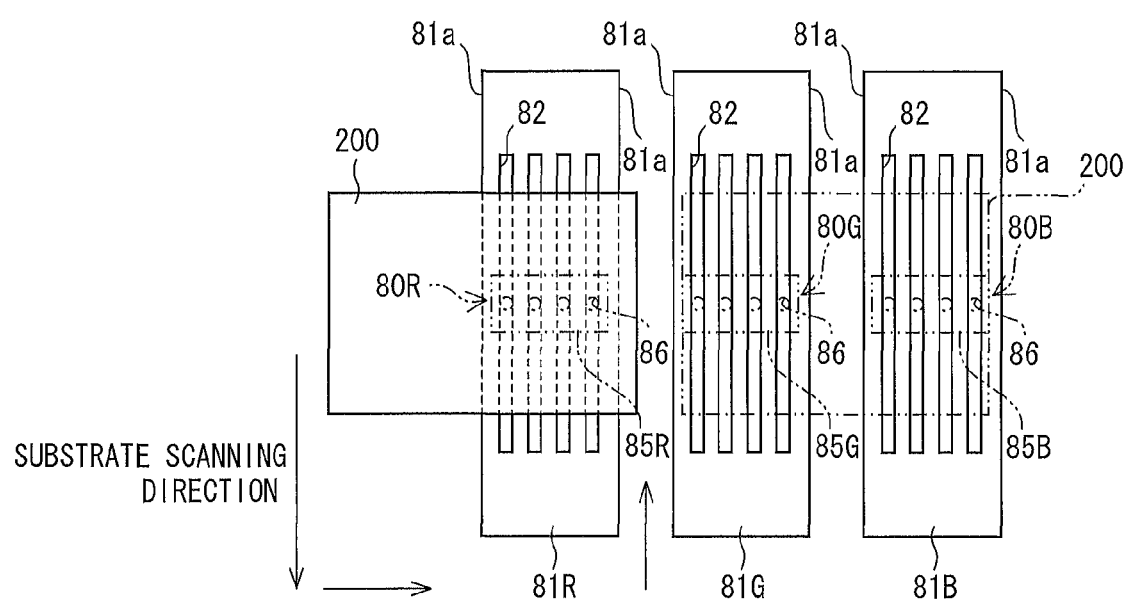
FIG. 20 is a plan view illustrating a positional relationship observed, when vapor deposition is carried out, between a mask unit and a film formation substrate inside a vacuum chamber of a vapor deposition device according to Embodiment 5 of the present invention.

FIG. 20 is a plan view illustrating a positional relationship, observed during vapor deposition, between the mask unit 80 and the film formation substrate 200 inside the vacuum chamber 60 of the vapor deposition device 50 of the present embodiment. FIG. 20 omits some constituent elements.

The vapor deposition device 50 of the present embodiment differs from that of Embodiment 4 above in that, as illustrated in FIG. 20, (i) it includes a plurality of mask units 80 in a single vacuum chamber 60 and (ii) the mask units 80 include respective rectangular shadow masks 81 (each in the shape of a belt) arranged along the short-axis direction of the shadow masks 81.

Specifically, the vacuum chamber 60 contains three mask units as the mask units 80: (i) a mask unit (hereinafter referred to as "mask unit 80R") for forming the luminous layer 23R, (ii) a mask unit (hereinafter referred to as "mask unit 80G") for forming the luminous layer 23G, and (iii) a mask unit (hereinafter referred to as "mask unit 80B") for forming the luminous layer 23B.

The mask unit 80R includes (i) as a shadow mask 81, a shadow mask (hereinafter referred to as "shadow mask 81R") for forming the luminous layer 23R and (ii) as a vapor deposition source 85, a vapor deposition source (hereinafter referred to as "vapor deposition source 85R") fixed in position relative to the shadow mask 81R.

Similarly the mask unit 80G includes (i) as a shadow mask 81, a shadow mask (hereinafter referred to as "shadow mask 81G") for forming the luminous layer 23G and (ii) as a vapor deposition source 85, a vapor deposition source (hereinafter referred to as "vapor deposition source 85G") fixed in position relative to the shadow mask 81G.

The mask unit 80B includes (i) as a shadow mask 81, a shadow mask (hereinafter referred to as "shadow mask 81B") for forming the luminous layer 23B and (ii) as a vapor deposition source 85, a vapor deposition source (hereinafter referred to as "vapor deposition source 85B") fixed in position relative to the shadow mask 81B.

The respective shadow masks 81R, 81G, and 81B of the mask units 80R, 80G, and 80B are so arranged as to have their long sides 81a juxtaposed to one another.

The present embodiment is, as well as Embodiment 4 above, arranged such that the alignment in S12 is carried out in such a manner that the substrate scanning direction is identical to the long-axis direction of the openings 82 of each of the shadow masks 81R, 81G, and 81B.

The present embodiment is further arranged such that (i) in S13, the film formation substrate 200 is held by the substrate holding member 71, as in Embodiment 4 above, in a state in which the film formation substrate 200 is rotated 90° as compared to that of Embodiment 1 above, that is, in such a manner that the long-axis direction of the film formation substrate 200 is identical to the short-axis direction of each of the shadow masks 81R, 81G, and 81B, and (ii) after S13, a zigzag scan involving a zigzag movement is carried out as a vapor deposition step as in Embodiment 4 above.

FIG. 20 illustrates a state in which the film formation substrate 200 lies across the shadow masks 81G and 81B.

In the present embodiment, in the case where the scan rate and the reciprocating number for each color are each adjusted so as to be equal among the colors, it is possible to deposit, onto an identical film formation substrate 200 located across a plurality of shadow masks 81, a plurality of organic layers (for example, at least two of the luminous layers 23R, 23G, and 23B) simultaneously as illustrated in FIG. 20.

With any conventional vapor deposition device and vapor deposition method, in a case where, for example, a discriminative application formation is carried out for a luminous layer of each color, it has been necessary to either (i) prepare a vacuum chamber for each luminous layer or (ii) switch (replace) shadow masks and vapor deposition sources in an identical vacuum chamber to form individual luminous layers separately in a time-series sense (that is, not simultaneously).

In contrast, the present embodiment, which can carry out vapor deposition of a plurality of organic layers simultaneously as described above, can form all patterns of the luminous layers 23R, 23G, and 23B simply in a single vacuum chamber 60 by containing the shadow masks 81R, 81G, and 81B for the respective colors in such a single vacuum chamber 60 as described above.

Further, the present embodiment, which carries out vapor deposition of a plurality of organic layers simultaneously as described above, can reduce a tact time of the vapor deposition device 50.

Embodiment 6

The present embodiment is described below mainly with reference to FIG. 21.

The present embodiment mainly deals with how the present embodiment is different from Embodiments 1 through 5 above. Constituent elements of the present embodiment that are identical in function to their respective equivalents described in Embodiments 1 through 5 are each assigned the same reference numeral, and are not described here.

FIG. 21 is a plan view illustrating a relation between a substrate scanning direction and the long-axis direction of the openings 82 of the shadow mask 81 in the mask unit 80 of the present embodiment.

The present embodiment is, as well as Embodiment 4 above, arranged such that in S13, the film formation substrate 200 is held by the substrate holding member 71 in a state in which the film formation substrate 200 is rotated 90° as compared to that of Embodiment 1 above, that is, in such a manner that the long-axis direction of the film formation substrate 200 is identical to the short-axis direction of each of the shadow masks 81R, 81G, and 81B.

While Embodiment 4 above carries out a zigzag scan, the present embodiment scans the film formation substrate 200, as in Embodiment 1, along the short-axis direction of the shadow mask 81 as illustrated in FIG. 20.

The present embodiment thus, instead of continuously moving the film formation substrate 200, (i) forms, in a partial region of the vapor deposition region 210 of the film formation substrate 200, a vapor deposition film 211 in the shape of the openings 82 of the shadow mask 81 and then (ii) moves (shifts) the film formation substrate 200 relative to the shadow mask 81 along the short-axis direction of the shadow mask 81 by a predetermined width, for example, a width equal to the product of (i) the pitch p of the openings 82 and (ii) the number of the openings 82, so that the openings 82 coincide with a region for which no vapor deposition has been carried out. The present embodiment next (i) holds the film formation substrate 200 to cause it to be stationary in the above state and then (ii) forms, in such a region for which no vapor deposition has been carried out, a vapor deposition film 211 in the shape of the openings 82 of the shadow mask 81. In the present embodiment, the expression "cause . . . to be stationary" refers to stopping a relative movement of the shadow mask 81 and the film formation substrate 200 along the scanning direction, that is, stopping the scan.

The present embodiment thus uses, as the vapor deposition source 85, a planar vapor deposition source including emission holes 86 arranged two-dimensionally. In the present embodiment, the emission holes 86 of the vapor deposition source 85 are provided to simultaneously correspond to all the openings 82 of the shadow mask 81.

More specifically, the present embodiment is arranged such that (i) each opening 82 corresponds to a plurality of emission holes 86 so that vapor deposition particles can be deposited simultaneously through all the openings 82 of the shadow mask 81 and that (ii) the emission holes 86 are arranged along the long-axis direction of the openings 82.

The present embodiment, as described above, operates in such an order as follows: (i) carrying out vapor deposition, (ii) slightly shifting the film formation substrate and then holding it to cause it to be stationary, (iii) carrying out vapor deposition, (iv) slightly shifting the film formation substrate and then holding it to cause it to be stationary, (v) carrying out vapor deposition . . . . The present embodiment, as such, alternates (i) vapor deposition (film formation) carried out in a stationary state, that is, in a state in which the scan is stopped, and (ii) a relative movement. The present embodiment can thus form, throughout the entire vapor deposition region 210 of the film formation substrate 200, a vapor deposition film 211 in the shape of the openings 82 of the shadow mask 81.

The present embodiment, as described above, intermittently carries out a scan involving a relative movement of the shadow mask 81 and the film formation substrate 200.

Even in such a case where a scan involving a relative movement of the shadow mask 81 and the film formation substrate 200 is carried out intermittently, it is preferable to continuously carry out (i) an alignment between the shadow mask 81 and the film formation substrate 200 relative to each other, that is, an alignment adjustment, and (ii) an adjustment (gap control) of the substrate-mask gap. The vapor deposition itself thus does not need to be stopped.

In other words, the present embodiment preferably continuously carries out an alignment adjustment and an adjustment of the substrate-mask gap even when a scan of the shadow mask 81 and the film formation substrate 200 is stopped.

The present embodiment, which continuously carries out an alignment and a gap control as described above, eliminates the need to, even in a case where (i) a film formation in a stationary state is stopped by, for example, closing the shutter 89 and (ii) a subsequent scan step (for example, a substrate scan step) is started, start an alignment and a gap control again from the beginning in a subsequent stationary state. The present embodiment can thus reduce the tact time.

Embodiment 7

The present embodiment is described below mainly with reference to FIGS. 24 and 25.

The present embodiment mainly deals with how the present embodiment is different from Embodiments 1 through 6 above. Constituent elements of the present embodiment that are identical in function to their respective equivalents described in Embodiments 1 through 6 are each assigned the same reference numeral, and are not described here.

Figure 24:
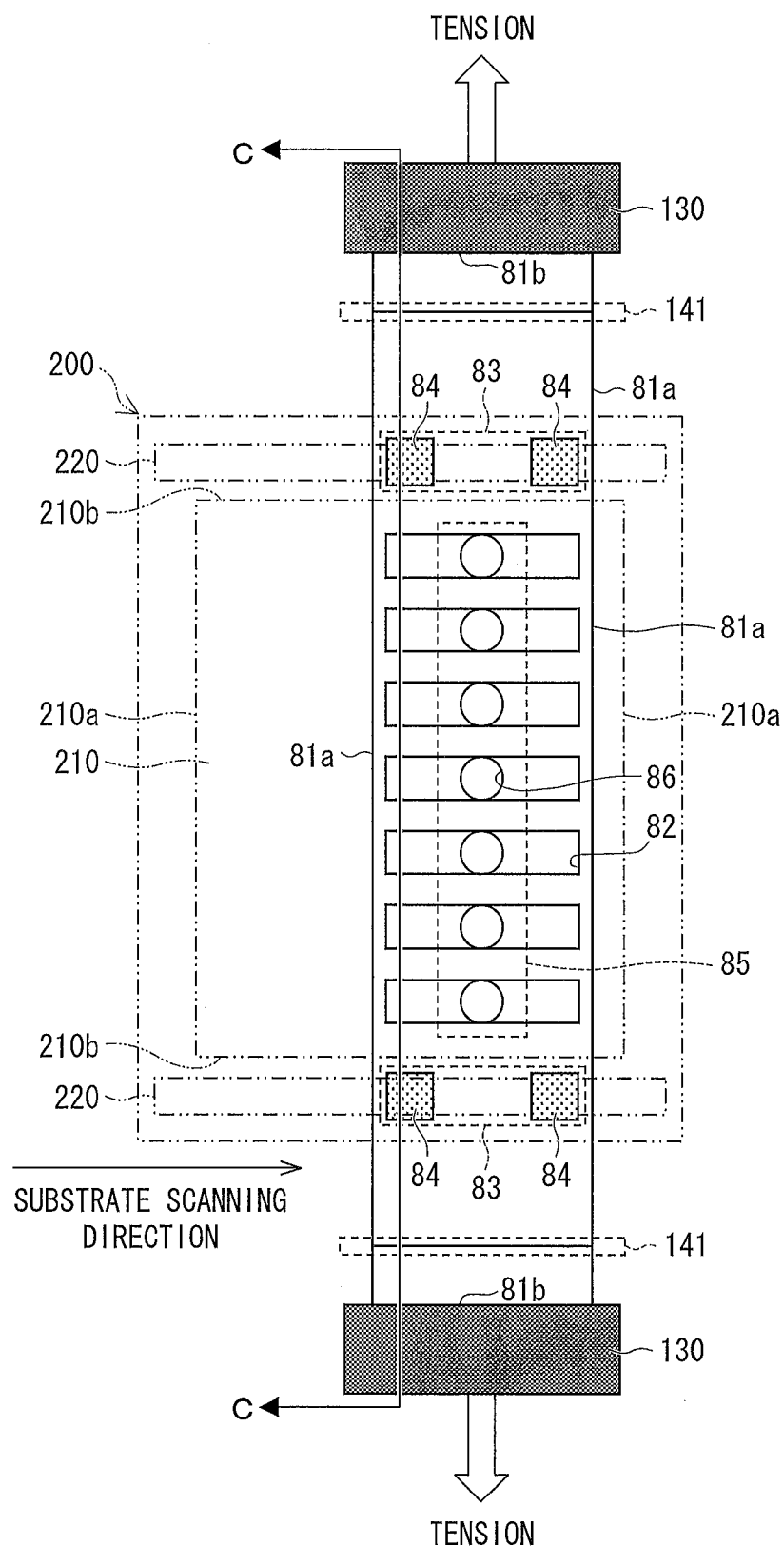
FIG. 24 is a plan view illustrating a film formation substrate and a mask unit inside a vacuum chamber of a vapor deposition device according to Embodiment 7 of the present invention, the plan view being taken from a back surface side of the film formation substrate.

FIG. 24 is a plan view of the film formation substrate 200 and the mask unit 80 in the vacuum chamber 60 of the vapor deposition device 50 of the present embodiment, as viewed from a back surface side of the film formation substrate 200. FIG. 25 is a cross-sectional view schematically illustrating a configuration of a main part provided inside the vacuum chamber 60 of the vapor deposition device 50 of the present embodiment. FIG. 25 illustrates a cross section of the vapor deposition device 50 which cross section is taken along line C-C in FIG. 24. As in the embodiments above, FIGS. 24 and 25 illustrating the present embodiment omit some constituent elements, such as openings of the shadow mask 81 and a vapor deposition film, for convenience of illustration.

The present embodiment mainly describes an arrangement of the mask unit 80.

Figure 25:
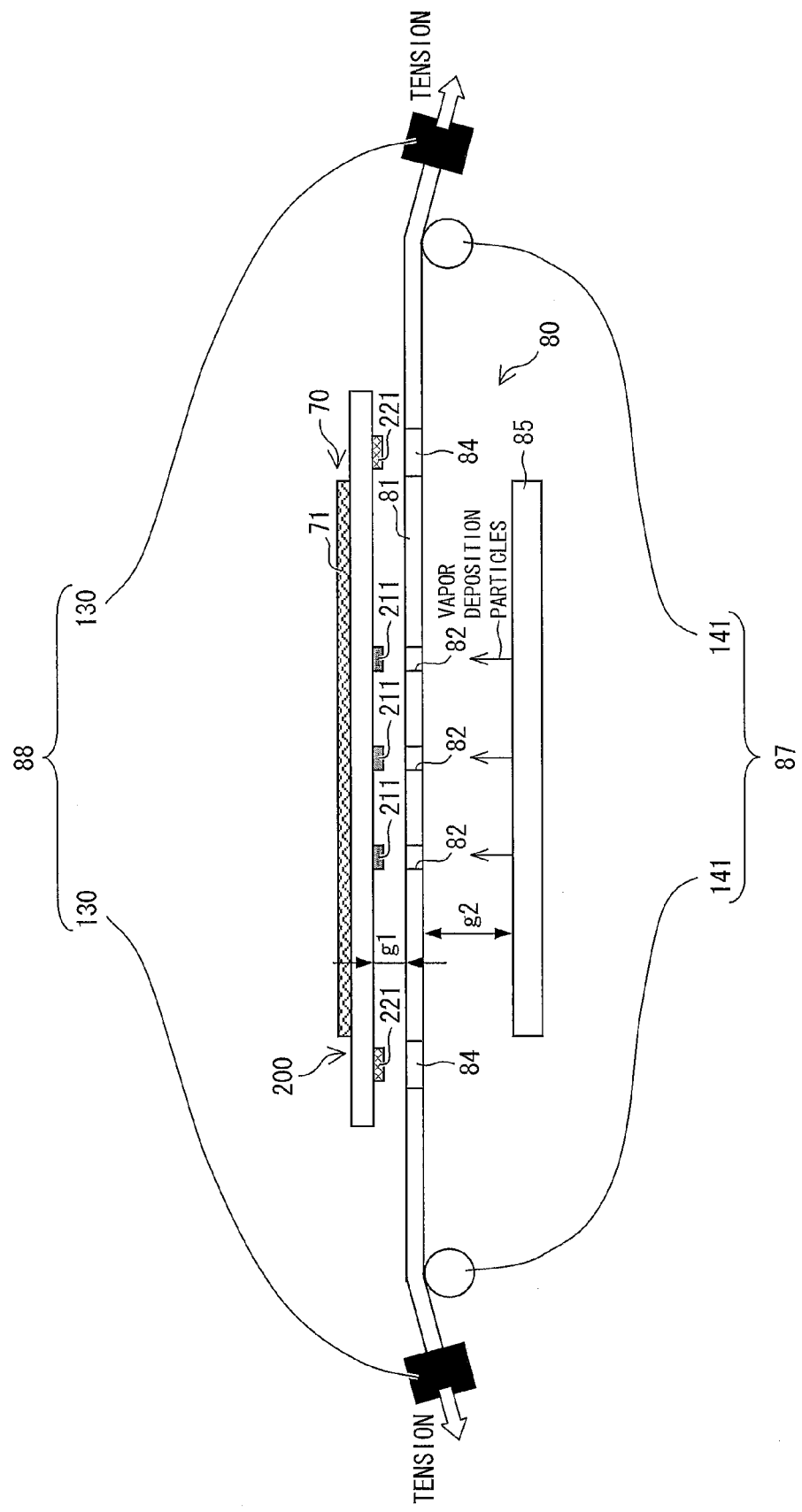
FIG. 25 is a cross-sectional view schematically illustrating a configuration of a main part inside the vacuum chamber of the vapor deposition device according to Embodiment 7 of the present invention.

The mask unit 80 of the present embodiment, as illustrated in FIGS. 24 and 25, includes a mask tension mechanism 88 that includes mask clamps 130 (clamps; clamp means) for fixing (attaching) the shadow mask 81 to a device (that is, the vapor deposition device 50) in a state in which the shadow mask 81 is under tension. The mask clamps 130 are provided at opposite end sections of the shadow mask 81 which end sections (that is, the respective short sides 81$b$ and 81$b$) are juxtaposed along the long-side direction of the shadow mask 81.

The mask unit 80 further includes, as the mask holding member 87 for supporting the shadow mask 81, a mask fixing stand that includes mask supporting sections 141 and 141 (mask supporting bars; mask holding stands) at respective portions abutting the shadow mask 81. In other words, the mask supporting sections 141 and 141 of the present embodiment each function as a member abutting the shadow mask 81.

The mask holding member 87 of the present embodiment, as well as the embodiments above, may be fixed to a top wall or peripheral wall of the vacuum chamber 60, or to a bottom wall of the vacuum chamber 60 by a prop (strut; not shown) extending from the bottom wall. Thus, the mask supporting sections 141 and 141 may each be fixed to the top wall or peripheral wall of the vacuum chamber 60, or to the bottom wall of the vacuum chamber 60 by a prop (strut; not shown) extending from the bottom wall. In other words, the mask supporting sections 141 and 141 may themselves be each a supporting member (mask holding means) for supporting the shadow mask 81.

In the case where the mask fixing stand (mask holding member 87) is a holder for holding and fixing the shadow mask 81 and the vapor deposition source 85, the mask supporting sections 141 and 141 may each be a part of a holder for holding and fixing the vapor deposition source 85. In other words, the mask supporting sections 141 and 141 may each be fitted to a holder for holding and fixing the vapor deposition source 85.

The mask clamps 130 and 130 may thus each serve to (i) fix the shadow mask 81 to, for example, an inner wall of the vacuum chamber 60 in a state in which the shadow mask 81 is under tension or (ii) fix the shadow mask 81 to the mask holding member 87 such as a holder.

The mask clamps 130 and 130 are simply required to serve to fix the shadow mask 81 to a device in a state in which the shadow mask 81 is under tension, and are thus not particularly limited in terms of material or shape.

The mask clamps 130 and 130 thus simply need to be arranged such that (i) the shadow mask 81 to which the mask clamps 130 and 130 are fitted has, in a state in which the shadow mask 81 is under no tension, an overall length that is smaller than the distance (length) of a straight line that extends through the mask supporting sections 141 and 141 and that connects sections provided inside the device to fix the shadow mask 81 and (ii) applying tension to the mask clamps 130 and 130 lays the shadow mask 81, in a tensioned state, across the sections provided inside the device to fix the shadow mask 81. The above expression "that extends through the mask supporting sections 141 and 141 and that connects sections provided inside the device to fix the shadow mask 81" describes the space between positions at which the shadow mask 81 is fixed in the vapor deposition device 50.

The mask tension mechanism 88 is, as illustrated in FIG. 25, preferably arranged to use the mask clamps 130 and 130 to apply tension to the shadow mask 81 in directions that are oblique with respect to the shadow mask 81.

With reference to FIGS. 24 and 25, the mask supporting sections 141 and 141 are each provided, for example, (i) below the shadow mask 81 (that is, on a side of the shadow mask 81 which side is opposite to a surface of the shadow mask 81 which surface faces the film formation substrate 200) (ii) in a region (specifically, in the vicinity of each end section of the shadow mask 81 which end section is present along the long-side direction of the shadow mask 81) between the corresponding mask clamp 130 and a vapor deposition region, that is, a region in which openings are provided (that is, the openings 82).

In the example illustrated in FIGS. 24 and 25, the above arrangement allows the mask clamps 130 and 130 to apply tension to the shadow mask 81 in obliquely downward directions with use of each of the mask supporting sections 141 and 141 as a fulcrum.

In other words, the mask supporting sections 141 and 141 serve to, when the shadow mask 81 is placed thereon, (i) hold the shadow mask 81 in a state in which the shadow mask 81 and the film formation substrate 200 are parallel to each other and (ii) each function as a fulcrum when tension is applied to the shadow mask 81.

As described above, the present embodiment thus (i) includes, as the mask tension mechanism 88, a mask fixing stand including the mask supporting sections 141 and 141 and (ii) applies tension to the shadow mask 81 in obliquely downward directions, to prevent waviness in the shadow mask 81. This arrangement makes it possible to align the film formation substrate 200 and the shadow mask 81 with each other accurately. The above arrangement, which reduces waviness in the shadow mask 81 for the vapor deposition region 210 as well, can reduce mispositioning in vapor deposition onto the film formation substrate 200.

As described above, in the present embodiment as well as Embodiment 1 above, aligning the film formation substrate 200 and the shadow mask 81 with each other can adjust the position of vapor deposition onto the film formation substrate 200.

Further, in the present embodiment as well, the alignment between the film formation substrate 200 and the shadow mask 81 may be carried out by (i) a method of placing the shadow mask 81 at a home position set for the vapor deposition device 50 and aligning the film formation substrate 200 with the shadow mask 81 serving as a basis (mask-based) or (ii) a method of aligning the shadow mask 81 with the film formation substrate 200 serving as a basis method (substrate-based).

The present embodiment, as described above, uses the mask clamps 130 to adjust the position and tension of the shadow mask 81.

Thus, in the present embodiment, moving the mask clamps 130 to respective home positions (that is, default positions set for the device) can adjust (place) the shadow mask 81 itself to its home position.

The present embodiment, as well as the embodiments above, can carry out an alignment between the film formation substrate 200 and the shadow mask 81, as in Embodiment 1 above, with use of the alignment markers 84 and 221. In the case of carrying out, as a pattern formation for the vapor deposition film 211, a pattern formation for organic EL layers such as the luminous layers 23R, 23G, and 23B as described above, the present embodiment can carry out discriminative application vapor deposition of such organic EL layers accurately.

The present embodiment, as well as the embodiments above, preferably scans an identical substrate once or a plurality of times until a formed film has a target film thickness.

In the present embodiment as well as the embodiments above, the substrate position is desirably corrected, as described in Embodiment 1 above, with use of the alignment markers 84 and 221 before the film formation substrate 200 enters a region (vapor deposition area) in which vapor deposition particles from the vapor deposition source 85 are deposited.

Thus, in the present embodiment as well as the embodiments above, the alignment markers 221 (that is, the alignment marker sections 220) are preferably provided, as illustrated in FIG. 24, such that (i) an alignment marker 221 is located away, upstream in the substrate scanning direction, from the vapor deposition region 210, and that (ii) in a case where reciprocating vapor deposition is carried out, an alignment marker 221 is located away, downstream in the substrate scanning direction, from the vapor deposition region 210.

In the case where it is impossible to locate the alignment markers 221 (that is, the alignment marker sections 220) away in the scanning direction from the vapor deposition region 210 for the purpose of securing the vapor deposition region 210, it is possible to, as described above, locate the alignment markers 84 of the shadow mask 81 outside relative to the openings 82 of the shadow mask 81 by decreasing the opening width of the openings 82 of the shadow mask 81 along the scanning direction. In other words, it is also possible to, as described above, adjust the alignment position on the shadow mask 81 side by relatively positioning an alignment marker of the shadow mask 81 outside the vapor deposition area for the vapor deposition source 85.

In the case where the alignment markers 84 of the shadow mask 81 each have a width along the substrate scanning direction which width is smaller than the width of the shadow mask 81 along the substrate scanning direction as illustrated in (b) and (c) of FIG. 5, an alignment marker 84 is, as illustrated in FIG. 24, preferably located, for the same reason as above, at an end of the shadow mask 81 which end is located downstream in the direction in which the substrate makes its entry (that is, an end of the shadow mask 81 which end is located upstream in the substrate scanning direction). In the case where reciprocating vapor deposition is carried out, alignment markers 84 are preferably located at both ends along the substrate scanning direction (that is, at the four corners).

In the present embodiment as well as the embodiments above, the mask tension mechanism 88 for applying tension to the shadow mask 81 is provided, as described above, not as a jig (mask jig; fitting) for the film formation substrate 200, but as a part (mechanism) of the vapor deposition device 50.

Thus, the present embodiment, as well as the embodiments above, (i) secures a fixed gap g1 between the film formation substrate 200 and the shadow mask 81 as described above to use a vapor deposition system that does not allow the film formation substrate 200 and the shadow mask 81 to be closely attached to each other, and (ii) includes the mask tension mechanism 88 in the vapor deposition device 50. The present embodiment can thus reduce bending and thermal expansion of the shadow mask 81. Further, the present invention can adjust alignment accuracy for the shadow mask 81 by tension in accordance with a situation occurring during vapor deposition (for example, thermal expansion of the shadow mask 81 and/or finishing accuracy of the film formation substrate 200).

In the present embodiment as well as the embodiments above, the mask tension mechanism 88 desirably has a set minimum tension (MIN) in order to prevent the shadow mask 81 from being bent by tension applied thereto.

The present embodiment describes an example case in which, as described above, the mask holding member 87 (mask fixing stand) includes, as abutting members abutting the shadow mask 81, mask supporting sections 141 and 141 each in the vicinity of an end section of the shadow mask 81 which end section is present along the long-side direction of the shadow mask 81. The present embodiment is, however, not limited to such an arrangement. The mask holding member 87 may alternatively include an abutting member having the shape of a frame surrounding the openings 82 of the shadow mask 81. Even in such a case, the abutting member can not only hold the shadow mask 81 horizontally, but also function as a fulcrum when tension is applied to the shadow mask 81.

Figure 26:
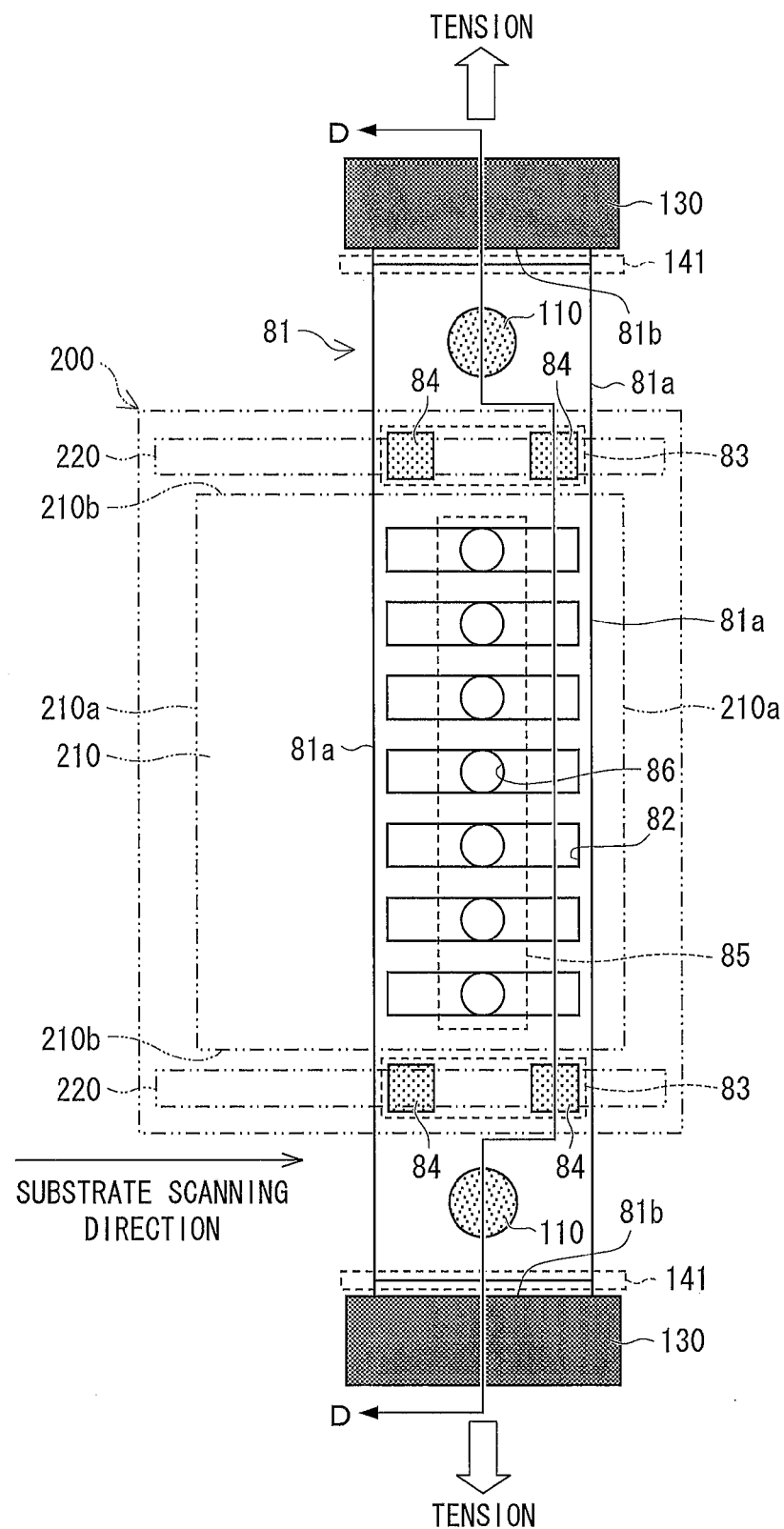
FIG. 26 is a plan view illustrating a film formation substrate and a mask unit inside a vacuum chamber of a vapor deposition device according to Embodiment 8 of the present invention, the plan view being taken from a back surface side of the film formation substrate.

The present embodiment describes an example case in which, as described above, the mask clamps 130 and 130, as illustrated in FIGS. 25 and 26, applies tension to the shadow mask 81 in obliquely downward directions as an example of applying tension to the shadow mask 81 in an oblique direction with use of each of the mask supporting sections 141 and 141 as a fulcrum.

The present embodiment is, however, not limited to such an arrangement. The present embodiment may alternatively be arranged such that abutting members (for example, the mask supporting sections 141 and 141) abutting the shadow mask 81 are provided at respective positions corresponding to an upper portion of each of FIGS. 25 and 26, that is, on a side of the shadow mask 81 which side faces the film formation substrate 200, so that tension is applied in obliquely upward directions.

Tension can be easily applied to the shadow mask 81 by, as described above, applying tension to the shadow mask 81 in oblique directions by using, as fulcrums, abutting members, such as the mask supporting sections 141 and 141 that are themselves fixed and thus do not move, each of which abutting members abuts either a top surface or lower surface of the shadow mask 81.

In the present embodiment, (i) the mask unit 80 includes abutting members such as the mask supporting sections 141 and 141, and (ii) the mask tension mechanism 88 has a mechanism for applying tension to the shadow mask 81 in oblique directions by using, as fulcrums, the abutting members, such as the mask supporting sections 141 and 141, which are included in the supporting member such as the above mask fixing stand. The present embodiment can thus correct parallelism between (i) the mask supporting sections 141 and 141 and (ii) the film formation substrate 200 in order to correct parallelism between the shadow mask 81 and the film formation substrate 200. The abutting members such as the mask supporting sections 141 and 141 are more specifically stated as a supporting member, such as a mask fixing stand, which (i) is fixed and thus does not move and which includes the mask supporting sections 141 and 141. The above correction of parallelism can be carried out more easily and more accurately than precise correction of parallelism of the mask tension mechanism 88 itself, which moves in the back-and-forth direction and the left-and-right direction.

In other words, it is more accurate and easier to (i) correct parallelism between the shadow mask 81 and the film formation substrate 200 by correcting parallelism between the abutting members and the film formation substrate 200 than to (ii) precisely correct parallelism between the shadow mask 81 and the film formation substrate 200 with use of the mask tension mechanism 88, which itself moves in the back-and-forth direction and the left-and-right direction relative to the shadow mask 81.

Thus, in the case where the abutting members abutting either the top surface or lower surface of the shadow mask 81 are each used as a fulcrum as described above, parallelism between the shadow mask 81 and the film formation substrate 200 can be easily and accurately corrected.

Further, since the abutting members such as the mask supporting sections 141 and 141 (more specifically, the correction of parallelism between the abutting members and the film formation substrate 200) governs the correction of parallelism between the shadow mask 81 and the film formation substrate 200, it is unnecessary to, when the shadow mask 81 is replaced, precisely adjust the correction of parallelism between the shadow mask 81 and the film formation substrate 200. This arrangement facilitates replacement of the shadow mask 81.

The correction of parallelism between the shadow mask 81 and the film formation substrate 200 refers to correction of parallelism between (i) a mask surface of the shadow mask 81 and (ii) a substrate surface of the film formation substrate 200 (that is, adjusting the gap g1 between the shadow mask 81 and the film formation substrate 200 so that the gap g1 is uniform).

Embodiment 8

The present embodiment is described below mainly with reference to FIGS. 26 through 30.

The present embodiment deals with how the present embodiment is different from Embodiments 1 through 7 (in particular, Embodiments 1 and 7) above. Constituent elements of the present embodiment that are identical in function to their respective equivalents described in Embodiments 1 through 7 are each assigned the same reference numeral, and are not described here.

Figure 27:
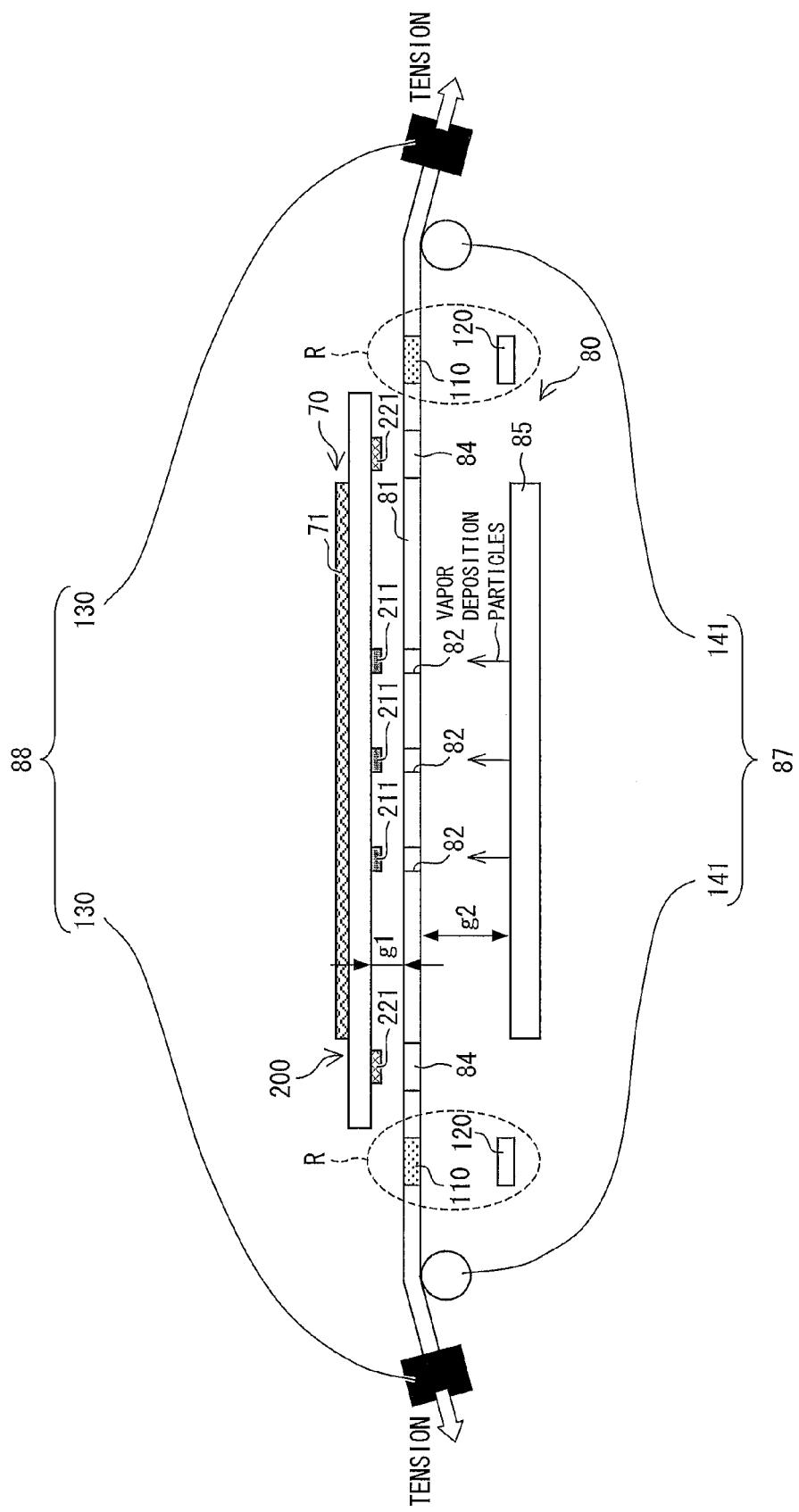
FIG. 27 is a cross-sectional view schematically illustrating a configuration of a main part inside the vacuum chamber of the vapor deposition device according to Embodiment 8 of the present invention.
Figure 29:
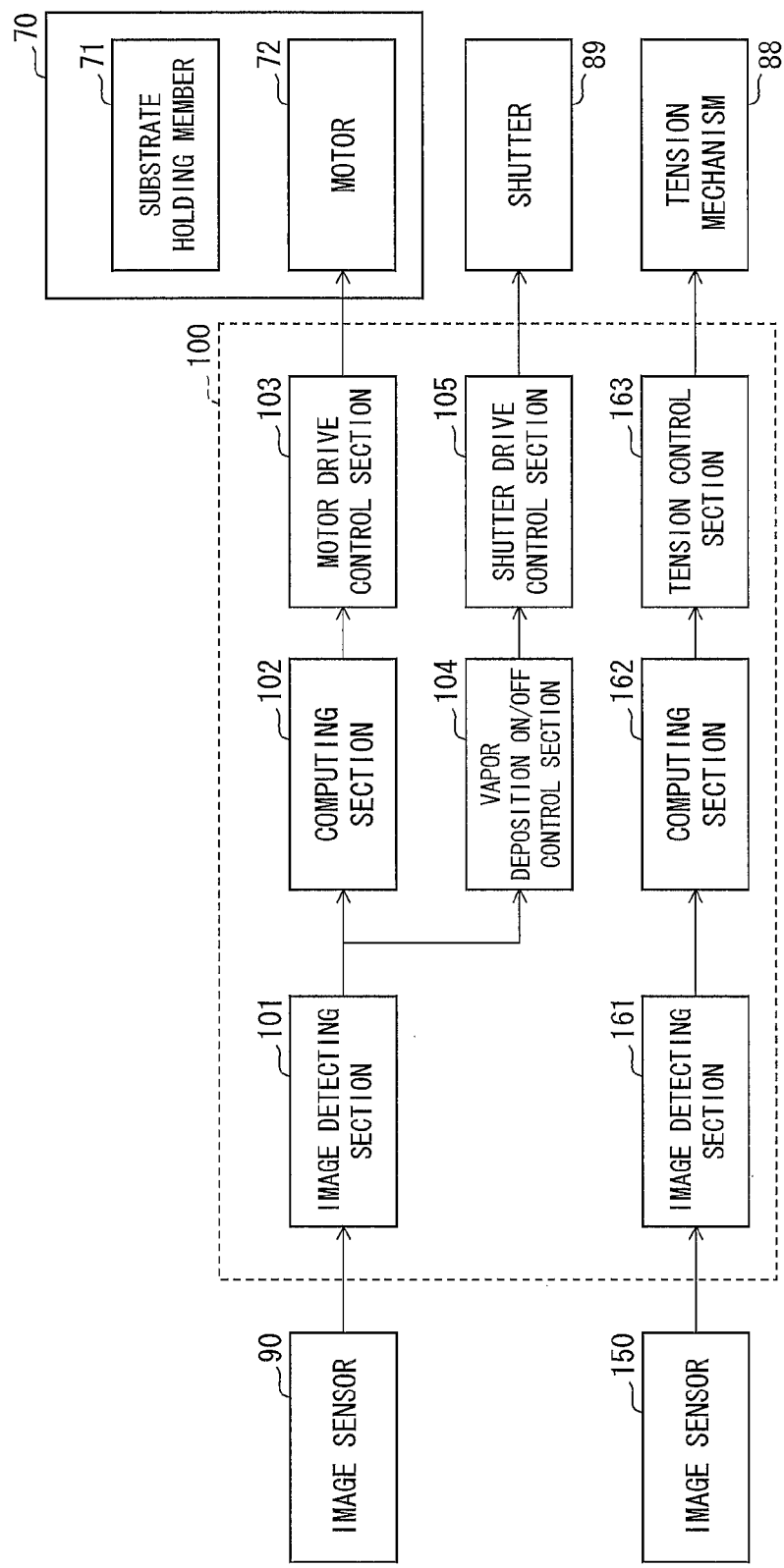
FIG. 29 is a block diagram partially illustrating a configuration of the vapor deposition device according to Embodiment 8 of the present invention.

FIG. 26 is a plan view of the film formation substrate 200 and the mask unit 80 in the vacuum chamber 60 of the vapor deposition device 50 of the present embodiment, as viewed from a back surface side of the film formation substrate 200. FIG. 27 is a cross-sectional view schematically illustrating a configuration of a main part provided inside the vacuum chamber 60 of the vapor deposition device 50 of the present embodiment. FIG. 27 illustrates a cross section of the vapor deposition device 50 which cross section is taken along line D-D in FIG. 26. As in the embodiments above, FIGS. 26 and 27 illustrating the present embodiment omit some constituent elements, such as openings of the shadow mask 81 and a vapor deposition film, for convenience of illustration. FIG. 29 is a block diagram partially illustrating a configuration of the vapor deposition device 50 of the present embodiment.

Figure 28:
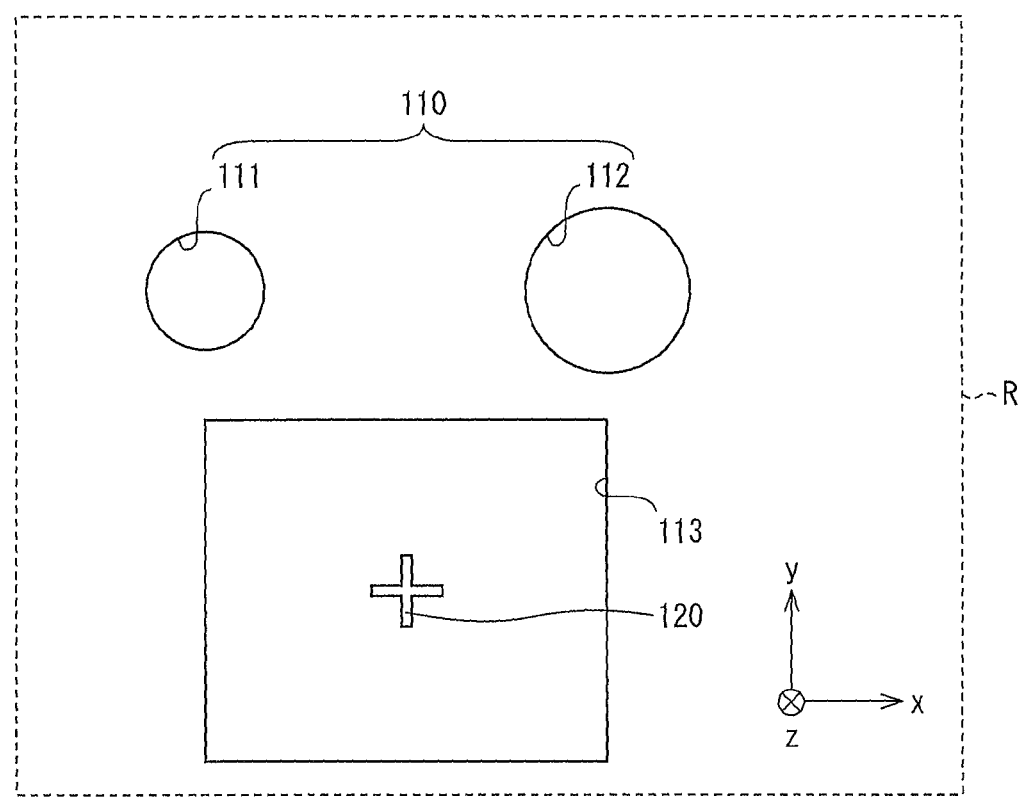
FIG. 28 is a plan view illustrating an absolute alignment of a vapor deposition mask.

The vapor deposition device 50 of the present embodiment, as illustrated in FIG. 27, includes a mask unit 80 that includes, inside the vapor deposition device 50, absolute alignment reference markers 120, each as an alignment marker for an absolute alignment, that correspond to an absolute position (that is, an absolute position for an alignment) of the shadow mask 81 so that the shadow mask 81 can be placed at the absolute position. Further, the shadow mask 81 of the mask unit 80 includes absolute-alignment markers 110 as illustrated in FIGS. 27 and 28. In these respects, the mask unit 80 in the vapor deposition device 50 of the present embodiment differs from that in the vapor deposition device 50 of Embodiment 7 above.

The above absolute position is determined, in advance at a designing stage, in relation to the device on the basis of either (i) the respective positions of the shadow mask 81 and the vapor deposition device 50 relative to each other or (ii) the respective positions of the shadow mask 81 and the vapor deposition source 85 relative to each other, so that no portion of the shadow mask 81 is placed outside the vapor deposition region 210 of the film formation substrate 200.

FIG. 28 is a plan view illustrating an absolute alignment for the shadow mask 81. FIG. 28 is a plan view, taken from above the shadow mask 81, of a region R defined by a dotted line in FIG. 27.

As illustrated in FIG. 28, the mask unit includes in the region R (i) absolute-alignment markers 110, namely alignment markers 111 and 112, and (ii) openings 113 each serving as a window (window section) through which to see an absolute alignment reference marker 120.

The alignment markers 111 and 112 are, for example, two openings: one is larger than the other. The alignment markers 111 and 112 are provided along the substrate scanning direction (that is, each short side 81b of the shadow mask 81) in parallel to the substrate scanning direction.

One of the alignment markers 111 and 112 serves as an alignment center, while the other is used to check a direction (that is, the direction parallel to the substrate scanning direction) in which the substrate scanning direction is parallel to each short side 81b of the shadow mask 81, that is, to the direction along which the belt-shaped openings 82 of the shadow mask 81 each extend.

The direction in which the shadow mask 81 is parallel to the substrate scanning direction can be checked with use of the alignment markers 111 and 112 by a method below.

Specifically, the method first reads center coordinates of each of the alignment markers 111 and 112 with use of an image sensor 150 (second image sensor; alignment observing means; see FIG. 29) including, for example, a CCD as image sensing means (image reading means). The method then adjusts the position of the shadow mask 81 with use of the tension control section 163 (see FIG. 29) so that a parallel line passing through the centers is parallel to the substrate scanning direction.

The above arrangement allows the substrate scanning direction to be parallel to sides of the shadow mask 81 which sides (in the present embodiment, the short sides 81b and 81b) need to be parallel to the substrate scanning direction. In particular, the above arrangement allows the substrate scanning direction to be parallel to sides of each opening 82 extending along the above sides (that is, to sides (opening ends) of each opening 82 of the shadow mask 81 which sides are parallel to the substrate scanning direction).

The absolute-alignment markers 110 (that is, the alignment markers 111 and 112) may be provided at only one of the two sides of the shadow mask 81 which sides are parallel to the substrate scanning direction (in the present embodiment, the short sides 81b and 81b). The absolute-alignment markers 110 are, however, preferably provided at both of the two sides of the shadow mask 81. In the case where the substrate scanning direction is made parallel, with use of the absolute-alignment markers 110 provided at both sides of the shadow mask 81, to the sides of the shadow mask 81 which sides need to be parallel to the substrate scanning direction, the sides of the shadow mask 81 which sides need to be parallel to the substrate scanning direction can be made accurately parallel to the substrate scanning direction.

The present embodiment corrected parallelism (θ adjustment) of the shadow mask 81 by using a plurality of alignment markers as the absolute-alignment markers 110 as described above. The present embodiment is, however, not limited to such an arrangement.

In the case where, for example, an alignment marker out of the absolute-alignment markers 110 which alignment marker serves as an alignment center is adjusted precisely so that (i) the rotation midpoint of the absolute alignment reference marker 120 (that is, the midpoint (center coordinates) of the vapor deposition source 85) coincides, at an identical point (at identical coordinates), with (ii) the midpoint (center coordinates) of the alignment marker out of the absolute-alignment markers 110 which alignment marker serves as an alignment center, the absolute-alignment markers 110 do not necessarily need to include a plurality of alignment markers. Parallelism adjustment of the shadow mask 81 can be carried out even in the case where a single alignment marker serving as an absolute-alignment marker 110 is provided at each of the two sides (in the present embodiment, the short sides 81b and 81b) of the shadow mask which sides are parallel to the substrate scanning direction.

The shadow mask 81 is provided with, in the vicinity of the alignment markers 111 and 112, the above-mentioned opening 113 to read the absolute alignment reference marker 120 with use of the image sensor 150. The absolute alignment reference marker 120 can be seen through the opening 113.

The absolute-alignment markers 110 and the absolute alignment reference marker 120 are aligned with each other with use of one of the alignment markers 111 and 112 as described above.

Specifically, the present embodiment sets in advance the respective relative positions of (i) the absolute alignment reference marker 120 and (ii) an alignment marker out of the alignment markers 111 and 112 which alignment marker serves as an alignment center. The present embodiment thus adjusts the position of the shadow mask 81 to achieve the set value.

In the above regard, the shadow mask is preferably provided with a large aperture so that the absolute alignment reference marker 120 can be seen easily.

Such a large aperture may, however, be deformed when tension is applied to the shadow mask 81.

Thus, the present embodiment is preferably arranged such that (i) in addition to the opening 113 serving as a window through which to see the shadow mask 81, alignment markers 111 and 112 are provided which are smaller than the opening 113 and which are unlikely distorted and (ii) the alignment markers 111 and 112 are thus used respectively as an alignment marker serving as an alignment center and an alignment marker for checking parallelism, so that the shadow mask 81 is adjusted to its absolute position.

The opening 113 may be a single aperture (hole) or a mesh-pattern aperture. In the case where the opening 113 serving as a window as described above is not a single hole but a latticed window (mesh-pattern aperture) that is open to such an extent as to allow the absolute alignment reference marker 120 to be seen, distortion of the window can be prevented.

As described above, the present embodiment provides, as markers to each serve as a reference for placing the shadow mask 81 at the absolute position, (i) the absolute-alignment markers 110 to the shadow mask 81 and (ii) the absolute alignment reference marker 120 to a position in the vapor deposition device 50 which position faces the shadow mask 81. The present embodiment further adjusts the respective positions of an absolute-alignment marker 110 and the absolute alignment reference marker 120 relative to each other. This operation allows the shadow mask 81 to be placed at the absolute position inside the device, and consequently allows the shadow mask 81 to be fixed in position relative to the vapor deposition source 85.

The gap g2 between the vapor deposition source 85 and the shadow mask 81 is desirably as small as possible for, for example, improvement in efficiency of use of the vapor deposition material.

Decreasing the distance between the vapor deposition source 85 and the shadow mask 81, however, increases the temperature of the shadow mask 81, which in turn expands the shadow mask 81 and causes bending (slack) in the shadow mask 81.

The present embodiment thus (i) applies tension to the shadow mask 81 with use of the mask tension mechanism 88 at opposite ends of the shadow mask 81 which opposite ends are juxtaposed along the direction (that is, the long-side direction of the shadow mask 81) perpendicular to the substrate scanning direction, and (ii) before vapor deposition onto the film formation substrate 200, carries out an alignment adjustment with reference to the absolute alignment reference marker 120 so that the shadow mask 81 has its absolute dimensions (designed absolute values).

The above operation allows the shadow mask 81 to be placed at the absolute position, and consequently adjusts the position of the shadow mask 81 relative to the vapor deposition source 85.

In the present embodiment, as illustrated in FIG. 28, the alignment markers 111 and 112 are circular in shape, whereas the opening 113 (window section) is quadrangular in shape. The respective shapes of the alignment markers 111 and 112 and the opening 113 are, however, not limited to the above shapes.

The respective shapes of the alignment markers 111 and 112 and the opening 113 simply need to be shapes that facilitate the alignment and calculation along the parallel direction, and may thus each be any shape such as a quadrangle and a triangle.

In the present embodiment, the alignment marker 111 is an opening that is different in size from the opening of the alignment marker 112. The present embodiment is, however, not limited to such an arrangement.

Nevertheless, since the present embodiment uses one of the alignment markers 111 and 112 as an alignment center as described above, the alignment markers 111 and 112 are preferably different from each other in at least either size or shape in order to (i) make it clear which of the alignment markers 111 and 112 serves as an alignment center and which of the alignment markers 111 and 112 is used for checking parallelism and thus (ii) prevent misrecognition when image detection is carried out with respect to an image captured by the image sensor 150.

The present embodiment describes an example case in which (i) one of the alignment markers 111 and 112 is used as an alignment center for the alignment between the absolute-alignment markers 110 and the absolute alignment reference marker 120, and (ii) the other alignment marker is used as an alignment marker for checking parallelism. The present embodiment is, however, not limited to such an arrangement. The present embodiment may alternatively be arranged such that both the alignment markers are used for the alignment between the absolute-alignment markers 110 and the absolute alignment reference marker 120.

In the present embodiment as well as the embodiments above, the shadow mask 81 is preferably prepared to have a size smaller than design absolute dimensions (designed values) in consideration of, for example, expansion due to temperature. Further, the shadow mask 81 is preferably adjusted to have assumed absolute dimensions or dimensions slightly smaller than such absolute dimensions in response to tension applied to the shadow mask 81 during the alignment adjustment.

The step for preparing the mask unit preferably carries out an alignment between the shadow mask 81 and the vapor deposition source 85 by (i) recognizing the absolute-alignment markers 110 at each end of the shadow mask 81 which end is present along the long-side direction of the shadow mask 81 and (ii) placing the shadow mask 81 in the vapor deposition device 50 in a state in which either no tension or preferably a small tension is applied to the shadow mask 81. The absolute-alignment markers 110 can be recognized by using, for example, an image sensor 150 that is provided outside the vacuum chamber 60 and that, as described above, includes, for example, a CCD serving as image sensing means (image reading means).

With the above arrangement, even in the case where the distance between the vapor deposition source 85 and the film formation substrate 200 is decreased as described above for a higher efficiency of use of the material, the vapor deposition position can be finely adjusted by (i) preparing in advance a shadow mask 81 with a size smaller than designed values to absorb thermal expansion of the shadow mask 81 and (ii) applying tension to the shadow mask 81 with reference to the absolute alignment reference marker 120 so that the shadow mask 81 is placed at the absolute position (corresponding to the designed absolute values). The above arrangement can further control thermal deformation of the shadow mask 81.

In the present embodiment as well as the embodiments above, the mask tension mechanism 88 desirably has a set minimum tension (MIN) in order to prevent the shadow mask 81 from being bent by tension applied thereto.

In the present embodiment as well as the embodiments above, the mask tension mechanism 88 is, as described above, provided not as a jig for the film formation substrate 200 but to the vapor deposition device 50 itself. This arrangement makes it possible to (i) adjust expansion of the shadow mask 81 before vapor deposition, and consequently (ii) immediately before vapor deposition, reduce, for example, self-weight bending and/or thermal bending of the shadow mask 81, thereby improving vapor deposition accuracy.

The vapor deposition device 50 of the present embodiment, as illustrated in FIG. 29, preferably includes (i) the above-described image sensor 150 as position detecting means for carrying out an alignment between the absolute-alignment markers 110 and the absolute alignment reference marker 120, and (ii) a control circuit 100 that includes, in addition to the constituent elements described in Embodiment 1 above: an image detecting section 161; a computing section 162; and a tension control section 163.

The image sensor 150 functions as position detecting means for carrying out an alignment between the absolute-alignment markers 110 and the absolute alignment reference marker 120.

The image detecting section 161 detects, from an image captured by the image sensor 150, respective images of the absolute-alignment markers 110 and the absolute alignment reference marker 120.

The computing section 162 determines, from the images detected by the image detecting section 161, the amount of movement (that is, tension applied by the mask tension mechanism 88) of the absolute-alignment markers 110 relative to the absolute alignment reference marker 120. For example, the computing section 162, for example, the computing section 102 measures the amount of positional difference (that is, a shift component along the x axis direction and the y axis direction, and a rotation component on the x-y plane) between the absolute-alignment markers 110 and the absolute alignment reference marker 120 to determine a correction value for the position of the absolute-alignment markers 110 by computation.

The tension control section 163 adjusts the tension, applied to the shadow mask 81, so that an absolute-alignment marker 110 is superimposed over the absolute alignment reference marker 120.

In other words, the present embodiment causes (i) the image detecting section 161 to detect, from an image captured by the image sensor 150, respective images of the absolute-alignment markers 110 and the absolute alignment reference marker 120 and (ii) the computing section 162 to measure, from the images detected by the image detecting section 161, the amount of positional difference between the absolute-alignment markers 110 and the absolute alignment reference marker 120 to determine a correction value for the position of the absolute-alignment marker 110 by computation.

The correction value is outputted in the form of a correction signal to the tension control section 163. The tension control section 163, on the basis of the correction signal from the computing section 162, adjusts the tension, applied to the shadow mask 81 by means of the mask clamps 130 and 130, to move the absolute-alignment markers 110 relative to the absolute alignment reference marker 120 for an alignment adjustment.

The present embodiment, as well as the embodiments above, carries out vapor deposition onto the film formation substrate 200 by, similarly to, for example, Embodiments 1 through 7 above, (i) maintaining a fixed gap g1 between the film formation substrate 200 and the shadow mask 81 and (ii) for example, scanning the film formation substrate 200 at a fixed rate to cause the film formation substrate 200 to pass the region of the shadow mask 81 in which region the openings are formed. The present embodiment uses the alignment markers 84 and 221 to simultaneously scan the film formation substrate and carry out an alignment between the film formation substrate 200 and the shadow mask 81. The present embodiment further adjusts tension to the shadow mask 81 on the basis of (i) the position of the shadow mask 81 relative to a reference position in the device (that is, the absolute position or a home position set for the device) and (ii) the position of the shadow mask 81 relative to the vapor deposition source 85. The present embodiment thus simultaneously (i) corrects, for example, self-weight bending and/or thermal bending of the shadow mask 81 and (ii) adjusts the elongation rate of the shadow mask 81.

The present embodiment aligns the shadow mask 81 with a reference position in the device with use of the absolute-alignment markers 110 and the absolute alignment reference marker 120 as described above. Thus, even in the case where, for example, (i) the vapor deposition device 50 is an inline device, (ii) the substrate moving mechanism 70 is a carrying device including a substrate carrying path, and (iii) the shadow mask 81 and the vapor deposition source 85 extend over the film formation substrate 200, the present embodiment can narrow (limit) a region in which a vapor deposition distribution can be maintained.

In other words, the present embodiment can (i) align the shadow mask 81 with the absolute position (that is, a reference position in the device) with use of the absolute-alignment markers 110 and the absolute alignment reference marker 120 as described above, and thus (ii) adjust the shadow mask 81 to the absolute position. The present embodiment can consequently accurately fix the respective positions of the vapor deposition device 50 and the shadow mask 81 relative to each other or the respective positions of the vapor deposition source 85 and the shadow mask 81 relative to each other. (There is, however, a minute operating region due to the alignment process as described above.)

In the case where, however, an absolute alignment is not carried out for the shadow mask 81 by, as described above, using alignment markers for an absolute alignment, although the shadow mask 81 can be positioned roughly, it is impossible to accurately fix (i) the respective positions of the vapor deposition device 50 and the shadow mask 81 relative to each other or (ii) the respective positions of the vapor deposition source 85 and the shadow mask 81 relative to each other. This means that it is impossible to accurately position the shadow mask 81 in the region (that is, the vapor deposition area) in which vapor deposition particles from the vapor deposition source 85 are deposited.

The shadow mask 81 needs to be placed within a region (vapor deposition area) in which vapor deposition particles from the vapor deposition source 85 are deposited. Thus, the vapor deposition area needs to be designed to be considerably wide so that no portion of the shadow mask 81 is placed outside the vapor deposition area of the vapor deposition source 85, even if the shadow mask 81 is slightly mispositioned relative to the vapor deposition area of the vapor deposition source 85, in a case where a positional relationship is not correctly fixed between the vapor deposition area of the vapor deposition source 85 and the openings 82 of the shadow mask 81 relative to each other.

In contrast, in the case where the respective positions of the vapor deposition source 85 and the shadow mask 81 relative to each other are accurately fixed (that is, the position of the shadow mask 81 relative to the vapor deposition area of the vapor deposition source 85 is accurately fixed), the vapor deposition area can be narrowed. Thus, the present embodiment (i) eliminates the need for a design that includes a wide vapor deposition area as a precaution so that no problem arises even if the shadow mask 81 is slightly mispositioned, and (ii) allows a vapor deposition material to be efficiently deposited onto the film formation substrate 200. This arrangement consequently improves efficiency of use of the material.

The present embodiment, as described above, includes alignment markers for an absolute alignment in (i) the shadow mask 81 and (ii) a position in either the mask unit 80 or the vacuum chamber 60 which position faces the shadow mask 81. In addition, the vapor deposition device 50 includes the constituent elements illustrated in FIG. 29. This arrangement makes it possible to correct parallelism, that is, to cause the substrate scanning direction to be parallel to a side of each opening 82 of the shadow mask 81 which side needs to be parallel to the substrate scanning direction.

The constituent elements illustrated in FIG. 29 are each used as an alignment mechanism for carrying out a parallelism adjustment between the shadow mask 81 and the substrate scanning direction with use of the alignment markers for an absolute alignment (in other words, a parallelism adjustment of the shadow mask 81 in the vapor deposition device 50).

Thus, in the case where the film formation substrate 200 is moved relative to the shadow mask 81, it is possible, even if mispositioning between the film formation substrate 200 and the shadow mask 81 is not corrected by constantly carrying out an alignment during a substrate scan for vapor deposition, to deposit vapor deposition particles onto a target region (stripe-shaped region) by simply carrying out an alignment once with use of the alignment markers 221 of the film formation substrate 200 and the alignment markers 84 of the shadow mask 81 before the vapor deposition region 210 of the film formation substrate 200 reaches the openings 82 of the shadow mask 81.

The above arrangement can (i) prevent the vapor deposition film 211 from having edge blurring caused by θ mispositioning between the substrate scanning direction and the openings 82 of the shadow mask 81, and consequently (ii) more accurately form a predetermined pattern (vapor deposition pattern) of the vapor deposition film 211.

The present embodiment, as described above, includes alignment markers for an absolute alignment in (i) the shadow mask 81 and (ii) a position in either the mask unit 80 or the vacuum chamber 60 which position faces the shadow mask 81. This arrangement fixes either the absolute position of the shadow mask 81 inside the vacuum chamber 60 or the position of the shadow mask 81 relative to the vapor deposition source 85. Thus, in the case where the film formation substrate 200 is moved relative to the shadow mask 81, the ON/OFF control for vapor deposition can be carried out, even without recognition of the alignment markers 221 of the film formation substrate 200, on the basis of the distance (absolute distance for substrate movement) from the film formation substrate 200 to the alignment markers for an absolute alignment along the scanning direction for the film formation substrate 200.

The present embodiment describes an example case in which, similarly to Embodiment 7 as described above, (i) the mask tension mechanism 88 includes mask clamps 130 and (ii) tension is applied to the shadow mask 81 by means of the mask clamps 130. The present embodiment is, however, not limited to such an arrangement.

Figure 30:
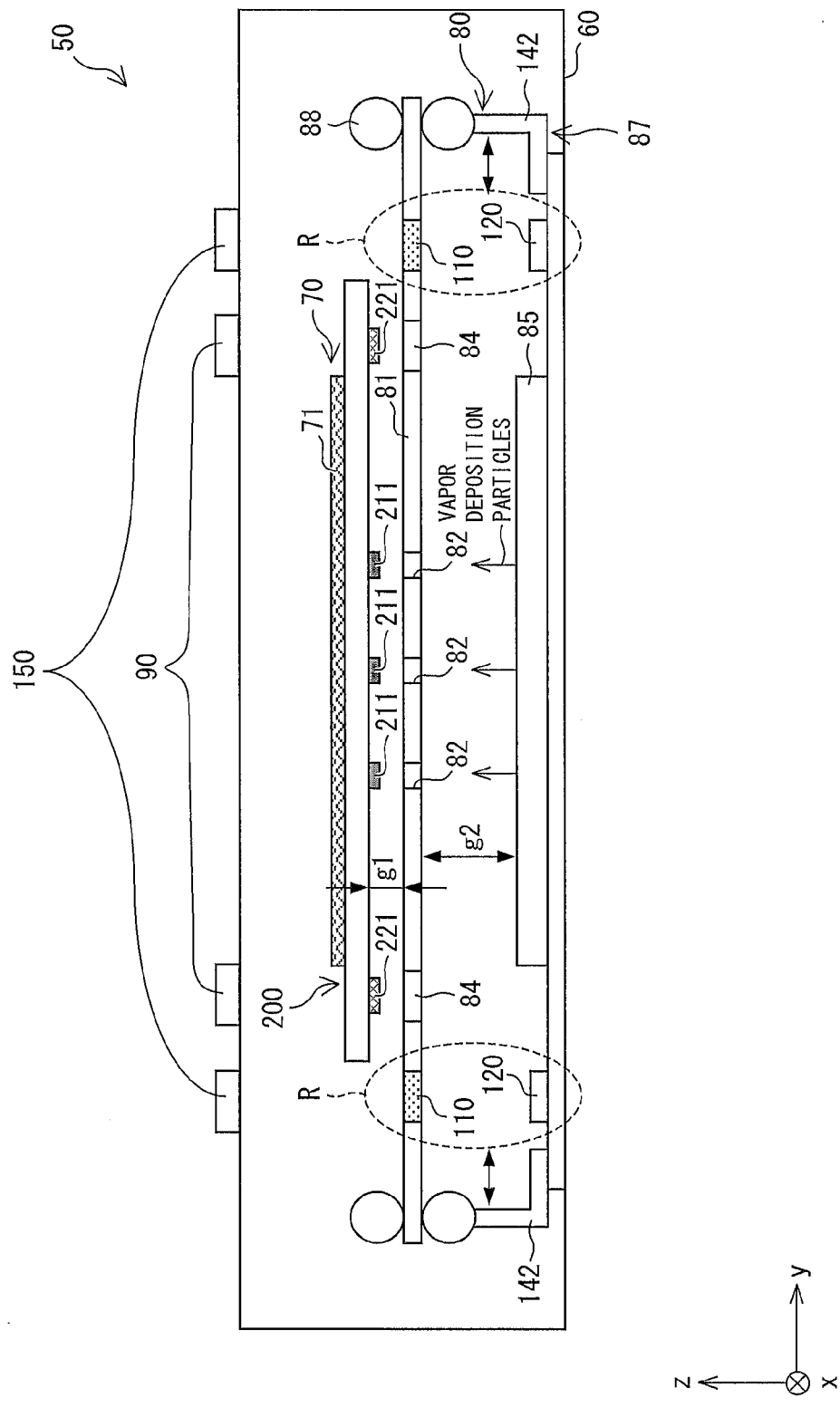
FIG. 30 is a cross-sectional view schematically illustrating a configuration of a main part inside the vacuum chamber for a case in which alignment markers for an absolute alignment are provided to the vapor deposition device illustrated in FIG. 3.

FIG. 30 is a cross-sectional view schematically illustrating a configuration of a main part provided inside the vacuum chamber 60 of the vapor deposition device 50 of FIG. 3 which vapor deposition device 50 includes absolute-alignment markers 110 and absolute alignment reference markers 120.

The vapor deposition device 50 is, as illustrated in FIG. 30, arranged such that, to place the shadow mask 81 at an absolute position, (i) the mask holding member 87 includes absolute alignment reference markers 120 corresponding to the absolute position of the shadow mask 81 and (ii) the shadow mask 81 includes absolute-alignment markers 110.

In the case where (i) the mask holding member 87 includes absolute alignment reference markers 120 and (ii) the mask holding member 87 includes a slider mechanism as described above, the absolute alignment reference markers 120 are, as illustrated in FIG. 30, provided outside the range of motion of movable sections 142 of the slider mechanism, that is, at such positions that the absolute alignment reference markers 120 are not shifted in position (slid) or covered by the movable sections 142.

In this case, (i) the tension control section 163, on the basis of a correction signal from the computing section 162, adjusts, by means of the slider mechanism, tension applied to the shadow mask 81, and (ii) an alignment adjustment is carried out by sliding the movable sections 142 to move the absolute-alignment markers 110 relative to the absolute alignment reference markers 120.

FIG. 30 describes an example case in which, as described above, the mask holding member 87 includes absolute alignment reference markers 120 for placing the shadow mask 81 at the absolute position. The absolute alignment reference markers 120 thus provided on the device side as alignment references, however, each simply need to be provided at such a fixed position in the vapor deposition device 50 as to, during an alignment adjustment, (i) face the shadow mask 81 and (ii) not be shifted in position. Similarly, in FIG. 27 as well, the absolute alignment reference markers 120 provided on the device side as alignment references each simply need to be provided at such a fixed position in the vapor deposition device 50 as to, during an alignment adjustment, (i) face the shadow mask 81 and (ii) not be shifted in position.

Thus, the absolute alignment reference markers 120 may alternatively each be provided, for example, on (i) an inner wall, such as a bottom wall, of the vacuum chamber 60 or (ii) the vapor deposition source 85.

In the case where the mask holding member 87 includes a slider mechanism as described above, the vapor deposition source 85 is, needless to say, also provided outside the range of motion of movable sections of the slider mechanism.

FIGS. 1 and 30 each illustrate an example case in which the vapor deposition source 85 is placed on the mask holding member 87. Where to provide the vapor deposition source 85 (that is, its fixing position) is, however, not limited to such a position as described above. The vapor deposition source 85 may be provided at such a position in the vapor deposition device 50 as to not interfere with the mask holding member 87, for example, provided to the vacuum chamber 60 itself.

In the case where the mask unit 80 is moved relative to the film formation substrate 200, the present embodiment may, of course, be arranged such that (i) the mask holding member 87 itself is provided movably along the x axis direction and the y axis direction, and (ii) the vapor deposition source 85 is movable together with the shadow mask 81 and the mask holding member 87 in a state in which the respective positions of the vapor deposition source 85 and the shadow mask 81 are fixed relative to each other as described above.

The present embodiment describes an example case in which the movable sections 142 are each connected to, for example, a slider to function as a movable section. The present embodiment is, however, not limited to such an arrangement. The present embodiment may alternatively be arranged such that (i) the movable sections 142 themselves are slidable along the up-and-down direction by, for example, a hydraulic pump, and (ii) sliding the movable sections 142 along the up-and-down direction can adjust the tension applied to the shadow mask 81.

Embodiment 9

The present embodiment is described below mainly with reference to FIG. 31.

Figure 31:
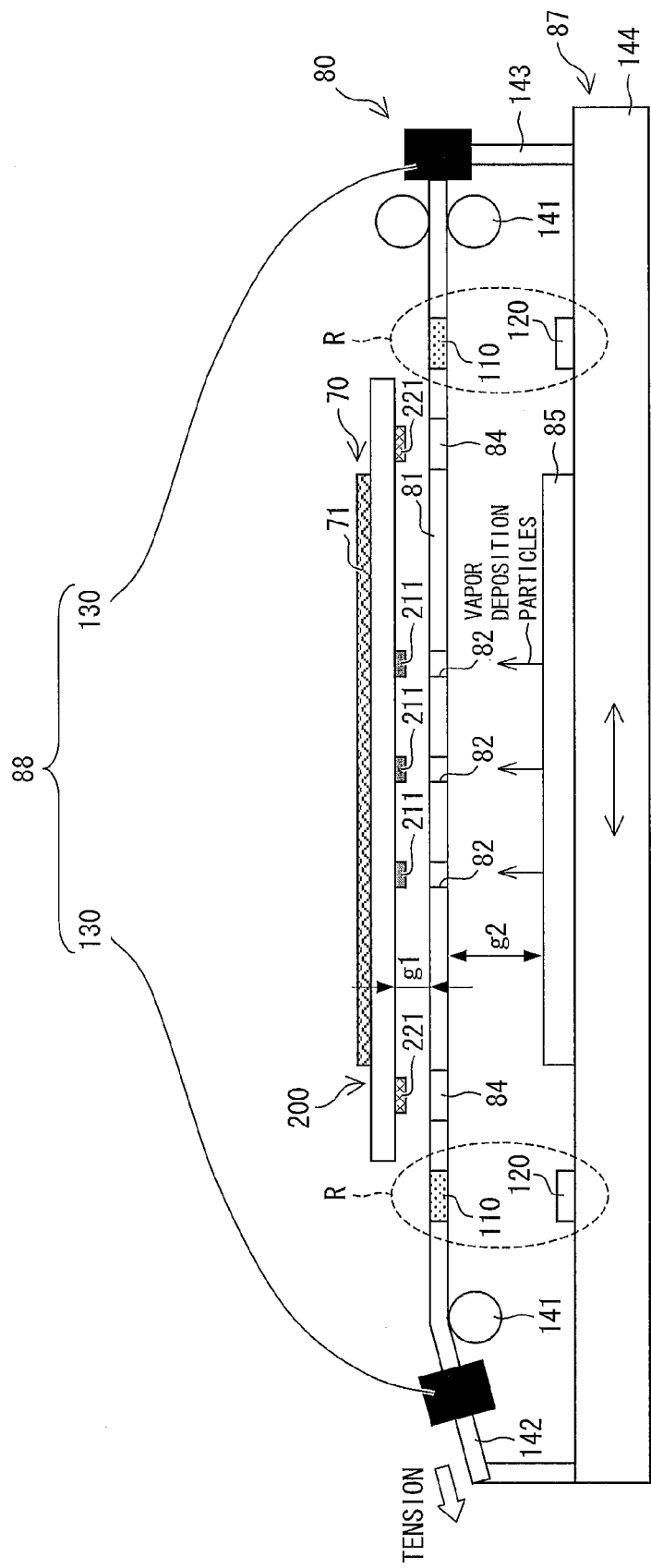
FIG. 31 is a cross-sectional view schematically illustrating a configuration of a main part inside a vacuum chamber of a vapor deposition device according to Embodiment 9 of the present invention.

FIG. 31 is a cross-sectional view schematically illustrating a configuration of a main part provided inside the vacuum chamber 60 of the vapor deposition device 50 of the present embodiment. As in the embodiments above, FIG. 31 illustrating the present embodiment omits some constituent elements, such as openings of the shadow mask 81 and a vapor deposition film, for convenience of illustration. A plan view, taken from above the shadow mask 81, of a region R defined by a dotted line in FIG. 31 is identical to that of FIG. 28.

The present embodiment describes an example case in which, as in Embodiments 7 and 8 above, the shadow mask 81 is fixed (attached in a tensioned state) with use of mask clamps 130 and 130. The present embodiment mainly deals with how the present embodiment is different from Embodiments 7 and 8 above.

Embodiments 7 and 8 above each describe a case in which tension is applied, with use of mask clamps 130 and 130 provided at respective opposite end sections of the shadow mask 81 which opposite end sections are juxtaposed along the long-side direction of the shadow mask 81, to the shadow mask 81 at its opposite ends that are juxtaposed along the long-side direction of the shadow mask 81.

In this case, however, the shadow mask 81 may be subjected to a twist (torsion) depending on the state of an alignment. An example of such a case is one in which in Embodiments 7 and 8 above, one of the mask clamps 130 is moved in the direction from the back side of FIGS. 25 and 28 to the front side thereof, whereas the other mask clamp 130 is moved in the direction from the front side of FIGS. 25 and 28 to the back side thereof.

The above problem, of course, does not arise if an alignment along a parallel line direction (that is, an alignment along a parallel direction) is carried out without fail during the alignment. The above problem may, however, arise if, for example, the alignment position is misrecognized.

In view of this, the present embodiment describes a case in which tension applied to the shadow mask 81 is adjusted by (i) fixing a first one of the mask clamps 130 to the mask holding member 87 and (ii) applying tension, by means of a second one of the mask clamps 130 which second one is provided opposite to the first one of the mask clamps 130, to the shadow mask 81 at only one of its end sections (that is, in only one direction) that are juxtaposed along the long-axis direction of the shadow mask 81.

The mask unit 80 of the present embodiment, as illustrated in FIG. 31, includes, as the mask holding member 87, (i) mask supporting sections 141 (mask supporting bars; mask holding stands) and (ii) a mask fixing stand 144.

The mask fixing stand 144 is arranged such that (i) it includes a slide mechanism, (ii) one of connection sections connected to a mask clamp 130 is a movable section 142, (iii) a tension adjustment for the shadow mask 81 can be carried out through a length adjustment, and (iv) the mask clamps 130 can be moved in the back-and-forth direction and the left-and-right direction, and subjected to a θ (rotary) movement.

While the mask clamps 130 have respective connection sections, namely the movable section 142 and a fixing section 143, the movable section 142 is connected to, for example, a slider to function as a movable section.

The shadow mask 81 of the present embodiment is, as illustrated in FIG. 31, (i) fixed (clamped) integrally to the fixing section 143 of the mask fixing stand 144, and (ii) subjected to tension via the mask clamp 130 fixed to the movable section 142. The shadow mask is thus subjected to an absolute alignment, and is further relatively aligned with the film formation substrate 200.

The present embodiment is, as described above, arranged such that (i) it is mainly the mask fixing stand 144 that serves, by means of one of the mask clamps 130, as an alignment mechanism and a tension mechanism, and (ii) the shadow mask 81 is clamped to the mask fixing stand 144 by means of the other mask clamp 130 as described above. The shadow mask 81 is thus subjected to tension in only one axis direction. This arrangement prevents torsion in the shadow mask 81 itself, and thus ensures a stable operation.

The mask supporting sections 141, as in Embodiments 7 and 8 above, (i) serve to hold the shadow mask 81 in such a manner that the shadow mask 81 is in parallel to the film formation substrate 200 and also (ii) serve as a fulcrum for applying tension to the shadow mask 81. The mask supporting sections 141 may each be fixed to an inner wall, such as a peripheral wall, of the vacuum chamber 60 or to a fixed position of the mask fixing stand 144 which fixed portion is not slid.

The mask supporting section 141 provided for the mask clamp 130 that is not connected to the slider mechanism does not serve as a fulcrum for applying tension to the shadow mask 81, and thus simply needs to be capable of holding the shadow mask 81 horizontally. Thus, as illustrated in FIG. 31, there may alternatively be, for example, (i) two mask supporting sections 141 provided above and below the shadow mask 81 respectively for the mask clamp 130 that is not connected to the slider mechanism or (ii) a roller member for sandwiching the shadow mask 81 to hold it.

The present embodiment is, as described above, arranged such that (i) it is mainly the mask fixing stand 144 that serves, by means of one of the mask clamps 130, as an alignment mechanism and a tension mechanism, and (ii) the shadow mask 81 is clamped to the mask fixing stand 144 by means of the other mask clamp 130 as described above. Thus, the mask tension mechanism 88 and the mask holding member 87 are provided integrally with each other, so that the mask holding member 87 doubles as the mask tension mechanism 88.

The present embodiment, as illustrated in FIG. 31, describes an example case in which an absolute alignment is carried out for the shadow mask 81 with use of (i) the absolute-alignment markers 110 provided to the shadow mask 81 and (ii) the absolute alignment reference markers 120 provide in the vapor deposition device 50.

The present embodiment is, however, not limited to such an arrangement. It is alternatively possible to omit the absolute position alignment involving the use of the absolute-alignment markers 110 and the absolute alignment reference markers 120. The present embodiment may alternatively be arranged, as described above, such that, for example, the mask clamps 130 are moved to their respective home positions (that is, default positions set for the device) to adjust (place) the shadow mask 81 itself to its home position.

The above arrangement makes it possible to simplify the device configuration as compared to the case involving the use of the absolute-alignment markers 110 and the absolute alignment reference markers 120.

In the case where, however, an absolute alignment is not carried out for the shadow mask 81 by, as described above, using alignment markers for an absolute alignment, although the shadow mask 81 can be positioned roughly, it is impossible to accurately fix (i) the respective positions of the vapor deposition device 50 and the shadow mask 81 relative to each other or (ii) the respective positions of the vapor deposition source 85 and the shadow mask 81 relative to each other. This makes it impossible to accurately position the shadow mask 81 in the region (that is, the vapor deposition area) in which vapor deposition particles from the vapor deposition source 85 are deposited. The vapor deposition area needs to be designed to be considerably wide so that no portion of the shadow mask 81 is placed outside the vapor deposition area of the vapor deposition source 85 even if the shadow mask 81 is slightly mispositioned relative to the vapor deposition area of the vapor deposition source 85.

Thus, in the present embodiment as well as the embodiments above, it is desirable to provide (i) absolute-alignment markers 110 to the shadow mask 81 and (ii) absolute alignment reference markers 120 to either the mask unit 80 (specifically to, for example, the vapor deposition source 85 or mask fixing stand 144 included in the mask unit 80) or a position in the vacuum chamber 60 which position faces the shadow mask 81.

FIG. 31 illustrates an example case in which the vapor deposition source 85 is placed on the mask fixing stand 144. In the present embodiment as well as the embodiments above, where to provide the vapor deposition source 85 (that is, its fixing position) may be a position, such as the vacuum chamber 60 itself, in the vapor deposition device 50 which position does not interfere with the mask fixing stand 144.

In the case where the mask unit 80 is moved relative to the film formation substrate 200, the present embodiment may alternatively be arranged such that (i) the mask fixing stand 144 itself is provided movably in the x axis direction and the y axis direction, and (ii) the vapor deposition source 85 is moved together with the shadow mask 81 and the mask fixing stand 144 in a state in which the respective positions of the vapor deposition source 85 and the shadow mask 81 are fixed relative to each other as described above.

Embodiment 10

The present embodiment is described below mainly with reference to FIG. 32.

The present embodiment mainly deals with how the present embodiment is different from Embodiments 1 through 8 above. Constituent elements of the present embodiment that are identical in function to their respective equivalents described in Embodiments 1 through 8 are each assigned the same reference numeral, and are not described here.

Figure 32:
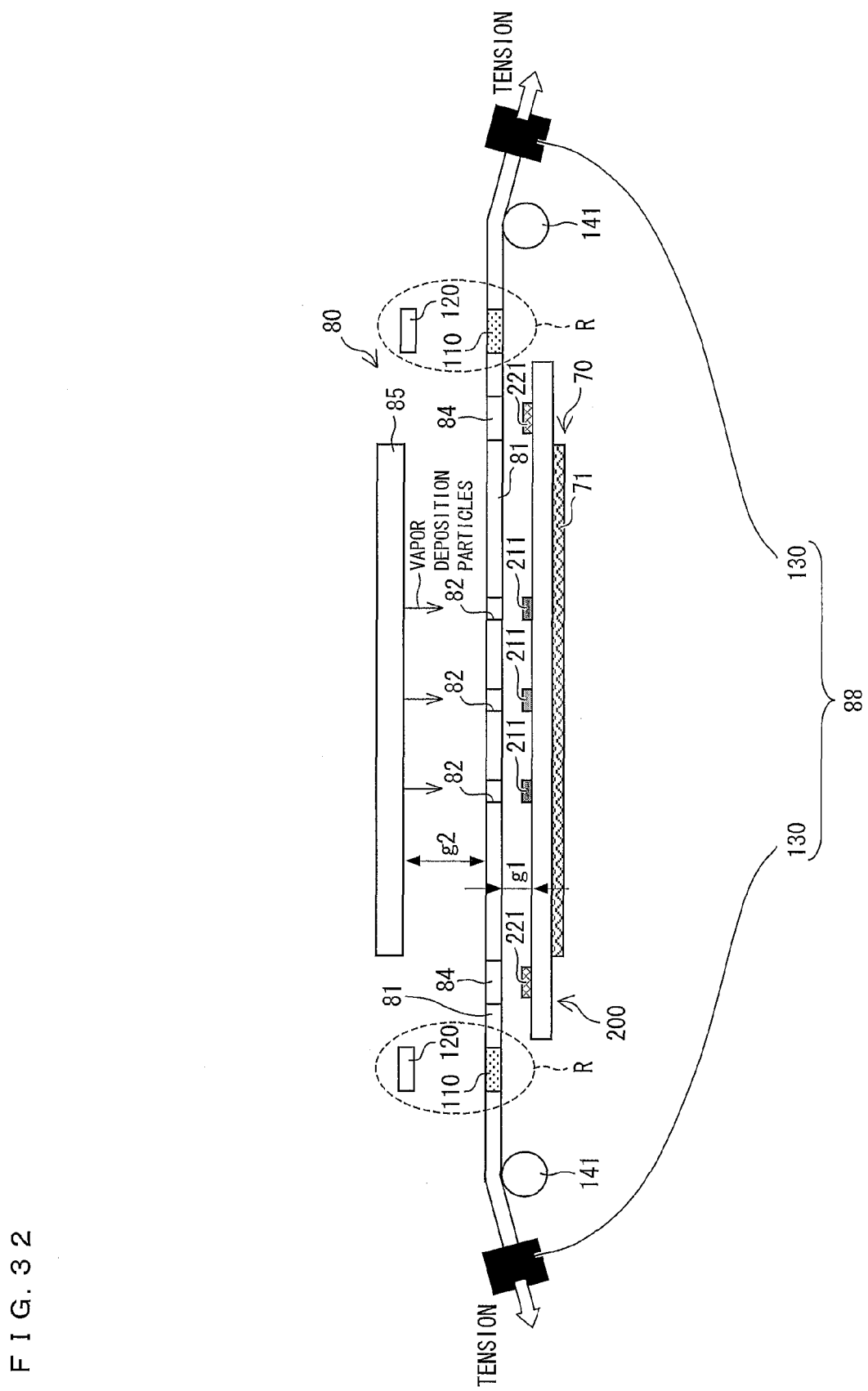
FIG. 32 is a cross-sectional view schematically illustrating a configuration of a main part inside a vacuum chamber of a vapor deposition device according to Embodiment 10 of the present invention.

FIG. 32 is a cross-sectional view schematically illustrating a configuration of a main part provided inside the vacuum chamber 60 of the vapor deposition device 50 of the present embodiment. As in the embodiments above, FIG. 32 illustrating the present embodiment omits some constituent elements, such as openings of the shadow mask 81 and a vapor deposition film, for convenience of illustration. A plan view, taken from the shadow mask 81 side (that is, from below the shadow mask 81), of a region R defined by a dotted line in FIG. 32 is identical to that of FIG. 28.

As illustrated in FIG. 32, the vapor deposition device 50 of the present embodiment differs from the vapor deposition device 50 of Embodiment 8 above in that, as in Embodiment 3 above, the mask unit 80 and the substrate holding member 71 for holding the film formation substrate 200 are positioned inversely along the vertical direction.

In other words, while Embodiment 8 above carries out vapor deposition by depo-up, the present embodiment carries out vapor deposition by depo-down.

The vapor deposition device 50 of the present embodiment is arranged such that (i) the substrate holding member 71 includes, for example, a substrate stage provided movably along an x direction and a y direction, and that (ii) the film formation substrate 200 is held by the substrate stage. The substrate stage may have the function as an electrostatic chuck. The present embodiment may alternatively be arranged such that (i) the substrate holding member 71 includes, instead of the substrate stage, a roller as described in Embodiment 1 above, and that (ii) the film formation substrate 200 is held and moved by the roller.

The vapor deposition source 85 of the present embodiment is held by a holding member (not illustrated in FIG. 32) (that is, a vapor deposition source holding member), such as a holder, which is, for example, fixed to the vacuum chamber 60 and in which the vapor deposition source 85 is, for example, placed to be contained and fixed. The holding member is, for example, similar to the holder used in Embodiment 3 above. The holding member is fixed to, for example, a top wall or peripheral wall of the vacuum chamber 60.

The present embodiment, as in Embodiment 8 above, (i) uses mask clamps 130 and 130 as the mask tension mechanism 88 and (ii) applies tension to the shadow mask 81 in obliquely downward directions by using each of the mask supporting sections 141 and 141 (mask supporting bars; mask holding stands) as a fulcrum.

The present embodiment is thus arranged such that the mask supporting sections 141 and 141 are each either fixed to a peripheral wall or bottom wall of the vacuum chamber 60 or (i) provided in an L-shape or U-shape (concave) to allow the shadow mask 81 to be placed thereon and (ii) attached to and suspended from the vapor deposition source holding member or the top wall of the vacuum chamber 60. The absolute alignment reference markers 120 are provided in, for example, (i) an inner wall, such as a bottom wall, of the vacuum chamber 60 or (ii) the vapor deposition source 85.

The present embodiment describes a case in which tension is applied to the shadow mask 81 in obliquely downward directions as described above. The present embodiment is, however, not limited to such an arrangement.

In a case where, for example, tension is applied to the shadow mask 81 in, for example, obliquely upward directions, the present embodiment may be arranged, for example, as follows: The mask supporting sections 141 and 141 are provided on a surface of the shadow mask 81 which surface faces the vapor deposition source 85. The shadow mask 81 and the vapor deposition source 85 are attached to and suspended from (i) a mask holding member (not illustrated in FIG. 32), such as a holder, in which the shadow mask and the vapor deposition source are for example, placed to be contained and fixed or (ii) for example, the top wall of the vacuum chamber 60. Further, the mask clamps 130 and 130 are fixed to the mask holding member or to an inner wall, such as the top wall or peripheral wall, of the vacuum chamber 60.

In this case, the absolute alignment reference markers 120 may each be provided either (i) to the mask holding member or (ii) to the top wall of the vacuum chamber 60 or the vapor deposition source 85.

Even in the case where, for example, (i) depo-down is carried out as described above or (ii) the absolute-alignment markers 110 and the absolute alignment reference markers 120 are positioned inversely along the vertical direction, the absolute-alignment markers 110 and the absolute alignment reference markers 120 are aligned with each other in a manner identical to the manner described in Embodiment 8 above. The present embodiment thus does not describe such a manner.

Embodiment 11

The present embodiment is described below mainly with reference to FIGS. 33 through 35.

The present embodiment mainly deals with how the present embodiment is different from Embodiments 1 through 10 (particularly, Embodiment 8) above. Constituent elements of the present embodiment that are identical in function to their respective equivalents described in Embodiments 1 through 10 are each assigned the same reference numeral, and are not described here.

Figure 33:
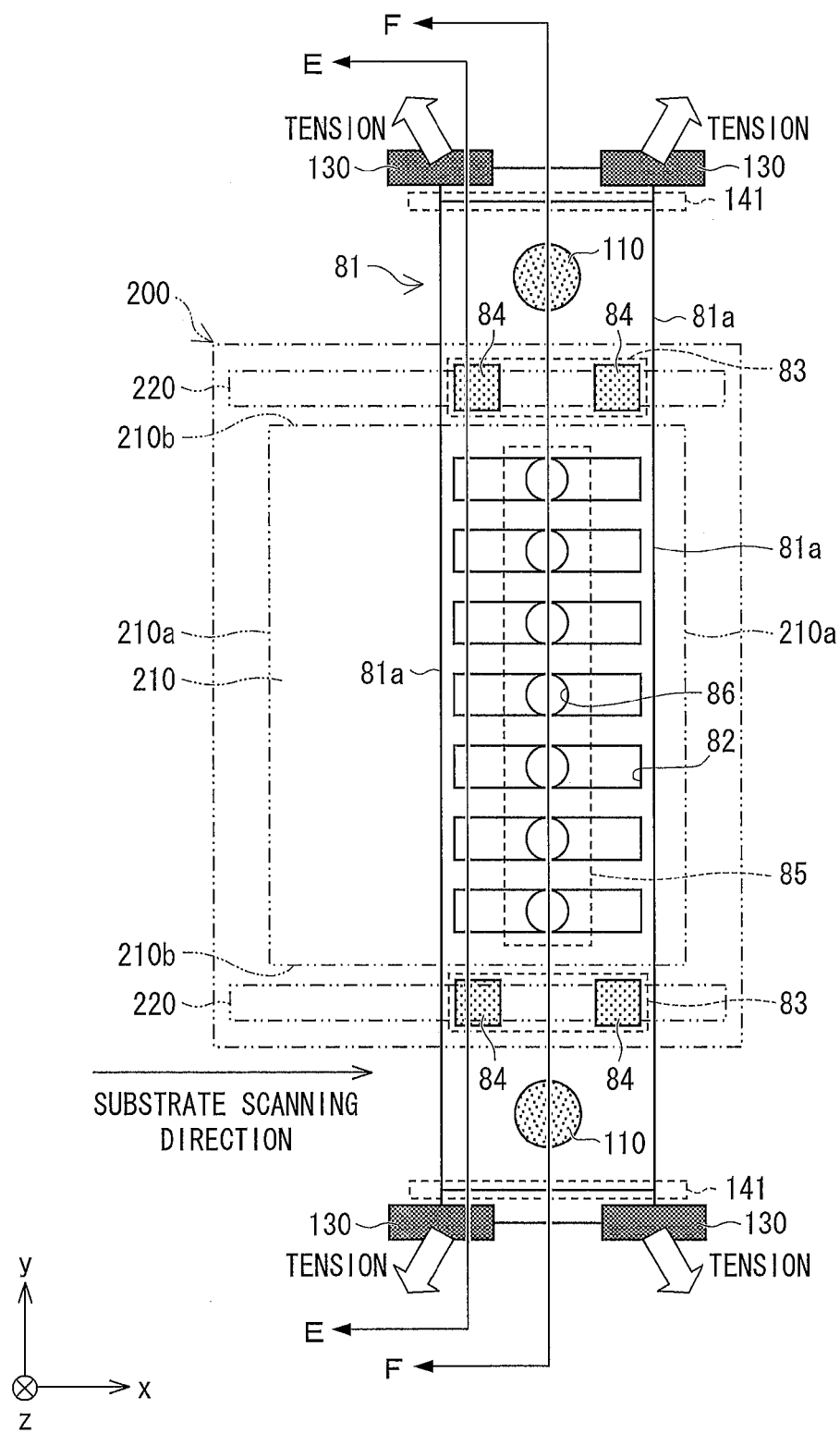
FIG. 33 is a plan view illustrating a film formation substrate and a mask unit inside a vacuum chamber of a vapor deposition device according to Embodiment 11 of the present invention, the plan view being taken from a back surface side of the film formation substrate.
Figure 34:
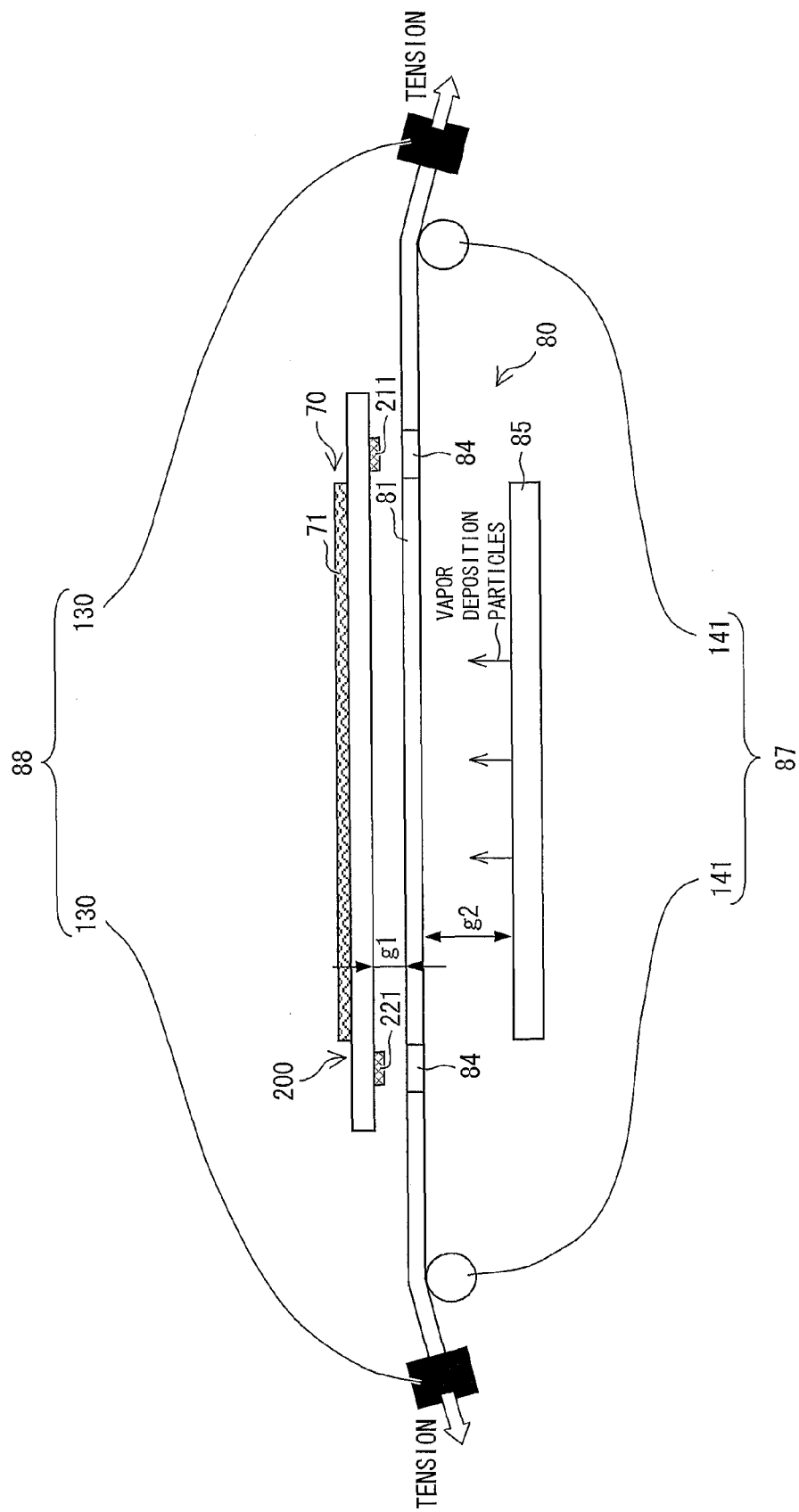
FIG. 34 is a cross-sectional view schematically illustrating a configuration of a main part inside the vacuum chamber of the vapor deposition device according to Embodiment 11 of the present invention.

FIG. 33 is a plan view of the film formation substrate 200 and the mask unit 80 in the vacuum chamber 60 of the vapor deposition device 50 of the present embodiment, as viewed from a back surface side of the film formation substrate 200. FIGS. 34 and 35 are each a cross-sectional view schematically illustrating a configuration of a main part provided inside the vacuum chamber 60 of the vapor deposition device 50 of the present embodiment. FIG. 34 illustrates a cross section of the vapor deposition device 50 which cross section is taken along line E-E in FIG. 33. FIG. 35 illustrates a cross section of the vapor deposition device 50 which cross section is taken along line F-F in FIG. 33. As in the embodiments above, FIGS. 33 through 35 illustrating the present embodiment omit some constituent elements, such as openings of the shadow mask 81 and a vapor deposition film, for convenience of illustration. A plan view, taken from above the shadow mask 81, of a region R defined by a dotted line in FIG. 35 is identical to that of FIG. 28.

The mask unit 80 and the mask tension mechanism 88 of the present embodiment are, as illustrated in FIG. 33, different from those of Embodiment 8 above in that the shadow mask 81 is provided with mask clamps 130 at respective corner sections (four corners) thereof.

Figure 35:
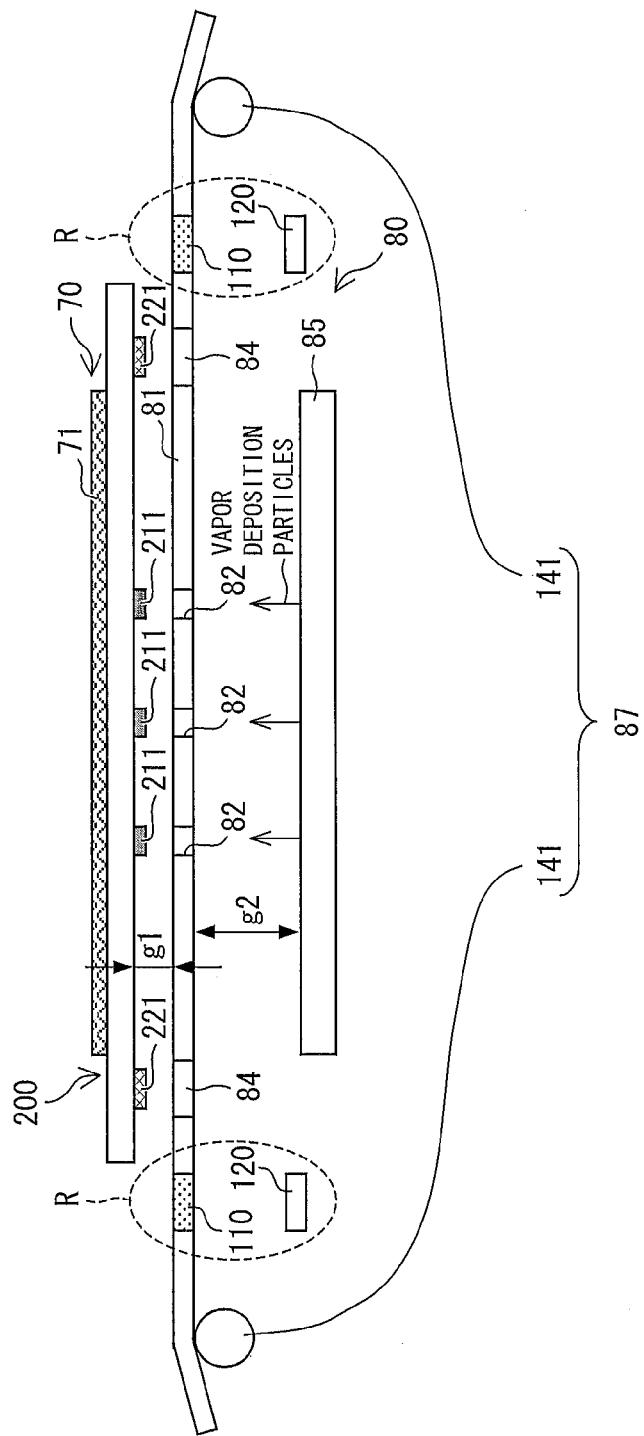
FIG. 35 is a cross-sectional view schematically illustrating a configuration of a main part inside the vacuum chamber of the vapor deposition device according to Embodiment 11 of the present invention.

In the present embodiment having the above arrangement, the alignment between the absolute-alignment markers 110 and the absolute alignment reference markers 120 both illustrated in FIG. 35 is carried out while tension is adjusted by moving the four individual mask clamps 130 illustrated in FIG. 33 that are provided at the respective corner sections of the shadow mask 81.

The shape of the absolute-alignment markers 110 and the alignment between the absolute-alignment markers 110 and the absolute alignment reference markers 120 are as described in Embodiment 8 above with reference to FIGS. 29 and 30. The present embodiment thus does not provide a detailed description thereof.

The four mask clamps 130 are each individually movable along the x axis (±x axis) direction and the y axis (±y axis) direction in FIG. 33. An absolute alignment is carried out immediately before vapor deposition by applying tension to the shadow mask 81 to such an extent that there is no bending (slack) in the shadow mask 81.

In particular, in the case where the distance between the vapor deposition source 85 and the shadow mask 81 is decreased as described above, the temperature of the shadow mask 81 increases when the vapor deposition rate has been stabilized at a target vapor deposition rate. The shadow mask 81 is bent as a result.

The vapor deposition position can thus be finely adjusted by (i) preparing in advance a shadow mask 81 with a size smaller than designed values to absorb thermal expansion of the shadow mask 81 and (ii) applying tension to the shadow mask 81 with reference to the absolute alignment reference markers 120 so that the shadow mask 81 is placed at the absolute position (corresponding to the designed absolute values). The above arrangement can further control thermal deformation of the shadow mask 81.

In the present embodiment, the mask clamps 130 are (i) provided at the respective corner sections (four corners) of the shadow mask 81 and (ii) each movable along the x axis direction and the y axis direction. The present embodiment can thus apply tension to the shadow mask 81 in all directions (360 degrees). In other words, the present embodiment can apply tension to the shadow mask 81 in any direction. The present embodiment can thus carry out a finer position adjustment than Embodiment 8 above, and have a higher alignment accuracy than Embodiment 8 above. The present embodiment can consequently further improve vapor deposition accuracy.

The film formation substrate 200 is desirably held by the substrate holding member 71, for example, an electrostatic chuck, to prevent self-weight bending of the film formation substrate 200.

In the present embodiment as well as the embodiments above, the film formation substrate 200 and the shadow mask 81 can be aligned with each other, as in Embodiment 1 above, with use of the alignment markers 84 and 221.

In the present embodiment as well as the embodiments above, an alignment marker 84 is preferably located at an end of the shadow mask 81 which end is located downstream in the direction in which the substrate makes its entry (that is, an end of the shadow mask 81 which end is located upstream in the substrate scanning direction). In the case where reciprocating vapor deposition is carried out, alignment markers 84 are preferably located at both ends along the substrate scanning direction (that is, at the four corners).

In this case, if, for example, (i) vapor deposition is carried out in the substrate scanning direction indicated by an arrow in FIG. 33, the alignment between the film formation substrate 200 and the shadow mask 81 is carried out with use of, among the four alignment markers 84 provided in the alignment marker sections 83 of the shadow mask 81, the two alignment markers 84 on the left in FIG. 33, and if (ii) vapor deposition is carried out in the direction opposite to the substrate scanning direction indicated by the arrow in FIG. 33, the alignment between the film formation substrate 200 and the shadow mask 81 is carried out with use of the two alignment markers 84 on the right in FIG. 33.

The alignment between the film formation substrate 200 and the shadow mask 81 is carried out as follows: When the alignment marker sections 220 of the film formation substrate 200 reach the alignment marker sections 83 of the shadow mask 81, the movement (scan) of the film formation substrate 200 is temporarily stopped. Then, (i) the substrate holding member 71 (the substrate moving mechanism 70) such as a substrate stage and (ii) the mask clamps 130, for example, are moved in consideration of the respective positions of the shadow mask 81 and the film formation substrate 200, parallelism of the film formation substrate 200, and the size of the shadow mask 81. Preparing in advance the shadow mask 81 with a small size as described above allows the mask tension mechanism 88 to function as such to prevent bending of the shadow mask.

In the present embodiment as well as the embodiments above, the substrate position is corrected with use of the alignment markers 84 and 221 before the film formation substrate 200 enters the region (vapor deposition area) in which vapor deposition particles from the vapor deposition source 85 are deposited. Thus, in the present embodiment as well as the embodiments above, the alignment markers 221 (that is, the alignment marker sections 220) are located away, downstream and upstream in the substrate scanning direction respectively, from respective opposite ends of the vapor deposition region 210 which ends are juxtaposed along the substrate scanning direction (see FIG. 33).

In the present embodiment as well as the embodiments above, the film formation substrate 200 is, for example, the TFT substrate 10 described above. With this arrangement, in the case of carrying out, as a pattern formation for the vapor deposition film 211, a pattern formation for organic EL layers such as the luminous layers 23R, 23G, and 23B as described above, the present embodiment can carry out discriminative application vapor deposition of such organic EL layers accurately.

In the above case, vapor deposition can be carried out under conditions that are, for example, similar to those described in Embodiment 1 above.

The present embodiment, as an example, assumed (i) 100 mm for the gap g2 between the vapor deposition source 85 and the shadow mask 81 and (ii) 200 μm for the distance between the TFT substrate 10 serving as the film formation substrate 200 and the shadow mask 81.

The present embodiment further assumed (i) for a substrate size of the TFT substrate 10, 320 mm along the scanning direction and 400 mm along the direction perpendicular to the scanning direction and (ii) for widths of the vapor deposition region (display region), 260 mm for the width along the scanning direction (that is, the width d4) and 310 mm for the width (that is, the width d3) along the direction perpendicular to the scanning direction.

The present embodiment assumed 360 μm (along the scanning direction)×90 μm (along the direction perpendicular to the scanning direction) for widths of the openings 15R, 15G, and 15B for the respective sub-pixels 2R, 2G, and 2B of the TFT substrate 10. The present embodiment further assumed 480 μm (along the scanning direction)×160 μm (along the direction perpendicular to the scanning direction) for a pitch between the openings 15R, 15G, and 15B. In the present embodiment as well as the embodiments above, the pitch between the openings 15R, 15G, and 15B (that is, a pitch between pixel openings) refers to a pitch between respective openings 15R, 15G, and 15B for the sub-pixels 2R, 2G, and 2B adjacent to one another, but not to a pitch between sub-pixels of an identical color.

The present embodiment used, as the shadow mask 81, a shadow mask having (i) a length of 700 mm along the width d1 (that is, the width along the direction perpendicular to the scanning direction) along each long side 81a (corresponding to the long-axis direction) and (ii) a length of 200 mm along the width d2 (that is, the width along the scanning direction) along each short side 81b (corresponding to the short-axis direction).

The openings 82 of the shadow mask 81 were each in the shape of a slot (slot pattern) for reinforcement against a tension load on the shadow mask 81. The openings 82 of the shadow mask 81 were, in the size (absolute dimensions; designed values) taking thermal expansion and a mask tension into consideration, (i) each (that is, a single slot pattern) 4 mm along the substrate scanning direction and 130 μm along the direction perpendicular to the substrate scanning direction, (ii) 5 mm in pitch along the substrate scanning direction, and (iii) 480 μm in pitch along the direction perpendicular to the substrate scanning direction. The present embodiment included 30 slots along the substrate scanning direction, each of which had a pattern length of 150 mm. The vapor deposition rate was 2.0 nm/s.

Embodiment 12

The present embodiment is described below mainly with reference to FIGS. 36 through 45.

The present embodiment mainly deals with how the present embodiment is different from Embodiments 1 through 11 above. Constituent elements of the present embodiment that are identical in function to their respective equivalents described in Embodiments 1 through 11 are each assigned the same reference numeral, and are not described here.

Embodiments 1 through 11 above each describe, as a method for aligning the film formation substrate 200 and the shadow mask 81 with each other, (i) an example method for aligning the film formation substrate 200 and the shadow mask 81 with each other before vapor deposition on the basis of image recognition by the image sensor 90, or (ii) an example method for aligning the film formation substrate 200 and the shadow mask 81 with each other in real time on the basis of continuous image recognition by the image sensor 90.

The above example methods do not, however, ensure absolute reliability of mechanical accuracy in scanning the film formation substrate 200 or the mask unit 80 (relative movement thereof).

Thus, merely aligning the film formation substrate 200 and the shadow mask 81 with each other with use of the alignment markers 84 and 221 before the start of vapor deposition unfortunately leaves the risk of mispositioning between the film formation substrate 200 and the shadow mask 81, the mispositioning being caused by various factors such as the above mechanical accuracy, respective thermal expansions of the film formation substrate 200 and the shadow mask 81, and mispositioning of a pattern of the film formation substrate 200 such as the TFT substrate 10. Further, accuracy in image recognition is decreased in the case where, while a scan is carried out, the alignment markers 84 and 221 are simultaneously recognized from an image sensed by an image sensing element (image sensing means), such as a CCD, that is attached to the vacuum chamber 60. In particular, in the case where the mask unit 80 is moved relative to the film formation substrate 200, it is necessary to provide a plurality of image sensing elements or move the image sensing element in synchronization with the scan (relative movement) of the mask unit 80. In this case, accuracy in recognition is undeniably decreased.

Figure 36:
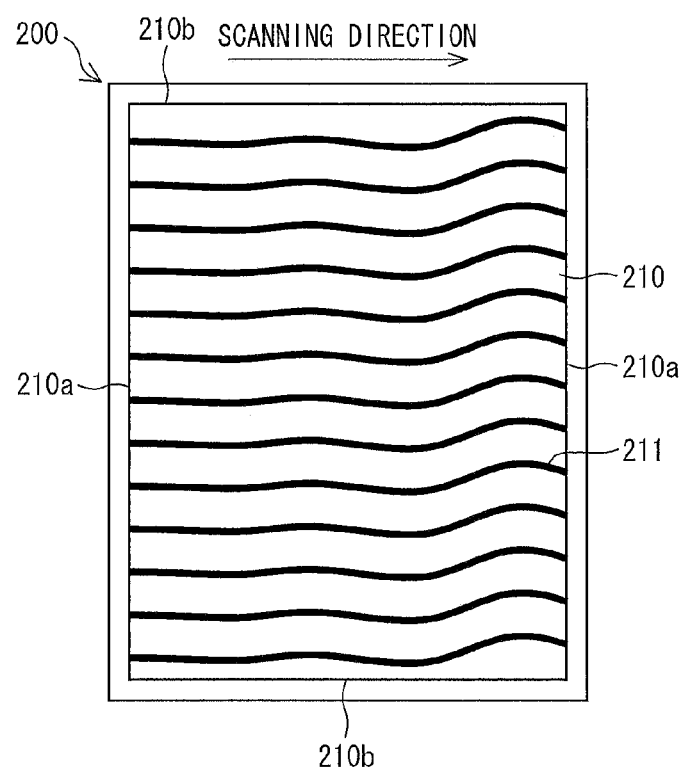
FIG. 36 is a plan view illustrating a vapor deposition pattern of a film formation substrate for a case in which there has occurred mispositioning between the film formation substrate and a vapor deposition mask.

FIG. 36 is a plan view illustrating a vapor deposition pattern formed on the film formation substrate 200 in a case where there occurs mispositioning between the film formation substrate 200 and the shadow mask 81.

Mispositioning between the film formation substrate 200 and the shadow mask 81, as illustrated in FIG. 36, leads to mispositioning of a vapor deposition pattern formed on the film formation substrate 200.

In view of this, the present embodiment continuously monitors (recognizes), with use of an alignment sensor (alignment observing means) and throughout a vapor deposition period, an alignment pattern formed on the film formation substrate 200 from end to end of a region, along the scanning direction of the film formation substrate 200, in which region at least a first one of the mask unit 80 and the film formation substrate 200 is moved relative to a second one thereof. This arrangement allows a scan and vapor deposition to be carried out while the alignment between the film formation substrate 200 and the shadow mask 81 is dynamically carried out by moving at least the first one of the film formation substrate 200 and the mask unit 80 relative to the second one thereof.

The present embodiment controls in real time the amount of mispositioning between the film formation substrate 200 and the shadow mask 81 as described above to prevent misalignment of the film formation substrate 200.

Figure 37:
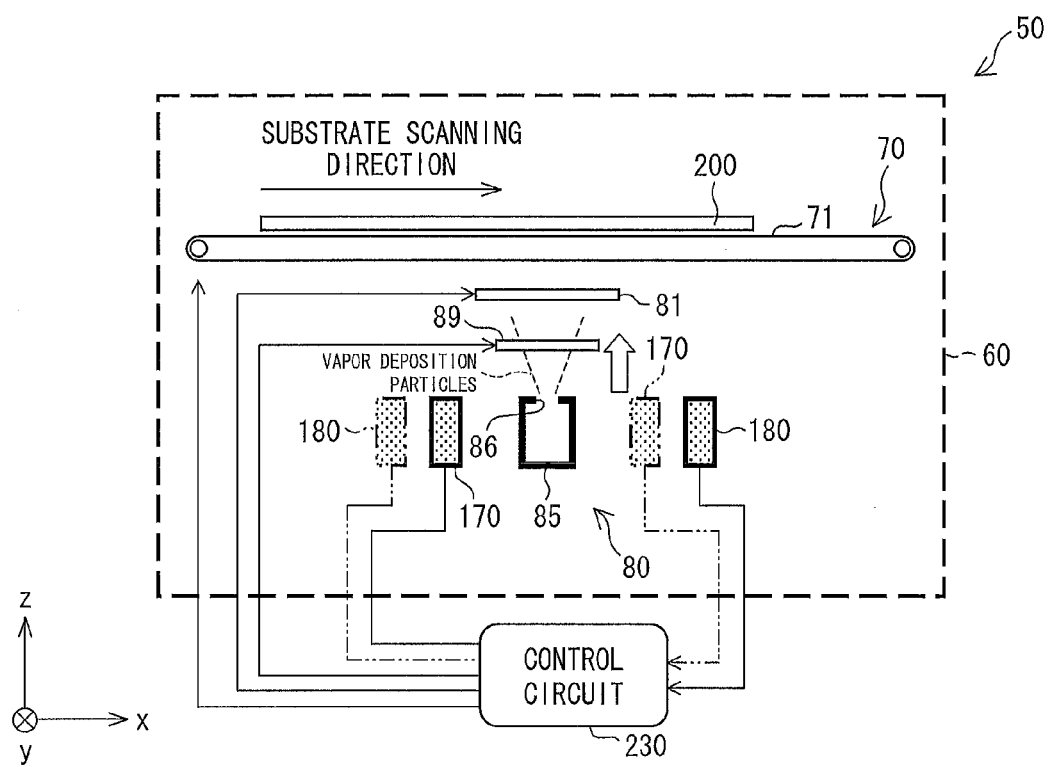
FIG. 37 is a cross-sectional view schematically illustrating a configuration of a main part of a vapor deposition device according to Embodiment 12 of the present invention.
Figure 38:
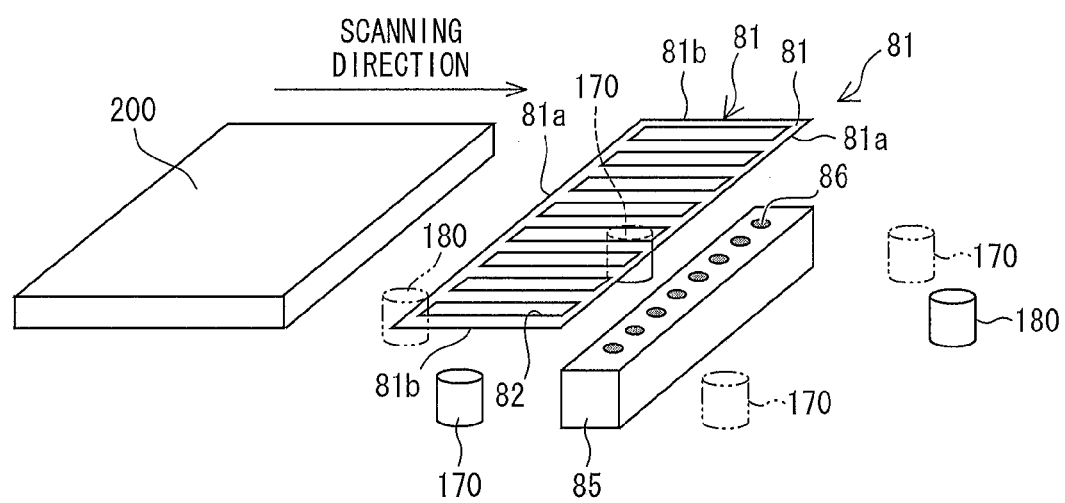
FIG. 38 is a bird's eye view illustrating main constituent elements inside a vacuum chamber of the vapor deposition device illustrated in FIG. 37.
Figure 39:
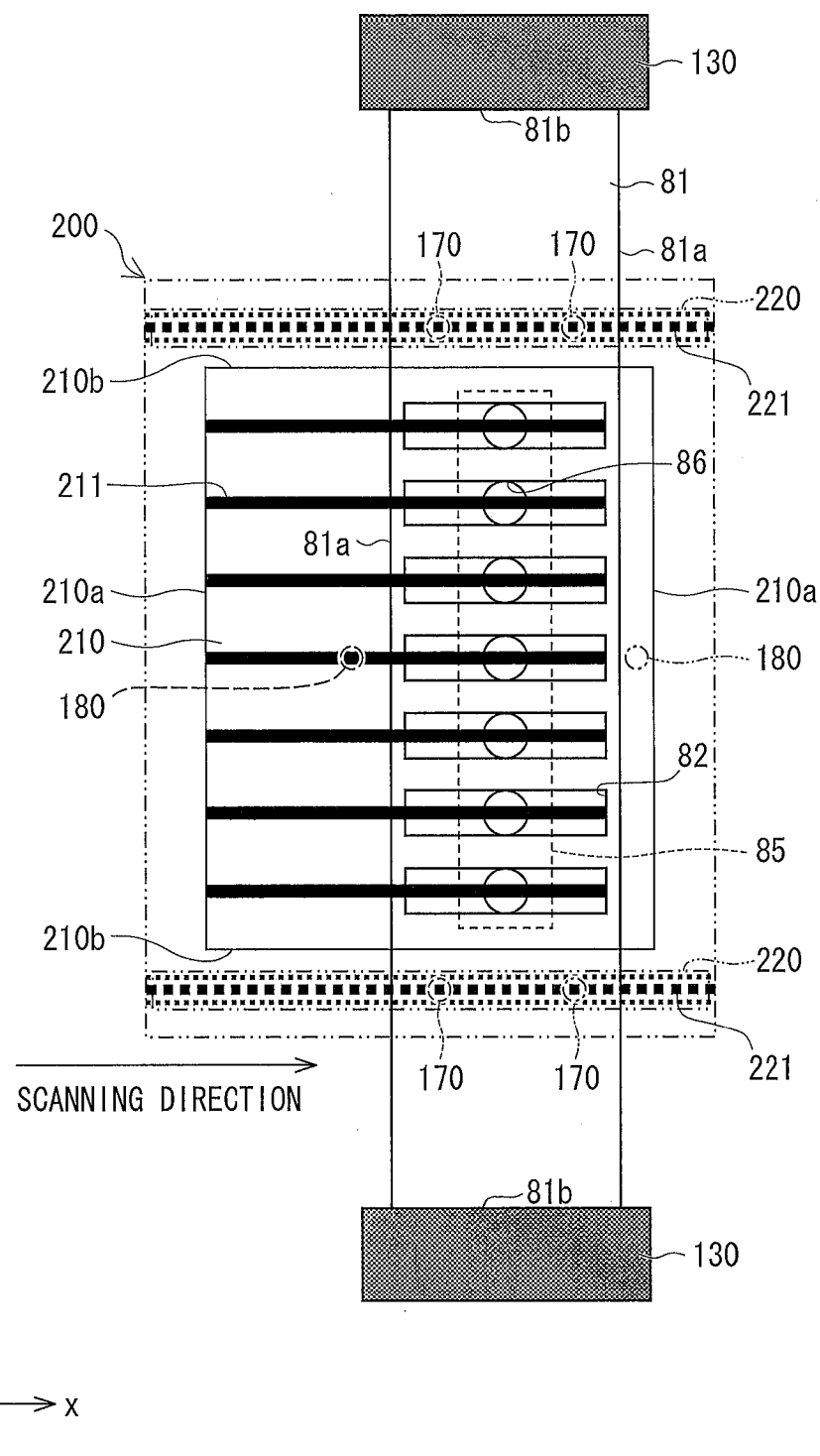
FIG. 39 is a plan view illustrating a positional relationship between an alignment pattern and vapor deposition pattern of the film formation substrate and a positional relationship between an alignment sensor and a film thickness sensor, the plan view being taken from a back surface side of the film formation substrate used in Embodiment 12 of the present invention.
Figure 40:
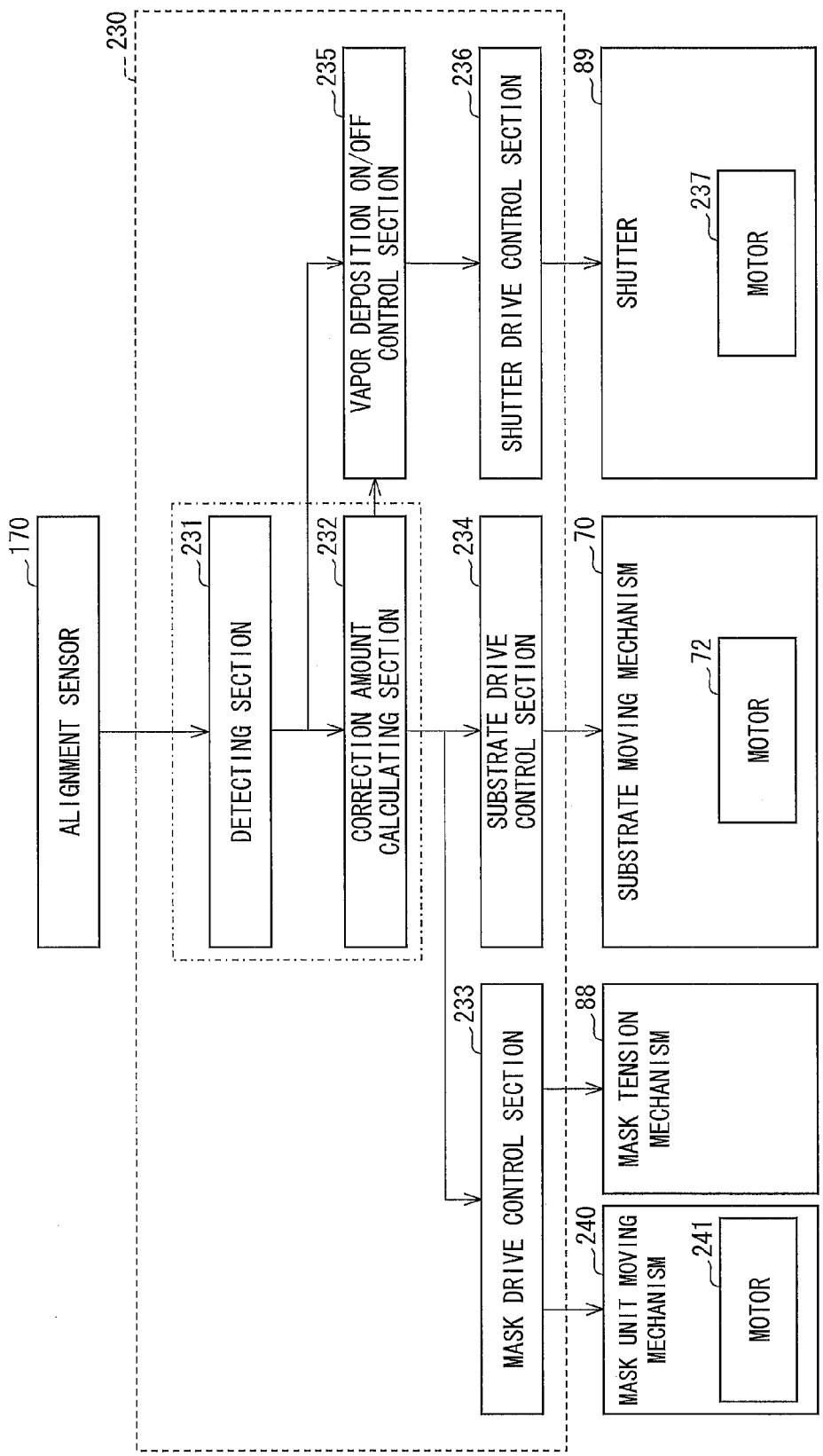
FIG. 40 is a block diagram partially illustrating a configuration of the vapor deposition device illustrated in FIG. 37.

FIG. 37 is a cross-sectional view schematically illustrating a configuration of a main part of the vapor deposition device 50 of the present embodiment. FIG. 38 is a bird's eye view of main constituent elements inside the vacuum chamber 60 of the vapor deposition device 50 illustrated in FIG. 37. FIG. 39 is a plan view taken from a back surface side of the film formation substrate and illustrating positional relationships, observed in the film formation substrate 200 for use in the present embodiment, between an alignment pattern and a vapor deposition pattern and between an alignment sensor and a film thickness sensor. FIG. 39 illustrates a state observed in the process of a film formation. FIG. 39 indicates the film formation substrate by a chain double-dashed line for convenience of illustration. FIGS. 40 and 41 are each a block diagram partially illustrating a configuration of the vapor deposition device 50 illustrated in FIG. 37.

The vapor deposition device 50 of the present embodiment, as illustrated in FIG. 37, includes: a vacuum chamber 60 (film growing chamber); a substrate moving mechanism 70 (substrate moving means; moving means); a mask unit 80; an alignment sensor 170 (alignment observing means); a film thickness sensor 180; and a control circuit 230.

The vapor deposition device 50 of the present embodiment is, as illustrated in FIGS. 37 through 39, different from those of Embodiments 1 through 11 above in that it includes, as alignment observing means, an alignment sensor 170 that is fixed in position relative to the shadow mask 81 and that is so provided in the vacuum chamber 60 as to be adjacent to the shadow mask 81 and the vapor deposition source 85 (that is, at such a position that the alignment sensor is next to the shadow mask and the vapor deposition source).

The alignment sensor 170 simply needs to be fixed in position relative to the shadow mask 81 similarly to the vapor deposition source 85, and may be integrated with or independent of the mask unit 80.

More specifically, in a case where the mask unit 80 is fixed inside the vacuum chamber 60 and the film formation substrate 200 is moved relative to the mask unit 80, the alignment sensor 170 may be, for example, (i) fixed directly to an inner wall of the vacuum chamber 60 or (ii) held by a mask holding member 87 (not illustrated in FIG. 37; see, for example, FIG. 1), similarly to the vapor deposition source 85. In a case where the mask unit 80 is moved relative to the film formation substrate 200, the alignment sensor 170 may be held by the mask holding member 87 (see, for example, FIG. 1). Further, the alignment sensor 170 may alternatively be held by an alignment sensor moving mechanism for holding the alignment sensor 170, the alignment sensor moving mechanism being (i) provided separately from the mask holding member 87 and (ii) moved relative to the film formation substrate 200 while maintaining its position relative to the mask unit 80 (that is, the alignment sensor moving mechanism follows a mask unit moving mechanism 240 [see FIG. 40] including the mask holding member 87).

In the case where the alignment sensor 170 is provided independently of the mask unit 80, it is necessary to carry out an alignment to fix the respective positions of the alignment sensor 170 and the shadow mask 81 relative to each other.

The alignment sensor 170 is thus preferably incorporated in (that is, integrated with) the mask unit 80. In other words, the mask unit 80 preferably includes an alignment sensor 170 that is fixed in position relative to the shadow mask 81 (in which case also, there is a minute operating region due to the alignment process as described above).

The alignment sensor 170 is not particularly limited as long as it is capable of continuously observing an alignment pattern formed on the film formation substrate 200.

The alignment sensor 170 may be an optical sensor or a sensor (for example, an ultrasonic sensor) other than an optical sensor.

The optical sensor is, for example, (i) an image sensor including an image sensing element (image sensing means) such as a CCD, (ii) a sensor for detecting the intensity of reflection of, for example, laser light or infrared light, or (iii) a sensor for detecting the distribution of light scattered by the alignment markers 221.

In the case where the alignment sensor 170 is, as described above, a sensor for detecting the intensity of reflection of, for example, laser light or infrared light, the respective positions of the alignment markers 221 can be detected from the intensity of reflection. In the case where the alignment sensor 170 is, as described above, a sensor for detecting the distribution of light scattered by the alignment markers 221, the respective positions of the alignment markers 221 can be determined from a variation in the distribution of light scattered by the alignment marker 221.

The optical sensor is, for example, a sensor, such as (i) a position sensor, (ii) an LED alignment sensor, and (iii) a detector (for example, a half-divided detector or a quadrantly-divided detector), which detects the position of a luminous flux to measure the position of a detection object.

Any of the above sensors can be a commercially available sensor. Among others, an undivided position sensor is capable of measuring the position of a rapidly moving spot with high precision.

The alignment sensor 170 can detect the alignment markers 221 by any of various publicly known systems such as LSA (laser step alignment) system and LIA (laser interferometric alignment) system.

The substrate position is, as described above, desirably corrected with use of the alignment markers 84 and 221 before the film formation substrate 200 enters a region (vapor deposition area) in which vapor deposition particles from the vapor deposition source 85 are deposited.

Thus, in the present embodiment as well as the embodiments above, an alignment marker 84 of the shadow mask 81 is preferably provided at an end of the shadow mask 81 which end is located downstream in the direction in which the substrate makes its entry. More preferably, alignment markers 84 are provided at both ends of the shadow mask 81 which ends are juxtaposed along the substrate entry direction.

Thus, the alignment sensor 170 is, similarly to the alignment markers 84, preferably so provided as to face the end of the shadow mask 81 which end is located downstream in the substrate entry direction, or more preferably so provided as to face both ends of the shadow mask 81 which ends are juxtaposed along the substrate entry direction.

In the case where, for example, reciprocating vapor deposition is carried out, alignment markers 84 are preferably provided, as described above, at both ends juxtaposed along the substrate scanning direction (that is, at the four corners). Thus, in the case where reciprocating vapor deposition is carried out, there is preferably (i) also provided, as indicated by a chain double-dashed line in FIGS. 37 through 39, an alignment sensor 170 at such a position as to, in the case where the film formation substrate 200 and the mask unit 80 are moved relative to each other (that is, scanned) in the direction opposite to the substrate scanning direction indicated by an arrow in FIGS. 37 through 39, face the end of the shadow mask 81 which end is located downstream in the substrate entry direction, or there are (ii) more preferably also provided alignment sensors 170 at such positions as to face both ends of the shadow mask 81 which ends are juxtaposed along the substrate entry direction.

Further, it is possible to determine mispositioning (θ mispositioning) along the rotation direction between the shadow mask 81 and the film formation substrate 200 by, as in the case of providing alignment markers 84 at the four corners of the shadow mask 81, providing (i) a plurality of alignment markers 84 to the shadow mask 81 along the scanning direction and (ii) a plurality of alignment sensors 170 along the scanning direction in correspondence with the alignment markers 84. Thus, regardless of whether reciprocating vapor deposition is carried out, it is preferable to provide a plurality of alignment markers 84 and a plurality of alignment sensors 170 both along the scanning direction (for example, the substrate scanning direction).

As described above, the present embodiment, while carrying out vapor deposition, continuously observes an alignment pattern provided on the film formation substrate 200. Thus, the film formation substrate 200 is provided with, as illustrated in FIG. 39, an alignment pattern that is formed by a plurality of alignment markers 221 throughout the entire scan region of the film formation substrate 200 along the scanning direction. Further, as described above, the alignment markers 84 and 221 are more preferably provided at both ends of the shadow mask 81 which ends are juxtaposed along the substrate entry direction. Thus, the alignment pattern (that is, the alignment marker section 220) is preferably so provided, along the short sides 210b and 210b of the vapor deposition region 210, which are parallel to the substrate scanning direction, as to sandwich the vapor deposition region 210.

In the present embodiment, the amount of scanning the film formation substrate 200 can be determined accurately by, as described above, continuously monitoring (recognizing) the alignment marker 221 (alignment pattern), which is provided along the scanning direction of the film formation substrate 200, through the mask openings of the shadow mask 81 throughout a vapor deposition period. This arrangement makes it possible to carry out vapor deposition control more accurately.

The vapor deposition device 50 of the present embodiment, as illustrated in FIGS. 37 through 39, includes a film thickness sensor 180 for measure the film thickness of a vapor deposition film 211 formed on the film formation substrate 200.

The film thickness sensor 180, for example, measures the film thickness of a vapor deposition film 211 actually deposited on the film formation substrate 200, and thus controls the film thickness of the vapor deposition film 211 to be formed on the film formation substrate 200.

The film thickness sensor 180 is, similar to the alignment sensor 170, preferably fixed in position relative to the shadow mask 81 and the vapor deposition source 85. This arrangement allows the film thickness of the vapor deposition film 211 to be formed on the film formation substrate 200 to be controlled continuously and in real time while a vapor deposition film 211 is being formed (deposited) on the film formation substrate 200.

Thus, the film thickness sensor 180 is, for example, provided at a portion of the shadow mask 81 which portion is provided downstream in the substrate scanning direction (that is, on the downstream side of the substrate scanning direction). The film thickness sensor 180 is, for example, provided (i) at a portion of the shadow mask 81 which portion is located downstream in the substrate scanning direction (that is, on the downstream side of the substrate scanning direction), (ii) in the vicinity of a central portion, along the substrate scanning direction, of the vapor deposition area of the vapor deposition source 85, and (iii) adjacently to the shadow mask 81 and the vapor deposition source 85 (that is, so that the thickness sensor 180 is next to the shadow mask 81 and the vapor deposition source 85). The film thickness sensor 180 is desirably provided at a position that is as close as possible to the shadow mask 81 and the vapor deposition source 85. This arrangement allows the film thickness sensor 180 to observe the vapor deposition film 211 on the film formation substrate 200 that has just passed the shadow mask 81.

The film formation substrate 200 includes a portion that faces the film thickness sensor 180, the portion serving as a film thickness monitor region section.

The film thickness sensor 180 can be, for example, a commercially available film thickness sensor, and can thus be any film thickness sensor. The film thickness sensor 180 suitably uses, for example, a non-contact technique of calculating a film thickness by (i) emitting laser light to the vapor deposition film 211 serving as an object and (ii) detecting, for example, the intensity of reflection of the laser light or the spectrum of the laser light. The film thickness sensor is, however, not limited to such an arrangement. The film thickness sensor may thus use a technique involving fluorescence based on ultraviolet light or X-rays, or may be a film thickness sensor of an eddy current type or a contact type.

The following describes, mainly with reference to FIG. 40, a process (alignment control) carried out by the vapor deposition device 50 for an alignment adjustment. The description below deals with an example case in which the alignment sensor 170 is a sensor for measuring the intensity of reflection of laser light. The present embodiment is, however, not limited to such an arrangement.

The alignment sensor 170 functions as position detecting means for carrying out an alignment between the film formation substrate 200 and the shadow mask 81. As illustrated in FIG. 37, the vapor deposition device 50 of the present embodiment includes, as a control circuit, a control circuit 230 having the configuration illustrated in FIGS. 40 and 41.

As illustrated in FIG. 40, the control circuit 230 includes, in its alignment control section: a detecting section 231 (difference detecting section; computing section); a correction amount calculating section 232 (computing section); a mask drive control section 233; a substrate drive control section 234; a vapor deposition ON/OFF control section 235; and a shutter drive control section 236.

The detecting section 231 and the correction amount calculating section 232 correspond to the computing section 102 in FIG. 4. The vapor deposition ON/OFF control section 235 corresponds to the vapor deposition ON/OFF control section 104 in FIG. 4.

The detecting section 231 detects (as a difference), from a detection signal from the alignment sensor 170, (i) the amount of positional difference (that is, a shift component along the x axis direction and the y axis direction, and a rotation component on the x-y plane) between the alignment markers 221 and the alignment markers 84 and (ii) the amount of scanning the film formation substrate 200. The detecting section then transmits a result of the detection to the correction amount calculating section 232 and the vapor deposition ON/OFF control section 235.

The correction amount calculating section 232 determines, on the basis of the detection result received from the detecting section 231, the amount of movement of the film formation substrate 200 and the shadow mask 81 relative to each other (for example, the amount of movement of the film formation substrate 200 relative to the shadow mask 81). Specifically, the correction amount calculating section 232 calculates, from the detection result received from the detecting section 231, (i) the amount of alignment correction (that is, the value of correction to the substrate position of the film formation substrate 200) and (ii) the amount of correction to the substrate scan. The correction amount calculating section then supplies a result of the calculation, in the form of a correction signal, to the mask drive control section 233, the substrate drive control section 234, and the vapor deposition ON/OFF control section 235.

In the present embodiment as well as the embodiments above, the amount of alignment correction (that is, the value of correction to the substrate position of the film formation substrate 200) is determined by computation with respect to the direction perpendicular to the substrate scanning direction and a rotation direction of the film formation substrate 200.

The mask drive control section 233 and the mask unit moving mechanism 240, on the basis of the correction signal from the correction amount calculating section 232, move at least a first one of the film formation substrate 200 and the mask unit 80 relative to a second one thereof so that the film formation substrate 200 and the mask unit 80 are each moved to a suitable scanning position.

Specifically, the mask drive control section 233, on the basis of the correction signal from the correction amount calculating section 232, drives, for example, at least one of (i) a motor 241, such as an XY θ drive motor, that is included in the mask unit moving mechanism (mask unit moving means) 240 connected to the mask unit 80 and (ii) the mask tension mechanism 88.

With the above arrangement, the mask unit moving mechanism 240, while maintaining the respective positions of the shadow mask 81 and the vapor deposition source 85 relative to each other, moves the mask unit 80 relative to the film formation substrate 200 so that the shadow mask 81 is at an appropriate vapor deposition position.

The mask tension mechanism 88 adjusts tension to the shadow mask 81 so that the shadow mask 81 is at an appropriate vapor deposition position.

The substrate drive control section 234 corrects the substrate position of the film formation substrate 200 by driving, on the basis of the correction signal from the correction amount calculating section 232, a motor 72, such as an XY θ drive motor, that is included in the substrate moving mechanism 70 and that is connected to the substrate holding member 71.

As described above, the present embodiment (i) derives, from the amount of misalignment and the amount of a substrate scan, their respective correction values and (ii) adjusts (controls) an alignment between the shadow mask 81 and the film formation substrate 200 on the basis of the above correction values.

In other words, in the present embodiment, the mask unit moving mechanism 240, the mask tension mechanism 88, and the substrate moving mechanism 70 each also function as adjusting means for adjusting the respective positions of the film formation substrate 200 and the shadow mask 81 relative to each other.

The vapor deposition ON/OFF control section 235 calculates, from (i) the substrate scan amount detected by the detecting section 231 and (ii) the substrate scan correction amount calculated by the correction amount calculating section 232, the position of the film formation substrate 200 relative to the vapor deposition area of the vapor deposition source 85. The vapor deposition ON/OFF control section then generates (i) a vapor deposition ON signal at the start-end of a film formation region (vapor deposition region) for the vapor deposition film 211 and (ii) a vapor deposition OFF signal at the rear-end of the film formation region.

The shutter drive control section 236, upon receipt of a vapor deposition OFF signal from the vapor deposition ON/OFF control section 235, closes the shutter 89 by driving a motor 237 (shutter drive motor; motor section) for driving the shutter 89. The shutter drive control section, upon receipt of a vapor deposition ON signal from the vapor deposition ON/OFF control section 235, opens the shutter 89 by driving the motor 237 (shutter drive motor; motor section) for driving the shutter 89.

The following describes, with reference to (a) and (b) of FIG. 42, a method for determining the amount of misalignment from the intensity of reflection of laser light. (a) and (b) of FIG. 42 each illustrate a case in which the film formation substrate 200 is moved relative to the shadow mask 81.

(a) of FIG. 42 is a plan view schematically illustrating an arrangement of a main part of the alignment marker section 220 illustrated in FIG. 39. (b) of FIG. 42 is a plan view illustrating a positional relationship between (i) the individual alignment markers 221 making up an alignment pattern of the alignment marker section 220 illustrated in (a) of FIG. 42, (ii) alignment markers 84 of the shadow mask 81, and (iii) laser spots. (b) of FIG. 42 illustrates only alignment markers 84 for the shadow mask 81 and omits the shadow mask 81 itself for convenience of illustration.

The alignment markers 221 are preferably made of a high reflective material. The alignment markers 221 are made of, for example, a metal material such as Al (aluminum) and Ti (titanium).

The alignment markers 221 are formed in advance on the film formation substrate 200. The alignment markers 221 can be made of, for example, a reflective material (high reflective member) such as an electrode material used in, for example, the TFT substrate 10. Thus, the alignment markers 221 are desirably (i) formed during an electrode forming step for forming, for example, gate electrodes, source electrodes, and drain electrodes of the film formation substrate 200 such as the TFT substrate 10 and (ii) made of the material of which the above electrodes are made. This arrangement makes it possible to avoid, for example, the problem of an increase in the number of steps which increase arises from providing the alignment markers 221 to the film formation substrate 200 and the problem of a cost increase due to, for example, use of another material.

The shadow mask 81 preferably is made of a low reflective material or has been subjected to a low reflection process.

The alignment markers 84, as described above, each include an opening (mask opening) provided in an alignment marker section 83 of the shadow mask 81.

As illustrated in (b) of FIG. 42, the shadow mask 81 includes, for example, two alignment markers 84 as the above alignment markers 84 along the scanning direction (hereinafter, the two alignment markers 84 are referred to as a "first opening 84a" and a "second opening 84b" in the order from the upstream side of the substrate scanning direction). The first opening 84a and the second opening 84b are each so placed as to pass a position directly above a pattern border of each alignment marker 221.

The first opening 84a and the second opening 84b are each irradiated with laser light emitted from a laser light emitting section of the alignment sensor 170.

The alignment sensor 170 (i) emits laser light from the laser light emitting section to the first opening 84a and the second opening 84b, (ii) measures the intensity of reflection from laser spots 171 caused by the laser light emitted to the first opening 84a and the second opening 84b, and (iii) supplies information on the intensity of reflection to the control circuit 230 in the form of a detection signal.

The control circuit 230 determines, on the basis of the reflection intensity measured by the alignment sensor 170, mispositioning between a laser spot 171 and an alignment marker 221, that is, mispositioning between an alignment marker 84 (that is, the first opening 84a and the second opening 84b) and a laser spot 171.

The detecting section 231 in the control circuit 230 detects, from a reflection intensity IR1 and a reflection intensity IR2, (i) the amount of positional difference (that is, a shift component along the x axis direction and the y axis direction, and a rotation component on the x-y plane) between the alignment markers 221 and the individual alignment markers 84 (that is, the first opening 84a and the second opening 84b) and (ii) the amount of scanning the film formation substrate 200. The reflection intensity IR1 refers to the intensity of reflection of laser light emitted in the form of a spot to the first opening 84a, that is, the alignment marker 84 located upstream in the substrate scanning direction. The reflection intensity IR2 refers to the intensity of reflection of laser light emitted in the form of a spot to the second opening 84b, that is, the alignment marker 84 located downstream in the substrate scanning direction.

Figure 43:
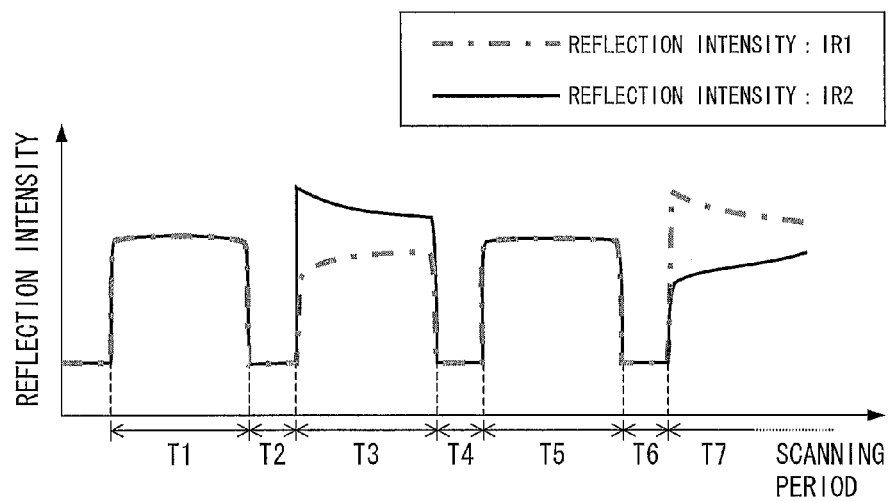
FIG. 43 is a graph illustrating a relation between the intensity of reflection of laser light and a period of scanning the film formation substrate, the graph being obtained from the relation between the alignment markers of the film formation substrate and the alignment markers of the vapor deposition mask illustrated in (b) of FIG. 42.

FIG. 43 is a graph illustrating a relation between (i) the intensity of reflection of laser light and (ii) a period of scanning the film formation substrate 200, the relation being obtained from a relation between the alignment markers 221 and the alignment markers 84 (that is, the first opening 84a and the second opening 84b) both illustrated in (b) of FIG. 42.

The graph of FIG. 43 illustrates an initial first period T1, which indicates a state in which the reflection intensity IR1 is equal to the reflection intensity IR2. The first period T1, in other words, indicates a correct positional relationship between the alignment markers 221 and the individual alignment markers 84 (that is, the first opening 84a and the second opening 84b). With reference to, for example, the example illustrated in (b) of FIG. 42, the first period T1 indicates that respective border sections (that is, a side of each alignment marker 221 which side is parallel to the substrate scanning direction) of the alignment markers 221 each pass through respective central portions of the first opening 84a and the second opening 84b identically, and thus indicates a correct alignment between the shadow mask 81 and the film formation substrate 200.

The following second period T2 indicates a decrease in each of the reflection intensities IR1 and IR2. This is because the alignment markers 221, which are provided discontinuously, cannot be observed through the first opening 84a and the second opening 84b.

The following third period T3 indicates an increase in each of the reflection intensities IR1 and IR2 because the alignment markers 221 can be observed again through the first opening 84a and the second opening 84b.

The third period T3, however, indicates that the reflection intensity IR2 is higher than the reflection intensity IR1. This specifically indicates that (i) an area of an alignment marker 221 which area is exposed through the second opening 84b is larger than an area of an alignment marker 221 which area is exposed through the first opening 84a and that (ii) a larger area of an alignment marker 221 is observed through the second opening 84b than through the first opening 84a.

In other words, the third period T3 indicates that an alignment marker 221 is deviated to the second opening 84b side and that the alignment is incorrect between the alignment markers 221 and the alignment markers 84 (that is, the first opening 84a and the second opening 84b).

Thus, during the third period T3, an alignment adjustment is carried out on the basis of the difference in the intensity of reflection. This makes it possible to achieve, during a fifth period T5 in which the alignment markers 221 can next be observed again through the first opening 84a and the second opening 84b, the state in which the reflection intensity IR1 is equal to the reflection intensity IR2 as in the first period T1.

The fifth period T5 indicates that, as in the first period T1, the alignment is correct between the alignment markers 221 and the alignment markers 84 (that is, the first opening 84a and the second opening 84b).

During (i) a fourth period T4 between the third period T3 and the fifth period T5 and (ii) a sixth period T6 between the fifth period T5 and a seventh period T7, the reflection intensities IR1 and IR2 are both low as in the second period T2 since the alignment markers 221 are far from the first opening 84*a* and the second opening 84*b*.

The following seventh period T7 indicates an increase in each of the reflection intensities IR1 and IR2 because the alignment markers 221 can be observed again through the first opening 84*a* and the second opening 84*b*.

The seventh period T7, however, indicates that the reflection intensity IR1 is higher than the reflection intensity IR2. This specifically indicates that (i) an area of an alignment marker 221 which area is exposed through the first opening 84*a* is larger than an area of an alignment marker 221 which area is exposed through the second opening 84*b* and that (ii) an alignment marker 221 is deviated to the first opening 84*a* side.

Thus, during the seventh period T7, an alignment adjustment is carried out on the basis of the difference in the intensity of reflection. This makes it possible to achieve, during a period in which the alignment markers 221 can next be observed again through the first opening 84*a* and the second opening 84*b*, the state in which the reflection intensity IR1 is equal to the reflection intensity IR2.

The present embodiment, as described above, (i) measures the reflection intensity that changes with the elapse of the scanning period, and (ii) can thus, in real time, detect mispositioning between the alignment markers 83 and the alignment markers 221 while scanning a substrate (that is, carrying a substrate).

Further, in the case where there are provided, as described above, a plurality of mask openings as the alignment markers 84 along the substrate scanning direction, it is possible to determine, on the basis of the difference between reflection intensities obtained from the respective mask openings, the side to which an alignment marker 221 is deviated from a mask opening.

Thus, providing a plurality of alignment markers 84 along the scanning direction as described above further makes it possible to observe mispositioning (θ mispositioning) along the rotation direction between the shadow mask 81 and the film formation substrate 200.

Thus, in the case where, as illustrated in FIG. 39, (i) the shadow mask 81 in use has a long side 81*a* with a width that is larger than the width of a side (that is, a long side 210*a*) of the vapor deposition region 210 of the film formation substrate 200 which side faces each long side 81*a* of the shadow mask 81 and (ii) the film formation substrate 200 is scanned along a side (that is, a short side 210*a*) perpendicular to the above side (that is, the long side 210*a*) of the film formation substrate 200, even if the alignment markers 221 are provided on only one of the two sides (that is, the short sides 210*a* and 210*a*) parallel to the scanning direction, it is possible to correct the misalignment, including θ mispositioning, by adjusting the alignment so that the respective reflection intensities obtained from the mask openings are equal to each other as described above. This arrangement makes it possible to carry out an alignment correctly.

In the case where, as illustrated in FIG. 39, the alignment markers 84 and 221 are provided on both end sides of the vapor deposition region 210 of the film formation substrate 200 (that is, on both sides juxtaposed along the direction perpendicular to the substrate scanning direction), it is possible to determine not only the amount of scanning the film formation substrate 200 but also θ mispositioning in alignment regardless of whether there are provided a plurality of alignment markers 84 along the scanning direction as described above.

The following describes a method for determining θ mispositioning in alignment on the basis of alignment markers 84 and 221 provided, as described above, on both end sides of the vapor deposition region 210 of the film formation substrate 200.

Figure 44:
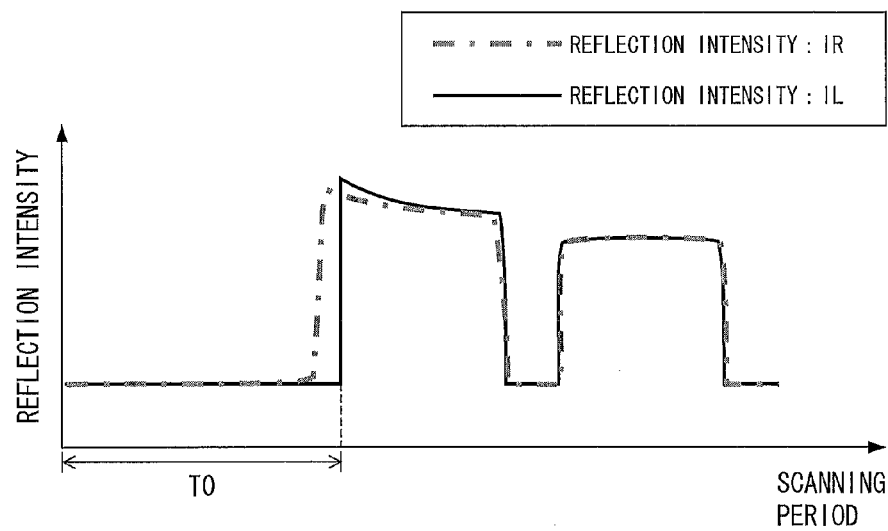
FIG. 44 is a graph illustrating a relation between the intensity of reflection and the period of scanning the film formation substrate, the relation being observed after the start of scanning the film formation substrate.

FIG. 44 is a graph illustrating a relation between the intensity of reflection and a period of scanning the film formation substrate 200, the relation being observed after introduction of the film formation substrate 200 (that is, after the start of a substrate scan).

FIG. 44 illustrates IR and IL, which indicate the intensities of reflection from respective alignment markers 221 and 221 so provided on respective end sides of the vapor deposition region 210 of the film formation substrate 200 as to be opposite to each other, the intensities having been measured with use of alignment markers 84 and 84 (mask openings) so provided, as illustrated in FIG. 39, as to be opposite to each other along the direction perpendicular to the scanning direction of the shadow mask 81.

The graph of FIG. 44 illustrates a signal produced from the reflection intensity IR which signal rises first during an initial period T0, which extends from the introduction of the substrate until the end of a certain length of time. This indicates that (i) the alignment marker 221 from which the reflection intensity IR has been obtained has been detected earlier than the alignment marker 221 from which the intensity of reflection IL has been obtained, and that (ii) the alignment marker 221 from the reflection intensity IR has been obtained is located ahead of the alignment marker 221 from which the intensity of reflection IL has been obtained. In other words, the above indicates that there has occurred θ mispositioning (undesired shift in rotation) in the alignment between the film formation substrate 200 and the shadow mask 81.

Under such circumstances, it is possible to correct the position of the film formation substrate 200 during the initial period T0 by, for example, causing, as described above, the substrate drive control section 234 to (i) drive the motor 72, such as an XY θ drive motor, that is connected to the substrate holding member 71 and thus (ii) move (rotate) the substrate holding member 71 along a θ direction to in turn move (rotate) the film formation substrate 200 along the θ direction. This arrangement makes it possible to correct the θ mispositioning.

The present embodiment is arranged such that, as illustrated in (a) and (b) of FIG. 42, the alignment markers 221 are provided discontinuously and that, as illustrated in FIG. 43, the intensity of reflection changes discontinuously as well.

Thus, counting cycles of the above change makes it possible to accurately determine (monitor) the amount of scanning the film formation substrate 200.

The above arrangement in turn makes it possible to more accurately control, for example, the timing of opening and closing the shutter 89, and consequently carry out vapor deposition with higher accuracy.

In (a) and (b) of FIG. 42, the discontinuous cycle (formation cycle) of the alignment markers 221 is fixed. The present embodiment is, however, not limited to such an arrangement. It is possible to more accurately determine the position of the film formation substrate 200 (that is, the scan amount) in a case where, for example, the discontinuous cycle (formation cycle) of the alignment markers 221 is intentionally varied according to the position in the film formation substrate 200, for example, the width of the discontinuation of the alignment markers 221 is varied, as illustrated in FIG. 45, from d11 to d12 according to the position in the film formation substrate 200.

Further, it is possible to more accurately determine the position of the film formation substrate 200 (that is, the scan amount) in a case where the shape of the alignment markers 221 is varied according to the position in the film formation substrate 200 either instead of or in combination with varying, as described above, the discontinuous cycle (formation cycle) of the alignment markers 221 according to the position in the film formation substrate 200.

The following describes, mainly with reference to FIG. 41, a process (film thickness control) carried out by the vapor deposition device 50 for film thickness adjustment. The description below deals with an example case in which the film thickness sensor 180 is a sensor for measuring the intensity of reflection from an object (that is, the vapor deposition film 211). The present embodiment is, however, not limited to such an arrangement.

While the method itself for detecting a film thickness varies according to the kind of sensor in use, the process itself of film thickness adjustment is basically identical. The method for detecting a film thickness may, in the case where, for example, a commercially available sensor is used, simply be a method that meets the specifications of such a sensor. The present embodiment thus omits a detailed description thereof. The present embodiment is, however, readily implementable even in a case where another sensor is used.

The same explanation applies, of course, to the above-described alignment sensor 170 as well.

As illustrated in FIG. 41, the control circuit 230 includes, each as a film thickness control section: a film thickness difference amount calculating section 251 (computing section); a correction amount calculating section 252 (computing section); a mask drive control section 233; a substrate drive control section 234; and a vapor deposition control section 253.

The film thickness difference amount calculating section 251 calculates the amount of difference in film thickness from the difference between (i) the reflection intensity detected by the film thickness sensor 180 and (ii) a reflection intensity for a film thickness set in advance. The film thickness difference amount calculating section then transmits a result of the calculation to the correction amount calculating section 252.

The correction amount calculating section 252, from the calculation result received from the film thickness difference amount calculating section 251, calculates, for example, (i) the amount of correction to the speed of scanning the film formation substrate 200 or the mask unit 80 or the amount of correction to the number of vapor deposition operations for the film formation substrate 200 or the mask unit 80, and (ii) the amount of correction to the temperature of the vapor deposition source 85. The correction amount calculating section then transmits a result of the calculation to the mask drive control section 233, the substrate drive control section 234, and the vapor deposition control section 253 in the form of a correction signal.

In the case where the mask unit 80 is moved relative to the film formation substrate 200, the mask drive control section 233 (i) on the basis of the correction signal from the correction amount calculating section 252, corrects (adjusts), for example, the number of rotations of the motor 241, such as an XY θ drive motor, included in the mask unit moving mechanism (mask unit moving means) 240 connected to the mask unit 80, and thus (ii) corrects (adjusts) the speed of scanning the mask unit 80. Alternatively, the mask drive control section, on the basis of the correction signal from the correction amount calculating section 252, drives the motor 241 to correct (adjust) the number of vapor deposition operations.

In the case where the film formation substrate 200 is moved relative to the mask unit 80, the substrate drive control section 234 (i) on the basis of the correction signal from the correction amount calculating section 252, corrects (adjusts), for example, the number of rotations of the motor 72, such as an XY θ drive motor, that is included in the substrate moving mechanism 70 and that is connected to the substrate holding member 71, and thus (ii) corrects (adjusts) the speed of scanning the film formation substrate 200. Alternatively, the substrate drive control section, on the basis of the correction signal from the correction amount calculating section 252, drives the motor 72 to correct (adjust) the number of vapor deposition operations.

The vapor deposition control section 253 (i) on the basis of the correction signal from the correction amount calculating section 252, drives, for example, heating means, such as a heater 260, included in the vapor deposition source and thus (ii) adjusts the temperature of the vapor deposition source 85.

As described above, the present embodiment, for example, (i) derives a correction value for a difference in film thickness from the amount of an actual difference included in a vapor deposition film 211 formed on the film formation substrate 200, and (ii) on the basis of the correction value, adjusts (controls) the film thickness of a vapor deposition film 211 to be deposited onto the film formation substrate 200.

FIG. 37 illustrates an example in which (i) the substrate moving mechanism 70 is a roller-type moving mechanism including, for example, a substrate holding member 71 having the shape of a frame and (ii) the film formation substrate 200 is moved relative to the mask unit 80.

The present embodiment is, however, not limited to such an arrangement. The present embodiment may alternatively be arranged, for example, such that, as described above, (i) a hydraulic moving mechanism is used and (ii) the film formation substrate 200 is moved relative to the mask unit 80. The present embodiment may further alternatively be arranged, as illustrated in FIG. 1, such that (i) the substrate holding member 71 includes an electrostatic chuck provided on a surface of the film formation substrate 200 which surface is opposite to a surface that faces the mask unit 80 and (ii) the film formation substrate 200 is moved in a state in which the film formation substrate 200 is adhered to the electrostatic chuck.

Further, the present embodiment may, of course, be arranged such that, as described above, the mask unit 80 is moved relative to the film formation substrate 200 with use of the mask drive control section 233. In this case, the present embodiment may be arranged such that (i) the film formation substrate 200 is fixed and only the mask unit 80 is moved or that (ii) both the film formation substrate 200 and the mask unit 80 are moved relative to each other.

The present embodiment can, as described above, while carrying out vapor deposition and a scan, carry out an alignment between the shadow mask 81 and the film formation substrate 200 in real time. The present embodiment can thus carry out a more accurate alignment. Further, the present embodiment, which eliminates the need to stop a scan for an alignment, can form a vapor deposition film 211 with higher efficiency. The present embodiment consequently makes it possible to produce a finished product with higher efficiency.

The present embodiment, as described above, only requires simple alignment markers 84 to be provided on the film formation substrate 200, and thus does not affect efficiency of use of the film formation substrate 200.

The present embodiment, instead of recognizing a pattern, uses laser light and monitors the intensity of reflection of the laser light. The present embodiment thus eliminates the need to include a complicated arithmetic unit and causes no occurrence of, for example, a recognition error. The present embodiment can consequently carry out a stable alignment more accurately with a simple device.

The present embodiment is characterized in that, as described above, it continuously measures the positional relationship between (i) the alignment markers 221 (alignment pattern) provided to the film formation substrate 200 in advance and (ii) the alignment markers 84 (alignment pattern) provided to the shadow mask 81, and thus determines the amount of a misalignment so as to carry out an alignment operation continuously. The present embodiment is not limited to the above-described examples as long as it has the above characteristic.

The present embodiment describes an example case in which, for determination of the amount of movement of the film formation substrate 200 and the shadow mask 81 relative to each other, the correction amount calculating section 232 calculates the amount of alignment correction and the amount of substrate scan correction from a detection result received from the detecting section 231. The present embodiment is, however, not limited to such an arrangement. The present embodiment may alternatively be arranged to, for example, determine a correction value for a substrate position of the film formation substrate 200 from the amount of positional difference between the alignment markers 221 and the alignment markers 84 with reference to a lookup table stored in advance in a storage section (storage means).

More specifically, the control circuit 100 may include: a storage section in which the lookup table is stored; and a selecting section for selecting (determining) a correction value for a substrate position of the film formation substrate 200 on the basis of the amount of positional difference between the alignment markers 221 and the alignment markers 84 with reference to the lookup table.

The present embodiment describes an example case in which the alignment sensor 170 is an optical sensor as described above. The alignment sensor 170 may, however, be a sensor other than an optical sensor as described above.

The present embodiment describes an example case in which the film thickness sensor 180 measures the film thickness of a vapor deposition film 211 actually deposited on the film formation substrate 200, and thus controls the film thickness of the vapor deposition film 211 to be formed on the film formation substrate 200.

The present embodiment is, however, not limited to such an arrangement. The present embodiment may alternatively be arranged to (i) calculate, from a change in resonance frequency of a quartz oscillator, the mass of a film formation material adhered to a surface of the quartz oscillator which surface serves to detect a film thickness, and (ii) convert, with use of a correction factor or the like stored in advance in the storage section, the amount of the film formation material, adhered to the above surface of the quartz oscillator, into the thickness of a film on the film formation substrate 200 so as to compare this thickness with a set film thickness.

The film thickness of the vapor deposition film 211 may be controlled in such a manner that (i) when vapor deposition particles released from the vapor deposition source 85 are deposited onto the film formation substrate 200, the film thickness sensor 180 detects, with use of a plurality of quartz oscillators, the density distribution for evaporation in a flow released from the vapor deposition source 85 and that (ii) the distance between the mask unit 80 and the film formation substrate 200 is adjusted in accordance with a gradient of the density distribution with use of, for example, an XYZ θ stage.

In a case where, for example, the film formation substrate 200 is a TFT substrate 10 or the like, as in Embodiment 1 above, the above alignment control (mask alignment process) is unnecessary for a layer to be deposited onto the entire surface of the film formation substrate 200. The above active control of a film thickness is, however, preferably carried out with respect to such a layer as well.

Embodiment 13

The present embodiment is described below mainly with reference to FIG. 46, and (a) and (b) of FIG. 47.

The present embodiment mainly deals with how the present embodiment is different from Embodiments 1 through 12 (particularly, Embodiment 12) above. Constituent elements of the present embodiment that are identical in function to their respective equivalents described in Embodiments 1 through 12 are each assigned the same reference numeral, and are not described here.

Embodiment 12 above mainly describes an example case in which the alignment sensor 170 is a sensor for measuring the intensity of reflection of laser light. The alignment sensor 170 is, however, not limited to such a sensor, and may thus be, as described above, an image sensor including an image sensing element such as a CCD.

The vapor deposition device 50 of the present embodiment is different from those of Embodiments 1 through 12 above in that, as in Embodiment 12 above, the alignment sensor 170 (image sensor) is so provided in the vacuum chamber 60 as to be adjacent to the shadow mask 81 and the vapor deposition source 85 (that is, at such a position that the alignment sensor is next to the shadow mask and the vapor deposition source) and that the alignment sensor is fixed in position relative to the shadow mask 81.

Figure 46:
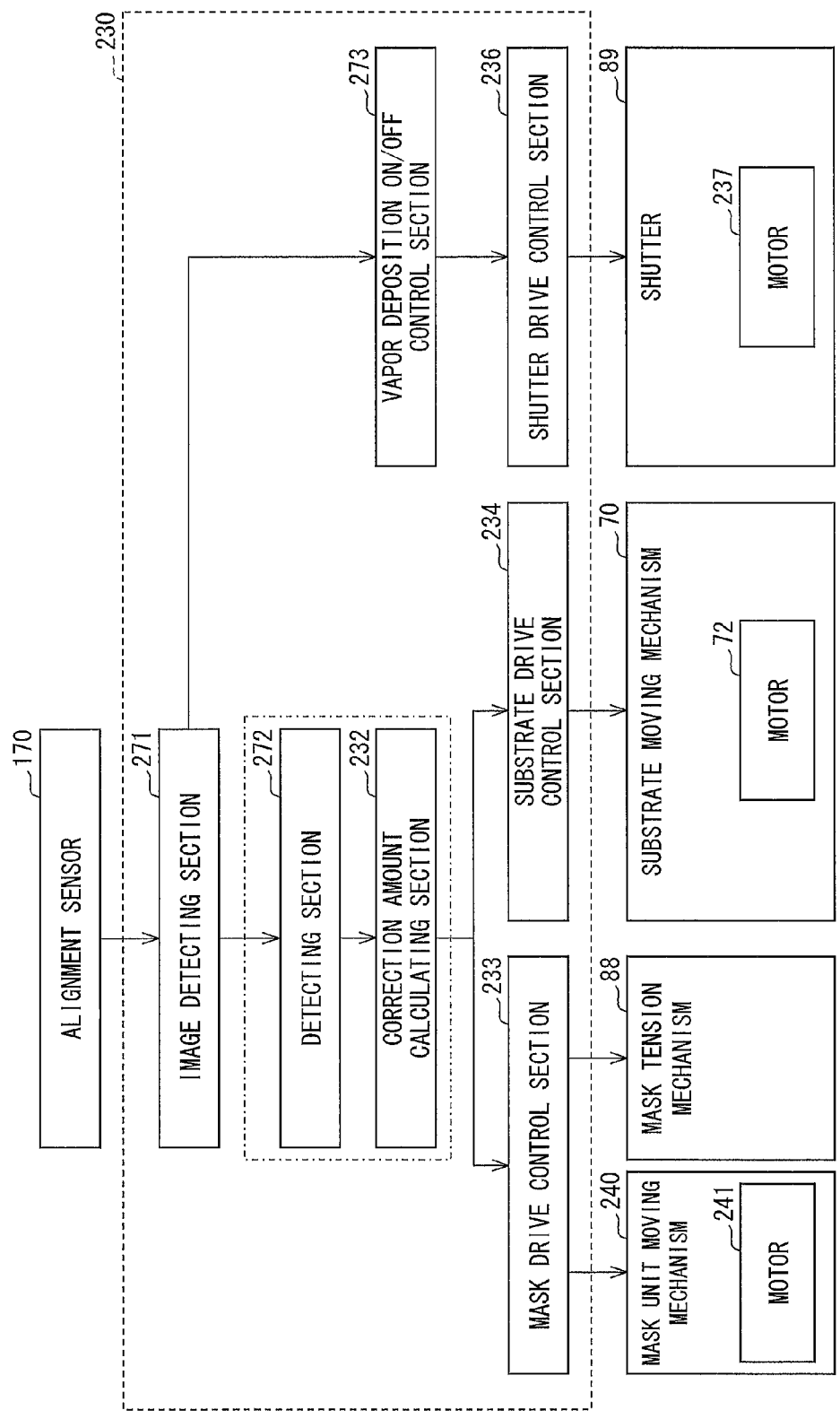
FIG. 46 is a block diagram partially illustrating a configuration of a vapor deposition device according to Embodiment 13 of the present invention.

FIG. 46 is a block diagram partially illustrating a configuration of the vapor deposition device 50 of the present embodiment.

The vapor deposition device 50 of the present embodiment includes, as a control circuit, a control circuit 230 having (i) the configuration illustrated in FIG. 46 and (ii) that illustrated in FIG. 41 referred to above. The configuration illustrated in FIG. 41 is identical to that described in Embodiment 12 above. The present embodiment thus omits such a description.

As illustrated in FIG. 46, the control circuit 230 includes, each as an alignment control section: an image detecting section 271; a detecting section 272 (difference detecting section; computing section); a correction amount calculating section 232 (computing section); a mask drive control section 233; a substrate drive control section 234; a vapor deposition ON/OFF control section 273; and a shutter drive control section 236.

In the present embodiment, (i) the detecting section 272 and the correction amount calculating section 232 correspond to the computing section 102 in FIG. 4, (ii) the image detecting section 271 corresponds to the image detecting section 101 in FIG. 4, (iii) the detecting section 272 corresponds to the detecting section 231 in FIG. 40, and (iv) the vapor deposition ON/OFF control section 273 corresponds to the vapor deposition ON/OFF control section 104 in FIG. 4 and to the vapor deposition ON/OFF control section 235 in FIG. 40.

The description below deals, for FIG. 46, with only the image detecting section 271, the detecting section 272, and the vapor deposition ON/OFF control section 273. For the other constituent elements, Embodiment 12 above is to be referred to by, for example, replacing (i) the detecting section 231 with the detecting section 272 and (ii) the vapor deposition ON/OFF control section 235 with the vapor deposition ON/OFF control section 273.

In the case where the alignment sensor 170 is an image sensor, the image detecting section 271 first, as illustrated in FIG. 46, detects, from an image captured by the alignment sensor 170 (image sensor), respective images of (i) the alignment markers 221 provided to the film formation substrate 200 and (ii) the alignment markers 84 of the shadow mask 81. The image detecting section further detects the start-end and rear-end of the vapor deposition region 210 of the film formation substrate 200 on the basis of, among the alignment markers 221 provided to the film formation substrate 200, (i) a start-end marker indicative of the start-end of the vapor deposition region 210 and (ii) a rear-end marker indicative of the rear-end of the vapor deposition region 210.

The detecting section 272 uses, as a detection signal of the alignment sensor 170, the images detected by the image detecting section 271, and thus detects (as a difference) (i) the amount of positional difference (that is, a shift component along the x axis direction and the y axis direction, and a rotation component on the x-y plane) between the alignment markers 221 and the alignment markers 84 and (ii) the amount of scanning the film formation substrate 200. The detecting section then transmits a result of the detection to the correction amount calculating section 232.

The vapor deposition ON/OFF control section 273 (i) generates a vapor deposition OFF signal when the image detecting section 271 has detected the rear-end of the vapor deposition region 210, and (ii) generates a vapor deposition ON signal when the image detecting section 271 has detected the start-end of the vapor deposition region 210.

The following describes a method for determining the amount of misalignment in the case where the alignment sensor 170 is an image sensor as described above.

Figure 47:
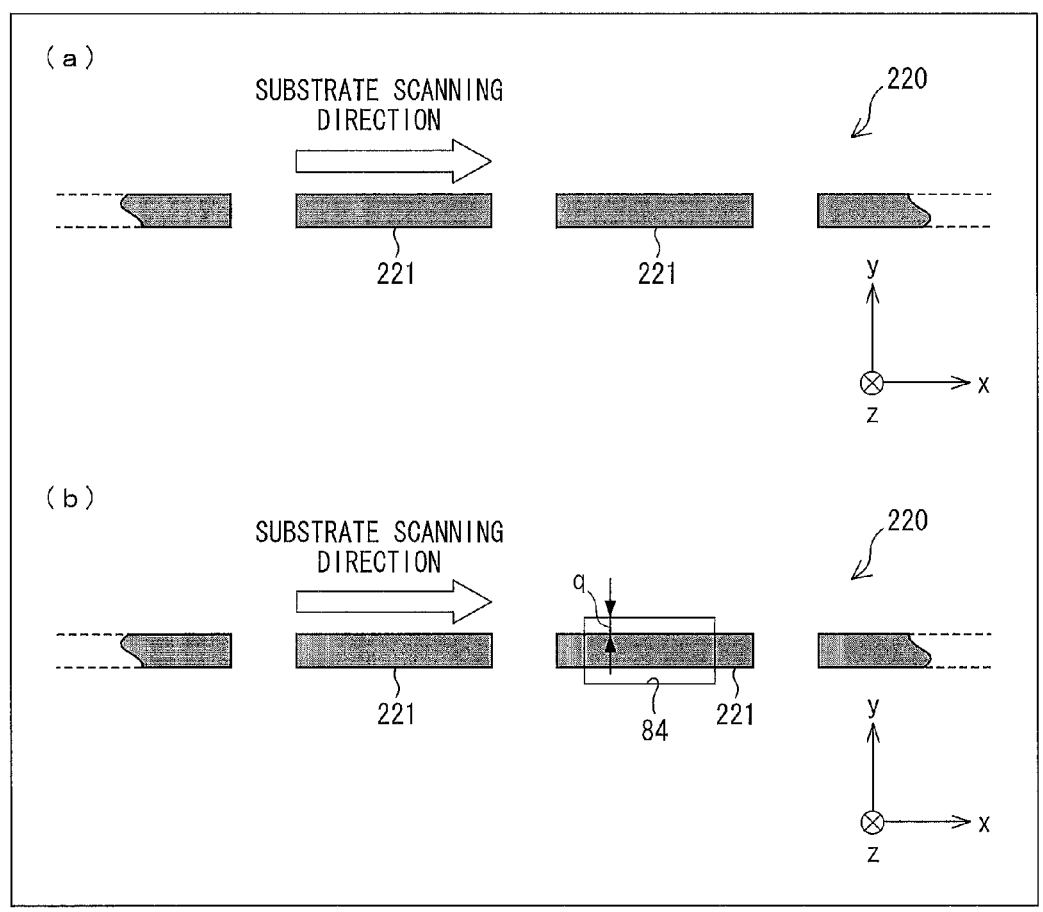
FIG. 47 (a) is a plan view schematically illustrating an arrangement of a main part of an alignment marker section of the film formation substrate illustrated in FIG. 39, and (b) is a plan view illustrating a positional relationship between individual alignment markers in the alignment marker section illustrated in (a) and alignment markers of the vapor deposition mask.

(a) of FIG. 47 is a plan view schematically illustrating an arrangement of a main part of the alignment marker section 220 illustrated in FIG. 39. (b) of FIG. 47 is a plan view illustrating a positional relationship between (i) the individual alignment markers 221 making up an alignment pattern of the alignment marker section 220 illustrated in (a) of FIG. 47 and (ii) alignment markers 84 of the shadow mask 81. (b) of FIG. 47 illustrates only alignment markers 84 for the shadow mask 81 and omits the shadow mask 81 itself for convenience of illustration.

The alignment markers 84, as described above, each include an opening (mask opening) provided in an alignment marker section 83 of the shadow mask 81.

In the present embodiment as well as the embodiments above, the alignment markers 221 can be made of, for example, a reflective material (high reflective member) such as an electrode material used in, for example, the TFT substrate 10. Thus, the alignment markers 221 can be (i) formed during an electrode forming step for forming, for example, gate electrodes, source electrodes, and drain electrodes of the film formation substrate 200 such as the TFT substrate 10 and (ii) made of the material of which the above electrodes are made.

The present embodiment, as illustrated in (b) of FIG. 47, captures respective images of an alignment marker 221 and an alignment marker 84 (mask opening), and measures the distance between respective ends (outer edges) of the alignment markers 84 and 221 to determine the amount of misalignment between the substrate and the mask.

The example of (b) of FIG. 47 illustrates only the distance q between the respective ends of alignment markers 84 and 221. However, as described in Embodiment 1 above with reference to (a) through (d) of FIG. 5, the detecting section 231 serving as a computing section measures (determines), on the basis of the respective images of the alignment markers 84 and 221, the images having been detected by the image detecting section 271, (i) the distance r between respective ends (outer edges) of the alignment markers 84 and 221 along the x axis direction and (ii) the distance q between the respective ends (outer edges) of the alignment markers 84 and 221 along the y axis direction, to calculate the amount of misalignment.

In this case also, in a case where (i) a plurality of alignment markers 84 are provided along the scanning direction or (ii) the alignment markers 84 and 221 are provided on both end sides of the vapor deposition region 210 of the film formation substrate 200, it is also possible to observe, not only the amount of scanning the film formation substrate 200, but also mispositioning (θ mispositioning) along the rotation direction between the shadow mask 81 and the film formation substrate 200.

In the present embodiment as well as the embodiments above, the alignment markers 221 are provided discontinuously as illustrated in (a) and (b) of FIG. 47. This arrangement makes it possible to (i) correctly determine (monitor) the amount of scanning the film formation substrate 200, and (ii) more accurately control, for example, the timing of opening and closing the shutter 89.

In the present embodiment as well as the embodiments above, it is possible to, while carrying out vapor deposition and a scan, align the shadow mask 81 and the film formation substrate 200 with each other in real time in the case where, as described above, (i) the alignment sensor 170 serving as alignment observing means and fixed in position relative to the shadow mask 81 is so provided as to be adjacent to the shadow mask 81 and the vapor deposition source 85 and (ii) the alignment sensor 170 continues to monitor (recognize) the alignment markers 221 (alignment pattern), provided along the scanning direction of the film formation substrate 200, through mask openings of the shadow mask 81 throughout a vapor deposition period. This arrangement makes it possible to carry out a more accurate alignment.

Further, the present embodiment, which eliminates the need to stop a scan for an alignment, can form a vapor deposition film 211 with higher efficiency. The present embodiment consequently makes it possible to produce a finished product with higher efficiency.

Embodiment 14

The present embodiment is described below mainly with reference to FIGS. 48 through 50.

The present embodiment mainly deals with how the present embodiment is different from Embodiments 1 through 13 (particularly, Embodiment 12) above. Constituent elements of the present embodiment that are identical in function to their respective equivalents described in Embodiments 1 through 13 are each assigned the same reference numeral, and are not described here.

Embodiments 1 through 13 above each describe an example case in which the film formation substrate 200 is observed through the shadow mask 81. More specifically, Embodiments 1 through 13 above each describe a case of measuring mispositioning between (i) an alignment pattern (for example, alignment markers 84) provided to the film formation substrate 200 in advance and (ii) an alignment pattern (for example, alignment markers 221) provided to the shadow mask 81, and thus controlling mispositioning of the vapor deposition film 211 (that is, a vapor deposition pattern) on the basis of the amount of misalignment between the film formation substrate 200 and the shadow mask 81.

The present embodiment, in contrast, measures the amount of positional difference between (i) an alignment pattern provided to the film formation substrate 200 in advance and (ii) a vapor deposition film 211 (that is, a vapor deposition pattern) actually formed, and thus directly observes and controls mispositioning of the vapor deposition film 211 (that is, a vapor deposition pattern).

Figure 48:
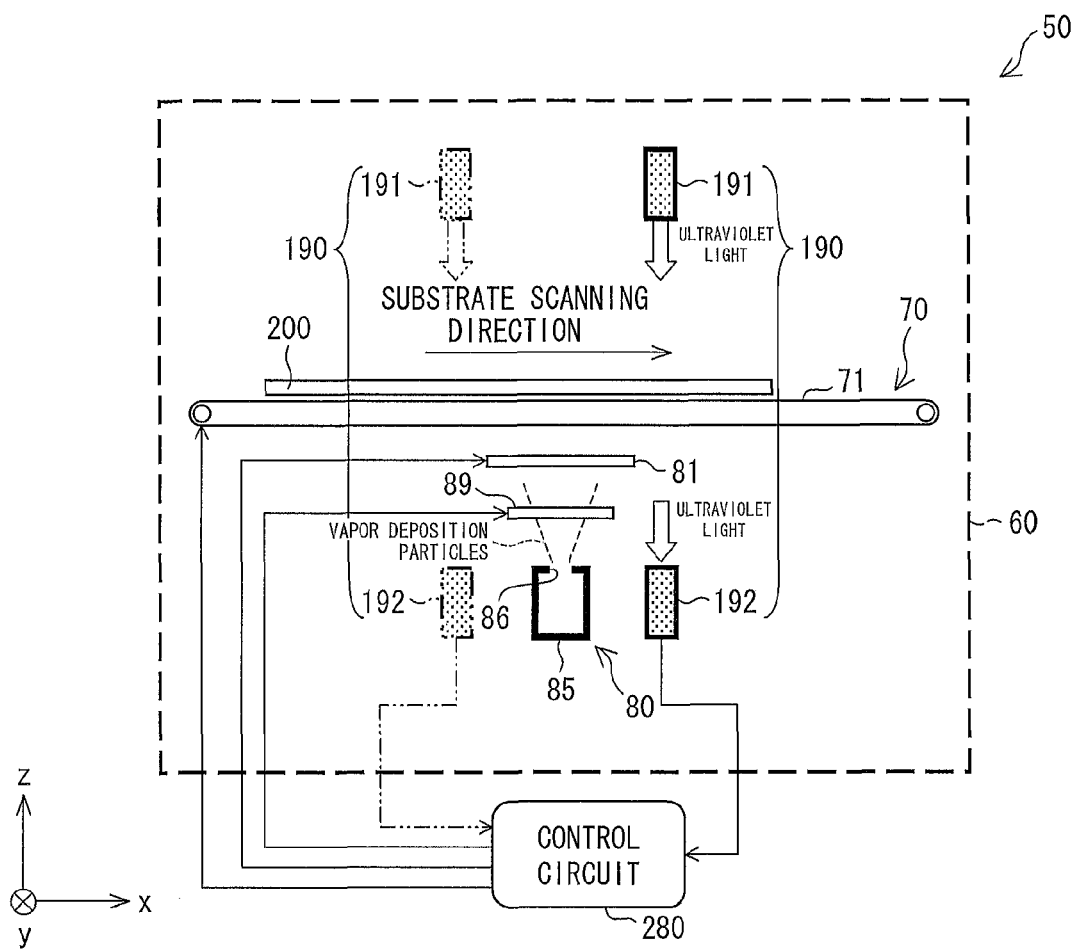
FIG. 48 is a cross-sectional view schematically illustrating a configuration of a main part of a vapor deposition device according to Embodiment 14 of the present invention.

FIG. 48 is a cross-sectional view schematically illustrating a configuration of a main part of the vapor deposition device 50 of the present embodiment. FIG. 49 is a block diagram partially illustrating a configuration of the vapor deposition device 50 illustrated in FIG. 48.

The vapor deposition device 50 of the present embodiment, as illustrated in FIG. 48, includes: a vacuum chamber 60 (film growing chamber); a substrate moving mechanism 70 (substrate moving means; moving means); a mask unit 80; an alignment sensor 190 (alignment observing means); a film thickness sensor 180 (not illustrated in FIG. 48; see FIGS. 37 through 40; film thickness observing means); and a control circuit 280.

The vapor deposition device 50 of the present embodiment is, as well as those of the embodiments above, arranged such that the alignment sensor 190 serving as alignment observing means is so provided in the vacuum chamber 60 as to be adjacent to the shadow mask 81 and the vapor deposition source 85 (that is, at such a position that the alignment sensor is next to the shadow mask and the vapor deposition source) and that the alignment sensor is fixed in position relative to the shadow mask 81.

The alignment sensor 190 of the present embodiment, as illustrated in FIG. 48, includes: an ultraviolet light emitting device 191 (ultraviolet light emitting section); and a detector 192 (detecting section).

The ultraviolet light emitting device 191 and the detector 192 are so provided, as illustrated in FIG. 48, as to sandwich the film formation substrate 200 and be opposite to each other. The ultraviolet light emitting device 191 is provided on a side of the film formation substrate 200 which side is opposite to a vapor deposition surface thereof.

The vapor deposition device 50 of the present embodiment is arranged such that the alignment sensor 190 is provided further downstream in the substrate scanning direction (that is, on the downstream side of the substrate scanning direction) than the respective alignment sensors 170 of Embodiments 12 and 13 above. With this arrangement, the present embodiment, instead of observing the film formation substrate 200 through the shadow mask 81 as in Embodiments 12 and 13 above, directly observes the film formation substrate 200 that has just passed the shadow mask 81.

The present embodiment is arranged such that the alignment sensor 190 is fixed in position relative to the shadow mask 81, and can thus, while carrying out vapor deposition and a scan, (i) observe an alignment pattern provided along the scanning direction of the film formation substrate 200 and a vapor deposition film 211 on the film formation substrate 200 that has passed the shadow mask 81 and (ii) on the basis of a result of the observation, carry out an alignment between the shadow mask 81 and the film formation substrate 200.

The alignment sensor 190 is, as with the film thickness sensor 180, desirably provided at a position that is as close as possible to the shadow mask 81 and the vapor deposition source 85. This arrangement makes it possible to observe a vapor deposition film 211 on the film formation substrate 200 that has just passed the shadow mask 81.

Figure 50:
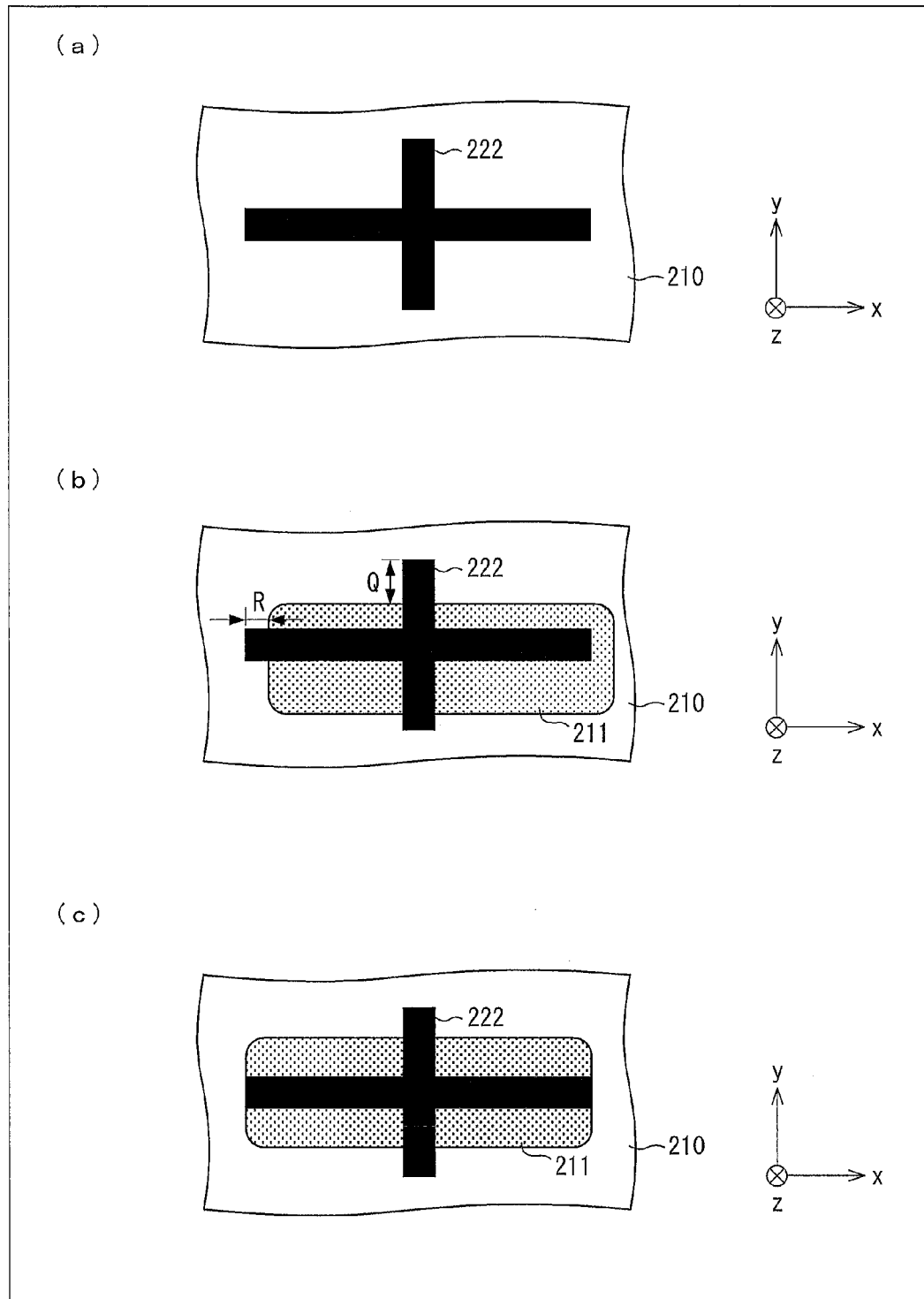
FIG. 50 (a) through (c) are each a plan view illustrating a method for measuring the amount of misalignment, in Embodiment 14 of the present invention, on the basis of a relation between an alignment marker provided to the film formation substrate in advance and a vapor deposition pattern actually deposited on the film formation substrate.

The following describes, with reference to (a) through (c) of FIG. 50, a method for determining the amount of misalignment with use of the alignment sensor 190.

(a) through (c) of FIG. 50 are each a plan view illustrating a method for measuring the amount of misalignment on the basis of a relation between (i) an alignment marker provided to the film formation substrate 200 in advance and (ii) a vapor deposition pattern actually deposited on the film formation substrate 200.

(a) of FIG. 50 illustrates an example shape of an alignment marker provided to the film formation substrate 200. (b) of FIG. 50 illustrates a positional relationship, observed in a case where there has occurred misalignment, between (i) the alignment marker illustrated in (a) of FIG. 50 and (ii) a vapor deposition pattern actually deposited on the film formation substrate 200. (c) of FIG. 50 illustrates a positional relationship, observed in a case where there has occurred no misalignment, between (i) the alignment marker illustrated in (a) of FIG. 50 and (ii) a vapor deposition pattern actually deposited on the film formation substrate 200.

As illustrated in (a) through (c) of FIG. 50, the present embodiment includes, inside the vapor deposition region 210 of the film formation substrate 200, an alignment marker 222 for an alignment between the shadow mask 81 and the film formation substrate 200.

The present embodiment, as described above, uses the alignment sensor 190 to measure a positional relationship between (i) a vapor deposition pattern of the vapor deposition film 211 actually deposited on the film formation substrate 200 and (ii) the alignment marker 222 provided on the film formation substrate 200 in advance. The vapor deposition pattern is, for example, an organic layer pattern of an organic EL layer or the like.

In the present embodiment, the alignment marker 222 is not particularly limited in terms of material as long as it is possible to observe (i) photoluminesence by a vapor deposition film 211 and (ii) the alignment marker 222. In the present embodiment, the alignment marker 222 is preferably made of a material that reflects or absorbs ultraviolet light or is more preferably made of a material that transmits no ultraviolet light. This arrangement makes it possible to observe photoluminesence by a vapor deposition film 211 and the alignment marker 222 with good contrast.

Thus, in the case where the film formation substrate 200 is a TFT substrate 10, the alignment marker 222 is made of, for example, an electrode material, such as Al, that is used in preparation of the TFT substrate 10.

The alignment marker 222 can be made of a material identical to an electrode material used in, for example, the TFT substrate 10. Thus, the alignment marker 222 can be (i) formed during an electrode forming step for forming, for example, gate electrodes, source electrodes, and drain electrodes of the film formation substrate 200 such as the TFT substrate 10 and (ii) made of the material of which the above electrodes are made.

In the case where the film formation substrate 200 is, for example, a wiring board (electrode substrate; array substrate) such as a TFT substrate 10, the alignment marker 222 may be provided in a region other than the region of the wire, or the wire may itself be used as the alignment marker 222. This arrangement makes it possible to avoid, for example, the problem of an increase in the number of steps which increase arises from providing the alignment markers 222 to the film formation substrate 200 and the problem of a cost increase due to, for example, use of another material.

The present embodiment is, however, not limited to the above arrangement. It is alternatively possible to, for example, provide, on a surface of the film formation substrate 200 which surface (substrate back surface) is opposite to a vapor deposition surface thereof, a separate alignment marker 222 made of a material that reflects or absorbs ultraviolet light or preferably a material that transmits no ultraviolet light.

The alignment marker 222 (alignment pattern) of the film formation substrate 200 is surrounded by a region made of a material that can transmit ultraviolet light. In a case where the alignment marker 222 is made of a material that partially transmits ultraviolet light (that is, that does not completely block ultraviolet light), the region surrounding the alignment marker 222 of the film formation substrate 200 is preferably made of a material that is higher in transmittance for ultraviolet light than the alignment marker 222.

As illustrated in (c) of FIG. 50, the present embodiment forms a vapor deposition film 211 with use of the shadow mask 81 during a vapor deposition step in such a manner that the vapor deposition film 211 overlaps the alignment marker 222. The alignment marker 222 is formed in advance in a region of the film formation substrate 200 on which region a vapor deposition pattern of the vapor deposition film 211 is to be formed.

Immediately after the film formation substrate 200 passes the shadow mask 81 (that is, immediately after vapor deposition), the ultraviolet light emitting device 191 emits ultraviolet light to the surface of the film formation substrate 200 which surface (substrate back surface) is opposite to the vapor deposition surface thereof. This causes a region on which an organic layer has been deposited to exhibit PL (photoluminesence).

The detector 192 included in the alignment sensor 190 thus, as illustrated in (b) and (c) of FIG. 50, simultaneously observes (i) the non-emissive alignment marker 221 and (ii) the vapor deposition pattern of the vapor deposition film 211 that is emitting light.

The above arrangement makes it possible to control the alignment by (i) recognizing an image observed by the detector 192 and thus (ii) deriving the amount of misalignment.

Figure 49:
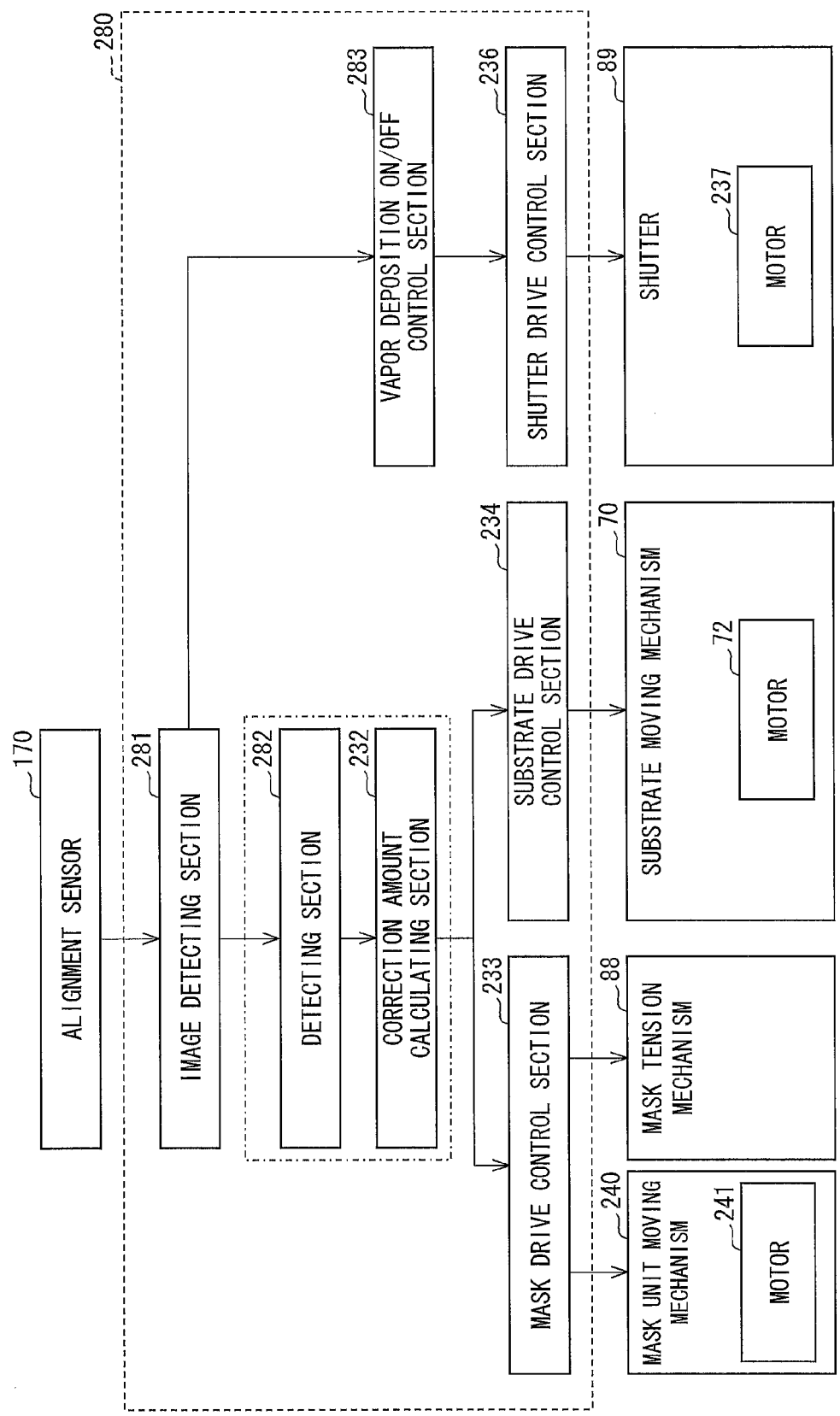
FIG. 49 is a block diagram partially illustrating a configuration of the vapor deposition device illustrated in FIG. 48.

The vapor deposition device 50 of the present embodiment includes, as a control circuit, a control circuit 280 having (i) the configuration illustrated in FIG. 49 and (ii) that illustrated in FIG. 41 referred to above. The configuration illustrated in FIG. 41 is identical to that described in Embodiment 12 above. The present embodiment thus omits such a description.

As illustrated in FIG. 49, the control circuit 280 includes, each as an alignment control section: an image detecting section 281; a detecting section 282 (difference detecting section; computing section); a correction amount calculating section 232 (computing section); a mask drive control section 233; a substrate drive control section 234; a vapor deposition ON/OFF control section 283; and a shutter drive control section 236.

In the present embodiment, (i) the detecting section 282 and the correction amount calculating section 232 correspond to the computing section 102 in FIG. 4, (ii) the image detecting section 281 corresponds to the image detecting section 101 in FIG. 4, (iii) the detecting section 282 corresponds to the detecting section 231 in FIG. 40, and (iv) the vapor deposition ON/OFF control section 283 corresponds to the vapor deposition ON/OFF control section 104 in FIG. 4 and to the vapor deposition ON/OFF control section 235 in FIG. 40.

The description below deals, for FIG. 49, with only the image detecting section 281, the detecting section 282, and the vapor deposition ON/OFF control section 283. For the other constituent elements, Embodiment 12 above is to be referred to by, for example, replacing (i) the detecting section 231 with the detecting section 282 and (ii) the vapor deposition ON/OFF control section 235 with the vapor deposition ON/OFF control section 283.

The present embodiment is arranged as follows: As illustrated in FIG. 49, the image detecting section 281 first, on the basis of an image captured by the detector 192 included in the alignment sensor 190, detects (recognizes) respective images of the non-emissive alignment marker 222 and the vapor deposition film 211 that is emitting light. The image detecting section further detects the start-end and rear-end of the vapor deposition region 210 of the film formation substrate 200 on the basis of (i) a start-end marker provided to the film formation substrate 200 and indicative of the start-end of the vapor deposition region 210 and (ii) a rear-end marker provided to the film formation substrate 200 and indicative of the rear-end of the vapor deposition region 210.

The alignment sensor 190, which is designed to detect an image of an actually deposited vapor deposition film 211, is provided further downstream in the substrate scanning direction than the shadow mask 81. Thus, the start-end marker is provided separately from the alignment marker 222 at a position that is further upstream in the substrate scanning direction than the vapor deposition region 210 of the film formation substrate 200. The rear-end marker is provided (i) inside the vapor deposition region 210 of the film formation substrate 200 and (ii) at a position that is further upstream in the substrate scanning direction than the rear-end of the vapor deposition region 210 of the film formation substrate 200.

The rear-end of the vapor deposition region 210 may alternatively be determined on the basis of a substrate scan amount detected by the detecting section 282, and is thus not necessarily required.

The detecting section 282 calculates, from the respective images of the alignment marker 222 and the vapor deposition film 211 which images have been detected by the image detecting section 281, (i) the distance R (corresponding to the distance r above) between respective ends (outer edges) of the alignment marker 222 and the vapor deposition film 211 along the x axis direction and (ii) the distance Q (corresponding to the distance q above) between respective ends (outer edges) of the alignment marker 222 and the vapor deposition film 211 along the y axis direction.

The detecting section 282 compares the above-calculated distances R and Q with respective values set in advance (that is, (i) the distance between the respective ends of the alignment marker 222 and the vapor deposition film 211 along the x axis direction and (ii) the distance between the respective ends of the alignment marker 222 and the vapor deposition film 211 along the y axis direction, the distances corresponding respectively to the distances R and Q and being observed in the case where there has occurred no misalignment as illustrated in (c) of FIG. 50). This arrangement makes it possible to detect (i) the amount of positional difference between the alignment marker 222 and the actually formed vapor deposition film 211 and (ii) the amount of scanning the film formation substrate 200.

In the case where there are provided a plurality of alignment sensors 190 along the scanning direction or along the direction perpendicular to the scanning direction so that the plurality of alignment sensors 190 observe the alignment marker 222 and the vapor deposition film 211 in a plurality of regions simultaneously, it is possible to observe, not only the amount of scanning the film formation substrate 200, but also mispositioning (θ mispositioning) along a rotation direction between the shadow mask 81 and the film formation substrate 200.

The detecting section 282 transmits, to the correction amount calculating section 232, (i) the above-detected amount of positional difference (that is, a shift component along the x axis direction and the y axis direction, and a rotation component on the x-y plane) between the alignment marker 222 and the actually formed vapor deposition film 211 and (ii) the above-detected amount of scanning the film formation substrate 200.

The vapor deposition ON/OFF control section 283 (i) generates a vapor deposition OFF signal when the image detecting section 281 has detected the rear-end of the vapor deposition region 210, and (ii) generates a vapor deposition ON signal when the image detecting section 281 has detected the start-end of the vapor deposition region 210.

In the present embodiment, it is possible to, while carrying out vapor deposition and a scan, align the alignment marker 222 with the vapor deposition film 211, actually deposited on the film formation substrate 200, with each other in real time in the case where, as described above, (i) the alignment sensor 190 serving as alignment observing means and fixed in position relative to the shadow mask 81 is so provided as to be adjacent to the shadow mask 81 and the vapor deposition source 85 and (ii) the alignment sensor 190 continues to monitor (recognize), throughout a vapor deposition period, the positional relationship between the alignment marker 222 (alignment pattern), provided to the film formation substrate 200, and the vapor deposition film 211, actually deposited on the film formation substrate 200. Further, in the case where an alignment is carried out in real time between (i) the alignment marker 222 and (ii) the vapor deposition film 211 actually deposited on the film formation substrate 200, it is possible in turn to align the shadow mask 81 and the film formation substrate 200 with each other in real time. This arrangement makes it possible to carry out a more accurate alignment.

Further, the present embodiment, which eliminates the need to stop a scan for an alignment, can form a vapor deposition film 211 with higher efficiency. The present embodiment consequently makes it possible to produce a finished product with higher efficiency.

The present embodiment does not carry out an alignment operation with use of alignment markers 84 and 221 provided respectively to the shadow mask 81 and the film formation substrate 200, but, as described above, directly determines mispositioning of a vapor deposition film 211 actually deposited on the film formation substrate 200. The present embodiment can thus carry out a more accurate alignment.

The present embodiment describes an example case in which, as described above, (i) the alignment sensor 190 is so provided in the vacuum chamber 60 as to be adjacent to the shadow mask 81 and the vapor deposition source 85 (that is, at such a position that the alignment sensor is next to the shadow mask and (ii) the vapor deposition source) and the alignment sensor is fixed in position relative to the shadow mask 81.

The present embodiment is, however, not limited to such an arrangement. The alignment sensor 190 is thus not necessarily fixed in position relative to the shadow mask 81.

As described above, accuracy in image recognition is decreased in the case where the alignment markers 84 and 221 are simultaneously recognized from an image sensed by an image sensing element (image sensing means), such as a CCD, that is attached to the vacuum chamber 60.

In the case where, however, mispositioning of a vapor deposition film 211 actually deposited on the film formation substrate 200 is directly determined as in the present embodiment, it is only necessary to be able to observe the alignment marker 222 and the vapor deposition film 211 both on the film formation substrate 200. It is thus unnecessary to simultaneously observe (i) the alignment marker 84 provided to the shadow mask 81 and (ii) the alignment marker 222 provided to the film formation substrate 200. This arrangement prevents the above-mentioned problem of a decrease in recognition accuracy.

Thus, the alignment observing means is not necessarily fixed in position relative to the shadow mask 81, and may, for example, be an image sensing element, such as a CCD, that is attached to the vacuum chamber 60. The alignment observing means may alternatively include a plurality of alignment observing means each fixed in position relative to the film formation substrate 200.

The present embodiment carries out an alignment between the alignment marker 222 and the vapor deposition film 211 to align the shadow mask 81 and the film formation substrate 200 with each other. The alignment marker 222 thus functions also as an alignment marker for an alignment between the shadow mask 81 and the film formation substrate 200.

In the present embodiment as well as the embodiments above, it is preferable that the alignment observing means, as in Embodiments 1 through 13 above, optically observe the respective relative positions of (i) the alignment marker 222 and (ii) the vapor deposition film with a predetermined pattern while making no contact with the alignment marker 222 or the vapor deposition film 211.

The alignment observing means, that is, means for observing the positional relationship between (i) the alignment marker 222, provided to the film formation substrate 200 for an alignment between the shadow mask 81 and the film formation substrate 200, and (ii) the vapor deposition film 211 formed to have the predetermined pattern, can be alignment observing means for carrying out an optical observation such as observation of photoluminesence light emission, observation of the intensity of reflection, observation of transmission intensity, and simple image recognition.

The present embodiment is characterized in that, as described above, it directly determines mispositioning between (i) the alignment marker 222 (alignment pattern) provided to the film formation substrate 200 in advance and (ii) a vapor deposition pattern of the vapor deposition film 211 actually formed. The present embodiment is not limited to the above-described examples as long as it has the above characteristic.

Embodiment 15

The present embodiment is described below mainly with reference to FIGS. 51 and 52.

The present embodiment mainly deals with how the present embodiment is different from Embodiments 1 through 14 (particularly, Embodiment 14) above. Constituent elements of the present embodiment that are identical in function to their respective equivalents described in Embodiments 1 through 14 are each assigned the same reference numeral, and are not described here.

Figure 51:
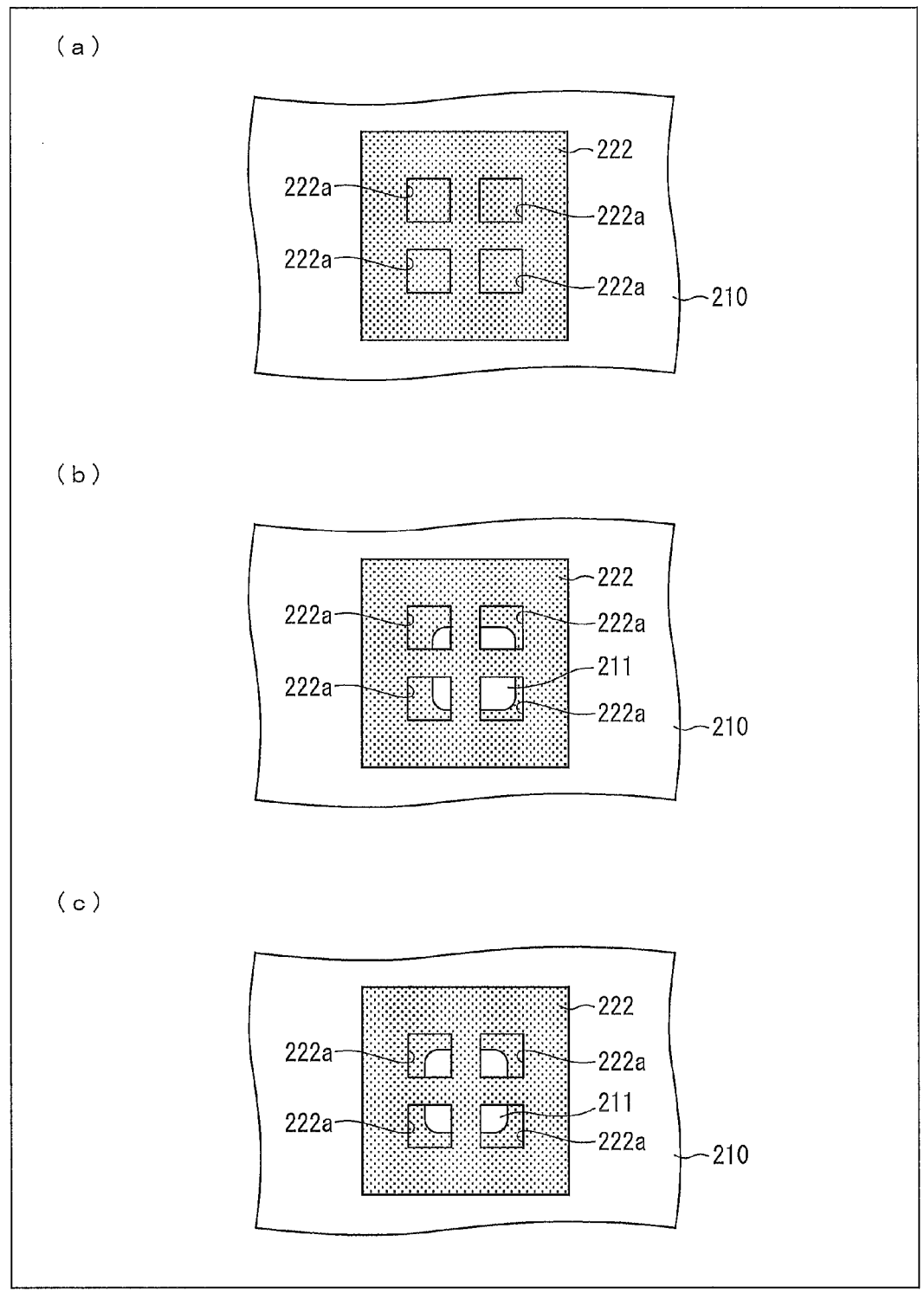
FIG. 51 (a) through (c) are each a plan view illustrating a method for measuring the amount of misalignment, in Embodiment 15 of the present invention, on the basis of a relation between an alignment marker provided to the film formation substrate in advance and a vapor deposition pattern of a vapor deposition film actually deposited on the film formation substrate.

As illustrated in (a) through (c) of FIG. 51, the present embodiment includes, as the alignment marker 222, an alignment marker 222 inside the vapor deposition region 210 of the film formation substrate 200, the alignment marker having a grid shape and including four openings 222a inside itself (that is, inside a single alignment marker 222).

(a) of FIG. 51 of FIG. 51 illustrates an example shape of the alignment marker 222 provided to the film formation substrate 200. (b) of FIG. 51 illustrates a positional relationship, observed in a case where there has occurred misalignment, between (i) the alignment marker 222 illustrated in (a) of FIG. 51 and (ii) a vapor deposition pattern of the vapor deposition film 211 actually deposited on the film formation substrate 200. (c) of FIG. 51 illustrates a positional relationship, observed in a case where there has occurred no misalignment, between (i) the alignment marker 222 illustrated in (a) of FIG. 51 and (ii) a vapor deposition pattern of the vapor deposition film 211 actually deposited on the film formation substrate 200.

As illustrated in (c) of FIG. 51, the present embodiment forms a vapor deposition film 211 with use of the shadow mask 81 during a vapor deposition step in such a manner that (i) the vapor deposition film 211 has a central portion that is located at a central portion of the alignment marker 222 (that is, overlaps such a central portion), and that (ii) the vapor deposition film 211 is exposed equally through the four openings 22a included in the alignment marker 222. The alignment marker 222 is formed in advance in a region of the film formation substrate 200 on which region a vapor deposition pattern of the vapor deposition film 211 is to be formed.

The present embodiment, which includes an alignment marker 222 having the above shape, does not carry out image recognition and instead derives the amount of misalignment on the basis of the ratio between respective fluorescence intensities for the four openings 222a.

The vapor deposition device 50 and vapor deposition method of the present embodiment, as described above, each use (i) an alignment marker 222 different in shape from the alignment marker 222 used in Embodiment 14 above and (ii) as the detector 192, a detector for detecting fluorescence intensity. The present embodiment, as a result, includes a control system that partially differs from that of Embodiment 14 above. The present embodiment is, however, identical to Embodiment 14 above except for the above point.

The following describes how the present embodiment differs from Embodiment 14 above.

The vapor deposition device 50 of the present embodiment, as with the vapor deposition device 50 of Embodiment 14 above, includes: a vacuum chamber 60 (film growing chamber); a substrate moving mechanism 70 (substrate moving means; moving means); a mask unit 80; an alignment sensor 190 (alignment observing means); and a film thickness sensor 180 (not illustrated in FIG. 51; see FIGS. 37 through 40). The vapor deposition device further includes, as a control circuit, not the control circuit 280 but a control circuit 290 having (i) the configuration illustrated in FIG. 52 and (ii) that illustrated in FIG. 41 referred to above. The configuration illustrated in FIG. 41 is identical to that described in Embodiment 12 above. The present embodiment thus omits such a description.

Figure 52:
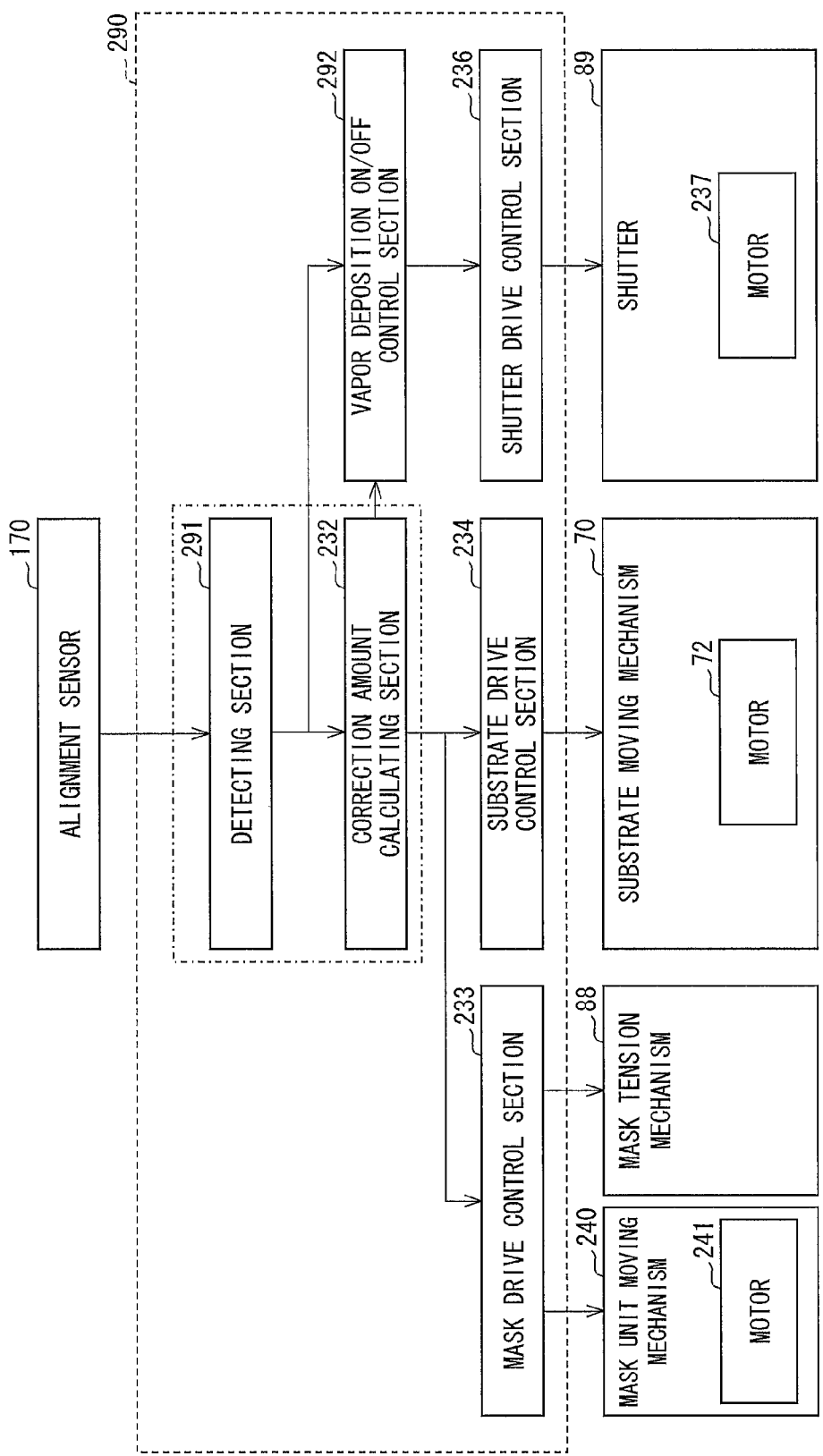
FIG. 52 is a block diagram partially illustrating a configuration of the vapor deposition device according to Embodiment 15 of the present invention.

FIG. 52 is a block diagram partially illustrating a configuration of the vapor deposition device 50 of the present embodiment.

As illustrated in FIG. 52, the control circuit 290 includes, each as an alignment control section: a detecting section 291 (difference detecting section; computing section); a correction amount calculating section 232 (computing section); a mask drive control section 233; a substrate drive control section 234; a vapor deposition ON/OFF control section 292; and a shutter drive control section 236.

In the present embodiment, (i) the detecting section 291 and the correction amount calculating section 232 correspond to the computing section 102 in FIG. 4, (ii) the detecting section 291 corresponds to the detecting section 231 in FIG. 40, and (iii) the vapor deposition ON/OFF control section 292 corresponds to the vapor deposition ON/OFF control section 235 in FIG. 40.

The description below deals, for FIG. 52, with only the detecting section 291 and the vapor deposition ON/OFF control section 292. For the other constituent elements, Embodiment 12 above is to be referred to by, for example, replacing (i) the detecting section 231 with the detecting section 291 and (ii) the vapor deposition ON/OFF control section 235 with the vapor deposition ON/OFF control section 292.

The present embodiment is arranged as follows: As illustrated in FIG. 52, on the basis of a fluorescence intensity detected by the detector 192 included in the alignment sensor 190 which fluorescence intensity serves as a detection signal from the alignment sensor 190, the detecting section 291 detects (as a difference) (i) the amount of positional difference (that is, a shift component along the x axis direction and the y axis direction, and a rotation component on the x-y plane) between the alignment marker 222 and the actually formed vapor deposition film 211 and (ii) the amount of scanning the film formation substrate 200. The detecting section then transmits a result of the detection to the correction amount calculating section 232 and the vapor deposition ON/OFF control section 292.

In the present embodiment as well as the embodiments above, in the case where there are provided a plurality of alignment sensors 190 along the scanning direction or along the direction perpendicular to the scanning direction so that the plurality of alignment sensors 190 observe the alignment marker 222 and the vapor deposition film 211 in a plurality of regions simultaneously, it is possible to observe, not only the amount of scanning the film formation substrate 200, but also mispositioning (θ mispositioning) along a rotation direction between the shadow mask 81 and the film formation substrate 200.

The vapor deposition ON/OFF control section 292 calculates, from (i) the substrate scan amount detected by the detecting section 291 and (ii) the substrate scan correction amount calculated by the correction amount calculating section 232, the position of the film formation substrate 200 relative to the vapor deposition area of the vapor deposition source 85. The vapor deposition ON/OFF control section then generates (i) a vapor deposition ON signal at the start-end of a film formation region (vapor deposition region) for the vapor deposition film 211 and (ii) a vapor deposition OFF signal at the rear-end of the film formation region.

In the present embodiment as well as the embodiments above, the alignment sensor 190, which is designed to detect an image of an actually deposited vapor deposition film 211, is provided further downstream in the substrate scanning direction than the shadow mask 81. Thus, the start-end marker is provided separately from the alignment marker 222 at a position that is further upstream in the substrate scanning direction than the vapor deposition region 210 of the film formation substrate 200. The rear-end marker is provided (i) inside the vapor deposition region 210 of the film formation substrate 200 and (ii) at a position that is further upstream in the substrate scanning direction than the rear-end of the vapor deposition region 210 of the film formation substrate 200.

The present embodiment, as in Embodiment 14 above, detects the respective positions of the vapor deposition film 211 and the alignment marker 222 with use of PL by an organic layer. Thus, in the present embodiment, in the case where (i) the detector 192 is a detector for detecting fluorescence intensity as described above to detect a start-end marker and a rear-end marker, the start-end marker is preferably (i) made of a material that exhibits PL and (ii) provided outside the vapor deposition region 210.

The rear-end marker is provided inside the vapor deposition region 210. Thus, the rear-end marker preferably has (i) a shape that is different from that of the alignment marker 222, or (ii) a discontinuous cycle (formation cycle) that varies according to the position in the film formation substrate 200 as illustrated in FIG. 45, so that the rear-end marker can be recognized.

The rear-end of the vapor deposition region 210 may alternatively be determined on the basis of a substrate scan amount detected by the detecting section 291, and is thus not necessarily required.

In the present embodiment, it is possible to, while carrying out vapor deposition and a scan, align the alignment marker 222 with the vapor deposition film 211, actually deposited on the film formation substrate 200, with each other in real time in the case where, as described above, (i) the alignment sensor 190 serving as alignment observing means and fixed in position relative to the shadow mask 81 is so provided as to be adjacent to the shadow mask 81 and the vapor deposition source 85 and (ii) the alignment sensor 190 continues to monitor (recognize), on the basis of, as described above, the ratio between fluorescence intensities, the positional relationship between the alignment marker 222 (alignment pattern), provided to the film formation substrate 200, and the vapor deposition film 211, actually deposited on the film formation substrate 200. Further, in the case where an alignment is carried out in real time between (i) the alignment marker 222 and (ii) the vapor deposition film 211 actually deposited on the film formation substrate 200, it is possible in turn to align the shadow mask 81 and the film formation substrate 200 with each other in real time. This arrangement makes it possible to carry out a more accurate alignment.

Further, the present embodiment, which eliminates the need to stop a scan for an alignment, can form a vapor deposition film 211 with higher efficiency. The present embodiment consequently makes it possible to produce a finished product with higher efficiency.

In the present embodiment, suitably designing the pattern shape for the alignment marker 222 as described above makes it possible to correctly determine, without image recognition, the amount of scanning the film formation substrate 200.

The present embodiment uses, as the alignment marker 222, an alignment marker 222 having a grid shape and including four openings 222a inside itself (that is, inside a single alignment marker 222). The present embodiment is, however, not limited to such an arrangement. As is clear from, for example, Embodiment 12 above, in the case where (i) there is an opening in a state in which alignment objects are placed on top of each other and (ii) a measurement by an alignment sensor provides a value that varies according to the area of a portion of a measurement object which portion is exposed through the opening, it is possible to determine misalignment on the basis of the measurement value. The openings 222a thus simply need to be provided in a number of two or more, and the number is not limited to four.

Embodiments 14 and 15 each describe a method by which it is possible to, while carrying out vapor deposition and a scan, align the alignment marker 222 with the vapor deposition film 211, actually deposited on the film formation substrate 200, with each other in real time by, as described above, continuously monitoring (recognizing), with use of the alignment sensor 190, the positional relationship between (i) the alignment marker 222 provided to the film formation substrate 200 and (ii) the vapor deposition film 211 deposited on the film formation substrate 200.

The present embodiment is, however, not limited to such an arrangement. It is alternatively possible to carry out an alignment between the shadow mask 81 and the film formation substrate 200 by, for example, (i) observing, with use of a plurality of alignment sensors each fixed in position relative to the shadow mask 81, the respective relative positions of an alignment marker 84 provided to the shadow mask 81 and a vapor deposition film 211 actually deposited on the film formation substrate 200 and (ii) adjusting, on the basis of a result of the observation, the respective relative positions of the alignment marker 84 provided to the shadow mask 81 and the vapor deposition film 211 actually deposited on the film formation substrate 200.

It is further alternatively possible to (i) similarly with use of a plurality of alignment sensors each fixed in position relative to the shadow mask 81, observe the respective relative positions of an alignment marker 84 provided to the shadow mask 81 and an alignment marker 221 or alignment marker 222 provided to the film formation substrate 200 and (ii) carry out an alignment between the shadow mask 81 and the film formation substrate 200 on the basis of a result of the observation.

The above arrangement eliminates the need to, for example, form an opening in the shadow mask 81 to observe, through the opening, the alignment marker 221 or alignment marker 222 provided to the film formation substrate 200. Thus, the alignment markers 84, 221, and 222 may each be, for example, made of any material.

In the case where the alignment markers 84 and 221 are provided outside the vapor deposition area of the vapor deposition source 85, it is possible to (i) form an opening in the film formation substrate 200 as an alignment marker 221 and thus (ii) observe, through the opening, the alignment marker 84 that is provided to the shadow mask 81 and that is made of any material or includes an opening.

Embodiment 16

The present embodiment is described below mainly with reference to (a) and (b) of FIG. 53 through FIG. 59.

The present embodiment mainly deals with how the present embodiment is different from Embodiments 1 through 15 above. Constituent elements of the present embodiment that are identical in function to their respective equivalents described in Embodiments 1 through 15 are each assigned the same reference numeral, and are not described here.

(a) and (b) of FIG. 53 each illustrate a relation between (i) an opening 82 of the shadow mask 81 and (ii) the vapor deposition width and vapor deposition position of a vapor deposition film 211, the relation being observed in the case where there is provided a void between the film formation substrate 200 and the shadow mask 81.

The embodiments above each (i) use a rectangular (belt-shaped) shadow mask 81 smaller in area (size) than the vapor deposition region 210 of the film formation substrate 200, and (ii) in a state in which there is provided a uniform void (gap g1; mask gap) between the film formation substrate 200 and the shadow mask 81, scan at least one of (a) the combination of the shadow mask 81 and the vapor deposition source 85 and (b) the film formation substrate 200 to deposit vapor deposition particles onto the entire vapor deposition region of the film formation substrate 200.

In the case where, however, there is provided a void as above between the film formation substrate 200 and the shadow mask 81, there is not necessarily a coincidence between (i) the vapor deposition width (for example, the pattern width of a pixel pattern) and vapor deposition position of a vapor deposition film 211 actually deposited on the film formation substrate 200 and (ii) the width and position of an opening 82 of the shadow mask 81.

In the case where, for example, (i) the film formation substrate 200 and the shadow mask 81 have the positional relationship illustrated in (a) of FIG. 53, and (ii) the vapor deposition particles fly in the direction indicated by the arrow in (a) of FIG. 53, the vapor deposition pattern of a vapor deposition film 211 (for example, the pixel pattern formed by a vapor deposition film 211) is different in width and position from the opening 82 of the shadow mask 81.

Thus, in the case where the amount of the void between the film formation substrate 200 and the shadow mask 81 is changed as illustrated in (b) of FIG. 53 from (i) the state indicated by the chain double-dashed line to (ii) the state indicated by the solid line, the vapor deposition pattern of a vapor deposition film 211 is further different in both width and position from the opening 82 of the shadow mask 81.

As described above, in the case where there is a void between the film formation substrate 200 and the shadow mask 81, a change in the amount of the void causes a change in the vapor deposition width and vapor deposition position of a vapor deposition film 211 to be obtained.

This indicates that without a fixed amount of the void, there occurs mispositioning of a vapor deposition pattern, thereby making it impossible to form a high-resolution vapor deposition pattern throughout the entire vapor deposition region of the film formation substrate 200.

Thus, the embodiments above each, as indicated in, for example, S13 of FIG. 10, carry out vapor deposition by (i) carrying out, after a rough alignment, an alignment between the film formation substrate 200 and the shadow mask 81 by carrying out a gap adjustment so that there is a gap (substrate-mask gap) with a desired, uniform value between the film formation substrate 200 and the shadow mask 81 throughout the film formation substrate 200 such as a TFT substrate 10, and then (ii) moving, for example, the film formation substrate 200 relative to the shadow mask 81 while maintaining the substrate-mask gap.

The substrate-mask gap can be adjusted to an extent by, for example, measuring the substrate-mask gap and adjusting the height of, for example, the mask holding member 87 or the substrate holding member 71 so that the substrate-mask gap has a desired, uniform value.

In actuality, however, the void amount is, without means for controlling it, constantly changed due to such factors as self-weight bending of the film formation substrate, accuracy of the vapor deposition device itself, and thermal expansion of a member.

In particular, in the case where a large-sized substrate is used as the film formation substrate as described above, there arises the following problem: The void amount is easily changed due to, for example, self-weight bending of the film formation substrate and/or thermal expansion of the film formation substrate or the vapor deposition mask.

In view of the above problem, the embodiments above each appropriately maintain the positional relationship between the film formation substrate 200 and the shadow mask 81 relative to each other by using members such as the mask unit moving mechanism 240, the mask tension mechanism 88, the substrate moving mechanism 70, and the mask supporting section 141 as adjusting means for adjusting the respective positions of the film formation substrate 200 and the shadow mask 81 relative to each other.

To adjust the substrate-mask gap to a desired, uniform value, the embodiments above, for example, (i) adjust tension to the shadow mask 81 with use of, for example, alignment markers, (ii) hold the film formation substrate 200 with use of, for example, an electrostatic chuck in a state in which there is no self-weight bending in the film formation substrate 200, (iii) correct parallelism between the shadow mask 81 and the film formation substrate 200 with use of an abutting member such as the mask supporting section 141 (that is, adjust the gap g1 between the shadow mask 81 and the film formation substrate 200 so that the gap g1 is uniform), or (iv) correct parallelism of the shadow mask 81 with use of a plurality of alignment markers such as the absolute-alignment markers 110.

Further, to maintain the substrate-mask gap so that it is uniform during vapor deposition, the embodiments above, for example, (i) adjust tension to the shadow mask 81 with use of, for example, alignment markers to correct self-weight bending and/or thermal bending of the shadow mask 81, (ii) move the film formation substrate 200 in a state in which the film formation substrate 200 is adhered to, for example, an electrostatic chuck, (iii) instead of circular movement by a ball screw as in Patent Literature 10, use a moving mechanism, such as a roller-type or hydraulic moving mechanism and an XY stage, that can move the film formation substrate 200 or the mask unit 80 horizontally while holding the film formation substrate 200 or the mask unit 80, or (iv) carry out vapor deposition by depo-down so that no bending is caused in the film formation substrate 200.

The present embodiment describes, in relation to a vapor deposition method involving a void as described above, a method for controlling the void amount (that is, the width of the gap g1) to a uniform value more precisely by (i) accurately determining, for example, the amount of the void between the shadow mask 81 and the film formation substrate 200 and distribution of the void amount and (ii) finely adjusting the void for a high-resolution vapor deposition pattern.

Figure 54:
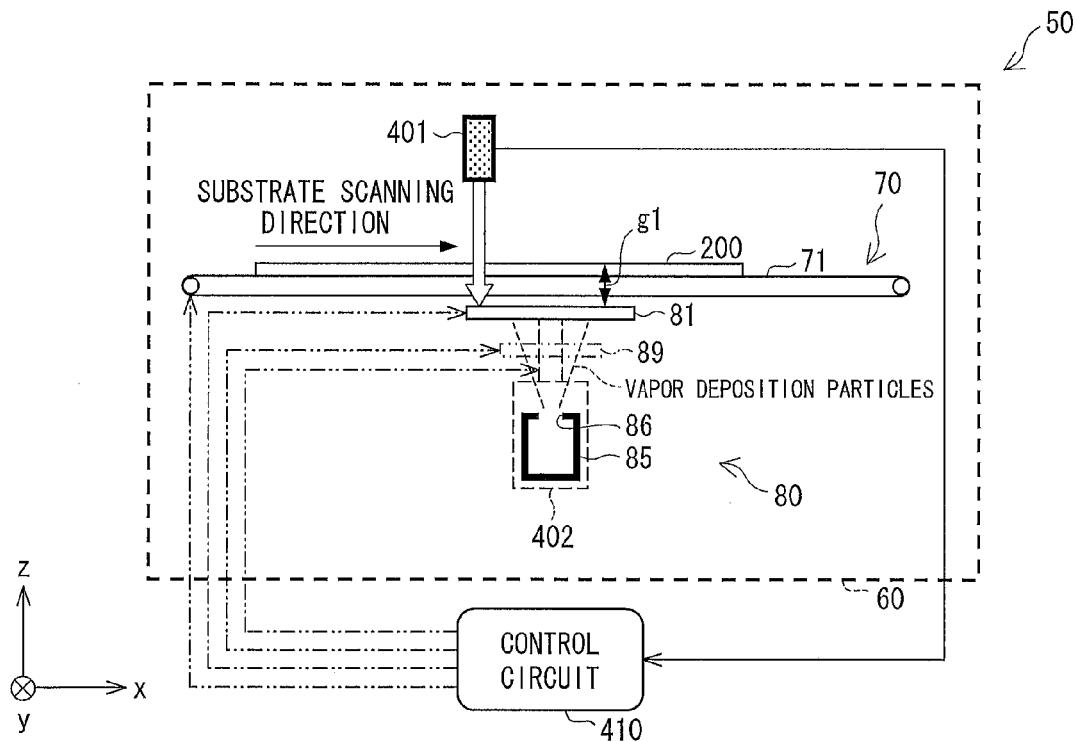
FIG. 54 is a cross-sectional view schematically illustrating a configuration of a main part of a vapor deposition device according to Embodiment 16 of the present invention.
Figure 55:
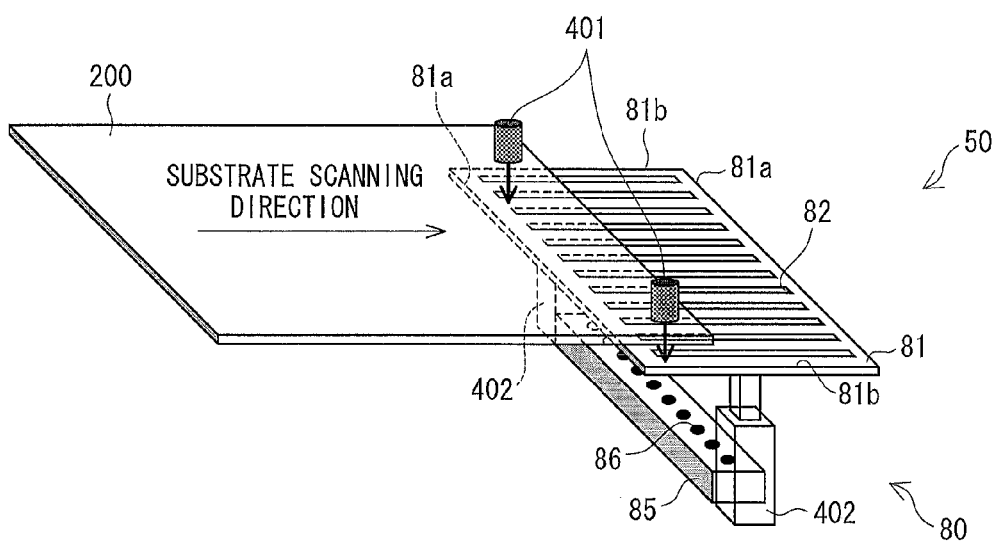
FIG. 55 is a bird's eye view illustrating example main constituent elements inside a vacuum chamber of the vapor deposition device illustrated in FIG. 54.

FIG. 54 is a cross-sectional view schematically illustrating a configuration of a main part of the vapor deposition device 50 of the present embodiment. FIG. 55 is a bird's eye view of example main constituent elements inside the vacuum chamber 60 of the vapor deposition device 50 illustrated in FIG. 54.

The vapor deposition device 50 of the present embodiment, as illustrated in FIG. 54, includes: a vacuum chamber 60 (film growing chamber); a substrate moving mechanism 70 (substrate moving means; moving means); a mask unit 80; void sensors 401; and a control circuit 230.

The mask unit 80 of the present embodiment, as illustrated in FIG. 54, includes: a shadow mask 81; a vapor deposition source 85; a shutter 89; and actuators 402 (void amount control mechanism; holding means; supporting member). In the present embodiment as well as the embodiments above, the mask unit 80 preferably includes a tension mechanism (not shown) such as a mask tension mechanism 88.

The vacuum chamber 60 contains the substrate moving mechanism 70, the mask unit 80, and the void sensors 401.

As illustrated in FIG. 54, the present embodiment describes an example in which the film formation substrate 200 is moved relative to the mask unit 80 with use of a substrate moving mechanism 70 that is, for example, a roller-type moving mechanism including a frame-shaped substrate holding member 71 as illustrated in, for example, FIG. 37 or 48.

The present embodiment is, however, not limited to such an arrangement. The present embodiment may alternatively be arranged, for example, such that the film formation substrate 200 is moved relative to the mask unit 80 with use of a hydraulic moving mechanism as described above. The present embodiment may further alternatively be arranged such that, as illustrated in FIG. 1, (i) a substrate holding member 71 including an electrostatic chuck is provided to a surface of the film formation substrate 200 which surface is opposite to a surface facing the mask unit 80 and (ii) the film formation substrate 200 is moved in a state in which the film formation substrate 200 is adhered to the electrostatic chuck.

The present embodiment may, of course, also be arranged such that the mask unit 80 is moved relative to the film formation substrate 200 with use of, for example, the mask unit moving mechanism 240 and the mask drive control section 233 as described above. In this case, the present embodiment may be arranged such that (i) only the mask unit 80 is moved while the film formation substrate 200 is fixed, or that (ii) both the film formation substrate 200 and the mask unit 80 are moved relative to each other.

The present embodiment, to carry out a scan while more precisely maintaining a uniform amount for the void between the film formation substrate 200 and the shadow mask 81, includes the void sensors 401 and the actuators 402 each as adjusting means for adjusting the respective positions of the film formation substrate 200 and the shadow mask 81 relative to each other.

The void sensors 401 are each a sensor for measuring the amount of the void between the film formation substrate 200 and the shadow mask 81.

The void sensors 401 each measure the amount of the void between the film formation substrate 200 and the shadow mask 81, and transmits to the control circuit 410 a result of the measurement in the form of a void amount signal.

The void sensors 401 are each, for example, an optical void sensor for measuring (reading) the amount of the void between the film formation substrate 200 and the shadow mask 81 through a transparent film formation substrate 200 or through a transparent region of the film formation substrate 200 (that is, through the film formation substrate 200).

In the above case, the void sensors 401, the film formation substrate 200, and the shadow mask 81 are so attached as to have a positional relationship with which, when measuring the void amount, the void sensors 401 can measure, through a transparent region of the film formation substrate 200, the void extending from the film formation substrate 200 to a non-opening section of the shadow mask 81.

As illustrated in FIGS. 54 and 55, the void sensors 401 of the present embodiment are each provided at a position that is (i) above the film formation substrate 200 (that is, on the top surface side thereof), (ii) in the vicinity of the mask unit 80, and (iii) on the upstream side of the substrate scanning direction.

FIG. 55 illustrates a case in which two void sensors 401 are provided at respective ends of a long side 81a of the shadow mask 81, which ends correspond to respective ends of the shadow mask 81 which ends are located downstream in the direction in which the substrate makes its entry (that is, ends located upstream in the substrate scanning direction).

The film formation substrate 200 is preferably provided with a void-sensing transparent region (sensing light transmitting region) located away from alignment marker sections 220 of the film formation substrate 200. This arrangement prevents sensing of the amount of the void between the film formation substrate 200 and the shadow mask 81 from being subjected to disturbance caused by the alignment marker sections 220 (not shown) of the film formation substrate 200 and alignment marker sections 83 (not shown) of the shadow mask 81 or by optical means (not shown) for reading the marker sections 220 and 83. The void-sensing transparent region is, depending on the situation, not necessarily located away from the alignment marker sections. The void sensors 401 are each so provided as to face the void-sensing transparent region.

The actuators 402 are each a z-axis drive actuator for controlling the void amount by converting a control signal into a motion along the z axis direction (that is, the direction of an axis that connects the shadow mask 81 and the film formation substrate 200 and that is perpendicular to the shadow mask 81 and the film formation substrate 200).

The actuators 402 each function as a void amount control mechanism for controlling the amount of the void between the shadow mask 81 and the film formation substrate 200.

The actuators 402 and the vapor deposition source 85 may each be fixed to, for example, (i) a bottom wall among inner walls of the vacuum chamber 60, or to (ii) a mask holding member (that is, a mask holding member provided separately from the actuators 402), such as a holder, that is so provided as to be capable of being moved by the mask unit moving mechanism for moving the mask unit 80 relative to the film formation substrate 200.

The present embodiment below describes an example case in which, as illustrated in FIGS. 54 and 55, the actuators 402 are each directly provided (fixed) to the shadow mask 81. The present embodiment is, however, not limited to such an arrangement.

Although the shadow mask 81 and the vapor deposition source 85 are fixed in position relative to each other, there is a minute operating region due to a void amount adjustment process. In the present embodiment, the actuators 402 are each so provided as to be adjacent to a lower surface of the shadow mask 81 as illustrated in FIGS. 54 and 55. This arrangement makes it possible to carry out a fine adjustment during the void amount adjustment process.

The fine adjustment during the void amount adjustment process does not affect the relative positional relationship between the shadow mask 81 and the vapor deposition source 85 along the substrate scanning direction. The present embodiment, as well as the embodiments above, fixes the relative respective positions of the shadow mask 81 and the vapor deposition source 85 along the substrate scanning direction.

Figure 56:
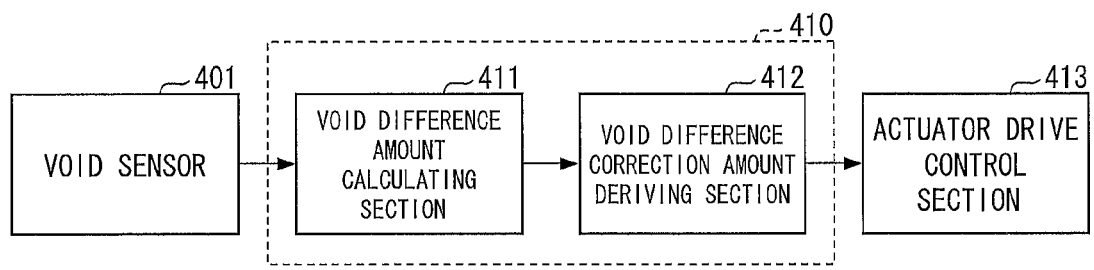
FIG. 56 is a block diagram partially illustrating a configuration of the vapor deposition device illustrated in FIG. 54.

FIG. 56 is a block diagram partially illustrating a configuration of the vapor deposition device 50 illustrated in FIG. 54.

As illustrated in FIG. 56, the control circuit 410 includes, each as a void amount control section: a void difference amount calculating section 411 (void difference amount detecting section; computing section); a void difference correction amount deriving section 412 (void difference correction amount calculating section; computing section); and an actuator drive control section 413.

The void sensors 401 measure the amount of the gap (void) between the film formation substrate 200 and the shadow mask 81, and transmit a result of the measurement to the control circuit in the form of a void amount signal as described above.

The void difference amount calculating section 411 calculates, from the void amount signal transmitted from the void sensor 401, the amount of difference (void difference amount) between (i) the gap between the film formation substrate 200 and the shadow mask 81, the gap having been measured by the void sensor 401, and (ii) the gap g1 between the film formation substrate 200 and the shadow mask 81, the gap g1 having been set in advance.

The void difference correction amount deriving section 412 derives (calculates), from the void difference amount calculated by the void difference amount calculating section 411, a correction value (void correction value) for correcting the above difference, and transmits a result of the derivation to the actuator drive control section 413 in the form of an adjustment signal.

The actuator drive control section 413, on the basis of the adjustment signal (void correction value), moves the actuators 402 along the z axis direction to control the gap (mask gap) between the film formation substrate 200 and the shadow mask 81 so that the gap is uniform.

Figure 57:
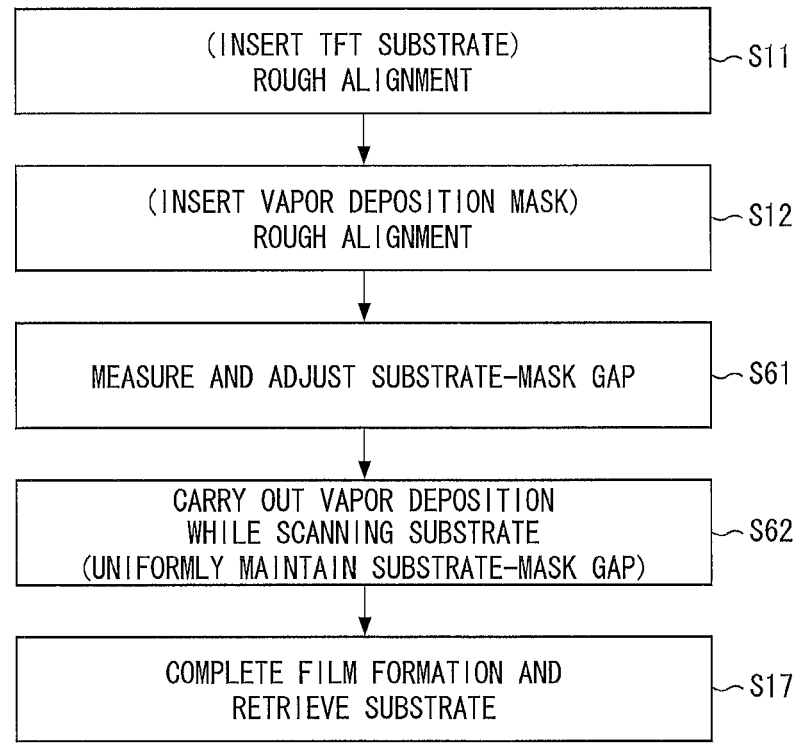
FIG. 57 is a flowchart indicating an example method for forming a predetermined pattern on a TFT substrate with use of the vapor deposition device according to Embodiment 16 of the present invention.

The following describes, with reference to FIGS. 55, 57, and 10, a step for forming a film with use of the vapor deposition device 50.

FIG. 57 is a flowchart illustrating an example method for forming a predetermined pattern on a TFT substrate 10 with use of the vapor deposition device 50 of the present embodiment.

The method first, as illustrated in FIG. 55, places the shadow mask 81, fixed to the actuators 402, above the vapor deposition source 85 in the vacuum chamber 60 in such a manner that the substrate scanning direction is identical to the long-axis direction of the stripe-shaped openings 82 provided in the shadow mask 81. This step assembles the mask unit 80 (preparation of a mask unit).

The method next, as illustrated in FIG. 57, inserts the TFT substrate 10 in the vacuum chamber 60, and carries out a rough alignment with use of the alignment markers 221 (not shown) of the TFT substrate 10 as the film formation substrate 200 so that each sub-pixel column of an identical color of the TFT substrate 10 has a direction that is identical to the substrate scanning direction (S11). The method holds the TFT substrate 10 with use of the substrate holding member 71 so that no bending due to the self weight is caused to the TFT substrate 10.

The method then carries out a rough alignment between the TFT substrate 10 and the shadow mask 81 (S12). The method further adjusts the gap g1 (substrate-mask gap) between the TFT substrate 10 and the shadow mask 81 so that the gap is uniform, and places the TFT substrate 10 and the shadow mask 81 so that they face each other. This allows the TFT substrate 10 and the shadow mask 81 to be aligned with each other (see S13 in FIG. 10).

In S13 above, the present embodiment controls the gap g1 to a uniform value by, as indicated by S61 in FIG. 57, (i) measuring the amount of the void between the TFT substrate 10 and the shadow mask 81 with use of the void sensors 401 and (ii) as described above, transmitting a suitable adjustment signal (void correction value) from the control circuit 410 to the actuators 402 on the basis of a void amount signal from the void sensors 401 (S61).

The method next stops the operation of the actuators 402, and carries out vapor deposition while mechanically maintaining the gap g1 and scanning the TFT substrate 10 simultaneously (S62).

The method, when carrying out vapor deposition while mechanically maintaining the gap g1 and scanning the TFT substrate 10 simultaneously, can be identical to any method described in the embodiments above. To prevent the void amount from changing due to such factors as thermal expansion of the shadow mask 81, the method desirably adjusts tension to the shadow mask 81 with use of a tension mechanism such as the mask tension mechanism 88 to correct self-weight bending and/or thermal bending of the shadow mask 81.

The method then retrieves, from the vacuum chamber 60, the TFT substrate 10 on which a predetermined pattern has been formed (S17). In S62, the method carries out, according to need, steps similar to the steps S14 to S17 in FIG. 10.

The present embodiment, which uses the void sensors 401 to measure the amount of the void between the film formation substrate 200 and the shadow mask 81 as described above, can accurately determine the amount of the void between the film formation substrate 200 and the shadow mask 81.

The present embodiment can thus accurately control the gap g1 (void amount) between the film formation substrate 200 and the shadow mask 81, and maintain the gap so that the gap has a desired, uniform value.

The present embodiment, which uses the actuators 402 to adjust the gap g1, that is, to control the void amount as described above, can carry out a fine adjustment. This arrangement consequently makes it possible to adjust the void amount easily and accurately.

Carrying out a fine adjustment with use of the actuators 402 as described above makes it possible to more precisely control the void amount. Further, providing a plurality of actuators 402 as described above makes it possible to locally control the void amount depending on the distribution of the void amount.

Thus, the present embodiment can prevent width variation, mispositioning, and shape change in a vapor deposition film 211 (not shown), such as a pixel pattern, that is deposited through the openings 82 of the shadow mask 81. This arrangement consequently makes it possible to accurately form a high-resolution pattern throughout the film formation substrate 200.

FIG. 57 illustrates an example case of, in S62, carrying out vapor deposition while maintaining the gap g1 mechanically as described above. The present embodiment is, however, not limited to such an arrangement.

Figure 58:
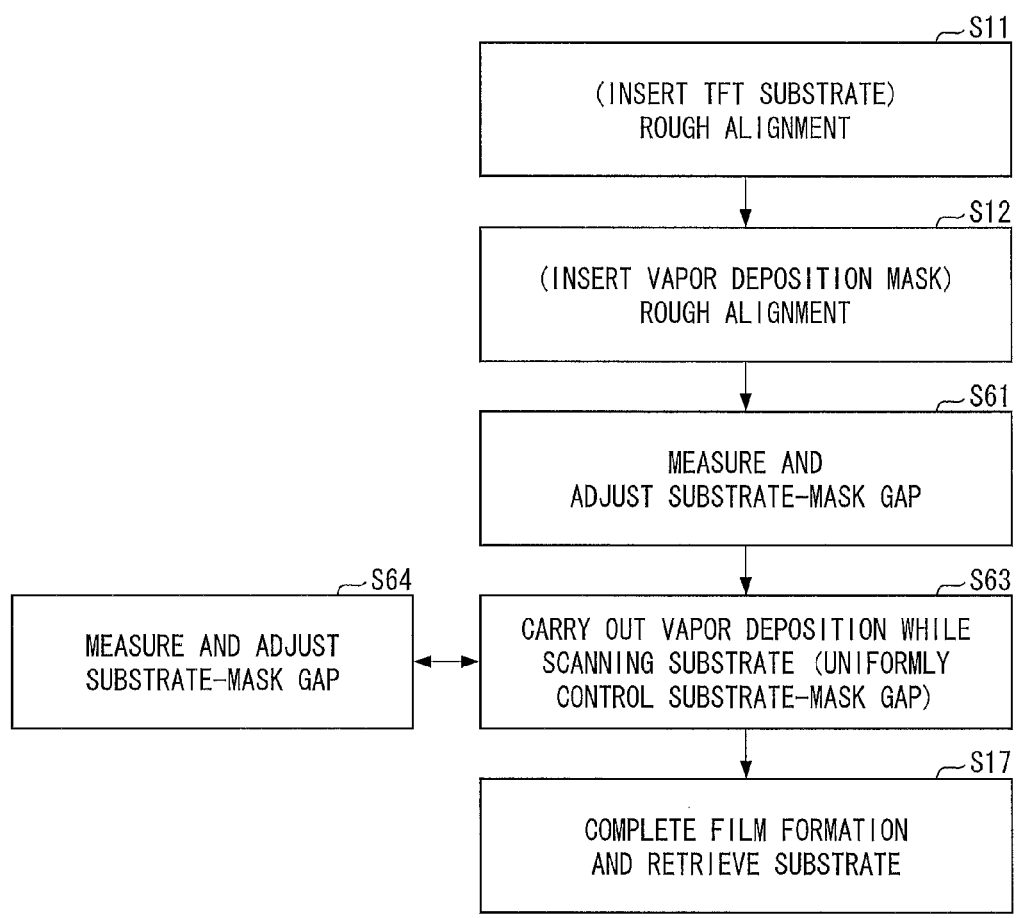
FIG. 58 is a flowchart indicating another example method for forming a predetermined pattern on a TFT substrate with use of the vapor deposition device according to Embodiment 16 of the present invention.
Figure 62:
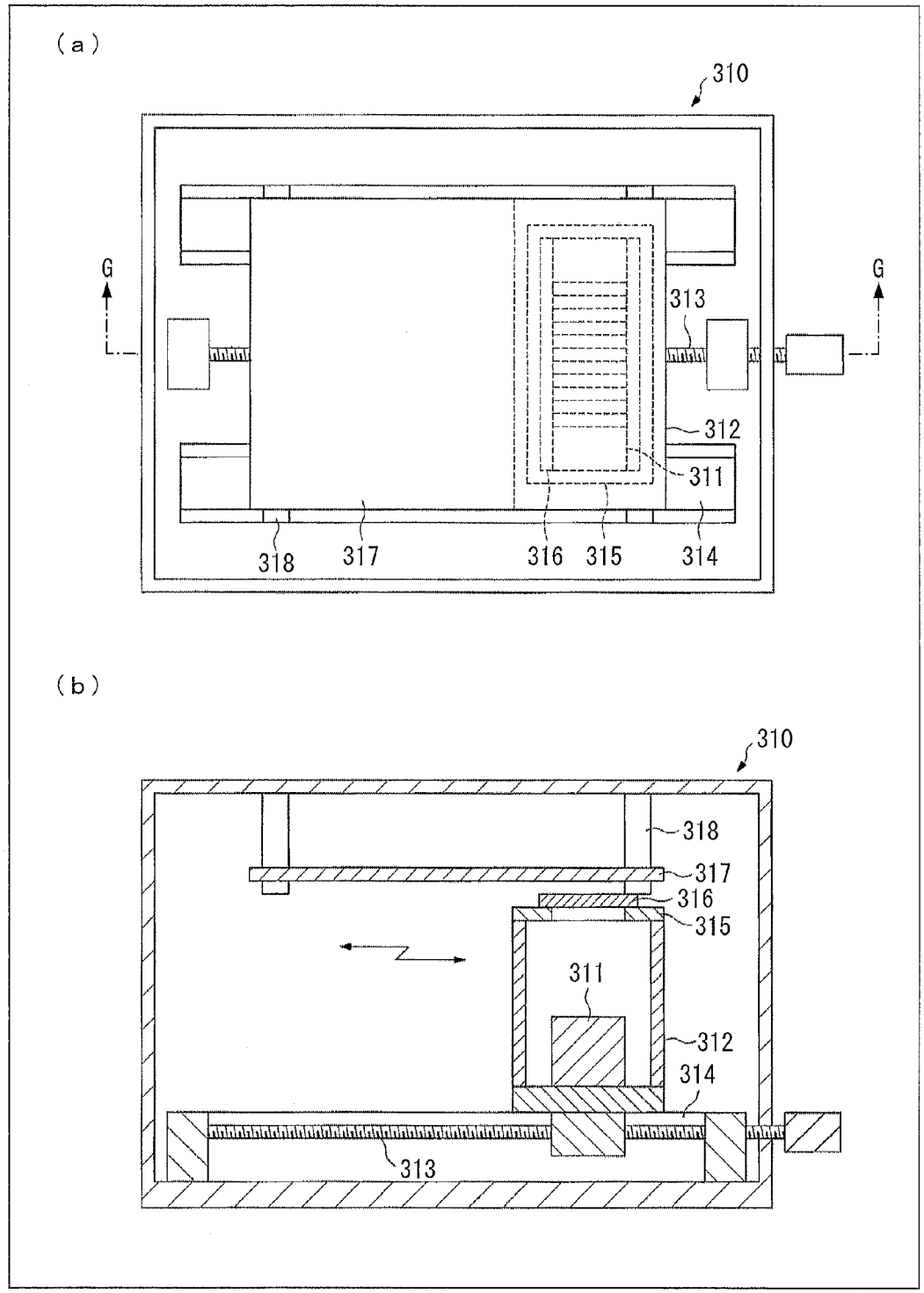
FIG. 62 (a) is a plan view schematically illustrating a vapor deposition device disclosed in Patent Literature 10, and (b) is a cross-sectional view, taken along an arrow, illustrating the vapor deposition device illustrated in (a).

FIG. 58 is a flowchart illustrating another example method for forming a predetermined pattern on a TFT substrate 10 with use of the vapor deposition device 50 of the present embodiment.

In this example as well as the above example, the method first, as illustrated in FIG. 55, places the shadow mask 81, fixed to the actuators 402, above the vapor deposition source 85 in the vacuum chamber 60 in such a manner that the substrate scanning direction is identical to the long-axis direction of the stripe-shaped openings 82 provided in the shadow mask 81. This step assembles the mask unit 80 (preparation of a mask unit).

The method then, as illustrated in FIG. 58, carries out steps similar to the steps S11 to S61 in FIG. 57. The present method next measures and controls (adjusts) the void amount in real time by (i) while scanning the film formation substrate 200, measuring the amount of the void between the TFT substrate 10 and the shadow mask 81 with use of the void sensors 401 and (ii) on the basis of a void amount signal from the void sensors 401, transmitting a suitable adjustment signal (void correction value) from the control circuit 410 to the actuators 402. With this arrangement, when vapor deposition is carried out while the TFT substrate 10 is scanned as indicated in S63, the void amount is corrected in real time, and vapor deposition is thus carried out while the gap g1 is so maintained as to be uniform as indicated in S64.

The method then retrieves, from the vacuum chamber 60, the TFT substrate 10 on which a predetermined pattern has been formed (S17). In this example as well as the above example, the method carries out, in S63, steps similar to the steps S14 to S17 in FIG. 10 according to need.

The method indicated in FIG. 58 is, as described above, more complex in both control and mechanism than the method indicated in FIG. 57; however, the method of FIG. 58 makes it possible to, while moving at least a first one of the mask unit 80 and the film formation substrate 200 relative to a second one and thus carrying out vapor deposition, reliably maintain the gap g1 along the entire substrate scanning direction so that the gap has a predetermined, constant value. The above arrangement consequently makes it possible to carry out patterning with higher accuracy.

The present embodiment, as illustrated in FIG. 55, describes an example case involving two void sensors provided at respective ends of a long side 81a of the shadow mask 81, which ends correspond to respective ends of the shadow mask 81 which ends are located downstream in the direction in which the substrate makes its entry. The present embodiment is, however, not limited to such an arrangement.

FIG. 59 is a bird's eye view of other example main constituent elements inside the vacuum chamber 60 of the vapor deposition device 50 illustrated in FIG. 54.

FIG. 59 illustrates a case involving three void sensors 401 provided along the long side 81a (specifically, at (i) respective ends of the long side 81a located downstream in the substrate entry direction and (ii) the middle of the long side).

It is possible to provide only one void sensor 401 or, as illustrated in FIG. 55, two void sensors 401. It is, however, preferable to provide a plurality of void sensors to determine the distribution of the void amount. It is particularly preferable to provide a plurality of void sensors next to one another on an identical plane along the direction perpendicular to the substrate scanning direction (that is, to the direction in which the shadow mask 81 and the film formation substrate 200 are moved relative to each other).

In the case where there are provided three or more void sensors 401 next to one another along the direction perpendicular to the substrate scanning direction as illustrated in FIG. 59, it is possible to more accurately determine the distribution of the void amount.

As described above, the present embodiment uses, as the void sensors 401, optical void sensors each for reading the amount of the void between the film formation substrate 200 and the shadow mask 81 through the film formation substrate 200.

The present embodiment is, however, not limited to such an arrangement. The void sensors 401 may each be a void sensor of another type such as an electrostatic capacity type and an eddy current type.

A void sensor of an electrostatic capacity type or an eddy current type, however, basically measures the void between an object and itself, the object needing to be a conductor. The use of such a void sensor is subject to a restriction as a result. The void sensors 401 are thus each desirably an optical void sensor as described above.

The present embodiment describes an example case in which the actuators 402 are each fitted to the shadow mask 81.

The present embodiment is, however, not limited to such an arrangement. The actuators 402 each simply need to be capable of controlling the amount of the void between the shadow mask 81 and the film formation substrate 200.

The actuators 402 may each be arranged, in order to control the void amount, to (i) move itself along the z axis direction to directly move the shadow mask 81 along the z axis direction, (ii) move, along the z axis direction, the entirety of the mask unit 80 including the vapor deposition source 85 and the shadow mask 81, or (iii) move, along the z axis direction, a part of the unit which part (for example, a mask frame) includes at least the shadow mask 81.

For example, the shadow mask 81 may be welded to a mask frame, and the actuators 402 may each be arranged to drive the mask frame.

In a case where, for example, there is provided a unit for setting or replacing the shadow mask 81 (or a mask frame provided integrally with the shadow mask 81), the actuators 402 may each be arranged to drive the unit.

In a case where, for example, the mask unit 80 is provided with a mechanism, such as (i) the mask tension mechanism 88, (ii) the mask holding member 87 including the mask fixing stand 144 having a slide mechanism, or (iii) the mask clamps 130, for applying tension to the shadow mask 81, the actuators 402 may each be arranged to drive the entire mechanism.

The actuators 402 may each be so provided as to be adjacent to a top surface of the shadow mask 81 instead of its lower surface.

In a case of depo-down, for example, the actuators 402 may each be so provided as to be adjacent to the top surface of the shadow mask 81.

As described above, the actuators 402 may each be directly fixed to the shadow mask 81 to be used as the mask holding member 87, or be provided separately from the mask holding member 87.

The present embodiment, as described above, describes an example case in which the actuators 402 are each fitted to the shadow mask 81. The present embodiment is, however, not limited to such an arrangement.

The present embodiment may alternatively be arranged to, for example, have another system in which (i) the shadow mask 81 is fixed, (ii) a mechanism for a driving along the z axis direction, such as an actuator, is provided inside a mechanism (for example, the substrate moving mechanism 70) for driving the film formation substrate 200, and (iii) the mechanism for a driving along the z axis direction controls the void amount.

In other words, the present embodiment may alternatively be arranged such that the film formation substrate 200, instead of the shadow mask 81, is moved for control of the amount of the void between the shadow mask 81 and the film formation substrate 200.

As described above, the actuator is simply required to move at least one of (1) either a part of the mask unit 80 which part includes at least the shadow mask 81 or the entirety of the mask unit 80 and (2) the film formation substrate 200. The actuator may be so provided as to, for example, be adjacent to the film formation substrate 200.

The actuator is simply required to move at least one of (1) either a part of the mask unit 80 which part includes at least the shadow mask 81 or the entirety of the mask unit 80 and (2) the film formation substrate 200 in order to adjust the void amount. It is preferable to provide a plurality of actuators because such an arrangement makes it possible to control the void amount accurately throughout the entire film formation substrate 200. However, only one actuator may instead be provided in the case where, for example, such an actuator is provided on the lower surface side of the mask holding member 87 such as a holder.

In the present embodiment as well as the embodiments above, the shadow mask 81 is, during the mask preparation step or vapor deposition step, desirably held horizontally by applying tension to the shadow mask with use of the mask tension mechanism 88 so that there occurs no self-weight or thermal bending or elongation.

In the case where, as described above, there is provided a mechanism, such as (i) the mask tension mechanism 88 and (ii) the mask holding member 87 including the mask fixing stand 144 having a slide mechanism, for applying tension to the shadow mask 81, driving the entire mechanism (for example, a part or the entirety of a unit including the mechanism) with use of the actuators 402 makes it possible to apply tension to the shadow mask 81 by a method similar to the methods described in the embodiments above, for example, Embodiments 1 and 7 through 12.

Further, even in the case where the actuator is so provided as to be adjacent to the film formation substrate 200, it is possible to apply tension to the shadow mask 81 by a method similar to the methods described in the embodiments above, for example, Embodiments 1 and 7 through 12.

The present embodiment is, however, not limited to such arrangements. Even in the case where, for example, the actuators 402 are each directly fitted to the shadow mask 81 as described above, it is possible to apply tension to the shadow mask 81 and control the gap g1 to a constant value on the basis of an arrangement in which, for example, the actuators 402 are each so provided as to be slidable in a direction substantially parallel to a surface direction as with the mask holding member 87 in FIG. 1 or the movable section 142 in FIG. 31 by, for example, being connected to a slider mechanism.

The present embodiment describes, each as a constituent element (functional block; control section) in the control circuit 410, only constituent elements for, for example, controlling the gap g1 with use of the void sensors 401.

It is clear, however, that the control circuit 410 may alternatively include, other than the above constituent elements, a constituent element similar to a constituent element included in (i) the control circuit 100 illustrated in FIG. 4 or 29, (ii) the control circuit 230 illustrated in FIG. 40 or 41, (iii) the control circuit 280 illustrated in FIG. 49, or (iv) the control circuit 290 illustrated in FIG. 52.

The present embodiment, as well as the embodiments above, describes an example case in which both the openings 82 of the shadow mask 81 and the emission holes 86 of the vapor deposition source 85 are arranged one-dimensionally. The present embodiment is, however, not limited to such an arrangement. It is clear that (i) the openings 82 of the shadow mask 81 and the emission holes 86 of the vapor deposition source 85 may be arranged two-dimensionally and that (ii) the shadow mask and the vapor deposition source may include a single opening and a single emission hole, respectively.

The present embodiment is, as well as the embodiments above, arranged such that (i) there is provided, as the shutter 89, a shutter that is capable of moving in a space between the shadow mask 81 and the vapor deposition source 85, and that (ii) when steps similar to the steps S14 to S17 in FIG. 10 are carried out in S62 indicated in FIG. 57 or in S63 indicated in FIG. 58, the shutter 89 is inserted between the vapor deposition source 85 and the shadow mask 81 to prevent vapor deposition particles from adhering to a non vapor deposition region (that is, a portion that needs no vapor deposition). The present embodiment is, however, not limited to such an arrangement.

The present embodiment may be arranged, for example, such that, as described above, (i) the vapor deposition source 85 is a vapor deposition source 85 that can be switched ON/OFF and that (ii) when a portion of the film formation substrate 200 which portion needs no vapor deposition is positioned in a region (that is, a region facing an opening 82) that faces an opening region of the shadow mask 81, vapor deposition is turned OFF so that no vapor deposition particles fly.

Embodiment 17

The present embodiment is described below mainly with reference to FIGS. 60 and 61.

The present embodiment mainly deals with how the present embodiment is different from Embodiments 1 through 16 (particularly, Embodiment 16) above. Constituent elements of the present embodiment that are identical in function to their respective equivalents described in Embodiments 1 through 16 are each assigned the same reference numeral, and are not described here.

As in Embodiment 16, the present embodiment describes, in relation to a vapor deposition method involving a void, a method for more precisely controlling the amount of the void (that is, the width of the gap g1) between the film formation substrate 200 and the shadow mask 81 to a uniform value in order to produce a high-resolution vapor deposition pattern.

FIG. 60 is a bird's eye view of example main constituent elements inside the vacuum chamber 60 of the vapor deposition device 50 of the present embodiment. FIG. 61 is a plan view illustrating void-sensing transparent regions in the film formation substrate used in the present embodiment.

The present embodiment is, in its general concept, identical to Embodiment 16. The vapor deposition device 50 of the present embodiment includes constituent elements that are identical to those of the vapor deposition device 50 of Embodiment 16.

More specifically, the vapor deposition device 50 of the present embodiment includes constituent elements identical to those of the vapor deposition device 50 illustrated in FIG. 54. There is, however, a difference in (i) the respective numbers of the void sensors 401 and actuators 402 and (ii) the respective positions thereof.

Embodiment 16 above describes an example case involving void sensors 401 each provided at a position that is (i) above the film formation substrate 200, (ii) in the vicinity of the mask unit 80, and (iii) along the long side 81*a* located at an end upstream in the substrate scanning direction, the void sensors being provided in the number of two (at respective ends of the long side 81*a* located downstream in the substrate entry direction) or three (at respective ends of the long side 81*a* located downstream in the substrate entry direction and the middle of the long side).

The present embodiment, as illustrated in FIG. 60, involves void sensors 401 each provided at a position that is (i) above the film formation substrate 200 and (ii) in the vicinity of the mask unit 80, the void sensors being provided in the number of three along the long side 81*a* located at the end upstream in the substrate scanning direction and three more along the long side 81*a* located downstream in the substrate scanning direction. In other words, the present embodiment involves void sensors 401 provided at respective ends and the middle of each long side 81*a* of the shadow mask 81.

Embodiment 16 above describes an example case involving two actuators 402 provided, as illustrated in FIGS. 55 and 59, at respective ends of the vapor deposition source 85 which ends are opposite to each other along the long-side direction of the vapor deposition source 85, that is, provided in the vicinity of the middle of each short side 81*b* of the shadow mask 81.

The present embodiment, as illustrated in FIG. 60, involves not only the two actuators 402 provided at the respective ends of the vapor deposition source 85 which ends are opposite to each other along the long-side direction of the vapor deposition source 85, but also two additional actuators provided, in the vicinity of the middle of the vapor deposition source 85 along the long-side direction thereof, respectively on the upstream side and downstream side of the substrate scanning direction.

The present embodiment describes below an example case of, while scanning the film formation substrate 200, sensing the void amount with use of the void sensors 401, provided as illustrated in FIG. 60, to control (adjust) the void amount in real time.

In the present embodiment, which controls the void amount in real time, the film formation substrate 200 includes, as illustrated in FIG. 61, void-sensing transparent regions 201 (sensing light transmitting regions) so provided in a region facing the void sensors 401 as to extend along the substrate scanning direction.

Since the void sensors 401 are provided, as described above, at the respective ends and the middle of each long side 81*a* of the shadow mask 81, the example illustrated in FIG. 61 involves void-sensing transparent regions 201 so provided, (i) in the vicinity of the middle of the film formation substrate 200 along the short-side direction thereof and (ii) at respective ends of the film formation substrate along the long-side direction thereof, as to extend along the substrate scanning direction.

In the present embodiment, the film formation substrate 200 thus includes, each as a vapor deposition region 210, TFT circuit formation regions 202*a* and 202*b* so provided as to sandwich the void-sensing transparent region 201 so provided in the vicinity of the middle of the film formation substrate 200 along the short-side direction thereof as to extend along the substrate scanning direction.

As described in Embodiment 16, the void-sensing transparent regions 201 are preferably located away from alignment marker sections 220 of the film formation substrate 200. This arrangement prevents sensing of the amount of the void between the film formation substrate 200 and the shadow mask 81 from being subjected to disturbance caused by the alignment marker sections 220 (not shown) of the film formation substrate 200 and alignment marker sections 83 (not shown) of the shadow mask 81 or by optical means (not shown) for reading the marker sections 220 and 83.

FIG. 61 illustrates a case in which the film formation substrate 200 includes void-sensing transparent regions 201 provided continuously along the substrate scanning direction. The present embodiment is, however, not limited to such an arrangement. The void-sensing transparent regions 201 may alternatively be provided discontinuously.

In the present embodiment as well as the embodiments above, the void sensors 401, the void-sensing transparent regions 201, and the shadow mask 81 are so attached as to have a positional relationship with which, when measuring the void amount, the void sensors 401 can measure, through the transparent regions 201 of the film formation substrate 200, the void extending from the film formation substrate 200 to a non-opening section of the shadow mask 81.

The present embodiment includes, as described above, a larger number of void sensors 401 than Embodiment 16, and can thus obtain a larger amount of information about the void amount than Embodiment 16.

Similarly, the present embodiment includes a large number of actuators 402 than Embodiment 16, and can thus carry out more precise control on the basis of a larger amount of information than Embodiment 16.

The present embodiment in particular includes void sensors 401 and actuators 402 on both the upstream side and downstream side of the substrate scanning direction. Thus, even in the case where, for example, the void amount is large on the upstream side of the substrate scanning direction and is small on the downstream side thereof, independently controlling the actuator 402 on the upstream side and that on the downstream side makes it possible to control the void amount accurately throughout the entire film formation substrate 200.

The present embodiment further includes a plurality of void sensors 401 and actuators 402 along the long-side direction of the shadow mask 81 (that is, the direction perpendicular to the substrate scanning direction). Thus, even in the case where, for example, the void amount is large at a central portion of the shadow mask 81 along its long-side direction and is small at the ends of the shadow mask, independently controlling the actuator 402 corresponding to the central portion of the shadow mask 81 along its long-side direction and the actuators 402 corresponding to the respective ends makes it possible to control the void amount accurately throughout the entire film formation substrate 200.

As described above, the present embodiment can, while carrying out an alignment in real time, control the amount of the void between the film formation substrate 200 and the shadow mask 81 more accurately throughout the entire film formation substrate 200. This arrangement makes it possible to reliably maintain the void amount at a desired, uniform value.

Thus, the present embodiment can prevent width variation, mispositioning, and shape change in a vapor deposition film 211 (not shown), such as a pixel pattern, that is deposited through the openings 82 of the shadow mask 81.

This arrangement consequently makes it possible to accurately form a high-resolution pattern throughout the film formation substrate 200.

The present embodiment, as described above, describes an example case involving void sensors 401 each provided at a position that is (i) above the film formation substrate 200 and (ii) in the vicinity of the mask unit 80, the void sensors being provided in the number of three along the long side 81*a* located at the end upstream in the substrate scanning direction and three more along the long side 81*a* located downstream in the substrate scanning direction. The present embodiment is, however, not limited to such an arrangement.

Even in the case involving, for example, void sensors 401 each provided, as in Embodiment 16 above, at a position that is (i) above the film formation substrate 200 and (ii) in the vicinity of the mask unit 80, the void sensors being provided in the number of three (at respective ends of the long side 81*a* located downstream in the substrate entry direction and the middle of the long side) along the long side 81*a* located at the end upstream in the substrate scanning direction, it is clearly possible to control the void amount in real time by, as illustrated in FIG. 61, providing void-sensing transparent regions 201, along the substrate scanning direction, in the region of the film formation substrate 200 which region faces the void sensors 401.

The embodiments above each mainly describe a case of carrying out depo-up or depo-down with respect to the film formation substrate 200. The present invention is, however, not limited to such an arrangement.

The present invention may alternatively be arranged, for example, such that (i) the vapor deposition source 85 includes a mechanism for emitting vapor deposition particles in a lateral direction and that (ii) such vapor deposition particles are deposited (side deposition) onto the film formation substrate 200 in a lateral direction through the shadow mask 81 in a state in which the film formation substrate 200 is stood vertically in such a manner that the vapor deposition surface (film formation surface) thereof faces the vapor deposition source 85 side.

The embodiments above each describe an example case in which (i) the organic EL display device 1 includes a TFT substrate 10 and (ii) an organic layer is formed on the TFT substrate 10. The present invention is, however, not limited to such an arrangement. The present invention may alternatively be arranged such that (i) the organic EL display device 1 includes not a TFT substrate 10 but, as a substrate on which an organic layer is to be formed, a passive substrate including no TFT, or that (ii) the film formation substrate 200 is such a passive substrate.

The embodiments above each describe an example case of, as described above, forming an organic layer on a TFT substrate 10. The present invention is, however, not limited to such an arrangement. The present invention is suitably applicable to a case of forming an electrode pattern instead of an organic layer. The vapor deposition device 50 and vapor deposition method of the present invention are, as described above, suitably applicable to, other than the method for producing the organic EL display device 1, any production method and production device for forming a patterned film by vapor deposition.

As described above, the vapor deposition method and vapor deposition device of the present invention each carry out vapor deposition by (i) using a mask unit including: a vapor deposition mask that has an opening and that is smaller in area than a vapor deposition region of a film formation substrate; and a vapor deposition source that has an emission hole for emitting a vapor deposition particle, the emission hole being provided so as to face the vapor deposition mask, the vapor deposition mask and the vapor deposition source being fixed in position relative to each other, (ii) adjusting an amount of a void between the vapor deposition mask and the film formation substrate, and (iii) moving at least a first one of the mask unit and the film formation substrate relative to a second one thereof while uniformly maintaining a void between the mask unit and the film formation substrate.

As described above, according to the present invention, the vapor deposition mask and the vapor deposition source are fixed in position relative to each other. This makes it possible to carry out vapor deposition by (i) using a vapor deposition mask smaller in area than the vapor deposition region of the film formation substrate and (ii) moving at least a first one of the mask unit and the film formation substrate relative to a second one thereof.

The present invention thus prevents the problem of, for example, self-weight bending and elongation due to a large-sized vapor deposition mask, and consequently makes it possible to not only form a pattern of an organic layer on a large-sized substrate, but also form such a pattern with high positional accuracy and high resolution.

The present invention uses a vapor deposition mask smaller in area than the vapor deposition region of the film formation substrate as described above. This can reduce or prevent problems caused by a frame for holding a vapor deposition mask which frame is extremely large and extremely heavy due to a large-sized vapor deposition mask.

The present invention can carry out vapor deposition by moving at least a first one of the mask unit and the film formation substrate relative to a second one thereof while uniformly maintaining the void between the mask unit and the film formation substrate, and thus form a vapor deposition film that is uniform in width and film thickness.

The void between the mask unit and the film formation substrate prevents the film formation substrate from coming into contact with the vapor deposition mask, and thus prevents the film formation substrate from being damaged by the vapor deposition mask. The present invention thus eliminates the need to form on the film formation substrate a mask spacer for preventing such damage, and can reduce costs as well.

The vapor deposition method may preferably be arranged such that the mask unit further includes a tension mechanism for applying tension to the vapor deposition mask; and the step (A) involves holding the vapor deposition mask in a state in which the vapor deposition mask is under the tension.

In other words, the vapor deposition method of the present invention may preferably be a vapor deposition method for forming, on a film formation substrate, a vapor deposition film having a predetermined pattern, the vapor deposition method including the steps of: (A) (i) preparing a mask unit including: a vapor deposition mask that has an opening and that is smaller in area than a vapor deposition region of the film formation substrate; a vapor deposition source that has an emission hole for emitting a vapor deposition particle, the emission hole being provided so as to face the vapor deposition mask; and a tension mechanism for applying tension to the vapor deposition mask, the vapor deposition mask and the vapor deposition source being fixed in position relative to each other, and (ii) while holding the vapor deposition mask in a state in which the vapor deposition mask is under the tension, aligning the mask unit and the film formation substrate with each other so that the vapor deposition mask faces the film formation substrate in a state in which the vapor deposition mask is separated from the film formation substrate by a uniform void; and (B) (i) moving at least a first one of the mask unit and the film formation substrate relative to a second one thereof in a state in which the uniform void is maintained between the mask unit and the film formation substrate, and (ii) sequentially depositing the vapor deposition particle.

The vapor deposition method may preferably be arranged such that the mask unit further includes a tension mechanism for applying tension to the vapor deposition mask.

In other words, the vapor deposition device of the present invention is a vapor deposition device for forming, on a film formation substrate, a film having a predetermined pattern, the vapor deposition device including: a mask unit provided so as to face the film formation substrate and so as to include: a vapor deposition mask that has an opening and that is smaller in area than a vapor deposition region of the film formation substrate; and a vapor deposition source that has an emission hole for emitting a vapor deposition particle, the emission hole being provided so as to face the vapor deposition mask, the vapor deposition mask and the vapor deposition source being fixed in position relative to each other; and moving means for moving at least a first one of the mask unit and the film formation substrate relative to a second one thereof in a state in which a uniform void is provided between the mask unit and the film formation substrate, the mask unit including a tension mechanism for applying tension to the vapor deposition mask.

The above arrangement, which applies tension to the vapor deposition mask with use of the tension mechanism, can reduce self-weight bending and thermal expansion of the vapor deposition mask. Further, the above arrangement can adjust alignment accuracy for the vapor deposition mask by tension in accordance with a situation occurring during vapor deposition (for example, thermal expansion of the vapor deposition mask and/or finishing accuracy of the film formation substrate).

Patent Literature 4 discloses forming a high-resolution vapor deposition pattern on a substrate by (i) holding a metal mask onto a base plate in a state in which the metal mask is under tension with use of a coil spring so that a slit can be maintained in a predetermined shape and (ii) fitting a substrate to the base plate.

The method disclosed in Patent Literature 4, however, closely attaches a substrate and a metal mask to each other with use of a base plate for vapor deposition as described above, and thus requires adjusting the mask before creating a vacuum state in a vacuum vapor deposition device. The above method, as a result, cannot correct a shift in the state (for example, temperature and substrate finishing) of the metal mask during vacuum vapor deposition.

In addition, Patent Literature 4 carries out vapor deposition on the vapor deposition region of a substrate with use of a metal mask so sized as to allow vapor deposition to be carried out with respect to the entire vapor deposition region of the substrate, and thus uses a substrate with a small vapor deposition region. Patent Literature 4, as a result, uses a metal mask smaller in size than the substrate. In the case where the substrate is large-sized, the metal mask itself also needs to be large-sized, and the base plate needs to be large-sized as well. This in turn requires an extremely large and complex device for handling such a metal mask and substrate, thus making device design difficult. Further, there remains a problem with safety in handling during a production step or a step of, for example, mask replacement.

The present invention, in contrast, poses no such problem as described above.

Patent Literature 11 discloses fixing, in the case of using a metal mask as a vapor deposition mask, the metal mask to a mask supporting section of a mask support with use of a fixing section mechanism, and further discloses fixing, during the above step, the metal mask by pulling it in its peripheral direction.

Patent Literature 11, however, merely discloses fixing, when the periphery of the metal mask is placed along a groove and the metal mask is fixed with use of a restrainer provided on the metal mask, the metal mask in the state in which it is pulled in its peripheral direction. Patent Literature 11 thus fails to disclose a tension mechanism itself for applying tension to the vapor deposition mask.

In addition, Patent Literature 11 fixes the metal mask to the groove with use of the restrainer in the end. As a result, Patent Literature 11, as in Patent Literature 4, cannot correct a shift in the state (for example, temperature and substrate finishing) of the metal mask during vacuum vapor deposition.

In contrast, the present invention is, as described above, arranged such that the vapor deposition device itself includes a tension mechanism for applying tension to the vapor deposition mask and that how tension is applied to the vapor deposition mask is controlled by the tension mechanism.

Thus, the present invention can, as described above, (i) reduce or correct self-weight bending and thermal expansion of the vapor deposition mask so that a uniform void is maintained between the mask unit and the film formation substrate, and further (ii) actively control, for example, pixel mispositioning with use of the tension mechanism. The tension mechanism, which is provided to the mask unit, can also be used as an auxiliary mechanism for a real-time alignment.

The vapor deposition method of the present invention may preferably be arranged such that the mask unit is placed in a film growing chamber so that the deposition of the vapor deposition particle is carried out inside the film growing chamber; a first absolute-alignment marker is provided to the vapor deposition mask; a second absolute-alignment marker is provided at a position in either the mask unit or the film growing chamber which position faces the vapor deposition mask; and the step (A) involves relatively aligning the first and second absolute-alignment markers with each other so as to place the vapor deposition mask at a predetermined absolute position.

The above arrangement can place the vapor deposition mask at an absolute position, and thus accurately fix the respective positions of the vapor deposition source and the vapor deposition mask relative to each other. In other words, the above arrangement can accurately place the vapor deposition mask in a region (vapor deposition area) onto which vapor deposition particles from the vapor deposition source are to be deposited.

The above arrangement can thus narrow the vapor deposition region, and eliminates the need for a design to provide a wide vapor deposition region so that no problem arises even if the vapor deposition mask is slightly mispositioned relative to the vapor deposition area. The above arrangement can consequently improve efficiency of material use.

The vapor deposition method may preferably be arranged such that the first absolute-alignment marker includes a plurality of absolute-alignment markers arranged in parallel to a direction (relative movement direction) of the relative movement; and the vapor deposition mask is placed at the absolute position by relatively aligning (i) at least one of the plurality of absolute-alignment markers with (ii) the second absolute-alignment marker provided to the mask unit or the film growing chamber.

The above arrangement allows the relative movement direction (that is, the scanning direction) to be accurately parallel to a side (opening end) of each opening of the vapor deposition mask which side needs to extend in a direction parallel to the scanning direction.

The vapor deposition method may preferably be arranged such that the film formation substrate includes, at a position therein which position lies upstream from the vapor deposition region along a direction of the relative movement, a first alignment marker for use in alignment between the vapor deposition mask and the film formation substrate; the vapor deposition mask includes, at an end section thereof which end section first meets the first alignment marker during the relative movement, a second alignment marker for use in the alignment between the vapor deposition mask and the film formation substrate; and the vapor deposition mask and the film formation substrate are aligned with each other by relatively aligning (i) the second alignment marker with (ii) the first alignment marker at the position during the relative movement.

The above arrangement can reliably correct the respective positions of the mask unit and the film formation substrate before the film formation substrate enters a region (vapor deposition area) in which vapor deposition particles from the vapor deposition source are deposited.

The vapor deposition method may preferably be arranged such that the vapor deposition mask includes a plurality of alignment markers for use in alignment between the vapor deposition mask and the film formation substrate which plurality of alignment markers are arranged in parallel to a direction of the relative movement; the film formation substrate includes a plurality of alignment markers for use in the alignment between the vapor deposition mask and the film formation substrate which plurality of alignment markers are arranged in parallel to the direction of the relative movement; and the vapor deposition mask and the film formation substrate are aligned with each other by relatively aligning (i) the plurality of alignment markers included in the vapor deposition mask with (ii) the plurality of alignment markers included in the film formation substrate.

The above arrangement, when carrying out an alignment between the vapor deposition mask and the film formation substrate, allows the relative movement direction (that is, the scanning direction) to be accurately parallel to a side (opening end) of each opening of the vapor deposition mask which side needs to extend in a direction parallel to the scanning direction.

The vapor deposition method may preferably be arranged such that, when the tension is applied to the vapor deposition mask, the tension is applied to the vapor deposition mask in either an obliquely upward direction or an obliquely downward direction by using, as a fulcrum, an abutting member abutting either an upper surface or lower surface of the vapor deposition mask.

The above arrangement allows tension to be easily applied to the vapor deposition mask by applying tension to the vapor deposition mask in either an obliquely upward direction or an obliquely downward direction by using, as a fulcrum, an abutting member, such as a supporting member (which is fixed and thus does not move) for supporting the vapor deposition mask, that abuts either an upper surface or lower surface of the vapor deposition mask.

The above arrangement uses, as a fulcrum, an abutting member abutting either the upper surface or lower surface of the vapor deposition mask, and can thus easily and accurately correct parallelism between the vapor deposition mask and the film formation substrate (that is, parallelism between a mask surface of the vapor deposition mask and a substrate surface of the film formation substrate).

In particular, it is easier and more accurate to (i) correct parallelism between the vapor deposition mask and the film formation substrate by correcting parallelism between the abutting member and the film formation substrate than to (ii) precisely correct parallelism between the vapor deposition mask and the film formation substrate with use of the tension mechanism itself that moves in the back-and-forth direction and the left-and-right direction relative to the vapor deposition mask.

Further, since the correction of parallelism between the abutting member and the film formation substrate governs the correction of parallelism between the vapor deposition mask and the film formation substrate, it is unnecessary to, when the vapor deposition mask is replaced, precisely adjust the correction of parallelism between the vapor deposition mask and the film formation substrate. The above arrangement thus facilitates replacement of the vapor deposition mask.

The vapor deposition method may preferably be arranged such that the vapor deposition mask has a fixed end; and the tension is applied to the vapor deposition mask in a single direction with use of the tension mechanism.

The above arrangement generates only tension applied to the vapor deposition mask in a single axis direction. The above arrangement can thus prevent torsion in the vapor deposition mask, and allows stable operation.

The vapor deposition method may preferably be arranged such that the tension mechanism includes clamps at respective corner sections of the vapor deposition mask; and the tension is applied to the vapor deposition mask at the corner sections by applying tension to the clamps.

The above arrangement allows tension to be applied to the vapor deposition mask in various directions, and thus allows a fine position adjustment. The above arrangement can consequently improve alignment accuracy, and in turn further improve vapor deposition accuracy.

The vapor deposition method may preferably be arranged such that the step (B) involves adjusting respective positions of the film formation substrate and the vapor deposition mask relative to each other while carrying out the deposition of the vapor deposition particle.

In other words, the vapor deposition method of the present invention may preferably be a vapor deposition method for forming, on a film formation substrate, vapor deposition film having a predetermined pattern, the vapor deposition method including the steps of: (A) (i) preparing a mask unit including: a vapor deposition mask that has an opening and that is smaller in area than a vapor deposition region of the film formation substrate; and a vapor deposition source that has an emission hole for emitting a vapor deposition particle, the emission hole being provided so as to face the vapor deposition mask, the vapor deposition mask and the vapor deposition source being fixed in position relative to each other, and (ii) aligning the mask unit and the film formation substrate with each other so that the vapor deposition mask faces the film formation substrate in a state in which the vapor deposition mask is separated from the film formation substrate by a uniform void; and (B) (i) moving at least a first one of the mask unit and the film formation substrate relative to a second one thereof in a state in which the uniform void is maintained between the vapor deposition mask and the film formation substrate, and (ii) sequentially depositing the vapor deposition particle through the opening of the vapor deposition mask onto the vapor deposition region of the film formation substrate, the step (B) involving adjusting respective positions of the film formation substrate and the vapor deposition mask relative to each other while carrying out the deposition of the vapor deposition particle.

For the above arrangement, the vapor deposition device may preferably further include: alignment observing means provided so as to be adjacent to the film formation substrate and the vapor deposition mask and so as to be fixed in position relative to the vapor deposition mask; and adjusting means for adjusting respective positions of the film formation substrate and the vapor deposition mask relative to each other.

In other words, the vapor deposition device of the present invention is a vapor deposition device for forming, on a film formation substrate, a film having a predetermined pattern, the vapor deposition device including: a mask unit provided so as to face the film formation substrate and so as to include: a vapor deposition mask that has an opening and that is smaller in area than a vapor deposition region of the film formation substrate; and a vapor deposition source that has an emission hole for emitting a vapor deposition particle, the emission hole being provided so as to face the vapor deposition mask, the vapor deposition mask and the vapor deposition source being fixed in position relative to each other; moving means for moving at least a first one of the mask unit and the film formation substrate relative to a second one thereof in a state in which a uniform void is provided between the mask unit and the film formation substrate; alignment observing means provided so as to be adjacent to the film formation substrate and the vapor deposition mask and so as to be fixed in position relative to the vapor deposition mask; and adjusting means for adjusting respective positions of the film formation substrate and the vapor deposition mask relative to each other.

No absolute reliability is ensured in mechanical accuracy of moving (scanning) the film formation substrate or the mask unit relative to the other. Adjusting the respective positions of the film formation substrate and the vapor deposition mask relative to each other while carrying out vapor deposition, however, makes it possible to appropriately maintain the positional relationship between the film formation substrate and the vapor deposition mask relative to each other during vapor deposition. Thus, the arrangements above each make it possible to form a pattern with high positional accuracy and high resolution even with use of a large-sized substrate as a film formation substrate.

Further, the arrangements above each eliminate the need to stop a scan for an alignment between the film formation substrate and the vapor deposition mask, and can thus form a vapor deposition film with higher efficiency.

In particular, recognition accuracy can be improved by, as described above, observing the respective positions of the film formation substrate and the vapor deposition mask relative to each other by using, as alignment observing means, alignment observing means provided so as to be adjacent to the film formation substrate and the vapor deposition mask and so as to be fixed in position relative to the vapor deposition mask. The arrangements above thus each make it possible to carry out an alignment with higher precision.

Since the use of the alignment observing means can improve recognition accuracy, the vapor deposition method may preferably be arranged such that the vapor deposition mask includes a second alignment marker for use in alignment between the vapor deposition mask and the film formation substrate; the film formation substrate includes a first alignment marker for use in the alignment between the vapor deposition mask and the film formation substrate; and the step (B) involves, while carrying out the deposition of the vapor deposition particle, adjusting the respective positions of the film formation substrate and the vapor deposition mask relative to each other by (i) observing respective positions of the second alignment marker and the first alignment marker relative to each other with use of alignment observing means provided so as to be adjacent to the film formation substrate and the vapor deposition mask and so as to be fixed in position relative to the vapor deposition mask, and (ii) adjusting the respective positions of the second alignment marker and the first alignment marker relative to each other on a basis of a result of the observation.

The above arrangement allows an alignment to be carried out in real time with higher precision.

The vapor deposition method may preferably be arranged such that the first alignment marker and the second alignment marker are each provided outside a vapor deposition region for the vapor deposition particle emitted from the vapor deposition source; the second alignment marker is an alignment opening; and the step (B) involves observing, through the alignment opening, the position of the first alignment marker relative to the second alignment marker with use of the alignment observing means.

The above arrangement, (i) with use of the alignment observing means and (ii) through the alignment opening provided to the vapor deposition mask, observes an alignment marker provided to the film formation substrate for use in the alignment between the vapor deposition mask and the film formation substrate. The above arrangement thus allows a more accurate alignment, and in turn allows a more accurate vapor deposition control.

The vapor deposition method may preferably be arranged such that the alignment observing means emits spot light to the first alignment marker through the alignment opening and, on a basis of an intensity of reflection of the spot light, observes the position of the first alignment marker relative to the second alignment marker.

The above arrangement can, without image recognition, more accurately observe and detect a relative position of the alignment marker for use in the alignment between the vapor deposition mask and the film formation substrate. Further, the above arrangement can carry out the above processes with high precision and yet at higher speed. The above arrangement is thus suitably applicable in a case where at least a first one of the mask unit and the film formation substrate is moved relative to a second one thereof rapidly.

The vapor deposition method may preferably be arranged such that the film formation substrate includes a first alignment marker for use in alignment between the vapor deposition mask and the film formation substrate; and the step (B) involves, while carrying out the deposition of the vapor deposition particle, adjusting respective positions of the film formation substrate and the vapor deposition mask relative to each other by (i) observing respective positions of the first alignment marker and the vapor deposition film relative to each other with use of alignment observing means and (ii) adjusting the respective positions of the first alignment marker and the vapor deposition film relative to each other on a basis of a result of the observation.

The above arrangement can determine mispositioning of a vapor deposition film actually deposited on the film formation substrate, and thus carry out a more accurate alignment.

The vapor deposition method may preferably be arranged such that the alignment observing means optically observes, in such a manner as to make no contact with the first alignment marker or the vapor deposition film, the respective positions of the first alignment marker and the vapor deposition film relative to each other.

The means for observing the positional relationship between (i) the alignment marker, provided to the film formation substrate for an alignment between the vapor deposition mask and the film formation substrate, and (ii) the vapor deposition film formed to have the predetermined pattern can be alignment observing means for carrying out an optical observation such as observation of photoluminesence light emission, observation of the intensity of reflection, observation of transmission intensity, and simple image recognition.

The vapor deposition method may preferably be arranged such that the first alignment marker is made of a material that reflects or absorbs ultraviolet light and is provided inside a vapor deposition region for the vapor deposition particle emitted from the vapor deposition source; the vapor deposition particle is made of a material that emits light by photoluminesence; the step (B) involves depositing the vapor deposition particle onto the first alignment marker; and the alignment observing means emits ultraviolet light to the first alignment marker and the vapor deposition film so as to observe the respective positions of the vapor deposition film emitting light by photoluminesence due to the ultraviolet light and the first alignment marker.

The above arrangement can directly determine mispositioning of a vapor deposition film actually deposited on the film formation substrate, and thus carry out a more accurate alignment.

The vapor deposition method may preferably be arranged such that the first alignment marker includes in itself a plurality of openings; and the alignment observing means observes the respective positions of the first alignment marker and the vapor deposition film relative to each other on a basis of a ratio in fluorescence intensity among the plurality of openings.

The above arrangement can, without image recognition, more accurately observe and detect a relative position of the alignment marker for use in the alignment between the vapor deposition mask and the film formation substrate. Further, the above arrangement can carry out the above processes with high precision and yet at higher speed. The above arrangement is thus suitably applicable in a case where at least a first one of the mask unit and the film formation substrate is moved relative to a second one thereof rapidly.

The vapor deposition method may preferably be arranged such that the first alignment marker is provided in a first region of the film formation substrate, the first region being a region in which the at least the first one of the mask unit and the film formation substrate is moved relative to the second one thereof, from end to end along a direction of the relative movement.

Continuously observing the above alignment marker while carrying out vapor deposition makes it possible to not only carry out an alignment between the vapor deposition mask and the film formation substrate with high precision, but also accurately determine the amount of scanning the film formation substrate. The above arrangement thus makes it possible to carry out a more accurate vapor deposition control.

The vapor deposition method may preferably be arranged such that the first alignment marker is provided discontinuously.

According to the above arrangement, the alignment marker is provided discontinuously, which causes the intensity of reflection to change discontinuously.

Thus, counting the cycle of the above change makes it possible to accurately determine the amount of scanning the film formation substrate. The above arrangement thus makes it possible to carry out a more accurate vapor deposition control.

The vapor deposition method may preferably be arranged such that the first alignment marker is discontinuous at an interval that varies according to a position in the film formation substrate.

The above arrangement, as described above, intentionally varies, according to the position in the film formation substrate, the discontinuous cycle of the alignment marker provided to the film formation substrate for use in the alignment between the vapor deposition mask and the film formation substrate. The above arrangement thus makes it possible to more accurately determine the position (scan amount) of the film formation substrate.

The vapor deposition method may preferably be arranged such that the step (A) involves adjusting the amount of the void between the vapor deposition mask and the film formation substrate to a uniform amount by (i) measuring the amount of the void between the vapor deposition mask and the film formation substrate with use of a void sensor and (ii) on a basis of the measured void amount, moving, along an axis direction that connects the vapor deposition mask and the film formation substrate and that is perpendicular to the vapor deposition mask and the film formation substrate, at least one of (a) a portion of the mask unit which portion includes at least the vapor deposition mask or an entirety of the mask unit and (b) the film formation substrate.

For the above arrangement, the vapor deposition device may preferably further include: at least one void sensor for measuring an amount of a void between the vapor deposition mask and the film formation substrate.

Although the vapor deposition mask and the vapor deposition source are fixed in position relative to each other, there is a minute operating region due to a void amount adjustment process.

Measuring the amount of the void between the vapor deposition mask and the film formation substrate with use of a void sensor as described above makes it possible to accurately determine the amount of the void between the vapor deposition mask and the film formation substrate. The above arrangement can thus accurately control the void amount, and maintain the void amount at a desired, uniform value.

Thus, the above arrangement can prevent width variation, mispositioning, and shape change in a vapor deposition film that is deposited through the opening of the vapor deposition mask. The above arrangement consequently makes it possible to accurately form a high-resolution pattern throughout the film formation substrate.

In the case where the vapor deposition device includes a plurality of void sensors, it is possible to more accurately determine the distribution of the amount of the void between the vapor deposition mask and the film formation substrate.

The above arrangement thus makes it possible to more accurately control the void amount. The vapor deposition method may preferably be arranged such that the step (B) involves (i) measuring the amount of the void between the vapor deposition mask and the film formation substrate with use of the void sensor and (ii) carrying out the deposition of the vapor deposition particle while adjusting the amount of the void between the vapor deposition mask and the film formation substrate to the uniform amount on a basis of the measured void amount.

Adjusting the void amount in real time while carrying out vapor deposition as described above makes it possible to reliably maintain the void amount at a fixed, uniform value. The above arrangement thus makes it possible to carry out patterning with higher accuracy.

The vapor deposition method may preferably be arranged such that the void sensor is an optical void sensor for measuring the amount of the void between the vapor deposition mask and the film formation substrate by means of transmission through the film formation substrate.

The void sensor may be a void sensor of another type such as an electrostatic capacity type and an eddy current type. Such a void sensor of another type, however, basically measures the void between an object and itself, the object needing to be a conductor. The use of such a void sensor is subject to a restriction as a result.

The void sensor is thus desirably an optical void sensor as described above. The use of the void sensor makes it possible to measure the amount of the void between the vapor deposition mask and the film formation substrate through the film formation substrate.

The vapor deposition method may preferably be arranged such that the void sensor includes a plurality of void sensors arranged in a direction perpendicular to a direction of the relative movement; the film formation substrate includes a plurality of transparent regions for measuring the void amount with use of the void sensors, the transparent regions extending along the direction of the relative movement and being arranged along the direction perpendicular to the direction of the relative movement; and the step (B) involves measuring the amount of the void between the vapor deposition mask and the film formation substrate by means of the transmission through the film formation substrate with use of the void sensors facing the transparent regions.

Including a plurality of void sensors as described above makes it possible to determine the distribution of the void amount and consequently control the void amount more precisely to a uniform value.

The vapor deposition method may preferably be arranged such that the void amount is adjusted by moving, along the axis direction that connects the vapor deposition mask and the film formation substrate and that is perpendicular to the vapor deposition mask and the film formation substrate, the at least one of (a) the portion of the mask unit which portion includes at least the vapor deposition mask or the entirety of the mask unit and (b) the film formation substrate, with use of an actuator.

For the above arrangement, the vapor deposition device may preferably further include: an actuator for adjusting an amount of a void between the vapor deposition mask and the film formation substrate by moving, along an axis direction that connects the vapor deposition mask and the film formation substrate and that is perpendicular to the vapor deposition mask and the film formation substrate, at least one of (a) a portion of the mask unit which portion includes at least the vapor deposition mask or an entirety of the mask unit and (b) the film formation substrate.

The vapor deposition device may preferably further include: a void difference amount computing section for calculating an amount of a difference between (i) the void amount measured by the at least one void sensor and (ii) a preset amount of the void between the vapor deposition mask and the film formation substrate; a void difference correction amount deriving section for deriving, from the void difference amount calculated by the void difference amount computing section, a correction value for overcoming the difference; and an actuator drive control section for, on a basis of a void difference correction amount derived by the void difference correction amount deriving section, moving the actuator along the axis direction so that the void between the vapor deposition mask and the film formation substrate is uniform.

The use of the actuator to adjust the void amount as described above makes it possible to finely adjust the void and to easily and accurately adjust the void amount.

The vapor deposition method may preferably be arranged such that the step (B) involves sequentially depositing the vapor deposition particle onto the vapor deposition region of the film formation substrate while continuously moving the at least the first one of the mask unit and the film formation substrate relative to the second one thereof in the vapor deposition region of the film formation substrate.

Carrying out vapor deposition while continuously moving at least a first one of the mask unit and the film formation substrate relative to a second one thereof as described above averages the flying distribution of the vapor deposition particle along the substrate scanning direction even in a case where the distribution extends along the scanning direction. The above arrangement thus makes it possible to form a vapor deposition film having a pattern that is uniform over the substrate surface.

The vapor deposition method may be arranged such that the step (B) involves sequentially depositing the vapor deposition particle onto the vapor deposition region of the film formation substrate by repeating (i) a step for moving the at least the first one of the mask unit and the film formation substrate relative to the second one thereof so as to scan the at least the first one of the mask unit and the film formation substrate and (ii) a step for stopping the scan and depositing the vapor deposition particle onto the vapor deposition region of the film formation substrate.

The vapor deposition method may preferably be arranged such that the vapor deposition mask is a rectangular vapor deposition mask having, (i) along a short-axis direction thereof, a first side that is shorter than a width of a first side of the vapor deposition region of the film formation substrate which first side of the vapor deposition region extends along the short-axis direction of the vapor deposition mask and (ii) along a long-axis direction of the vapor deposition mask, a second side that is longer than a width of a second side of the vapor deposition region of the film formation substrate which second side of the vapor deposition region extends along the second side of the vapor deposition mask.

The above arrangement makes it possible to form alignment marker sections at, for example, respective ends of the vapor deposition mask which ends are opposite to each other along the long-side direction of the vapor deposition mask. The above arrangement thus makes it possible to carry out an alignment easily and more precisely.

The vapor deposition method may preferably be arranged such that the step (B) involves reciprocating the at least the first one of the mask unit and the film formation substrate.

Conventional art has had the necessity to, in the case where, for example, a crucible is used as a vapor deposition source, control the film thickness by means of temperature in order to change the vapor deposition rate. This has led to, for example, (i) the problem that it takes a long time to stabilize temperature and/or (ii) the problem that a variation in temperature tends to cause a variation in vapor deposition rate.

The above arrangement can, in contrast, control the film thickness on the basis of, not a temperature control, but the number of reciprocating motions. The above arrangement is thus free from the above problems.

In particular, in the case where the above reciprocating movement is carried out to subsequently deposit the vapor deposition particle onto the vapor deposition region of the film formation substrate while continuously moving at least a first one of the mask unit and the film formation substrate relative to a second one thereof in the vapor deposition region of the film formation substrate as described above, the movement of the film formation substrate is stopped only momentarily when the substrate scanning direction is reversed, and vapor deposition is carried out even while the film formation substrate is in motion. The above arrangement thus does not require a long tact time.

The vapor deposition method may preferably be arranged such that the step (B) involves alternating (i) the relative movement along one side of the vapor deposition region of the film formation substrate and (ii) the relative movement along another side of the vapor deposition region of the film formation substrate, the another side being orthogonal to the one side.

The above arrangement makes it possible to form a film formation pattern (vapor deposition film) efficiently throughout the entire vapor deposition region of the film formation substrate with use of a vapor deposition mask that is smaller in area than the vapor deposition region of the film formation substrate.

In particular, in the case where the above relative movement is carried out to subsequently deposit the vapor deposition particle onto the vapor deposition region of the film formation substrate while continuously moving at least a first one of the mask unit and the film formation substrate relative to a second one thereof in the vapor deposition region of the film formation substrate as described above, the movement of the film formation substrate is stopped only momentarily when the substrate scanning direction is switched, and vapor deposition is carried out even while the film formation substrate is in motion. The above arrangement thus does not require a long tact time.

The vapor deposition method may preferably be arranged such that the step (B) involves stopping the emission of the vapor deposition particle from the vapor deposition source for a second region of the film formation substrate, the second region requiring no deposition of the vapor deposition particle.

The above arrangement, as described above, stops the emission of the vapor deposition particle from the vapor deposition source for a second region of the film formation substrate, the second region requiring no deposition of the vapor deposition particle. The above arrangement can thus prevent vapor deposition on a portion for which vapor deposition is unnecessary (that is, a non vapor deposition region).

The present invention uses a vapor deposition mask smaller in area than the vapor deposition region of the film formation substrate as described above, and fixes the vapor deposition mask and the vapor deposition source in position relative to each other. Thus, even in the case where the vapor deposition mask and the vapor deposition source include a plurality of openings and emission holes respectively, the present invention (i) eliminates the need to, as conventional, carry out OFF/OFF control of a part of a plurality of vapor deposition sources (or emission holes) and (ii) simply needs to stop the emission of the vapor deposition particle from the vapor deposition source (that is, the emission of the vapor deposition particle from all the emission holes) for a non vapor deposition region. The present invention thus requires no complicated mechanism and consequently allows ON/OFF control to be easily carried out.

The vapor deposition method may preferably be arranged such that the mask unit is provided so that the emission hole faces the opening of the vapor deposition mask in a one-to-one correspondence.

The above arrangement can reduce the number of vapor deposition particles adhered to a non-opening section of the vapor deposition mask, and thus improve efficiency of material use.

The vapor deposition method may preferably be arranged such that the step (A) involves aligning the mask unit and the film formation substrate with each other so that the mask unit is placed above the film formation substrate; and the step (B) involves sequentially depositing the vapor deposition particle onto the vapor deposition region of the film formation substrate by emitting the vapor deposition particle downward from the vapor deposition source.

The above method places the film formation substrate below the mask unit, and thus simply requires holding the film formation substrate with use of, for example, a substrate stage or a roller to only an extent that no self-weight bending is caused to the film formation substrate. The above method can consequently hold the film formation substrate easily and safely in a state in which the film formation substrate is maintained at a fixed distance from the vapor deposition mask.

The above predetermined pattern can be of an organic layer for an organic electroluminescent device. The above vapor deposition method is suitably applicable to production of an organic electroluminescent device.

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

INDUSTRIAL APPLICABILITY

The vapor deposition device and vapor deposition method of the present invention are suitably applicable to, for example, a device and method for producing an organic EL display device which are used in a process of, for example, discriminative application formation of an organic layer in an organic EL display device.

REFERENCE SIGNS LIST 1 organic EL display device
2 pixel
2R, 2G, 2B sub-pixel
10 TFT substrate (film formation substrate)
20 organic EL element
21 first electrode
22 hole injection layer/hole transfer layer (organic layer)
23R, 23G, 23B luminous layer (organic layer)
24 electron transfer layer (organic layer)
25 electron injection layer (organic layer)
26 second electrode
27 hole injection layer (organic layer)

28R, 28G, 28B hole transfer layer
50 vapor deposition device
60 vacuum chamber (film growing chamber)
70 substrate moving mechanism (adjusting means)
71 substrate holding member
72 motor
80 mask unit
80R, 80G, 80B mask unit
81 shadow mask
81R, 81G, 81B shadow mask
81a long side
81b short side
82 opening
83 alignment marker section
84 alignment marker
84R, 84G, 84B alignment marker
84a first opening (alignment marker)
84b second opening (alignment marker)
85 vapor deposition source
86 emission hole
87 mask holding member
88 mask tension mechanism (tension mechanism; adjusting means)
89 shutter
90 image sensor (alignment observing means)
100 control circuit
101 image detecting section
102 computing section
103 motor drive control section
104 vapor deposition ON/OFF control section
105 shutter drive control section
110 absolute-alignment marker (alignment marker for an absolute alignment)
111 alignment marker (alignment marker for an absolute alignment)
112 alignment marker (alignment marker for an absolute alignment)
113 opening
120 absolute alignment reference marker (alignment marker for an absolute alignment)
130 mask clamp
141 mask supporting section
142 movable section
143 fixing section
144 mask fixing stand
150 image sensor
161 image detecting section
162 computing section
163 tension control section
170 alignment sensor (alignment observing means)
171 laser spot
180 film thickness sensor
190 alignment sensor (alignment observing means)
191 ultraviolet light emitting device
192 detector
200 film formation substrate
201 transparent region (void-sensing transparent region)
202a, 202b TFT circuit formation region (vapor deposition region)
210 vapor deposition region
210a long side
210b short side
211 vapor deposition film
220 alignment marker section
221 alignment marker
221R, 221G, 221B alignment marker
222 alignment marker
222a opening
230 control circuit
231 detecting section
232 correction amount calculating section
233 mask drive control section
234 substrate drive control section
235 vapor deposition ON/OFF control section
236 shutter drive control section
237 motor
240 mask unit moving mechanism (adjusting means)
241 motor
251 film thickness difference amount calculating section
252 correction amount calculating section
253 vapor deposition control section
260 heater
271 image detecting section
272 detecting section
273 vapor deposition ON/OFF control section
280 control circuit
281 image detecting section
282 detecting section
283 vapor deposition ON/OFF control section
290 control circuit
291 detecting section
292 vapor deposition ON/OFF control section
410 control circuit
411 void difference amount calculating section
412 void difference correction amount deriving section
413 actuator drive control section

The invention claimed is:

1. A vapor deposition device for forming, on a film formation substrate, a film having a predetermined pattern, the vapor deposition device comprising:
 a mask unit provided so as to face the film formation substrate and so as to include:
  a vapor deposition mask that has an opening and that is smaller in area than a vapor deposition region of the film formation substrate, wherein the vapor deposition mask includes, outside the opening of the vapor deposition mask, an alignment marker for use in the alignment between the vapor deposition mask and the film formation substrate; and
  a vapor deposition source that has an emission hole for emitting a vapor deposition particle, the emission hole being provided so as to face the vapor deposition mask,
 the vapor deposition mask and the vapor deposition source being fixed in position relative to each other;
 a motor driver configured to move, by driving a motor, at least a first one of the mask unit and the film formation substrate relative to a second one thereof while maintaining a uniform void between the mask unit and the film formation substrate,
 the mask unit further including a tension mechanism for applying tension to the vapor deposition mask in either an obliquely upward direction or an obliquely downward direction by using, as a fulcrum, an abutting member abutting either an upper surface or lower surface of the vapor deposition mask;
 alignment observing means provided so as to be adjacent to the film formation substrate and the vapor deposition mask and so as to be fixed in position relative to the vapor deposition mask; and
 an adjusting apparatus configured to adjust respective positions of the film formation substrate and the vapor deposition mask relative to each other, wherein the adjusting apparatus includes the motor driver and the tension mechanism, wherein the adjusting apparatus further includes (i) a void sensor configured to measure an amount of a void between the vapor deposition mask and the film formation substrate and (ii) an actuator configured to move, along an axis direction that connects the vapor deposition mask and the film formation substrate and that is perpendicular to the vapor deposition mask and the film formation substrate, at least one of (a) a portion of the mask unit which portion includes at least the vapor deposition mask or an entirety of the mask unit and (b) the film formation substrate.

2. The vapor deposition device according to claim 1, further comprising:

at least one void sensor for measuring an amount of a void between the vapor deposition mask and the film formation substrate.

3. The vapor deposition device according to claim 1, further comprising:

an actuator for adjusting an amount of a void between the vapor deposition mask and the film formation substrate by moving, along an axis direction that connects the vapor deposition mask and the film formation substrate and that is perpendicular to the vapor deposition mask and the film formation substrate, at least one of (a) a portion of the mask unit which portion includes at least the vapor deposition mask or an entirety of the mask unit and (b) the film formation substrate.

4. The vapor deposition device according to claim 3, further comprising:

a void difference amount computing section for calculating an amount of a difference between (i) the void amount measured by the at least one void sensor and (ii) a preset amount of the void between the vapor deposition mask and the film formation substrate;

a void difference correction amount deriving section for deriving, from the void difference amount calculated by the void difference amount computing section, a correction value for overcoming the difference; and an actuator drive control section for, on a basis of a void difference correction amount derived by the void difference correction amount deriving section, moving the actuator along the axis direction so that the void between the vapor deposition mask and the film formation substrate is uniform.

5. The vapor deposition device according to claim 1, wherein the mask unit includes an abutting member which (i) abuts either a top surface or lower surface of the vapor deposition mask to hold the vapor deposition mask horizontally and (ii) functions as a fulcrum configured to correct parallelism between the vapor deposition mask and the film formation substrate.

6. The vapor deposition device according to claim 1, wherein the alignment marker is provided in a region of the vapor deposition mask which faces a region of the film formation substrate other than the vapor deposition region for the vapor deposition particle emitted from the vapor deposition source.

7. The vapor deposition device according to claim 6, wherein the film formation substrate includes, at a position therein which position lies outside the vapor deposition region along a direction in which at least the first one of the mask unit and the film formation substrate is moved relative to the second one thereof, an alignment marker for use in alignment between the vapor deposition mask and the film formation substrate, and the alignment marker of the vapor deposition mask is provided at an end section thereof which end section first meets the alignment marker of the film formation substrate while at least the first one of the mask unit and the film formation substrate is moved relative to the second one thereof.

8. The vapor deposition device according to claim 1, wherein the alignment marker is an alignment opening.

9. The vapor deposition device according to claim 1, wherein the void sensor is an optical void sensor configured to measure the amount of the void between the vapor deposition mask and the film formation substrate by means of transmission through the film formation substrate.

* * * * *